US010148285B1

(12) United States Patent
Schmitt

(10) Patent No.: US 10,148,285 B1
(45) Date of Patent: Dec. 4, 2018

(54) ABSTRACTION AND DE-ABSTRACTION OF A DIGITAL DATA STREAM

(71) Applicant: Erich Schmitt, Naples, FL (US)

(72) Inventor: Erich Schmitt, Naples, FL (US)

(73) Assignee: Erich Schmitt, Naples, FL (US)

( * ) Notice: Subject to any disclaimer, the term of this patent is extended or adjusted under 35 U.S.C. 154(b) by 0 days.

(21) Appl. No.: 13/677,477

(22) Filed: Nov. 15, 2012

Related U.S. Application Data

(60) Provisional application No. 61/675,373, filed on Jul. 25, 2012.

(51) Int. Cl.
*H03M 7/30* (2006.01)

(52) U.S. Cl.
CPC .................................. *H03M 7/3059* (2013.01)

(58) Field of Classification Search
USPC .... 341/50–90; 717/104, 116, 117, 126, 136, 717/139, 142, 159, 108; 709/203
See application file for complete search history.

(56) References Cited

U.S. PATENT DOCUMENTS

| | | | |
|---|---|---|---|
| 4,202,051 | A | 5/1980 | Davida et al. |
| 4,452,590 | A | 6/1984 | Trell |
| 4,575,088 | A | 3/1986 | Peek |
| 4,949,294 | A | 8/1990 | Wambergue |
| 4,949,380 | A | 8/1990 | Chaum |
| 4,991,210 | A | 2/1991 | Chaum |
| 4,996,711 | A | 2/1991 | Chaum |
| 5,159,632 | A | 10/1992 | Crandall |
| 5,244,371 | A | 9/1993 | Bello et al. |
| 5,270,956 | A | 12/1993 | Oruc et al. |
| 5,271,061 | A | 12/1993 | Crandall |
| 5,272,755 | A | 12/1993 | Miyaji et al. |
| 5,351,297 | A | 9/1994 | Miyaji et al. |
| 5,442,707 | A | 8/1995 | Miyaji et al. |
| 5,463,690 | A | 10/1995 | Crandall |
| 5,497,423 | A | 3/1996 | Miyaji |
| 5,502,665 | A | 3/1996 | Im |
| 5,577,124 | A | 11/1996 | Anshel et al. |
| 5,581,616 | A | 12/1996 | Crandall |
| 5,598,181 | A | 1/1997 | Kermisch |
| 5,606,690 | A | 2/1997 | Hunter et al. |
| 5,710,562 | A | 1/1998 | Gormish |
| 5,737,425 | A | 4/1998 | Ajtai |
| 5,751,808 | A | 5/1998 | Anshel et al. |
| 5,790,599 | A | 8/1998 | Wright, Jr. et al. |
| 5,805,703 | A | 9/1998 | Crandall |
| 5,838,794 | A | 11/1998 | Mittenthal |
| 5,838,795 | A | 11/1998 | Mittenthal |

(Continued)

OTHER PUBLICATIONS

"An Introduction to the Theory of Groups", George W. Polites, 1968, Chapter 4, pp. 49-61.

(Continued)

*Primary Examiner* — Lam T Mai
(74) *Attorney, Agent, or Firm* — Fish & Richardson P.C.

(57) ABSTRACT

Techniques for abstracting a set of abstraction codes from an input bit string and for de-abstracting to recover an original input bit string from a set of abstraction codes and a string length are described. Applications of these techniques to compressing, storage, networking, encryption are also described as is a parallel configuration for abstraction and de-abstraction.

100 Claims, 143 Drawing Sheets

(56) References Cited

U.S. PATENT DOCUMENTS 5,838,796 A 11/1998 Mittenthal
5,867,578 A 2/1999 Brickell et al.
6,018,735 A 1/2000 Hunter
6,035,041 A 3/2000 Frankel et al.
6,038,317 A 3/2000 Magliveras et al.
6,049,610 A 4/2000 Crandall
6,061,513 A * 5/2000 Scandura ................. G06F 8/74 717/142
6,064,738 A 5/2000 Fridrich
6,081,597 A 6/2000 Hoffstein et al.
6,128,764 A 10/2000 Gottesman
6,138,125 A 10/2000 DeMoss
6,141,420 A 10/2000 Vanstone et al.
6,145,111 A 11/2000 Crozier et al.
6,145,114 A 11/2000 Crozier et al.
6,199,088 B1 3/2001 Weng et al.
6,209,091 B1 3/2001 Sudia et al.
6,239,727 B1 5/2001 Crochemore
6,246,768 B1 6/2001 Kim
6,252,958 B1 6/2001 Rose
6,252,959 B1 6/2001 Paar et al.
6,275,587 B1 8/2001 Amerige
6,285,760 B1 9/2001 Crandall
6,285,761 B1 9/2001 Patel et al.
6,298,137 B1 10/2001 Hoffstein et al.
6,307,935 B1 10/2001 Crandall et al.
6,341,349 B1 1/2002 Takaragi et al.
6,411,716 B1 6/2002 Brickell
6,480,606 B1 11/2002 Kurumatani
6,490,352 B1 12/2002 Schroeppel
6,543,021 B1 4/2003 Piret
6,560,336 B1 5/2003 Arita
6,560,493 B1 5/2003 Dahleh et al.
6,567,916 B1 5/2003 Terao et al.
6,618,483 B1 9/2003 Vanstone et al.
6,651,167 B1 11/2003 Terao et al.
6,666,381 B1 12/2003 Kaminaga et al.
6,718,508 B2 4/2004 Lodge et al.
6,751,318 B2 6/2004 Crandall
6,782,100 B1 8/2004 Vanstone et al.
6,801,579 B1 10/2004 Hassibi et al.
6,803,599 B2 10/2004 Amin et al.
6,847,737 B1 1/2005 Kouri et al.
6,876,745 B1 4/2005 Kurumatani
6,968,354 B2 11/2005 Kaminaga et al.
6,970,112 B2 11/2005 Plotnikov et al.
6,986,054 B2 1/2006 Kaminaga et al.
6,987,282 B2 1/2006 Amin et al.
6,987,818 B2 1/2006 Brunel
7,000,110 B1 2/2006 Terao
7,000,168 B2 2/2006 Kurtas et al.
7,023,898 B2 4/2006 Brunel
7,031,468 B2 4/2006 Hoffstein et al.
7,050,580 B1 5/2006 Ferre
7,069,287 B2 6/2006 Paar et al.
7,079,650 B1 7/2006 Knudsen
7,081,839 B2 7/2006 Savari
7,109,593 B2 9/2006 Freedman et al.
7,113,594 B2 9/2006 Boneh et al.
7,130,353 B2 10/2006 Brunel
7,136,484 B1 11/2006 Koh
7,139,396 B2 11/2006 Montgomery et al.
7,162,679 B2 1/2007 Liberol et al.
7,174,013 B1 2/2007 Patel et al.
7,174,498 B2 2/2007 Weissinger
7,197,527 B2 3/2007 Naslund et al.
7,200,225 B1 4/2007 Schroeppel
7,221,762 B2 5/2007 Gentry et al.
7,240,084 B2 7/2007 Gura et al.
7,243,064 B2 7/2007 Paris
7,243,292 B1 7/2007 Naslund et al.
7,250,624 B1 7/2007 Freedman et al.
7,251,325 B2 7/2007 Paeng et al.
7,266,303 B2 9/2007 Linden et al.
7,272,265 B2 9/2007 Kouri et al.
7,308,018 B2 12/2007 Seeger et al.
7,321,131 B2 1/2008 Freedman et al.
7,328,397 B2 2/2008 Lunelli et al.
7,337,322 B2 2/2008 Gentry et al.
7,346,159 B2 3/2008 Gura et al.
7,349,459 B2 3/2008 Brunel
7,349,538 B2 3/2008 Gentry et al.
7,353,395 B2 4/2008 Gentry et al.
7,363,496 B2 4/2008 Gentry et al.
7,379,546 B2 5/2008 Ibrahim
7,382,293 B1 6/2008 Wicker
7,389,225 B1 6/2008 Jensen et al.
7,435,562 B2 10/2008 Jarrell et al.
7,443,980 B2 10/2008 Gentry et al.
7,451,292 B2 11/2008 Routt
7,453,162 B2 11/2008 Freedman et al.
7,457,469 B2 11/2008 Williams
7,458,009 B2 11/2008 Yu et al.
7,461,115 B2 12/2008 Eberle et al.
7,461,261 B2 12/2008 Vaudenay et al.
7,474,010 B2 1/2009 Freedman et al.
7,485,423 B2 2/2009 Jarrell et al.
7,499,544 B2 3/2009 Jao et al.
7,508,936 B2 3/2009 Eberle et al.
7,518,138 B2 4/2009 Freedman et al.
7,525,202 B2 4/2009 Freedman et al.
7,530,051 B1 5/2009 Allen et al.
7,533,270 B2 5/2009 Gentry
7,548,588 B2 6/2009 Averbuch et al.
7,558,970 B2 7/2009 Bellovin et al.
7,566,896 B2 7/2009 Freedman et al.
7,579,146 B2 8/2009 Jarrell et al.
7,579,699 B2 8/2009 Freedman et al.
7,580,564 B2 8/2009 Bailey
7,587,605 B1 9/2009 Venkatesan et al.
7,590,854 B2 9/2009 Gentry et al.
7,594,261 B2 9/2009 Lauter et al.
7,598,514 B2 10/2009 Freedman et al.
7,600,223 B2 * 10/2009 Massarenti ........... G06F 9/4435 707/999.202
7,603,560 B2 10/2009 Crandall
7,634,087 B2 12/2009 Boneh et al.
7,634,091 B2 12/2009 Zhou et al.
7,639,799 B2 12/2009 Lauter et al.
7,644,335 B2 1/2010 Luby et al.
7,653,817 B2 1/2010 Gentry
7,657,748 B2 2/2010 Gentry
7,664,957 B2 2/2010 Gentry et al.
7,672,952 B2 3/2010 Isaacson et al.
7,676,735 B2 3/2010 Luby et al.
7,680,268 B2 3/2010 Lauter et al.
7,685,566 B2 3/2010 Brown, Jr. et al.
7,689,056 B2 3/2010 Papadakis et al.
7,702,098 B2 4/2010 Lauter et al.
7,707,426 B2 4/2010 Lauter et al.
7,724,898 B2 5/2010 Nalund et al.
7,725,724 B2 5/2010 Ding et al.
7,737,870 B1 6/2010 Wang
7,743,253 B2 6/2010 Lauter et al.
7,751,558 B2 7/2010 Gentry
7,792,894 B1 9/2010 Cohn et al.
7,796,751 B2 9/2010 Gentry
7,814,326 B2 10/2010 Gentry
7,853,016 B2 12/2010 Gentry
7,881,466 B2 2/2011 Gorissen et al.
7,885,406 B2 2/2011 Lauter et al.
7,917,513 B2 3/2011 Watanabe et al.
7,930,335 B2 4/2011 Gura et al.
7,933,823 B1 4/2011 Seifert et al.
7,948,925 B2 5/2011 Miyabayashi et al.
7,961,873 B2 6/2011 Ibrahim
7,961,874 B2 6/2011 Ibrahim
7,962,761 B1 6/2011 Spalka et al.
7,974,405 B2 7/2011 Furukawa et al.
8,024,581 B2 9/2011 Spalka et al.
8,027,466 B2 9/2011 Ebeid
8,050,403 B2 11/2011 Ebeid
8,053,754 B2 11/2011 Freedman et al.
8,058,638 B2 11/2011 Freedman et al.

(56) References Cited

U.S. PATENT DOCUMENTS

| | | | | |
|---|---|---|---|---|
| 8,065,735 | B2 | 11/2011 | Joye | |
| 8,074,073 | B2 | 12/2011 | Gentry | |
| 8,076,666 | B2 | 12/2011 | Bonderson et al. | |
| 8,078,877 | B2 | 12/2011 | Cheon | |
| 8,111,826 | B2 | 2/2012 | Takashima | |
| 8,130,964 | B2 | 3/2012 | Boneh et al. | |
| 8,150,029 | B2 | 4/2012 | Huque et al. | |
| 8,160,245 | B2 | 4/2012 | Ebeid | |
| 8,176,110 | B2 | 5/2012 | Eberle et al. | |
| 8,180,047 | B2 | 5/2012 | Lauter et al. | |
| 8,180,049 | B2 | 5/2012 | Gentry | |
| 8,200,963 | B2 | 6/2012 | Jin et al. | |
| 8,204,232 | B2 | 6/2012 | Struik et al. | |
| 8,209,279 | B2 | 6/2012 | Freedman et al. | |
| 8,214,811 | B2 * | 7/2012 | Barcia | G06F 9/445 717/148 |
| 8,219,820 | B2 | 7/2012 | Ebeid | |
| 8,243,919 | B2 | 8/2012 | Ebeid | |
| 8,250,367 | B2 | 8/2012 | Broker et al. | |
| 8,261,069 | B2 | 9/2012 | Bellovin et al. | |
| 8,266,089 | B2 | 9/2012 | Asenjo | |
| 8,271,412 | B2 | 9/2012 | Johnson | |
| 8,300,807 | B2 | 10/2012 | Broko et al. | |
| 8,300,811 | B2 | 10/2012 | Georgiades et al. | |
| 8,331,557 | B2 | 12/2012 | Ebeid | |
| 8,345,863 | B2 | 1/2013 | Baek et al. | |
| 8,369,517 | B2 | 2/2013 | Venelli et al. | |
| 8,379,844 | B2 | 2/2013 | Ebeid | |
| 8,379,849 | B2 | 2/2013 | Ebeid | |
| 8,380,982 | B2 | 2/2013 | Miyabayashi et al. | |
| 8,391,479 | B2 | 3/2013 | Ebeid | |
| 8,402,287 | B2 | 3/2013 | Vigilant et al. | |
| 8,422,541 | B2 | 4/2013 | Ashikhmin et al. | |
| 8,422,685 | B2 | 4/2013 | Al-Somani et al. | |
| 8,432,884 | B1 | 4/2013 | Ashrafi | |
| 8,457,305 | B2 | 6/2013 | Lauter et al. | |
| 8,464,060 | B2 | 6/2013 | Yao et al. | |
| 8,467,535 | B2 | 6/2013 | Struik | |
| 8,468,512 | B2 * | 6/2013 | Bnayahu | G06F 8/433 705/322 |
| 8,471,245 | B2 | 6/2013 | Bonderson et al. | |
| 8,477,934 | B2 | 7/2013 | Nogami et al. | |
| 8,503,679 | B2 | 8/2013 | Bugbee | |
| 8,509,426 | B1 | 8/2013 | Ghouti et al. | |
| 8,516,267 | B2 | 8/2013 | Spalka et al. | |
| 8,522,011 | B2 | 8/2013 | Spalka et al. | |
| 8,533,490 | B2 | 9/2013 | Kargl et al. | |
| 2004/0101048 | A1 | 5/2004 | Paris | |
| 2013/0318093 | A1 | 11/2013 | Conron | |
| 2015/0055777 | A1 | 2/2015 | Wang | |

OTHER PUBLICATIONS

"An Introduction to the Theory of Groups", George W. Polites, Book Supplied.

"An Introduction to the Theory of Groups", Third Edition, Joseph J. Rotman, pp. 240-350.

*Alice Corp.* v. *CLS Bank Intl* 573 U.S. (2014).

http://planetmath.org/nonabeliangroup, pp. 1-3.

"New Public Key Cryptosystem using Finite Non Abelian Group," Seong-Hun Paeng et al., National Security Research Institute, Korea, pp. 1-16.

Abstraction Principal from Wikipedia page was last modified on Oct. 19, 2015. Retrieved from "https://en.wikipedia.org/wiki/Abstraction_principle_(computer_programming)".

Abelian group page was last modified Mar. 13, 2016 Retrieved from https://en.wikipedia.org/w/index.php?title=Abelian_group&oldid=709860886.

Non-Abelian group page was last modified Nov. 23, 2015 Retrieved from http://en.wikipedia.org/w/index.php?title=Non-abelian_group&oldid=691956962.

Dihedral group of order 6 page was last modified Mar. 13, 2016 Retrieved from https://en.wikipedia.org/wiki/Dihedral_group_of_order_6.

Abstract Algebra Theory and Applications Thomas W. Judson, Stephen F. Austin State University Aug. 12, 2015; © 1997-2015 Thomas W. Judson, Robert A. Beezer; GNU Free Documentation License Retrieved at http://abstract.ups.edu/download.html Preface; Table of Contents.

Abstract Algebra Theory and Applications Thomas W. Judson, Stephen F. Austin State University Aug. 12, 2015; © 1997-2015 Thomas W. Judson, Robert A. Beezer; GNU Free Documentation License Retrieved at http://abstract.ups.edu/download.html Chap. 3.

Abstract Algebra Theory and Applications Thomas W. Judson, Stephen F. Austin State University Aug. 12, 2015; © 1997-2015 Thomas W. Judson, Robert A. Beezer; GNU Free Documentation License Retrieved at http://abstract.ups.edu/download.html Chap. 5.

*An Introduction to the Theory of Groups*, Fourth Edition, Joseph J. Rotman, Springer, 4th edition (1999) cover pages, 2 pages.

*An Introduction to the Theory of Groups*, Fourth Edition, Joseph J. Rotman, Springer, 4th edition (1999) Chapter 10, Abelian Groups, 36 pages.

*An Introduction to the Theory of Groups*, Fourth Edition, Joseph J. Rotman, Springer, 4th edition (1999), Chapter 11, Free Groups and Free Products 75 pages.

*An Introduction to the Theory of Groups*, Fourth Edition, Joseph J. Rotman, Springer, 4th edition (1999), Table of Contents, 4 pages.

*An Introduction to the Theory of Groups*, Fourth Edition, Joseph J. Rotman, Springer, 4th edition (1999), Appendix II, Equivalence Relations and Equivalence Classes 2 pages.

"*A Mathematical Theory of Communication*", C.E. Shannon, Reprinted with corrections from The System Technical Journal, vol. 27, pp. 379-423, 623-656, Jul., Oct. 1948.

"*On the Length of Programs for Computing Finite Binary Sequences*", G.J. Chaitin, Journal of the ACM 13 (1966), pp. 547-569.

"*Development of Guidelines for the Definition of the Relevant Information Content in Data Classes*", Erich Schmitt, The Research Foundation of State University of New York, Apr. 1973, pp. 1-24.

Judson, T.W. *Abstract Algebra Theory and Applications*, Austin State Univ., 2013, p. 1-444.

"*Groups*," (Chap. 3) in: Judson, T.W., *Abstract Algebra Theory and Applications*, Austin State Univ., 2013, pp. 37-58.

"*Isomorphisms*," (Chap. 9) in: Judson, T.W., *Abstract Algebra Theory and Applications*, Austin State Univ., 2013, pp. 143-158.

"*Homomorphisms*," (Chap. 11) in: Judson, T.W., *Abstract Algebra Theory and Applications*, Austin State Univ., 2013, pp. 169-178.

"*The Structure of Groups*," (Chap. 13) in: Judson, T.W., *Abstract Algebra Theory and Applications*, Austin State Univ., 2013, pp. 200-212.

* cited by examiner

| Order DA String (k) | DA Element | Order DA String (k) | DA Element | Order DA String (k) | DA Element |
|---|---|---|---|---|---|
| 1 | 1 | 43 | 1 | 85 | 0 |
| 2 | 1 | 44 | 1 | 86 | 0 |
| 3 | 1 | 45 | 1 | 87 | 1 |
| 4 | 1 | 46 | 0 | 88 | 1 |
| 5 | 1 | 47 | 0 | 89 | 1 |
| 6 | 0 | 48 | 1 | 90 | 1 |
| 7 | 0 | 49 | 0 | 91 | 1 |
| 8 | 1 | 50 | 0 | 92 | 0 |
| 9 | 0 | 51 | 1 | 93 | 0 |
| 10 | 1 | 52 | 1 | 94 | 1 |
| 11 | 1 | 53 | 0 | 95 | 0 |
| 12 | 1 | 54 | 0 | 96 | 0 |
| 13 | 1 | 55 | 1 | 97 | 0 |
| 14 | 1 | 56 | 1 | 98 | 1 |
| 15 | 1 | 57 | 1 | 99 | 0 |
| 16 | 1 | 58 | 0 | 100 | 1 |
| 17 | 1 | 59 | 0 | 101 | 1 |
| 18 | 1 | 60 | 1 | 102 | 0 |
| 19 | 1 | 61 | 1 | 103 | 0 |
| 20 | 0 | 62 | 0 | 104 | 0 |
| 21 | 1 | 63 | 0 | 105 | 1 |
| 22 | 1 | 64 | 0 | 106 | 0 |
| 23 | 0 | 65 | 1 | 107 | 0 |
| 24 | 1 | 66 | 1 | 108 | 1 |
| 25 | 0 | 67 | 0 | 109 | 0 |
| 26 | 1 | 68 | 1 | 110 | 1 |
| 27 | 1 | 69 | 0 | 111 | 0 |
| 28 | 1 | 70 | 0 | 112 | 1 |
| 29 | 0 | 71 | 0 | 113 | 0 |
| 30 | 1 | 72 | 1 | 114 | 1 |
| 31 | 0 | 73 | 0 | 115 | 1 |
| 32 | 0 | 74 | 0 | 116 | 0 |
| 33 | 0 | 75 | 1 | 117 | 0 |
| 34 | 0 | 76 | 1 | 118 | 0 |
| 35 | 0 | 77 | 1 | 119 | 1 |
| 36 | 0 | 78 | 1 | 120 | 1 |
| 37 | 1 | 79 | 0 | 121 | 0 |
| 38 | 1 | 80 | 1 | 122 | 0 |
| 39 | 0 | 81 | 1 | 123 | 0 |
| 40 | 1 | 82 | 1 | 124 | 0 |
| 41 | 0 | 83 | 0 | 125 | 1 |
| 42 | 1 | 84 | 1 | | |

FIG. 4

| Order (m) | Limit Data String | Order (m) | Limit Data String |
|---|---|---|---|
| 0 | 0 | 21 | 0 |
| 1 | 0 | 22 | 1 |
| 2 | 1 | 23 | 0 |
| 3 | 0 | 24 | 0 |
| 4 | 0 | 25 | 0 |
| 5 | 0 | 26 | 1 |
| 6 | 0 | 27 | 1 |
| 7 | 1 | 28 | 1 |
| 8 | 0 | 29 | 1 |
| 9 | 1 | 30 | 1 |
| 10 | 1 | 31 | 0 |
| 11 | 1 | 32 | 0 |
| 12 | 1 | 33 | 1 |
| 13 | 1 | 34 | 1 |
| 14 | 0 | 35 | 0 |
| 15 | 0 | 36 | 1 |
| 16 | 1 | 37 | 0 |
| 17 | 1 | 38 | 1 |
| 18 | 1 | 39 | 1 |
| 19 | 0 | 40 | 0 |
| 20 | 0 | 41 | 1 |

FIG. 5A

| Order i | AD Bits | Order i | AD Bits | Order i | AD Bits | Order i | AD Bits | Order i | AD Bits |
|---|---|---|---|---|---|---|---|---|---|
| 0 | 0 | 36 | 1 | 72 | 1 | 108 | 1 | 144 | 1 |
| 1 | 0 | 37 | 1 | 73 | 1 | 109 | 0 | 145 | 0 |
| 2 | 1 | 38 | 1 | 74 | 0 | 110 | 1 | 146 | 1 |
| 3 | 1 | 39 | 1 | 75 | 0 | 111 | 0 | 147 | 1 |
| 4 | 1 | 40 | 0 | 76 | 1 | 112 | 0 | 148 | 1 |
| 5 | 0 | 41 | 0 | 77 | 0 | 113 | 1 | 149 | 1 |
| 6 | 1 | 42 | 1 | 78 | 0 | 114 | 1 | 150 | 1 |
| 7 | 1 | 43 | 0 | 79 | 1 | 115 | 0 | 151 | 0 |
| 8 | 0 | 44 | 0 | 80 | 1 | 116 | 0 | 152 | 0 |
| 9 | 1 | 45 | 1 | 81 | 0 | 117 | 1 | 153 | 0 |
| 10 | 1 | 46 | 0 | 82 | 0 | 118 | 1 | 154 | 0 |
| 11 | 1 | 47 | 1 | 83 | 1 | 119 | 1 | 155 | 0 |
| 12 | 1 | 48 | 0 | 84 | 0 | 120 | 0 | 156 | 0 |
| 13 | 1 | 49 | 0 | 85 | 1 | 121 | 0 | 157 | 1 |
| 14 | 1 | 50 | 1 | 86 | 0 | 122 | 0 | 158 | 1 |
| 15 | 1 | 51 | 0 | 87 | 0 | 123 | 0 | 159 | 0 |
| 16 | 0 | 52 | 0 | 88 | 0 | 124 | 0 | 160 | 0 |
| 17 | 0 | 53 | 1 | 89 | 0 | 125 | 0 | 161 | 0 |
| 18 | 1 | 54 | 0 | 90 | 0 | 126 | 1 | 162 | 1 |
| 19 | 1 | 55 | 1 | 91 | 0 | 127 | 0 | 163 | 0 |
| 20 | 0 | 56 | 0 | 92 | 1 | 128 | 1 | 164 | 0 |
| 21 | 1 | 57 | 0 | 93 | 0 | 129 | 1 | 165 | 0 |
| 22 | 1 | 58 | 1 | 94 | 1 | 130 | 1 | 166 | 1 |
| 23 | 1 | 59 | 1 | 95 | 0 | 131 | 1 | | |
| 24 | 0 | 60 | 0 | 96 | 1 | 132 | 0 | | |
| 25 | 0 | 61 | 1 | 97 | 1 | 133 | 1 | | |
| 26 | 1 | 62 | 0 | 98 | 1 | 134 | 1 | | |
| 27 | 1 | 63 | 0 | 99 | 1 | 135 | 1 | | |
| 28 | 1 | 64 | 1 | 100 | 1 | 136 | 0 | | |
| 29 | 0 | 65 | 1 | 101 | 1 | 137 | 0 | | |
| 30 | 0 | 66 | 1 | 102 | 1 | 138 | 0 | | |
| 31 | 0 | 67 | 0 | 103 | 1 | 139 | 0 | | |
| 32 | 1 | 68 | 1 | 104 | 0 | 140 | 1 | | |
| 33 | 1 | 69 | 1 | 105 | 1 | 141 | 1 | | |
| 34 | 0 | 70 | 0 | 106 | 1 | 142 | 0 | | |
| 35 | 1 | 71 | 1 | 107 | 0 | 143 | 1 | | |

FIG. 5B

| | 0 | 1 | 2 | 3 | 4 | 5 |
|---|---|---|---|---|---|---|
| 0 | 0 | 1 | 2 | 3 | 4 | 5 |
| 1 | 1 | 2 | 0 | 4 | 5 | 3 |
| 2 | 2 | 0 | 1 | 5 | 3 | 4 |
| 3 | 3 | 5 | 4 | 0 | 2 | 1 |
| 4 | 4 | 3 | 5 | 1 | 0 | 2 |
| 5 | 5 | 4 | 3 | 2 | 1 | 0 |

FIG. 6 aa' bb' cc'

| | 04 | 13 | 25 | 31 | 40 | 52 |
|---|---|---|---|---|---|---|
| 00 | 44 | 44 | 44 | 55 | 44 | 33 |
| 01 | 53 | 53 | 53 | 44 | 33 | 55 |
| 02 | 35 | 35 | 35 | 33 | 55 | 44 |
| 03 | 21 | 11 | 01 | 12 | 11 | 10 |
| 04 | 00 | 20 | 10 | 01 | 00 | 02 |
| 05 | 12 | 02 | 22 | 20 | 22 | 21 |
| 10 | 55 | 55 | 55 | 34 | 53 | 45 |
| 11 | 34 | 34 | 34 | 53 | 45 | 34 |
| 12 | 43 | 43 | 43 | 45 | 34 | 53 |
| 13 | 02 | 22 | 12 | 21 | 20 | 22 |
| 14 | 11 | 01 | 21 | 10 | 12 | 11 |
| 15 | 20 | 10 | 00 | 02 | 01 | 00 |
| 20 | 33 | 33 | 33 | 43 | 35 | 54 |
| 21 | 45 | 45 | 45 | 35 | 54 | 43 |
| 22 | 54 | 54 | 54 | 54 | 43 | 35 |
| 23 | 10 | 00 | 20 | 00 | 02 | 01 |
| 24 | 22 | 12 | 02 | 22 | 21 | 20 |
| 25 | 01 | 21 | 11 | 11 | 10 | 12 |

| | 04 | 13 | 25 | 31 | 40 | 52 |
|---|---|---|---|---|---|---|
| 30 | 22 | 21 | 20 | 11 | 21 | 01 |
| 31 | 10 | 12 | 11 | 22 | 02 | 12 |
| 32 | 01 | 00 | 02 | 00 | 10 | 20 |
| 33 | 45 | 54 | 33 | 54 | 54 | 54 |
| 34 | 33 | 45 | 54 | 35 | 35 | 35 |
| 35 | 54 | 33 | 45 | 43 | 43 | 43 |
| 40 | 00 | 02 | 01 | 20 | 00 | 10 |
| 41 | 21 | 20 | 22 | 01 | 11 | 21 |
| 42 | 12 | 11 | 10 | 12 | 22 | 02 |
| 43 | 53 | 35 | 44 | 33 | 33 | 33 |
| 44 | 44 | 53 | 35 | 44 | 44 | 44 |
| 45 | 35 | 44 | 53 | 55 | 55 | 55 |
| 50 | 11 | 10 | 12 | 02 | 12 | 22 |
| 51 | 02 | 01 | 00 | 10 | 20 | 00 |
| 52 | 20 | 22 | 21 | 21 | 01 | 11 |
| 53 | 34 | 43 | 55 | 45 | 45 | 45 |
| 54 | 55 | 34 | 43 | 53 | 53 | 53 |
| 55 | 43 | 55 | 34 | 34 | 34 | 34 |

| | 00 | 01 | 02 | 03 | 04 | 05 | 10 | 11 | 12 | 13 | 14 | 15 |
|---|---|---|---|---|---|---|---|---|---|---|---|---|
| 00 | 00 | 11 | 22 | 33 | 44 | 55 | 11 | 22 | 00 | 44 | 55 | 33 |
| 01 | 11 | 22 | 00 | 45 | 53 | 34 | 22 | 00 | 11 | 53 | 34 | 45 |
| 02 | 22 | 00 | 11 | 54 | 35 | 43 | 00 | 11 | 22 | 35 | 43 | 54 |
| 03 | 33 | 54 | 45 | 00 | 21 | 12 | 44 | 35 | 53 | 11 | 02 | 20 |
| 04 | 44 | 35 | 53 | 12 | 00 | 21 | 55 | 43 | 34 | 20 | 11 | 02 |
| 05 | 55 | 43 | 34 | 21 | 12 | 00 | 33 | 54 | 45 | 02 | 20 | 11 |
| 10 | 11 | 22 | 00 | 44 | 55 | 33 | 22 | 00 | 11 | 55 | 33 | 44 |
| 11 | 22 | 00 | 11 | 53 | 34 | 45 | 00 | 11 | 22 | 34 | 45 | 53 |
| 12 | 00 | 11 | 22 | 35 | 43 | 54 | 11 | 22 | 00 | 43 | 54 | 35 |
| 13 | 44 | 35 | 53 | 11 | 02 | 20 | 55 | 43 | 34 | 22 | 10 | 01 |
| 14 | 55 | 43 | 34 | 20 | 11 | 02 | 33 | 54 | 45 | 01 | 22 | 10 |
| 15 | 33 | 54 | 45 | 02 | 20 | 11 | 44 | 35 | 53 | 10 | 01 | 22 |
| 20 | 22 | 00 | 11 | 55 | 33 | 44 | 00 | 11 | 22 | 33 | 44 | 55 |
| 21 | 00 | 11 | 22 | 34 | 45 | 53 | 11 | 22 | 00 | 45 | 53 | 34 |
| 22 | 11 | 22 | 00 | 43 | 54 | 35 | 22 | 00 | 11 | 54 | 35 | 43 |
| 23 | 55 | 43 | 34 | 22 | 10 | 01 | 33 | 54 | 45 | 00 | 21 | 12 |
| 24 | 33 | 54 | 45 | 01 | 22 | 10 | 44 | 35 | 53 | 12 | 00 | 21 |
| 25 | 44 | 35 | 53 | 10 | 01 | 22 | 55 | 43 | 34 | 21 | 12 | 00 |

| | | |
|---|---|---|
| FIG. 8A | FIG. 8B | FIG. 8C |
| FIG. 8D | FIG. 8E | FIG. 8F |

FIG. 8

| | 20 | 21 | 22 | 23 | 24 | 25 | 30 | 31 | 32 | 33 | 34 | 35 |
|---|---|---|---|---|---|---|---|---|---|---|---|---|
| 00 | 22 | 00 | 11 | 55 | 33 | 44 | 33 | 55 | 44 | 00 | 22 | 11 |
| 01 | 00 | 11 | 22 | 34 | 45 | 53 | 55 | 44 | 33 | 21 | 10 | 02 |
| 02 | 11 | 22 | 00 | 43 | 54 | 35 | 44 | 33 | 55 | 12 | 01 | 20 |
| 03 | 55 | 43 | 34 | 22 | 10 | 01 | 00 | 12 | 21 | 33 | 45 | 54 |
| 04 | 33 | 54 | 45 | 01 | 22 | 10 | 22 | 01 | 10 | 54 | 33 | 45 |
| 05 | 44 | 35 | 53 | 10 | 01 | 22 | 11 | 20 | 02 | 45 | 54 | 33 |
| 10 | 00 | 11 | 22 | 33 | 44 | 55 | 45 | 34 | 53 | 12 | 01 | 20 |
| 11 | 11 | 22 | 00 | 45 | 53 | 34 | 34 | 53 | 45 | 00 | 22 | 11 |
| 12 | 22 | 00 | 11 | 54 | 35 | 43 | 53 | 45 | 34 | 21 | 10 | 02 |
| 13 | 33 | 54 | 45 | 00 | 21 | 12 | 12 | 21 | 00 | 45 | 54 | 33 |
| 14 | 44 | 35 | 53 | 12 | 00 | 21 | 01 | 10 | 22 | 33 | 45 | 54 |
| 15 | 55 | 43 | 34 | 21 | 12 | 00 | 20 | 02 | 11 | 54 | 33 | 45 |
| 20 | 11 | 22 | 00 | 44 | 55 | 33 | 54 | 43 | 35 | 21 | 10 | 02 |
| 21 | 22 | 00 | 11 | 53 | 34 | 45 | 43 | 35 | 54 | 12 | 01 | 20 |
| 22 | 00 | 11 | 22 | 35 | 43 | 54 | 35 | 54 | 43 | 00 | 22 | 11 |
| 23 | 44 | 35 | 53 | 11 | 02 | 20 | 21 | 00 | 12 | 54 | 33 | 45 |
| 24 | 55 | 43 | 34 | 20 | 11 | 02 | 10 | 22 | 01 | 45 | 54 | 33 |
| 25 | 33 | 54 | 45 | 02 | 20 | 11 | 02 | 11 | 20 | 33 | 45 | 54 |

FIG. 8B

| | 40 | 41 | 42 | 43 | 44 | 45 | 50 | 51 | 52 | 53 | 54 | 55 |
|---|---|---|---|---|---|---|---|---|---|---|---|---|
| 00 | 44 | 33 | 55 | 11 | 00 | 22 | 55 | 44 | 33 | 22 | 11 | 00 |
| 01 | 33 | 55 | 44 | 02 | 21 | 10 | 44 | 33 | 55 | 10 | 02 | 21 |
| 02 | 55 | 44 | 33 | 20 | 12 | 01 | 33 | 55 | 44 | 01 | 20 | 12 |
| 03 | 11 | 20 | 02 | 44 | 53 | 35 | 22 | 01 | 10 | 55 | 34 | 43 |
| 04 | 00 | 12 | 21 | 35 | 44 | 53 | 11 | 20 | 02 | 43 | 55 | 34 |
| 05 | 22 | 01 | 10 | 53 | 35 | 44 | 00 | 12 | 21 | 34 | 43 | 55 |
| 10 | 53 | 45 | 34 | 20 | 12 | 01 | 34 | 53 | 45 | 01 | 20 | 12 |
| 11 | 45 | 34 | 53 | 11 | 00 | 22 | 53 | 45 | 34 | 22 | 11 | 00 |
| 12 | 34 | 53 | 45 | 02 | 21 | 10 | 45 | 34 | 53 | 10 | 02 | 21 |
| 13 | 20 | 02 | 11 | 53 | 35 | 44 | 01 | 10 | 22 | 34 | 43 | 55 |
| 14 | 12 | 21 | 00 | 44 | 53 | 35 | 20 | 02 | 11 | 55 | 34 | 43 |
| 15 | 01 | 10 | 22 | 35 | 44 | 53 | 12 | 21 | 00 | 43 | 55 | 34 |
| 20 | 35 | 54 | 43 | 02 | 21 | 10 | 43 | 35 | 54 | 10 | 02 | 21 |
| 21 | 54 | 43 | 35 | 20 | 12 | 01 | 35 | 54 | 43 | 01 | 20 | 12 |
| 22 | 43 | 35 | 54 | 11 | 00 | 22 | 54 | 43 | 35 | 22 | 11 | 00 |
| 23 | 02 | 11 | 20 | 35 | 44 | 53 | 10 | 22 | 01 | 43 | 55 | 34 |
| 24 | 21 | 00 | 12 | 53 | 35 | 44 | 02 | 11 | 20 | 34 | 43 | 55 |
| 25 | 10 | 22 | 01 | 44 | 53 | 35 | 21 | 00 | 12 | 55 | 34 | 43 |

FIG. 8C

| | 00 | 01 | 02 | 03 | 04 | 05 | 10 | 11 | 12 | 13 | 14 | 15 |
|---|---|---|---|---|---|---|---|---|---|---|---|---|
| **30** | 33 | 55 | 44 | 00 | 22 | 11 | 54 | 43 | 35 | 21 | 10 | 02 |
| **31** | 55 | 44 | 33 | 21 | 10 | 02 | 43 | 35 | 54 | 12 | 01 | 20 |
| **32** | 44 | 33 | 55 | 12 | 01 | 20 | 35 | 54 | 43 | 00 | 22 | 11 |
| **33** | 00 | 12 | 21 | 33 | 45 | 54 | 21 | 00 | 12 | 54 | 33 | 45 |
| **34** | 22 | 01 | 10 | 54 | 33 | 45 | 10 | 22 | 01 | 45 | 54 | 33 |
| **35** | 11 | 20 | 02 | 45 | 54 | 33 | 02 | 11 | 20 | 33 | 45 | 54 |
| **40** | 44 | 33 | 55 | 11 | 00 | 22 | 35 | 54 | 43 | 02 | 21 | 10 |
| **41** | 33 | 55 | 44 | 02 | 21 | 10 | 54 | 43 | 35 | 20 | 12 | 01 |
| **42** | 55 | 44 | 33 | 20 | 12 | 01 | 43 | 35 | 54 | 11 | 00 | 22 |
| **43** | 11 | 20 | 02 | 44 | 53 | 35 | 02 | 11 | 20 | 35 | 44 | 53 |
| **44** | 00 | 12 | 21 | 35 | 44 | 53 | 21 | 00 | 12 | 53 | 35 | 44 |
| **45** | 22 | 01 | 10 | 53 | 35 | 44 | 10 | 22 | 01 | 44 | 53 | 35 |
| **50** | 55 | 44 | 33 | 22 | 11 | 00 | 43 | 35 | 54 | 10 | 02 | 21 |
| **51** | 44 | 33 | 55 | 10 | 02 | 21 | 35 | 54 | 43 | 01 | 20 | 12 |
| **52** | 33 | 55 | 44 | 01 | 20 | 12 | 54 | 43 | 35 | 22 | 11 | 00 |
| **53** | 22 | 01 | 10 | 55 | 34 | 43 | 10 | 22 | 01 | 43 | 55 | 34 |
| **54** | 11 | 20 | 02 | 43 | 55 | 34 | 02 | 11 | 20 | 34 | 43 | 55 |
| **55** | 00 | 12 | 21 | 34 | 43 | 55 | 21 | 00 | 12 | 55 | 34 | 43 |

FIG. 8D

| | 20 | 21 | 22 | 23 | 24 | 25 | 30 | 31 | 32 | 33 | 34 | 35 |
|---|---|---|---|---|---|---|---|---|---|---|---|---|
| 30 | 45 | 34 | 53 | 12 | 01 | 20 | 00 | 11 | 22 | 33 | 44 | 55 |
| 31 | 34 | 53 | 45 | 00 | 22 | 11 | 11 | 22 | 00 | 45 | 53 | 34 |
| 32 | 53 | 45 | 34 | 21 | 10 | 02 | 22 | 00 | 11 | 54 | 35 | 43 |
| 33 | 12 | 21 | 00 | 45 | 54 | 33 | 33 | 54 | 45 | 00 | 21 | 12 |
| 34 | 01 | 10 | 22 | 33 | 45 | 54 | 44 | 35 | 53 | 12 | 00 | 21 |
| 35 | 20 | 02 | 11 | 54 | 33 | 45 | 55 | 43 | 34 | 21 | 12 | 00 |
| 40 | 53 | 45 | 34 | 20 | 12 | 01 | 12 | 20 | 01 | 45 | 53 | 34 |
| 41 | 45 | 34 | 53 | 11 | 00 | 22 | 20 | 01 | 12 | 54 | 35 | 43 |
| 42 | 34 | 53 | 45 | 02 | 21 | 10 | 01 | 12 | 20 | 33 | 44 | 55 |
| 43 | 20 | 02 | 11 | 53 | 35 | 44 | 45 | 33 | 54 | 12 | 00 | 21 |
| 44 | 12 | 21 | 00 | 44 | 53 | 35 | 53 | 44 | 35 | 21 | 12 | 00 |
| 45 | 01 | 10 | 22 | 35 | 44 | 53 | 34 | 55 | 43 | 00 | 21 | 12 |
| 50 | 34 | 53 | 45 | 01 | 20 | 12 | 21 | 02 | 10 | 54 | 35 | 43 |
| 51 | 53 | 45 | 34 | 22 | 11 | 00 | 02 | 10 | 21 | 33 | 44 | 55 |
| 52 | 45 | 34 | 53 | 10 | 02 | 21 | 10 | 21 | 02 | 45 | 53 | 34 |
| 53 | 01 | 10 | 22 | 34 | 43 | 55 | 54 | 45 | 33 | 21 | 12 | 00 |
| 54 | 20 | 02 | 11 | 55 | 34 | 43 | 35 | 53 | 44 | 00 | 21 | 12 |
| 55 | 12 | 21 | 00 | 43 | 55 | 34 | 43 | 34 | 55 | 12 | 00 | 21 |

FIG. 8E

| | 40 | 41 | 42 | 43 | 44 | 45 | 50 | 51 | 52 | 53 | 54 | 55 |
|---|---|---|---|---|---|---|---|---|---|---|---|---|
| 30 | 21 | 02 | 10 | 54 | 35 | 43 | 12 | 20 | 01 | 45 | 53 | 34 |
| 31 | 02 | 10 | 21 | 33 | 44 | 55 | 20 | 01 | 12 | 54 | 35 | 43 |
| 32 | 10 | 21 | 02 | 45 | 53 | 34 | 01 | 12 | 20 | 33 | 44 | 55 |
| 33 | 54 | 45 | 33 | 21 | 12 | 00 | 45 | 33 | 54 | 12 | 00 | 21 |
| 34 | 35 | 53 | 44 | 00 | 21 | 12 | 53 | 44 | 35 | 21 | 12 | 00 |
| 35 | 43 | 34 | 55 | 12 | 00 | 21 | 34 | 55 | 43 | 00 | 21 | 12 |
| 40 | 00 | 11 | 22 | 33 | 44 | 55 | 21 | 02 | 10 | 54 | 35 | 43 |
| 41 | 11 | 22 | 00 | 45 | 53 | 34 | 02 | 10 | 21 | 33 | 44 | 55 |
| 42 | 22 | 00 | 11 | 54 | 35 | 43 | 10 | 21 | 02 | 45 | 53 | 34 |
| 43 | 33 | 54 | 45 | 00 | 21 | 12 | 54 | 45 | 33 | 21 | 12 | 00 |
| 44 | 44 | 35 | 53 | 12 | 00 | 21 | 35 | 53 | 44 | 00 | 21 | 12 |
| 45 | 55 | 43 | 34 | 21 | 12 | 00 | 43 | 34 | 55 | 12 | 00 | 21 |
| 50 | 12 | 20 | 01 | 45 | 53 | 34 | 00 | 11 | 22 | 33 | 44 | 55 |
| 51 | 20 | 01 | 12 | 54 | 35 | 43 | 11 | 22 | 00 | 45 | 53 | 34 |
| 52 | 01 | 12 | 20 | 33 | 44 | 55 | 22 | 00 | 11 | 54 | 35 | 43 |
| 53 | 45 | 33 | 54 | 12 | 00 | 21 | 33 | 54 | 45 | 00 | 21 | 12 |
| 54 | 53 | 44 | 35 | 21 | 12 | 00 | 44 | 35 | 53 | 12 | 00 | 21 |
| 55 | 34 | 55 | 43 | 00 | 21 | 12 | 55 | 43 | 34 | 21 | 12 | 00 |

FIG. 8F

| #F5 | #G5 |
|---|---|
| 10 | 10 |
| 55 | 10 |
| 34 | 55 |
| 35 | 34 |
| 35 | 35 |
| 43 | 43 |

output function

| #F6 | #G6 |
|---|---|
| 10 | 10 |
| 10 | 55 |
| 55 | 34 |
| 34 | 35 |
| 35 | 35 |
| 43 | 43 |

output function

| #F7 | #G7 |
|---|---|
| 10 | 10 |
| 10 | 55 |
| 55 | 34 |
| 34 | 35 |
| 34 | 43 |
| 35 | 33 |

output function

| #F13 | #G13 |
|---|---|
| 45 | 45 |
| 44 | 45 |
| 35 | 53 |
| 43 | 45 |
| 43 | 55 |
| 33 | 34 |

| #F14 | #G14 |
|---|---|
| 45 | 45 |
| 45 | 44 |
| 53 | 35 |
| 45 | 43 |
| 55 | 43 |
| 34 | 33 |

output function

| #F15 | #G15 |
|---|---|
| 45 | 45 |
| 45 | 44 |
| 53 | 35 |
| 45 | 43 |
| 45 | 33 |
| 55 | 54 |

| #F17 | #G17 |
|---|---|
| 33 | 33 |
| 54 | 33 |
| 43 | 33 |
| 33 | 54 |
| 33 | 53 |
| 54 | 45 |

output function

| #F19 | #G19 |
|---|---|
| 33 | 33 |
| 33 | 54 |
| 33 | 43 |
| 54 | 33 |
| 54 | 54 |
| 53 | 53 |

output function

| #F22 | #G22 |
|---|---|
| 54 | 54 |
| 54 | 34 |
| 43 | 54 |
| 33 | 53 |
| 54 | 53 |
| 53 | 45 |

output function

| #F23 | #G23 |
|---|---|
| 54 | 54 |
| 54 | 34 |
| 43 | 54 |
| 33 | 53 |
| 33 | 45 |
| 54 | 55 |

output function

| #F26 | #G27 |
|---|---|
| 00 | 00 |
| 00 | 44 |
| 44 | 35 |
| 44 | 43 |
| 44 | 33 |
| 44 | 54 |

output function

| #F29 | #G29 |
|---|---|
| 21 | 21 |
| 45 | 21 |
| 53 | 45 |
| 45 | 55 |
| 45 | 34 |
| 55 | 35 |

output function

| #F30 | #G30 |
|---|---|
| 21 | 21 |
| 21 | 45 |
| 45 | 53 |
| 55 | 45 |
| 34 | 45 |
| 35 | 55 |

output function

| #F31 | #G31 |
|---|---|
| 21 | 21 |
| 21 | 45 |
| 45 | 53 |
| 55 | 45 |
| 55 | 55 |
| 34 | 34 |

output function

| #F34 | #G34 |
|---|---|
| 12 | 12 |
| 12 | 43 |
| 43 | 44 |
| 33 | 44 |
| 54 | 44 |
| 53 | 44 |

| #F35 | #G34 |
|---|---|
| 12 | 12 |
| 12 | 43 |
| 43 | 44 |
| 33 | 44 |
| 33 | 44 |
| 54 | 44 |

output function

| #F36 | #G36 |
|---|---|
| 53 | 53 |
| 43 | 53 |
| 44 | 55 |
| 44 | 34 |
| 44 | 34 |
| 44 | 35 |

output function

| #F36 | #G37 |
|---|---|
| 53 | 53 |
| 43 | 53 |
| 44 | 55 |
| 44 | 34 |
| 44 | 35 |
| 44 | 43 |

| #F40 | #G40 |
|---|---|
| 44 | 44 |
| 53 | 44 |
| 55 | 35 |
| 34 | 43 |
| 35 | 43 |
| 43 | 33 |

| #F42 | #G42 |
|---|---|
| 44 | 44 |
| 44 | 53 |
| 35 | 55 |
| 43 | 34 |
| 33 | 34 |
| 54 | 35 |

output function

| #F44 | #G44 |
| --- | --- |
| 35 | 35 |
| 33 | 35 |
| 33 | 45 |
| 54 | 55 |
| 53 | 55 |
| 45 | 34 |

output function

| #F46 | #G46 |
|---|---|
| 35 | 35 |
| 35 | 33 |
| 45 | 33 |
| 55 | 54 |
| 34 | 54 |
| 35 | 53 |

output function

| #F47 | #G47 |
| --- | --- |
| 35 | 35 |
| 35 | 33 |
| 45 | 33 |
| 55 | 54 |
| 55 | 53 |
| 34 | 45 |

output function

| #F48 | #G48 |
|---|---|
| 11 | 11 |
| 34 | 11 |
| 54 | 34 |
| 53 | 35 |
| 45 | 35 |
| 55 | 43 |

Transition graph for present states, AD,DA and inputs for abstraction table
Present State and AD,DA
state,pair 50,10 output function

| #F50 | #G50 |
| --- | --- |
| 11 | 11 |
| 11 | 34 |
| 34 | 54 |
| 35 | 53 |
| 43 | 53 |
| 33 | 45 |

| #F52 | #G52 |
|---|---|
| 02 | 02 |
| 35 | 02 |
| 45 | 35 |
| 55 | 43 |
| 34 | 43 |
| 35 | 33 |

Transition graph for present states, AD,DA and inputs for abstraction table output function

| #F53 | #G53 |
| --- | --- |
| 02 | 02 |
| 35 | 02 |
| 45 | 35 |
| 55 | 43 |
| 55 | 33 |
| 34 | 54 |

| #F54 | #G54 |
|---|---|
| 02 | 02 |
| 02 | 35 |
| 35 | 45 |
| 43 | 55 |
| 33 | 55 |
| 54 | 34 |

output function

| #F56 | #G56 |
|---|---|
| 20 | 20 |
| 33 | 20 |
| 33 | 33 |
| 54 | 54 |
| 53 | 54 |
| 45 | 53 |

output function

| #F59 | #G59 |
|---|---|
| 20 | 20 |
| 20 | 33 |
| 33 | 33 |
| 54 | 54 |
| 54 | 53 |
| 53 | 45 |

output function

| #F62 | #G62 |
|---|---|
| 34 | 34 |
| 34 | 45 |
| 54 | 53 |
| 53 | 45 |
| 45 | 45 |
| 55 | 55 |

output function

| #F63 | #G63 |
|---|---|
| 34 | 34 |
| 34 | 45 |
| 54 | 53 |
| 53 | 45 |
| 53 | 55 |
| 45 | 34 |

| #F65 | #G65 |
|---|---|
| 55 | 55 |
| 55 | 55 |
| 34 | 34 |
| 35 | 35 |
| 35 | 43 |
| 43 | 33 |

output function

| #F66 | #G66 |
| --- | --- |
| 55 | 55 |
| 55 | 55 |
| 34 | 34 |
| 35 | 35 |
| 43 | 35 |
| 33 | 43 |

Transition graph for present states, AD,DA and inputs for abstraction table
Present State and AD,DA
state,pair 55,10 output function

| #F70 | #G70 |
|---|---|
| 43 | 43 |
| 43 | 35 |
| 44 | 45 |
| 44 | 55 |
| 44 | 55 |
| 44 | 34 |

output function

| #F70 | #G71 |
|---|---|
| 43 | 43 |
| 43 | 35 |
| 44 | 45 |
| 44 | 55 |
| 44 | 34 |
| 44 | 35 |

| FF' | | | | | | | | | | GG' | | | | | | | | | |
|---|---|---|---|---|---|---|---|---|---|---|---|---|---|---|---|---|---|---|---|
| present | | | | present+1 | | | | | | present | | | | present+1 | | | | | |
| | | | | AD | | | DA | | | | | | | AD | | | DA | | |
| state | AD | DA | #F | 0 | 1 | 2 | 3 | 4 | 5 | state | AD | DA | #G | 0 | 1 | 2 | 3 | 4 | 5 |
| 30 | 0 | 0 | 0 | 22 | 54 | 43 | 33 | 54 | 53 | 30 | 0 | 0 | 0 | 22 | 22 | 54 | 53 | 53 | 45 |
| 30 | 0 | 1 | 1 | 22 | 54 | 43 | 33 | 33 | 54 | 30 | 0 | 1 | 1 | 22 | 22 | 54 | 53 | 45 | 55 |
| 30 | 1 | 0 | 2 | 22 | 22 | 54 | 53 | 45 | 55 | 30 | 1 | 0 | 2 | 22 | 54 | 43 | 33 | 33 | 54 |
| 30 | 1 | 1 | 3 | 22 | 22 | 54 | 53 | 53 | 45 | 30 | 1 | 1 | 3 | 22 | 54 | 43 | 33 | 54 | 53 |
| 31 | 0 | 0 | 4 | 10 | 55 | 34 | 35 | 43 | 33 | 31 | 0 | 0 | 4 | 10 | 10 | 55 | 34 | 34 | 35 |
| 31 | 0 | 1 | 5 | 10 | 55 | 34 | 35 | 35 | 43 | 31 | 0 | 1 | 5 | 10 | 10 | 55 | 34 | 35 | 43 |
| 31 | 1 | 0 | 6 | 10 | 10 | 55 | 34 | 35 | 43 | 31 | 1 | 0 | 6 | 10 | 55 | 34 | 35 | 35 | 43 |
| 31 | 1 | 1 | 7 | 10 | 10 | 55 | 34 | 34 | 35 | 31 | 1 | 1 | 7 | 10 | 55 | 34 | 35 | 43 | 33 |
| 32 | 0 | 0 | 8 | 01 | 53 | 55 | 34 | 35 | 43 | 32 | 0 | 0 | 8 | 01 | 01 | 53 | 45 | 45 | 55 |
| 32 | 0 | 1 | 9 | 01 | 53 | 55 | 34 | 34 | 35 | 32 | 0 | 1 | 9 | 01 | 01 | 53 | 45 | 55 | 34 |
| 32 | 1 | 0 | 10 | 01 | 01 | 53 | 45 | 55 | 34 | 32 | 1 | 0 | 10 | 01 | 53 | 55 | 34 | 34 | 35 |
| 32 | 1 | 1 | 11 | 01 | 01 | 53 | 45 | 45 | 55 | 32 | 1 | 1 | 11 | 01 | 53 | 55 | 34 | 35 | 43 |
| 33 | 0 | 0 | 12 | 45 | 44 | 35 | 43 | 33 | 54 | 33 | 0 | 0 | 12 | 45 | 45 | 53 | 45 | 45 | 55 |
| 33 | 0 | 1 | 13 | 45 | 44 | 35 | 43 | 43 | 33 | 33 | 0 | 1 | 13 | 45 | 45 | 53 | 45 | 55 | 34 |
| 33 | 1 | 0 | 14 | 45 | 45 | 53 | 45 | 55 | 34 | 33 | 1 | 0 | 14 | 45 | 44 | 35 | 43 | 43 | 33 |
| 33 | 1 | 1 | 15 | 45 | 45 | 53 | 45 | 45 | 55 | 33 | 1 | 1 | 15 | 45 | 44 | 35 | 43 | 33 | 54 |
| 34 | 0 | 0 | 16 | 33 | 54 | 43 | 33 | 54 | 53 | 34 | 0 | 0 | 16 | 33 | 33 | 33 | 54 | 54 | 53 |
| 34 | 0 | 1 | 17 | 33 | 54 | 43 | 33 | 33 | 54 | 34 | 0 | 1 | 17 | 33 | 33 | 33 | 54 | 53 | 45 |
| 34 | 1 | 0 | 18 | 33 | 33 | 33 | 54 | 53 | 45 | 34 | 1 | 0 | 18 | 33 | 54 | 43 | 33 | 33 | 54 |
| 34 | 1 | 1 | 19 | 33 | 33 | 33 | 54 | 54 | 53 | 34 | 1 | 1 | 19 | 33 | 54 | 43 | 33 | 54 | 53 |

FIG. 10A

©2012 Erich Schmitt (17 U.S.C. 401

| FF' | | | | | | | | | | GG' | | | | | | | | | |
|---|---|---|---|---|---|---|---|---|---|---|---|---|---|---|---|---|---|---|---|
| p | | | | p+1 | | | | | | p | | | | p+1 | | | | | |
| | | | | AD | | | DA | | | | | | | AD | | | DA | | |
| state | AD | DA | #F | 0 | 1 | 2 | 3 | 4 | 5 | state | AD | DA | #G | 0 | 1 | 2 | 3 | 4 | 5 |
| 35 | 0 | 0 | 20 | 54 | 34 | 54 | 53 | 45 | 55 | 35 | 0 | 0 | 20 | 54 | 54 | 43 | 33 | 33 | 54 |
| 35 | 0 | 1 | 21 | 54 | 34 | 54 | 53 | 53 | 45 | 35 | 0 | 1 | 21 | 54 | 54 | 43 | 33 | 54 | 53 |
| 35 | 1 | 0 | 22 | 54 | 54 | 43 | 33 | 54 | 53 | 35 | 1 | 0 | 22 | 54 | 34 | 54 | 53 | 53 | 45 |
| 35 | 1 | 1 | 23 | 54 | 54 | 43 | 33 | 33 | 54 | 35 | 1 | 1 | 23 | 54 | 34 | 54 | 53 | 45 | 55 |
| 40 | 0 | 0 | 24 | 00 | 44 | 35 | 43 | 33 | 54 | 40 | 0 | 0 | 24 | 00 | 00 | 44 | 44 | 44 | 44 |
| 40 | 0 | 1 | 25 | 00 | 44 | 35 | 43 | 43 | 33 | 40 | 0 | 1 | 24 | 00 | 00 | 44 | 44 | 44 | 44 |
| 40 | 1 | 0 | 26 | 00 | 00 | 44 | 44 | 44 | 44 | 40 | 1 | 0 | 26 | 00 | 44 | 35 | 43 | 43 | 33 |
| 40 | 1 | 1 | 26 | 00 | 00 | 44 | 44 | 44 | 44 | 40 | 1 | 1 | 27 | 00 | 44 | 35 | 43 | 33 | 54 |
| 41 | 0 | 0 | 28 | 21 | 45 | 53 | 45 | 55 | 34 | 41 | 0 | 0 | 28 | 21 | 21 | 45 | 55 | 55 | 34 |
| 41 | 0 | 1 | 29 | 21 | 45 | 53 | 45 | 45 | 55 | 41 | 0 | 1 | 29 | 21 | 21 | 45 | 55 | 34 | 35 |
| 41 | 1 | 0 | 30 | 21 | 21 | 45 | 55 | 34 | 35 | 41 | 1 | 0 | 30 | 21 | 45 | 53 | 45 | 45 | 55 |
| 41 | 1 | 1 | 31 | 21 | 21 | 45 | 55 | 55 | 34 | 41 | 1 | 1 | 31 | 21 | 45 | 53 | 45 | 55 | 34 |
| 42 | 0 | 0 | 32 | 12 | 43 | 44 | 44 | 44 | 44 | 42 | 0 | 0 | 32 | 12 | 12 | 43 | 33 | 33 | 54 |
| 42 | 0 | 1 | 32 | 12 | 43 | 44 | 44 | 44 | 44 | 42 | 0 | 1 | 33 | 12 | 12 | 43 | 33 | 54 | 53 |
| 42 | 1 | 0 | 34 | 12 | 12 | 43 | 33 | 54 | 53 | 42 | 1 | 0 | 34 | 12 | 43 | 44 | 44 | 44 | 44 |
| 42 | 1 | 1 | 35 | 12 | 12 | 43 | 33 | 33 | 54 | 42 | 1 | 1 | 34 | 12 | 43 | 44 | 44 | 44 | 44 |
| 43 | 0 | 0 | 36 | 53 | 43 | 44 | 44 | 44 | 44 | 43 | 0 | 0 | 36 | 53 | 53 | 55 | 34 | 34 | 35 |
| 43 | 0 | 1 | 36 | 53 | 43 | 44 | 44 | 44 | 44 | 43 | 0 | 1 | 37 | 53 | 53 | 55 | 34 | 35 | 43 |
| 43 | 1 | 0 | 38 | 53 | 53 | 55 | 34 | 35 | 43 | 43 | 1 | 0 | 38 | 53 | 43 | 44 | 44 | 44 | 44 |
| 43 | 1 | 1 | 39 | 53 | 53 | 55 | 34 | 34 | 35 | 43 | 1 | 1 | 38 | 53 | 43 | 44 | 44 | 44 | 44 |

FIG. 10B

©2012 Erich Schmitt (17 U.S.C. 401)

| FF' | | | | | | | | | | GG' | | | | | | | | | |
|---|---|---|---|---|---|---|---|---|---|---|---|---|---|---|---|---|---|---|---|
| p | | | p+1 | | | | | | | p | | | p+1 | | | | | | |
| | | | | AD | | | DA | | | | | | | AD | | | DA | | |
| state | AD | DA | #F | 0 | 1 | 2 | 3 | 4 | 5 | state | AD | DA | #G | 0 | 1 | 2 | 3 | 4 | 5 |
| 44 | 0 | 0 | 40 | 44 | 53 | 55 | 34 | 35 | 43 | 44 | 0 | 0 | 40 | 44 | 44 | 35 | 43 | 43 | 33 |
| 44 | 0 | 1 | 41 | 44 | 53 | 55 | 34 | 34 | 35 | 44 | 0 | 1 | 41 | 44 | 44 | 35 | 43 | 33 | 54 |
| 44 | 1 | 0 | 42 | 44 | 44 | 35 | 43 | 33 | 54 | 44 | 1 | 0 | 42 | 44 | 53 | 55 | 34 | 34 | 35 |
| 44 | 1 | 1 | 43 | 44 | 44 | 35 | 43 | 43 | 33 | 44 | 1 | 1 | 43 | 44 | 53 | 55 | 34 | 35 | 43 |
| 45 | 0 | 0 | 44 | 35 | 33 | 33 | 54 | 53 | 45 | 45 | 0 | 0 | 44 | 35 | 35 | 45 | 55 | 55 | 34 |
| 45 | 0 | 1 | 45 | 35 | 33 | 33 | 54 | 54 | 53 | 45 | 0 | 1 | 45 | 35 | 35 | 45 | 55 | 34 | 35 |
| 45 | 1 | 0 | 46 | 35 | 35 | 45 | 55 | 34 | 35 | 45 | 1 | 0 | 46 | 35 | 33 | 33 | 54 | 54 | 53 |
| 45 | 1 | 1 | 47 | 35 | 35 | 45 | 55 | 55 | 34 | 45 | 1 | 1 | 47 | 35 | 33 | 33 | 54 | 53 | 45 |
| 50 | 0 | 0 | 48 | 11 | 34 | 54 | 53 | 45 | 55 | 50 | 0 | 0 | 48 | 11 | 11 | 34 | 35 | 35 | 43 |
| 50 | 0 | 1 | 49 | 11 | 34 | 54 | 53 | 53 | 45 | 50 | 0 | 1 | 49 | 11 | 11 | 34 | 35 | 43 | 33 |
| 50 | 1 | 0 | 50 | 11 | 11 | 34 | 35 | 43 | 33 | 50 | 1 | 0 | 50 | 11 | 34 | 54 | 53 | 53 | 45 |
| 50 | 1 | 1 | 51 | 11 | 11 | 34 | 35 | 35 | 43 | 50 | 1 | 1 | 51 | 11 | 34 | 54 | 53 | 45 | 55 |
| 51 | 0 | 0 | 52 | 02 | 35 | 45 | 55 | 34 | 35 | 51 | 0 | 0 | 52 | 02 | 02 | 35 | 43 | 43 | 33 |
| 51 | 0 | 1 | 53 | 02 | 35 | 45 | 55 | 55 | 34 | 51 | 0 | 1 | 53 | 02 | 02 | 35 | 43 | 33 | 54 |
| 51 | 1 | 0 | 54 | 02 | 02 | 35 | 43 | 33 | 54 | 51 | 1 | 0 | 54 | 02 | 35 | 45 | 55 | 55 | 34 |
| 51 | 1 | 1 | 55 | 02 | 02 | 35 | 43 | 43 | 33 | 51 | 1 | 1 | 55 | 02 | 35 | 45 | 55 | 34 | 35 |
| 52 | 0 | 0 | 56 | 20 | 33 | 33 | 54 | 53 | 45 | 52 | 0 | 0 | 56 | 20 | 20 | 33 | 54 | 54 | 53 |
| 52 | 0 | 1 | 57 | 20 | 33 | 33 | 54 | 54 | 53 | 52 | 0 | 1 | 57 | 20 | 20 | 33 | 54 | 53 | 45 |
| 52 | 1 | 0 | 58 | 20 | 20 | 33 | 54 | 53 | 45 | 52 | 1 | 0 | 58 | 20 | 33 | 33 | 54 | 54 | 53 |
| 52 | 1 | 1 | 59 | 20 | 20 | 33 | 54 | 54 | 53 | 52 | 1 | 1 | 59 | 20 | 33 | 33 | 54 | 53 | 45 |

FIG. 10C

©2012 Erich Schmitt (17 U.S.C. 401

| FF' | | | | | | | | | | GG' | | | | | | | | | |
|---|---|---|---|---|---|---|---|---|---|---|---|---|---|---|---|---|---|---|---|
| p | | | | p+1 | | | | | | p | | | | p+1 | | | | | |
| | | | | AD | | | DA | | | | | | | AD | | | DA | | |
| state | AD | DA | #F | 0 | 1 | 2 | 3 | 4 | 5 | state | AD | DA | #G | 0 | 1 | 2 | 3 | 4 | 5 |
| 53 | 0 | 0 | 60 | 34 | 45 | 53 | 45 | 55 | 34 | 53 | 0 | 0 | 60 | 34 | 34 | 54 | 53 | 53 | 45 |
| 53 | 0 | 1 | 61 | 34 | 45 | 53 | 45 | 45 | 55 | 53 | 0 | 1 | 61 | 34 | 34 | 54 | 53 | 45 | 55 |
| 53 | 1 | 0 | 62 | 34 | 34 | 54 | 53 | 45 | 55 | 53 | 1 | 0 | 62 | 34 | 45 | 53 | 45 | 45 | 55 |
| 53 | 1 | 1 | 63 | 34 | 34 | 54 | 53 | 53 | 45 | 53 | 1 | 1 | 63 | 34 | 45 | 53 | 45 | 55 | 34 |
| 54 | 0 | 0 | 64 | 55 | 55 | 34 | 35 | 43 | 33 | 54 | 0 | 0 | 64 | 55 | 55 | 34 | 35 | 35 | 43 |
| 54 | 0 | 1 | 65 | 55 | 55 | 34 | 35 | 35 | 43 | 54 | 0 | 1 | 65 | 55 | 55 | 34 | 35 | 43 | 33 |
| 54 | 1 | 0 | 66 | 55 | 55 | 34 | 35 | 43 | 33 | 54 | 1 | 0 | 66 | 55 | 55 | 34 | 35 | 35 | 43 |
| 54 | 1 | 1 | 67 | 55 | 55 | 34 | 35 | 35 | 43 | 54 | 1 | 1 | 67 | 55 | 55 | 34 | 35 | 43 | 33 |
| 55 | 0 | 0 | 68 | 43 | 35 | 45 | 55 | 34 | 35 | 55 | 0 | 0 | 68 | 43 | 43 | 44 | 44 | 44 | 44 |
| 55 | 0 | 1 | 69 | 43 | 35 | 45 | 55 | 55 | 34 | 55 | 0 | 1 | 68 | 43 | 43 | 44 | 44 | 44 | 44 |
| 55 | 1 | 0 | 70 | 43 | 43 | 44 | 44 | 44 | 44 | 55 | 1 | 0 | 70 | 43 | 35 | 45 | 55 | 55 | 34 |
| 55 | 1 | 1 | 70 | 43 | 43 | 44 | 44 | 44 | 44 | 55 | 1 | 1 | 71 | 43 | 35 | 45 | 55 | 34 | 35 |

FIG. 10D

©2012 Erich Schmitt (17 U.S.C. 401

| |
|---|
| FIG. 10A |
| FIG. 10B |
| FIG. 10C |
| FIG. 10D |

FIG. 10

| #F | => decimal equivalent | #F end binary code | #F | #F | binary code |
|---|---|---|---|---|---|
| 0 | 0 | 0 0 0 0 0 0 | 38 | 32 | 1 0 0 0 0 0 |
| 1 | 1 | 0 0 0 0 0 1 | 39 | 33 | 1 0 0 0 0 1 |
| 2 | 2 | 0 0 0 0 1 0 | 40 | 34 | 1 0 0 0 1 0 |
| 3 | 3 | 0 0 0 0 1 1 | 41 | 35 | 1 0 0 0 1 1 |
| 4 | 4 | 0 0 0 1 0 0 | 42 | 36 | 1 0 0 1 0 0 |
| 5 | 5 | 0 0 0 1 0 1 | 43 | 37 | 1 0 0 1 0 1 |
| 6 | 6 | 0 0 0 1 1 0 | 44 | 38 | 1 0 0 1 1 0 |
| 7 | 7 | 0 0 0 1 1 1 | 45 | 39 | 1 0 0 1 1 1 |
| 8 | 8 | 0 0 1 0 0 0 | 46 | 40 | 1 0 1 0 0 0 |
| 9 | 9 | 0 0 1 0 0 1 | 47 | 41 | 1 0 1 0 0 1 |
| 10 | 10 | 0 0 1 0 1 0 | 48 | 42 | 1 0 1 0 1 0 |
| 11 | 11 | 0 0 1 0 1 1 | 49 | 43 | 1 0 1 0 1 1 |
| 12 | 12 | 0 0 1 1 0 0 | 50 | 44 | 1 0 1 1 0 0 |
| 13 | 13 | 0 0 1 1 0 1 | 51 | 45 | 1 0 1 1 0 1 |
| 14 | 14 | 0 0 1 1 1 0 | 52 | 46 | 1 0 1 1 1 0 |
| 15 | 15 | 0 0 1 1 1 1 | 53 | 47 | 1 0 1 1 1 1 |
| 16 | 16 | 0 1 0 0 0 0 | 54 | 48 | 1 1 0 0 0 0 |
| 17 | 17 | 0 1 0 0 0 1 | 55 | 49 | 1 1 0 0 0 1 |
| 18 | 18 | 0 1 0 0 1 0 | 56 | 50 | 1 1 0 0 1 0 |
| 19 | 19 | 0 1 0 0 1 1 | 57 | 51 | 1 1 0 0 1 1 |
| 20 | 20 | 0 1 0 1 0 0 | 58 | 52 | 1 1 0 1 0 0 |
| 21 | 21 | 0 1 0 1 0 1 | 59 | 53 | 1 1 0 1 0 1 |
| 22 | 22 | 0 1 0 1 1 0 | 60 | 54 | 1 1 0 1 1 0 |
| 23 | 23 | 0 1 0 1 1 1 | 61 | 55 | 1 1 0 1 1 1 |
| 24 | 24 | 0 1 1 0 0 0 | 62 | 56 | 1 1 1 0 0 0 |
| 25 | 25 | 0 1 1 0 0 1 | 63 | 57 | 1 1 1 0 0 1 |
| | | | 64 | 58 | 1 1 1 0 1 0 |
| 28 | 26 | 0 1 1 0 1 0 | 65 | 59 | 1 1 1 0 1 1 |
| 29 | 27 | 0 1 1 0 1 1 | 66 | 60 | 1 1 1 1 0 0 |
| 30 | 28 | 0 1 1 1 0 0 | 67 | 61 | 1 1 1 1 0 1 |
| 31 | 29 | 0 1 1 1 0 1 | 68 | 62 | 1 1 1 1 1 0 |
| | | | 69 | 63 | 1 1 1 1 1 1 |
| 34 | 30 | 0 1 1 1 1 0 | .. | | |
| 35 | 31 | 0 1 1 1 1 1 | | | |

FIG. 11A

| #G | => decimal equivalent | #G end binary code | #G | #G | binary code |
|---|---|---|---|---|---|
| 0 → | 0 | 0 0 0 0 0 0 | 36 → | 32 | 1 0 0 0 0 0 |
| 1 | 1 | 0 0 0 0 0 1 | 37 | 33 | 1 0 0 0 0 1 |
| 2 | 2 | 0 0 0 0 1 0 | . | | |
| 3 | 3 | 0 0 0 0 1 1 | 40 | 34 | 1 0 0 0 1 0 |
| 4 | 4 | 0 0 0 1 0 0 | 41 | 35 | 1 0 0 0 1 1 |
| 5 | 5 | 0 0 0 1 0 1 | 42 | 36 | 1 0 0 1 0 0 |
| 6 | 6 | 0 0 0 1 1 0 | 43 | 37 | 1 0 0 1 0 1 |
| 7 | 7 | 0 0 0 1 1 1 | 44 | 38 | 1 0 0 1 1 0 |
| 8 | 8 | 0 0 1 0 0 0 | 45 | 39 | 1 0 0 1 1 1 |
| 9 | 9 | 0 0 1 0 0 1 | 46 | 40 | 1 0 1 0 0 0 |
| 10 | 10 | 0 0 1 0 1 0 | 47 | 41 | 1 0 1 0 0 1 |
| 11 | 11 | 0 0 1 0 1 1 | 48 | 42 | 1 0 1 0 1 0 |
| 12 | 12 | 0 0 1 1 0 0 | 49 | 43 | 1 0 1 0 1 1 |
| 13 | 13 | 0 0 1 1 0 1 | 50 | 44 | 1 0 1 1 0 0 |
| 14 | 14 | 0 0 1 1 1 0 | 51 | 45 | 1 0 1 1 0 1 |
| 15 | 15 | 0 0 1 1 1 1 | 52 | 46 | 1 0 1 1 1 0 |
| 16 | 16 | 0 1 0 0 0 0 | 53 | 47 | 1 0 1 1 1 1 |
| 17 | 17 | 0 1 0 0 0 1 | 54 | 48 | 1 1 0 0 0 0 |
| 18 | 18 | 0 1 0 0 1 0 | 55 | 49 | 1 1 0 0 0 1 |
| 19 | 19 | 0 1 0 0 1 1 | 56 | 50 | 1 1 0 0 1 0 |
| 20 | 20 | 0 1 0 1 0 0 | 57 | 51 | 1 1 0 0 1 1 |
| 21 | 21 | 0 1 0 1 0 1 | 58 | 52 | 1 1 0 1 0 0 |
| 22 | 22 | 0 1 0 1 1 0 | 59 | 53 | 1 1 0 1 0 1 |
| 23 | 23 | 0 1 0 1 1 1 | 60 | 54 | 1 1 0 1 1 0 |
| | | | 61 | 55 | 1 1 0 1 1 1 |
| 26 | 24 | 0 1 1 0 0 0 | 62 | 56 | 1 1 1 0 0 0 |
| 27 | 25 | 0 1 1 0 0 1 | 63 | 57 | 1 1 1 0 0 1 |
| 28 | 26 | 0 1 1 0 1 0 | 64 | 58 | 1 1 1 0 1 0 |
| 29 | 27 | 0 1 1 0 1 1 | 65 | 59 | 1 1 1 0 1 1 |
| 30 | 28 | 0 1 1 1 0 0 | 66 | 60 | 1 1 1 1 0 0 |
| 31 | 29 | 0 1 1 1 0 1 | 67 | 61 | 1 1 1 1 0 1 |
| 32 | 30 | 0 1 1 1 1 0 | . | | |
| 33 | 31 | 0 1 1 1 1 1 | 70 | 62 | 1 1 1 1 1 0 |
| . | | | 71 | 63 | 1 1 1 1 1 1 |

FIG. 11B

| #F | => decimal equivalent | #F end binary code |
|---|---|---|
| 12 | → 0 | 0 0 0 0 0 |
| 13 | 1 | 0 0 0 0 1 |
| 14 | 2 | 0 0 0 1 0 |
| 15 | 3 | 0 0 0 1 1 |
| 16 | 4 | 0 0 1 0 0 |
| 17 | 5 | 0 0 1 0 1 |
| 18 | 6 | 0 0 1 1 0 |
| 19 | 7 | 0 0 1 1 1 |
| 20 | 8 | 0 1 0 0 0 |
| 21 | 9 | 0 1 0 0 1 |
| 22 | 10 | 0 1 0 1 0 |
| 23 | 11 | 0 1 0 1 1 |
| 38 | 12 | 0 1 1 0 0 |
| 39 | 13 | 0 1 1 0 1 |
| 40 | 14 | 0 1 1 1 0 |
| 41 | 15 | 0 1 1 1 1 |
| 42 | 16 | 1 0 0 0 0 |
| 43 | 17 | 1 0 0 0 1 |
| 44 | 18 | 1 0 0 1 0 |
| 45 | 19 | 1 0 0 1 1 |
| 46 | 20 | 1 0 1 0 0 |
| 47 | 21 | 1 0 1 0 1 |
| 60 | 22 | 1 0 1 1 0 |
| 61 | 23 | 1 0 1 1 1 |
| 62 | 24 | 1 1 0 0 0 |
| 63 | 25 | 1 1 0 0 1 |
| 64 | 26 | 1 1 0 1 0 |
| 65 | 27 | 1 1 0 1 1 |
| 66 | 28 | 1 1 1 0 0 |
| 67 | 29 | 1 1 1 0 1 |
| 68 | 30 | 1 1 1 1 0 |
| 69 | 31 | 1 1 1 1 1 |

FIG. 11C

| #G | => decimal equivalent | #G end binary code |
|---|---|---|
| 12 | → 0 | 0 0 0 0 0 |
| 13 | 1 | 0 0 0 0 1 |
| 14 | 2 | 0 0 0 1 0 |
| 15 | 3 | 0 0 0 1 1 |
| 16 | 4 | 0 0 1 0 0 |
| 17 | 5 | 0 0 1 0 1 |
| 18 | 6 | 0 0 1 1 0 |
| 19 | 7 | 0 0 1 1 1 |
| 20 | 8 | 0 1 0 0 0 |
| 21 | 9 | 0 1 0 0 1 |
| 22 | 10 | 0 1 0 1 0 |
| 23 | 11 | 0 1 0 1 1 |
| 36 | 12 | 0 1 1 0 0 |
| 37 | 13 | 0 1 1 0 1 |
| 40 | 14 | 0 1 1 1 0 |
| 41 | 15 | 0 1 1 1 1 |
| 42 | 16 | 1 0 0 0 0 |
| 43 | 17 | 1 0 0 0 1 |
| 44 | 18 | 1 0 0 1 0 |
| 45 | 19 | 1 0 0 1 1 |
| 46 | 20 | 1 0 1 0 0 |
| 47 | 21 | 1 0 1 0 1 |
| 60 | 22 | 1 0 1 1 0 |
| 61 | 23 | 1 0 1 1 1 |
| 62 | 24 | 1 1 0 0 0 |
| 63 | 25 | 1 1 0 0 1 |
| 64 | 26 | 1 1 0 1 0 |
| 65 | 27 | 1 1 0 1 1 |
| 66 | 28 | 1 1 1 0 0 |
| 67 | 29 | 1 1 1 0 1 |
| 70 | 30 | 1 1 1 1 0 |
| 71 | 31 | 1 1 1 1 1 |

FIG.11D

| #F | 3 | 4 | DEC equiv | binary code #Fend 3,4 | #F | 3 | 4 | DEC equiv | binary code #Fend 3,4 |
|---|---|---|---|---|---|---|---|---|---|
| 0 | 33 | 54 | 4 | 0100 | 38 | 34 | 35 | 10 | 1010 |
| 1 | 33 | 33 | 5 | 0101 | 39 | 34 | 34 | 11 | 1011 |
| 2 | 53 | 45 | 8 | 1000 | 40 | 34 | 35 | 10 | 1010 |
| 3 | 53 | 53 | 9 | 1001 | 41 | 34 | 34 | 11 | 1011 |
| 4 | 35 | 43 | 14 | 1110 | 42 | 43 | 33 | → 0 | 0000 |
| 5 | 35 | 35 | 15 | 1111 | 43 | 43 | 43 | 1 | 0001 |
| 6 | 34 | 35 | 10 | 1010 | 44 | 54 | 53 | 6 | 0110 |
| 7 | 34 | 34 | 11 | 1011 | 45 | 54 | 54 | 7 | 0111 |
| 8 | 34 | 35 | 10 | 1010 | 46 | 55 | 34 | 12 | 1100 |
| 9 | 34 | 34 | 11 | 1011 | 47 | 55 | 55 | 13 | 1101 |
| 10 | 45 | 55 | 2 | 0010 | 48 | 53 | 45 | 8 | 1000 |
| 11 | 45 | 45 | 3 | 0011 | 49 | 53 | 53 | 9 | 1001 |
| 12 | 43 | 33 | → 0 | 0000 | 50 | 35 | 43 | 14 | 1110 |
| 13 | 43 | 43 | 1 | 0001 | 51 | 35 | 35 | 15 | 1111 |
| 14 | 45 | 55 | 2 | 0010 | 52 | 55 | 34 | 12 | 1100 |
| 15 | 45 | 45 | 3 | 0011 | 53 | 55 | 55 | 13 | 1101 |
| 16 | 33 | 54 | 4 | 0100 | 54 | 43 | 33 | → 0 | 0000 |
| 17 | 33 | 33 | 5 | 0101 | 55 | 43 | 43 | 1 | 0001 |
| 18 | 54 | 53 | 6 | 0110 | 56 | 54 | 53 | 6 | 0110 |
| 19 | 54 | 54 | 7 | 0111 | 57 | 54 | 54 | 7 | 0111 |
| 20 | 53 | 45 | 8 | 1000 | 58 | 54 | 53 | 6 | 0110 |
| 21 | 53 | 53 | 9 | 1001 | 59 | 54 | 54 | 7 | 0111 |
| 22 | 33 | 54 | 4 | 0100 | 60 | 45 | 55 | 2 | 0010 |
| 23 | 33 | 33 | 5 | 0101 | 61 | 45 | 45 | 3 | 0011 |
| 24 | 43 | 33 | → 0 | 0000 | 62 | 53 | 45 | 8 | 1000 |
| 25 | 43 | 43 | 1 | 0001 | 63 | 53 | 53 | 9 | 1001 |
| 28 | 45 | 55 | 2 | 0010 | 64 | 35 | 43 | 14 | 1110 |
| 29 | 45 | 45 | 3 | 0011 | 65 | 35 | 35 | 15 | 1111 |
| 30 | 55 | 34 | 12 | 1100 | 66 | 35 | 43 | 14 | 1110 |
| 31 | 55 | 55 | 13 | 1101 | 67 | 35 | 35 | 15 | 1111 |
| 34 | 33 | 54 | 4 | 0100 | 68 | 55 | 34 | 12 | 1100 |
| 35 | 33 | 33 | 5 | 0101 | 69 | 55 | 55 | 13 | 1101 |

FIG. 11E

| #G | 3 | 4 | DEC equiv | binary code #Gend 3.4 | #G | 3 | 4 | DEC equiv | binary code #G end 3.4 |
|---|---|---|---|---|---|---|---|---|---|
| 0 | 53 | 53 | 8 | 1000 | 36 | 34 | 34 | 10 | 1010 |
| 1 | 53 | 45 | 9 | 1001 | 37 | 34 | 35 | 11 | 1011 |
| 2 | 33 | 33 | 6 | 0110 | 40 | 43 | 43 | 2 | 0010 |
| 3 | 33 | 54 | 7 | 0111 | 41 | 43 | 33 | 3 | 0011 |
| 4 | 34 | 34 | 10 | 1010 | 42 | 34 | 34 | 10 | 1010 |
| 5 | 34 | 35 | 11 | 1011 | 43 | 34 | 35 | 11 | 1011 |
| 6 | 35 | 35 | 14 | 1110 | 44 | 55 | 55 | 12 | 1100 |
| 7 | 35 | 43 | 15 | 1111 | 45 | 55 | 34 | 13 | 1101 |
| 8 | 45 | 45 | → 0 | 0000 | 46 | 54 | 54 | 4 | 0100 |
| 9 | 45 | 55 | 1 | 0001 | 47 | 54 | 53 | 5 | 0101 |
| 10 | 34 | 34 | 10 | 1010 | 48 | 35 | 35 | 14 | 1110 |
| 11 | 34 | 35 | 11 | 1011 | 49 | 35 | 43 | 15 | 1111 |
| 12 | 45 | 45 | → 0 | 0000 | 50 | 53 | 53 | 8 | 1000 |
| 13 | 45 | 55 | 1 | 0001 | 51 | 53 | 45 | 9 | 1001 |
| 14 | 43 | 43 | 2 | 0010 | 52 | 43 | 43 | 2 | 0010 |
| 15 | 43 | 33 | 3 | 0011 | 53 | 43 | 33 | 3 | 0011 |
| 16 | 54 | 54 | 4 | 0100 | 54 | 55 | 55 | 12 | 1100 |
| 17 | 54 | 53 | 5 | 0101 | 55 | 55 | 34 | 13 | 1101 |
| 18 | 33 | 33 | 6 | 0110 | 56 | 54 | 54 | 4 | 0100 |
| 19 | 33 | 54 | 7 | 0111 | 57 | 54 | 53 | 5 | 0101 |
| 20 | 33 | 33 | 6 | 0110 | 58 | 54 | 54 | 4 | 0100 |
| 21 | 33 | 54 | 7 | 0111 | 59 | 54 | 53 | 5 | 0101 |
| 22 | 53 | 53 | 8 | 1000 | 60 | 53 | 53 | 8 | 1000 |
| 23 | 53 | 45 | 9 | 1001 | 61 | 53 | 45 | 9 | 1001 |
| 26 | 43 | 43 | 2 | 0010 | 62 | 45 | 45 | → 0 | 0000 |
| 27 | 43 | 33 | 3 | 0011 | 63 | 45 | 55 | 1 | 0001 |
| 28 | 55 | 55 | 12 | 1100 | 64 | 35 | 35 | 14 | 1110 |
| 29 | 55 | 34 | 13 | 1101 | 65 | 35 | 43 | 15 | 1111 |
| 30 | 45 | 45 | → 0 | 0000 | 66 | 35 | 35 | 14 | 1110 |
| 31 | 45 | 55 | 1 | 0001 | 67 | 35 | 43 | 15 | 1111 |
| 32 | 33 | 33 | 6 | 0110 | 70 | 55 | 55 | 12 | 1100 |
| 33 | 33 | 54 | 7 | 0111 | 71 | 55 | 34 | 13 | 1101 |

FIG. 11F

| #F | 3 | 4 | Dec equiv | binary code |
|---|---|---|---|---|
| 12 | 43 | 33 | 0 | 0000 |
| 13 | 43 | 43 | 1 | 0001 |
| 14 | 45 | 55 | 2 | 0010 |
| 15 | 45 | 45 | 3 | 0011 |
| 16 | 33 | 54 | 4 | 0100 |
| 17 | 33 | 33 | 5 | 0101 |
| 18 | 54 | 53 | 6 | 0110 |
| 19 | 54 | 54 | 7 | 0111 |
| 20 | 53 | 45 | 8 | 1000 |
| 21 | 53 | 53 | 9 | 1001 |
| 22 | 33 | 54 | 4 | 0100 |
| 23 | 33 | 33 | 5 | 0101 |
| 38 | 34 | 35 | 10 | 1010 |
| 39 | 34 | 34 | 11 | 1011 |
| 40 | 34 | 35 | 10 | 1010 |
| 41 | 34 | 34 | 11 | 1011 |
| 42 | 43 | 33 | 0 | 0000 |
| 43 | 43 | 43 | 1 | 0001 |
| 44 | 54 | 53 | 6 | 0110 |
| 45 | 54 | 54 | 7 | 0111 |
| 46 | 55 | 34 | 12 | 1100 |
| 47 | 55 | 55 | 13 | 1101 |
| 60 | 45 | 55 | 2 | 0010 |
| 61 | 45 | 45 | 3 | 0011 |
| 62 | 53 | 45 | 8 | 1000 |
| 63 | 53 | 53 | 9 | 1001 |
| 64 | 35 | 43 | 14 | 1110 |
| 65 | 35 | 35 | 15 | 1111 |
| 66 | 35 | 43 | 14 | 1110 |
| 67 | 35 | 35 | 15 | 1111 |
| 68 | 55 | 34 | 12 | 1100 |
| 69 | 55 | 55 | 13 | 1101 |

FIG.11G

| #G | 3 | 4 | Dec equiv | binary code |
|---|---|---|---|---|
| 12 | 45 | 45 | 0 | 0000 |
| 13 | 45 | 55 | 1 | 0001 |
| 14 | 43 | 43 | 2 | 0010 |
| 15 | 43 | 33 | 3 | 0011 |
| 16 | 54 | 54 | 4 | 0100 |
| 17 | 54 | 53 | 5 | 0101 |
| 18 | 33 | 33 | 6 | 0110 |
| 19 | 33 | 54 | 7 | 0111 |
| 20 | 33 | 33 | 6 | 0110 |
| 21 | 33 | 54 | 7 | 0111 |
| 22 | 53 | 53 | 8 | 1000 |
| 23 | 53 | 45 | 9 | 1001 |
| 36 | 34 | 34 | 10 | 1010 |
| 37 | 34 | 35 | 11 | 1011 |
| 40 | 43 | 43 | 2 | 0010 |
| 41 | 43 | 33 | 3 | 0011 |
| 42 | 34 | 34 | 10 | 1010 |
| 43 | 34 | 35 | 11 | 1011 |
| 44 | 55 | 55 | 12 | 1100 |
| 45 | 55 | 34 | 13 | 1101 |
| 46 | 54 | 54 | 4 | 0100 |
| 47 | 54 | 53 | 5 | 0101 |
| 60 | 53 | 53 | 8 | 1000 |
| 61 | 53 | 45 | 9 | 1001 |
| 62 | 45 | 45 | 0 | 0000 |
| 63 | 45 | 55 | 1 | 0001 |
| 64 | 35 | 35 | 14 | 1110 |
| 65 | 35 | 43 | 15 | 1111 |
| 66 | 35 | 35 | 14 | 1110 |
| 67 | 35 | 43 | 15 | 1111 |
| 70 | 55 | 55 | 12 | 1100 |
| 71 | 55 | 34 | 13 | 1101 |

FIG.11H

| # F | | DEC equiv | binary code |
|---|---|---|---|
| 3 | 4 | | |
| 43 | 33 | 0 | 0000 |
| 43 | 43 | 1 | 0001 |
| 45 | 55 | 2 | 0010 |
| 45 | 45 | 3 | 0011 |
| 33 | 54 | 4 | 0100 |
| 33 | 33 | 5 | 0101 |
| 54 | 53 | 6 | 0110 |
| 54 | 54 | 7 | 0111 |
| 53 | 45 | 8 | 1000 |
| 53 | 53 | 9 | 1001 |
| 34 | 35 | 10 | 1010 |
| 34 | 34 | 11 | 1011 |
| 55 | 34 | 12 | 1100 |
| 55 | 55 | 13 | 1101 |
| 35 | 43 | 14 | 1110 |
| 35 | 35 | 15 | 1111 |

| # G | | DEC equiv | binary code |
|---|---|---|---|
| 3 | 4 | | |
| 45 | 45 | 0 | 0000 |
| 45 | 55 | 1 | 0001 |
| 43 | 43 | 2 | 0010 |
| 43 | 33 | 3 | 0011 |
| 54 | 54 | 4 | 0100 |
| 54 | 53 | 5 | 0101 |
| 33 | 33 | 6 | 0110 |
| 33 | 54 | 7 | 0111 |
| 53 | 53 | 8 | 1000 |
| 53 | 45 | 9 | 1001 |
| 34 | 34 | 10 | 1010 |
| 34 | 35 | 11 | 1011 |
| 55 | 55 | 12 | 1100 |
| 55 | 34 | 13 | 1101 |
| 35 | 35 | 14 | 1110 |
| 35 | 43 | 15 | 1111 |

| p FF' state | AD | DA | p + 1 #F | FF' state |
|---|---|---|---|---|
| 40 | 1 | 0 | 26 | 44 |
| 40 | 1 | 1 | 26 | 44 |
| 42 | 0 | 0 | 32 | 44 |
| 42 | 0 | 1 | 32 | 44 |
| 43 | 0 | 0 | 36 | 44 |
| 43 | 0 | 1 | 36 | 44 |
| 55 | 1 | 0 | 70 | 44 |
| 55 | 1 | 1 | 70 | 44 |

FIG. 12A

| p GG' state | AD | DA | p + 1 #G | GG' state |
|---|---|---|---|---|
| 40 | 0 | 0 | 24 | 44 |
| 40 | 0 | 1 | 24 | 44 |
| 42 | 1 | 0 | 34 | 44 |
| 42 | 1 | 1 | 34 | 44 |
| 43 | 1 | 0 | 38 | 44 |
| 43 | 1 | 1 | 38 | 44 |
| 55 | 0 | 0 | 68 | 44 |
| 55 | 0 | 1 | 68 | 44 |

FIG. 12B

| present inputs | | | | | |
|---|---|---|---|---|---|
| i | AD | k | DA | m | DA |
| 0 | 0 | | | 0 | (0) |
| | | | | | |
| 1 | | 1 | | | |
| | 0 | | 1 | | |
| 2 | 1 | | | 1 | (0) |
| | | | | | |
| 3 | | 2 | | | |
| | 1 | | 1 | | |
| 4 | | 3 | | | |
| | 1 | | 1 | | |
| 5 | | 4 | | | |
| | 0 | | 1 | | |
| 6 | | 5 | | | |
| | 1 | | 1 | | |
| 7 | 1 | 6 | 0 | | |
| | | | | | |
| 8 | 0 | 7 | 0 | | |
| | | | | | |
| 9 | | 8 | | | |
| | 1 | | 1 | | |
| 10 | 1 | 9 | 0 | | |
| | | | | | |

| FF' | | | | | | | GG' | | | | | | |
|---|---|---|---|---|---|---|---|---|---|---|---|---|---|
| present | | | | present+1 | | gph. | present | | | | present+1 | | gph. |
| i | FF' | AD | DA | #F | FF' | no. | i | GG' | AD | DA | #G | GG' | no. |
| 0 | 30 | 0 | 0 | 0 | 53 | 1 | 0 | 30 | 0 | 0 | 0 | 45 | 1 |
| | | 0 | 1 | 1 | | 2 | | | 0 | 1 | 1 | | 2 |
| 1 | 53 | 0 | 0 | 60 | | 61 | 1 | 45 | 0 | 0 | 44 | | 45 |
| | | 0 | 1 | 61 | 55 | 62 | | | 0 | 1 | 45 | 35 | 46 |
| 2 | 55 | 1 | 0 | (70) | 44 | 71 | 2 | 35 | 1 | 0 | (22) | (45) | 23 |
| | | 1 | 1 | (70) | | 71 | | | 1 | 1 | 23 | | 24 |
| 3 | 44 | 1 | 0 | 42 | | 43 | 3 | 45 | 1 | 0 | 46 | | 47 |
| | | 1 | 1 | 43 | 33 | 44 | | | 1 | 1 | 47 | 45 | 48 |
| 4 | 33 | 1 | 0 | 14 | | 15 | 4 | 45 | 1 | 0 | 46 | | 47 |
| | | 1 | 1 | 15 | 55 | 16 | | | 1 | 1 | 47 | 45 | 48 |
| 5 | 55 | 0 | 0 | 68 | | 69 | 5 | 45 | 0 | 0 | 44 | | 45 |
| | | 0 | 1 | 69 | 34 | 70 | | | 0 | 1 | 45 | 35 | 46 |
| 6 | 34 | 1 | 0 | 18 | | 19 | 6 | 35 | 1 | 0 | 22 | | 23 |
| | | 1 | 1 | 19 | 53 | 20 | | | 1 | 1 | 23 | 55 | 24 |
| 7 | 53 | 1 | 0 | 62 | 55 | 63 | 7 | 55 | 1 | 0 | 70 | 34 | 71 |
| | | 1 | 1 | 63 | | 64 | | | 1 | 1 | 71 | | 72 |
| 8 | 55 | 0 | 0 | 68 | 35 | 69 | 8 | 34 | 0 | 0 | 16 | 53 | 17 |
| | | 0 | 1 | 69 | | 70 | | | 0 | 1 | 17 | | 18 |
| 9 | 35 | 1 | 0 | 22 | | 23 | 9 | 53 | 1 | 0 | 62 | | 63 |
| | | 1 | 1 | 23 | 54 | 24 | | | 1 | 1 | 63 | 34 | 64 |
| 10 | 54 | 1 | 0 | 66 | 33 | 67 | 10 | 34 | 1 | 0 | 18 | 54 | 19 |
| | | 1 | 1 | 67 | | 68 | | | 1 | 1 | 19 | | 20 |

©2012 Erich Schmitt (17 U.S.C. 401

FIG. 13A

| | | | | | | FF' | | | | | | | GG' | | | | | | |
|---|---|---|---|---|---|---|---|---|---|---|---|---|---|---|---|---|---|---|---|
| present inputs | | | | | | p | | | | p+ 1 | | gph. | p | | | | p+ 1 | | gph. |
| i | AD | k | DA | m | DA | i | FF' | AD | DA | #F | FF' | no. | i | GG' | AD | DA | #G | GG' | no |
| 11 | | 10 | | | | 11 | 33 | 1 | 0 | 14 | | 15 | 11 | 54 | 1 | 0 | 66 | | 67 |
| | 1 | | 1 | | | | | 1 | 1 | 15 | 55 | 16 | | | 1 | 1 | 67 | 33 | 68 |
| 12 | | | | 2 | | 12 | 55 | 1 | 0 | 70 | | 71 | 12 | 33 | 1 | 0 | 14 | | 15 |
| | 1 | | | | 1 | | | 1 | 1 | 70 | 44 | 71 | | | 1 | 1 | 15 | 54 | 16 |
| 13 | | 11 | | | | 13 | 44 | 1 | 0 | 42 | | 43 | 13 | 54 | 1 | 0 | 66 | | 67 |
| | 1 | | 1 | | | | | 1 | 1 | 43 | 33 | 44 | | | 1 | 1 | 67 | 33 | 68 |
| 14 | | 12 | | | | 14 | 33 | 1 | 0 | 14 | | 15 | 14 | 33 | 1 | 0 | 14 | | 15 |
| | 1 | | 1 | | | | | 1 | 1 | 15 | 55 | 16 | | | 1 | 1 | 15 | 54 | 16 |
| 15 | 1 | | | 3 | 0 | 15 | 55 | 1 | 0 | 70 | 44 | 71 | 15 | 54 | 1 | 0 | 66 | 43 | 67 |
| | | | | | | | | 1 | 1 | 70 | | 71 | | | 1 | 1 | 67 | | 68 |
| 16 | | 13 | | | | 16 | 44 | 0 | 0 | 40 | | 41 | 16 | 43 | 0 | 0 | 36 | | 37 |
| | 0 | | 1 | | | | | 0 | 1 | 41 | 35 | 42 | | | 0 | 1 | 37 | 43 | 38 |
| 17 | | 14 | | | | 17 | 35 | 0 | 0 | 20 | | 21 | 17 | 43 | 0 | 0 | 36 | | 37 |
| | 0 | | 1 | | | | | 0 | 1 | 21 | 45 | 22 | | | 0 | 1 | 37 | 43 | 38 |
| 18 | 1 | | | 4 | 0 | 18 | 45 | 1 | 0 | 46 | 35 | 47 | 18 | 43 | 1 | 0 | 38 | 44 | 39 |
| | | | | | | | | 1 | 1 | 47 | | 48 | | | 1 | 1 | 38 | | 39 |
| 19 | | 15 | | | | 19 | 35 | 1 | 0 | 22 | | 23 | 19 | 44 | 1 | 0 | 42 | | 43 |
| | 1 | | 1 | | | | | 1 | 1 | 23 | 54 | 24 | | | 1 | 1 | 43 | 43 | 44 |
| 20 | | 16 | | | | 20 | 54 | 0 | 0 | 64 | | 65 | 20 | 43 | 0 | 0 | 36 | | 37 |
| | 0 | | 1 | | | | | 0 | 1 | 65 | 43 | 66 | | | 0 | 1 | 37 | 43 | 38 |
| 21 | 1 | | | 5 | 0 | 21 | 43 | 1 | 0 | 38 | 43 | 39 | 21 | 43 | 1 | 0 | 38 | 44 | 39 |
| | | | | | | | | 1 | 1 | 39 | | 40 | | | 1 | 1 | 38 | | 39 |

©2012 Erich Schmitt (17 U.S.C. 401

FIG. 13B

| present inputs | | | | | |
|---|---|---|---|---|---|
| i | AD | k | DA | m | DA |
| 22 | | 17 | | | |
| | 1 | | 1 | | |
| 23 | 1 | | | 6 | (0) |
| 24 | | 18 | | | |
| | 0 | | 1 | | |
| 25 | | 19 | | | |
| | 0 | | 1 | | |
| 26 | 1 | 20 | 0 | | |
| 27 | | 21 | | | |
| | 1 | | 1 | | |
| 28 | | 22 | | | |
| | 1 | | 1 | | |
| 29 | 0 | 23 | 0 | | |
| 30 | | | | 7 | |
| | 0 | | | | (1) |
| 31 | | 24 | | | |
| | 0 | | 1 | | |
| 32 | 1 | 25 | 0 | | |

| FF' | | | | | | |
|---|---|---|---|---|---|---|
| p | | | | p+ 1 | | gph. |
| i | FF' | AD | DA | #F | FF' | no. |
| 22 | 43 | 1 | 0 | 38 | | 39 |
| | | 1 | 1 | 39 | 35 | 40 |
| 23 | 35 | 1 | 0 | (22) | (53) | 23 |
| | | 1 | 1 | 23 | | 24 |
| 24 | 53 | 0 | 0 | 60 | | 61 |
| | | 0 | 1 | 61 | 55 | 62 |
| 25 | 55 | 0 | 0 | 68 | | 69 |
| | | 0 | 1 | 69 | 34 | 70 |
| 26 | 34 | 1 | 0 | 18 | 45 | 19 |
| | | 1 | 1 | 19 | | 20 |
| 27 | 45 | 1 | 0 | 46 | | 47 |
| | | 1 | 1 | 47 | 34 | 48 |
| 28 | 34 | 1 | 0 | 18 | | 19 |
| | | 1 | 1 | 19 | 53 | 20 |
| 29 | 53 | 0 | 0 | 60 | 34 | 61 |
| | | 0 | 1 | 61 | | 62 |
| 30 | 34 | 0 | 0 | 16 | | 17 |
| | | 0 | 1 | (17) | (54) | 18 |
| 31 | 54 | 0 | 0 | 64 | | 65 |
| | | 0 | 1 | 65 | 43 | 66 |
| 32 | 43 | 1 | 0 | 38 | 43 | 39 |
| | | 1 | 1 | 39 | | 40 |

| GG' | | | | | | |
|---|---|---|---|---|---|---|
| p | | | | p+ 1 | | gph. |
| i | GG' | AD | DA | #G | GG' | no. |
| 22 | 44 | 1 | 0 | 42 | | 43 |
| | | 1 | 1 | 43 | 43 | 44 |
| 23 | 43 | 1 | 0 | (38) | 44 | 39 |
| | | 1 | 1 | (38) | | 39 |
| 24 | 44 | 0 | 0 | 40 | | 41 |
| | | 0 | 1 | 41 | 54 | 42 |
| 25 | 54 | 0 | 0 | 64 | | 65 |
| | | 0 | 1 | 65 | 33 | 66 |
| 26 | 33 | 1 | 0 | 14 | 33 | 15 |
| | | 1 | 1 | 15 | | 16 |
| 27 | 33 | 1 | 0 | 14 | | 15 |
| | | 1 | 1 | 15 | 54 | 16 |
| 28 | 54 | 1 | 0 | 66 | | 67 |
| | | 1 | 1 | 67 | 33 | 68 |
| 29 | 33 | 0 | 0 | 12 | 55 | 13 |
| | | 0 | 1 | 13 | | 14 |
| 30 | 55 | 0 | 0 | (68) | | 69 |
| | | 0 | 1 | (68) | 44 | 69 |
| 31 | 44 | 0 | 0 | 40 | | 41 |
| | | 0 | 1 | 41 | 54 | 42 |
| 32 | 54 | 1 | 0 | 66 | 43 | 67 |
| | | 1 | 1 | 67 | | 68 |

©2012 Erich Schmitt (17 U.S.C. 401

FIG. 13C

| present inputs | | | | | |
|---|---|---|---|---|---|
| i | AD | k | DA | m | DA |
| 33 | 1 | | | 8 | 0 |
| | | | | | |
| 34 | | | | 9 | |
| | 0 | | | | 1 |
| 35 | | 26 | | | |
| | 1 | | 1 | | |
| 36 | | 27 | | | |
| | 1 | | 1 | | |
| 37 | | | | 10 | |
| | 1 | | | | 1 |
| 38 | | 28 | | | |
| | 1 | | 1 | | |
| 39 | 1 | 29 | 0 | | |
| | | | | | |
| 40 | | 30 | | | |
| | 0 | | 1 | | |
| 41 | 0 | 31 | 0 | | |
| | | | | | |
| 42 | 1 | 32 | 0 | | |
| | | | | | |
| 43 | 0 | 33 | 0 | | |
| | | | | | |

| FF' | | | | | | | GG' | | | | | | |
|---|---|---|---|---|---|---|---|---|---|---|---|---|---|
| p | | | | p+ 1 | | gph. | p | | | | p+ 1 | | gph. |
| i | FF' | AD | DA | #F | FF' | no. | i | GG' | AD | DA | #G | GG' | no. |
| 33 | 43 | 1 | 0 | 38 | 43 | 39 | 33 | 43 | 1 | 0 | 38 | 44 | 39 |
| | | 1 | 1 | 39 | | 40 | | | 1 | 1 | 38 | | 39 |
| 34 | 43 | 0 | 0 | 36 | | 37 | 34 | 44 | 0 | 0 | 40 | | 41 |
| | | 0 | 1 | 36 | 44 | 37 | | | 0 | 1 | 41 | 54 | 42 |
| 35 | 44 | 1 | 0 | 42 | | 43 | 35 | 54 | 1 | 0 | 66 | | 67 |
| | | 1 | 1 | 43 | 33 | 44 | | | 1 | 1 | 67 | 33 | 68 |
| 36 | 33 | 1 | 0 | 14 | | 15 | 36 | 33 | 1 | 0 | 14 | | 15 |
| | | 1 | 1 | 15 | 55 | 16 | | | 1 | 1 | 15 | 54 | 16 |
| 37 | 55 | 1 | 0 | 70 | | 71 | 37 | 54 | 1 | 0 | 66 | | 67 |
| | | 1 | 1 | 70 | 44 | 71 | | | 1 | 1 | 67 | 33 | 68 |
| 38 | 44 | 1 | 0 | 42 | | 43 | 38 | 33 | 1 | 0 | 14 | | 15 |
| | | 1 | 1 | 43 | 33 | 44 | | | 1 | 1 | 15 | 54 | 16 |
| 39 | 33 | 1 | 0 | 14 | 34 | 15 | 39 | 54 | 1 | 0 | 66 | 43 | 67 |
| | | 1 | 1 | 15 | | 16 | | | 1 | 1 | 67 | | 68 |
| 40 | 34 | 0 | 0 | 16 | | 17 | 40 | 43 | 0 | 0 | 36 | | 37 |
| | | 0 | 1 | 17 | 54 | 18 | | | 0 | 1 | 37 | 43 | 38 |
| 41 | 54 | 0 | 0 | 64 | 33 | 65 | 41 | 43 | 0 | 0 | 36 | 35 | 37 |
| | | 0 | 1 | 65 | | 66 | | | 0 | 1 | 37 | | 38 |
| 42 | 33 | 1 | 0 | 14 | 34 | 15 | 42 | 35 | 1 | 0 | 22 | 45 | 23 |
| | | 1 | 1 | 15 | | 16 | | | 1 | 1 | 23 | | 24 |
| 43 | 34 | 0 | 0 | 16 | 53 | 17 | 43 | 45 | 0 | 0 | 44 | 34 | 45 |
| | | 0 | 1 | 17 | | 18 | | | 0 | 1 | 45 | | 46 |

FIG. 13D

©2012 Frich Schmitt (17 U.S.C. 401

| present inputs | | | | | |
|---|---|---|---|---|---|
| i | AD | k | DA | m | DA |
| 44 | 0 | 34 | 0 | | |
| 45 | 1 | 35 | 0 | | |
| 46 | | | | 11 | |
| | 0 | | | | (1) |
| 47 | 1 | 36 | 0 | | |
| 48 | | 37 | | | |
| | 0 | | 1 | | |
| 49 | | 38 | | | |
| | 0 | | 1 | | |
| 50 | 1 | 39 | 0 | | |
| 51 | | 40 | | | |
| | 0 | | 1 | | |
| 52 | 0 | 41 | 0 | | |
| 53 | | 42 | | | |
| | 1 | | 1 | | |
| 54 | | | | 12 | |
| | 0 | | | | (1) |

| FF' | | | | | | | GG' | | | | | | |
|---|---|---|---|---|---|---|---|---|---|---|---|---|---|
| p | | | | p+ 1 | | gph. | p | | | | p+ 1 | | gph. |
| i | FF' | AD | DA | #F | FF' | no. | i | GG' | AD | DA | #G | GG' | no. |
| 44 | 53 | 0 | 0 | 60 | 34 | 61 | 44 | 34 | 0 | 0 | 16 | 53 | 17 |
| | | 0 | 1 | 61 | | 62 | | | 0 | 1 | 17 | | 18 |
| 45 | 34 | 1 | 0 | 18 | 45 | 19 | 45 | 53 | 1 | 0 | 62 | 55 | 63 |
| | | 1 | 1 | 19 | | 20 | | | 1 | 1 | 63 | | 64 |
| 46 | 45 | 0 | 0 | 44 | | 45 | 46 | 55 | 0 | 0 | (68) | | 69 |
| | | 0 | 1 | (45) | (53) | 46 | | | 0 | 1 | (68) | 44 | 69 |
| 47 | 53 | 1 | 0 | 62 | 55 | 63 | 47 | 44 | 1 | 0 | 42 | 35 | 43 |
| | | 1 | 1 | 63 | | 64 | | | 1 | 1 | 43 | | 44 |
| 48 | 55 | 0 | 0 | 68 | | 69 | 48 | 35 | 0 | 0 | 20 | | 21 |
| | | 0 | 1 | 69 | 34 | 70 | | | 0 | 1 | 21 | 53 | 22 |
| 49 | 34 | 0 | 0 | 16 | | 17 | 49 | 53 | 0 | 0 | 60 | | 61 |
| | | 0 | 1 | 17 | 54 | 18 | | | 0 | 1 | 61 | 55 | 62 |
| 50 | 54 | 1 | 0 | 66 | 33 | 67 | 50 | 55 | 1 | 0 | 70 | 34 | 71 |
| | | 1 | 1 | 67 | | 68 | | | 1 | 1 | 71 | | 72 |
| 51 | 33 | 0 | 0 | 12 | | 13 | 51 | 34 | 0 | 0 | 16 | | 17 |
| | | 0 | 1 | 13 | 33 | 14 | | | 0 | 1 | 17 | 45 | 18 |
| 52 | 33 | 0 | 0 | 12 | 54 | 13 | 52 | 45 | 0 | 0 | 44 | 34 | 45 |
| | | 0 | 1 | 13 | | 14 | | | 0 | 1 | 45 | | 46 |
| 53 | 54 | 1 | 0 | 66 | | 67 | 53 | 34 | 1 | 0 | 18 | | 19 |
| | | 1 | 1 | 67 | 43 | 68 | | | 1 | 1 | 19 | 53 | 20 |
| 54 | 43 | 0 | 0 | (36) | | 37 | 54 | 53 | 0 | 0 | 60 | | 61 |
| | | 0 | 1 | (36) | 44 | 37 | | | 0 | 1 | (61) | (55) | 62 |

©2012 Erich Schmitt (17 U.S.C. 401

FIG. 13E

| present inputs | | | | | |
|---|---|---|---|---|---|
| i | AD | k | DA | m | DA |
| 55 | | 43 | | | |
| | 1 | | 1 | | |
| 56 | | 44 | | | |
| | 0 | | 1 | | |
| 57 | | 45 | | | |
| | 0 | | 1 | | |
| 58 | 1 | 46 | 0 | | |
| 59 | 1 | 47 | 0 | | |
| 60 | | 48 | | | |
| | 0 | | 1 | | |
| 61 | 1 | 49 | 0 | | |
| 62 | 0 | 50 | 0 | | |
| 63 | | | | 13 | |
| | 0 | | | | 1 |
| 64 | | 51 | | | |
| | 1 | | 1 | | |
| 65 | 1 | | | 14 | 0 |

| FF' | | | | | | | GG' | | | | | | |
|---|---|---|---|---|---|---|---|---|---|---|---|---|---|
| p | | | | p+ 1 | | gph. | p | | | | p+ 1 | | gph. |
| i | FF' | AD | DA | #F | FF' | no. | i | GG' | AD | DA | #G | GG' | no. |
| 55 | 44 | 1 | 0 | 42 | | 43 | 55 | 55 | 1 | 0 | 70 | | 71 |
| | | 1 | 1 | 43 | 33 | 44 | | | 1 | 1 | 71 | 35 | 72 |
| 56 | 33 | 0 | 0 | 12 | | 13 | 56 | 35 | 0 | 0 | 20 | | 21 |
| | | 0 | 1 | 13 | 33 | 14 | | | 0 | 1 | 21 | 53 | 22 |
| 57 | 33 | 0 | 0 | 12 | | 13 | 57 | 53 | 0 | 0 | 60 | | 61 |
| | | 0 | 1 | 13 | 33 | 14 | | | 0 | 1 | 61 | 55 | 62 |
| 58 | 33 | 1 | 0 | 14 | 34 | 15 | 58 | 55 | 1 | 0 | 70 | 34 | 71 |
| | | 1 | 1 | 15 | | 16 | | | 1 | 1 | 71 | | 72 |
| 59 | 34 | 1 | 0 | 18 | 45 | 19 | 59 | 34 | 1 | 0 | 18 | 54 | 19 |
| | | 1 | 1 | 19 | | 20 | | | 1 | 1 | 19 | | 20 |
| 60 | 45 | 0 | 0 | 44 | | 45 | 60 | 54 | 0 | 0 | 64 | | 65 |
| | | 0 | 1 | 45 | 53 | 46 | | | 0 | 1 | 65 | 33 | 66 |
| 61 | 53 | 1 | 0 | 62 | 55 | 63 | 61 | 33 | 1 | 0 | 14 | 33 | 15 |
| | | 1 | 1 | 63 | | 64 | | | 1 | 1 | 15 | | 16 |
| 62 | 55 | 0 | 0 | 68 | 35 | 69 | 62 | 33 | 0 | 0 | 12 | 55 | 13 |
| | | 0 | 1 | 69 | | 70 | | | 0 | 1 | 13 | | 14 |
| 63 | 35 | 0 | 0 | 20 | | 21 | 63 | 55 | 0 | 0 | 68 | | 69 |
| | | 0 | 1 | 21 | 45 | 22 | | | 0 | 1 | 68 | 44 | 69 |
| 64 | 45 | 1 | 0 | 46 | | 47 | 64 | 44 | 1 | 0 | 42 | | 43 |
| | | 1 | 1 | 47 | 34 | 48 | | | 1 | 1 | 43 | 43 | 44 |
| 65 | 34 | 1 | 0 | 18 | 45 | 19 | 65 | 43 | 1 | 0 | 38 | 44 | 39 |
| | | 1 | 1 | 19 | | 20 | | | 1 | 1 | 38 | | 39 |

FIG. 13F

©2012 Frich Schmitt (17 U.S.C. 401

| present inputs | | | | | |
|---|---|---|---|---|---|
| i | AD | k | DA | m | DA |
| 66 | | 52 | | | |
| | 1 | | 1 | | |
| 67 | 0 | 53 | 0 | | |
| 68 | 1 | 54 | 0 | | |
| 69 | 1 | | | 15 | (0) |
| 70 | | 55 | | | |
| | 0 | | 1 | | |
| 71 | | 56 | | | |
| | 1 | | 1 | | |
| 72 | | 57 | | | |
| | 1 | | 1 | | |
| 73 | 1 | 58 | 0 | | |
| 74 | | | | 16 | |
| | 0 | | | | (1) |
| 75 | 0 | 59 | 0 | | |
| 76 | | 60 | | | |
| | 1 | | 1 | | |

| FF' | | | | | | | GG' | | | | | | |
|---|---|---|---|---|---|---|---|---|---|---|---|---|---|
| p | | | | p+1 | | gph. | p | | | | p+1 | | gph. |
| i | FF' | AD | DA | #F | FF' | no. | i | GG' | AD | DA | #G | GG' | no. |
| 66 | 45 | 1 | 0 | 46 | | 47 | 66 | 44 | 1 | 0 | 42 | | 43 |
| | | 1 | 1 | 47 | 34 | 48 | | | 1 | 1 | 43 | 43 | 44 |
| 67 | 34 | 0 | 0 | 16 | 53 | 17 | 67 | 43 | 0 | 0 | 36 | 35 | 37 |
| | | 0 | 1 | 17 | | 18 | | | 0 | 1 | 37 | | 38 |
| 68 | 53 | 1 | 0 | 62 | 55 | 63 | 68 | 35 | 1 | 0 | 22 | 45 | 23 |
| | | 1 | 1 | 63 | | 64 | | | 1 | 1 | 23 | | 24 |
| 69 | 55 | 1 | 0 | (70) | 44 | 71 | 69 | 45 | 1 | 0 | (46) | (53) | 47 |
| | | 1 | 1 | (70) | | 71 | | | 1 | 1 | 47 | | 48 |
| 70 | 44 | 0 | 0 | 40 | | 41 | 70 | 53 | 0 | 0 | 60 | | 61 |
| | | 0 | 1 | 41 | 35 | 42 | | | 0 | 1 | 61 | 55 | 62 |
| 71 | 35 | 1 | 0 | 22 | | 23 | 71 | 55 | 1 | 0 | 70 | | 71 |
| | | 1 | 1 | 23 | 54 | 24 | | | 1 | 1 | 71 | 35 | 72 |
| 72 | 54 | 1 | 0 | 66 | | 67 | 72 | 35 | 1 | 0 | 22 | | 23 |
| | | 1 | 1 | 67 | 43 | 68 | | | 1 | 1 | 23 | 55 | 24 |
| 73 | 43 | 1 | 0 | 38 | 43 | 39 | 73 | 55 | 1 | 0 | 70 | 34 | 71 |
| | | 1 | 1 | 39 | | 40 | | | 1 | 1 | 71 | | 72 |
| 74 | 43 | 0 | 0 | (36) | | 37 | 74 | 34 | 0 | 0 | 16 | | 17 |
| | | 0 | 1 | (36) | 44 | 37 | | | 0 | 1 | (17) | (45) | 18 |
| 75 | 44 | 0 | 0 | 40 | 43 | 41 | 75 | 45 | 0 | 0 | 44 | 34 | 45 |
| | | 0 | 1 | 41 | | 42 | | | 0 | 1 | 45 | | 46 |
| 76 | 43 | 1 | 0 | 38 | | 39 | 76 | 34 | 1 | 0 | 18 | | 19 |
| | | 1 | 1 | 39 | 35 | 40 | | | 1 | 1 | 19 | 53 | 20 |

©2012 Erich Schmitt (17 U.S.C. 401

FIG. 13G

| present inputs | | | | | |
|---|---|---|---|---|---|
| i | AD | k | DA | m | DA |
| 77 | | 61 | | | |
| | 0 | | 1 | | |
| 78 | | | | 17 | |
| | 0 | | | | 1 |
| 79 | 1 | 62 | 0 | | |
| | | | | | |
| 80 | | | | 18 | |
| | 1 | | | | 1 |
| 81 | 0 | | | 19 | 0 |
| | | | | | |
| 82 | 0 | | | 20 | 0 |
| | | | | | |
| 83 | 1 | 63 | 0 | | |
| | | | | | |
| 84 | 0 | 64 | 0 | | |
| | | | | | |
| 85 | | 65 | | | |
| | 1 | | 1 | | |
| 86 | | 66 | | | |
| | 0 | | 1 | | |
| 87 | 0 | 67 | 0 | | |
| | | | | | |

| FF' | | | | | | | GG' | | | | | | |
|---|---|---|---|---|---|---|---|---|---|---|---|---|---|
| p | | | | p+ 1 | | gph. | p | | | | p+ 1 | | gph. |
| i | FF' | AD | DA | #F | FF' | no. | i | GG' | AD | DA | #G | GG' | no. |
| 77 | 35 | 00 | | 20 | | 21 | 77 | 53 | 0 | 0 | 60 | | 61 |
| | | 0 | 1 | 21 | 45 | 22 | | | 0 | 1 | 61 | 55 | 62 |
| 78 | 45 | 0 | 0 | 44 | | 45 | 78 | 55 | 0 | 0 | 68 | | 69 |
| | | 0 | 1 | 45 | 53 | 46 | | | 0 | 1 | 68 | 44 | 69 |
| 79 | 53 | 1 | 0 | 62 | 55 | 63 | 79 | 44 | 1 | 0 | 42 | 35 | 43 |
| | | 1 | 1 | 63 | | 64 | | | 1 | 1 | 43 | | 44 |
| 80 | 55 | 1 | 0 | 70 | | 71 | 80 | 35 | 1 | 0 | 22 | | 23 |
| | | 1 | 1 | 70 | 44 | 71 | | | 1 | 1 | 23 | 53 | 24 |
| 81 | 44 | 0 | 0 | 40 | 43 | 41 | 81 | 55 | 0 | 0 | 68 | 44 | 69 |
| | | 0 | 1 | 41 | | 42 | | | 0 | 1 | 68 | | 69 |
| 82 | 43 | 0 | 0 | 36 | 44 | 37 | 82 | 44 | 0 | 0 | 40 | 33 | 41 |
| | | 0 | 1 | 36 | | 37 | | | 0 | 1 | 41 | | 42 |
| 83 | 44 | 1 | 0 | 42 | 54 | 43 | 83 | 33 | 1 | 0 | 14 | 33 | 15 |
| | | 1 | 1 | 43 | | 44 | | | 1 | 1 | 15 | | 16 |
| 84 | 54 | 0 | 0 | 64 | 33 | 65 | 84 | 33 | 0 | 0 | 12 | 55 | 13 |
| | | 0 | 1 | 65 | | 66 | | | 0 | 1 | 13 | | 14 |
| 85 | 33 | 1 | 0 | 14 | | 15 | 85 | 55 | 1 | 0 | 70 | | 71 |
| | | 1 | 1 | 15 | 55 | 16 | | | 1 | 1 | 71 | 35 | 72 |
| 86 | 55 | 0 | 0 | 68 | | 69 | 86 | 35 | 0 | 0 | 20 | | 21 |
| | | 0 | 1 | 69 | 34 | 70 | | | 0 | 1 | 21 | 53 | 22 |
| 87 | 34 | 0 | 0 | 16 | 53 | 17 | 87 | 53 | 0 | 0 | 60 | 45 | 61 |
| | | 0 | 1 | 17 | | 18 | | | 0 | 1 | 61 | | 62 |

©2012 Erich Schmitt (17 U.S.C. 401

FIG. 13H

| present inputs | | | | | |
|---|---|---|---|---|---|
| i | AD | k | DA | m | DA |
| 88 | | 68 | | | |
| | 0 | | 1 | | |
| 89 | 0 | 69 | 0 | | |
| 90 | 0 | 70 | 0 | | |
| 91 | 0 | 71 | 0 | | |
| 92 | | 72 | | | |
| | 1 | | 1 | | |
| 93 | 0 | | | 21 | 0 |
| 94 | 1 | 73 | 0 | | |
| 95 | 0 | 74 | 0 | | |
| 96 | | 75 | | | |
| | 1 | | 1 | | |
| 97 | | 76 | | | |
| | 1 | | 1 | | |
| 98 | | 77 | | | |
| | 1 | | 1 | | |

| FF' | | | | | | |
|---|---|---|---|---|---|---|
| p | | | | p+ 1 | | gph. |
| i | FF' | AD | DA | #F | FF' | no. |
| 88 | 53 | 0 | 0 | 60 | | 61 |
| | | 0 | 1 | 61 | 55 | 62 |
| 89 | 55 | 0 | 0 | 68 | 35 | 69 |
| | | 0 | 1 | 69 | | 70 |
| 90 | 35 | 0 | 0 | 20 | 55 | 21 |
| | | 0 | 1 | 21 | | 22 |
| 91 | 55 | 0 | 0 | 68 | 35 | 69 |
| | | 0 | 1 | 69 | | 70 |
| 92 | 35 | 1 | 0 | 22 | | 23 |
| | | 1 | 1 | 23 | 54 | 24 |
| 93 | 54 | 0 | 0 | 64 | 33 | 65 |
| | | 0 | 1 | 65 | | 66 |
| 94 | 33 | 1 | 0 | 14 | 34 | 15 |
| | | 1 | 1 | 15 | | 16 |
| 95 | 34 | 0 | 0 | 16 | 53 | 17 |
| | | 0 | 1 | 17 | | 18 |
| 96 | 53 | 1 | 0 | 62 | | 63 |
| | | 1 | 1 | 63 | 45 | 64 |
| 97 | 45 | 1 | 0 | 46 | | 47 |
| | | 1 | 1 | 47 | 34 | 48 |
| 98 | 34 | 1 | 0 | 18 | | 19 |
| | | 1 | 1 | 19 | 53 | 20 |

| GG' | | | | | | |
|---|---|---|---|---|---|---|
| p | | | | p+ 1 | | gph. |
| i | GG' | AD | DA | #G | GG' | no. |
| 88 | 45 | 0 | 0 | 44 | | 45 |
| | | 0 | 1 | 45 | 35 | 46 |
| 89 | 35 | 0 | 0 | 20 | 54 | 21 |
| | | 0 | 1 | 21 | | 22 |
| 90 | 54 | 0 | 0 | 64 | 43 | 65 |
| | | 0 | 1 | 65 | | 66 |
| 91 | 43 | 0 | 0 | 36 | 35 | 37 |
| | | 0 | 1 | 37 | | 38 |
| 92 | 35 | 1 | 0 | 22 | | 23 |
| | | 1 | 1 | 23 | 55 | 24 |
| 93 | 55 | 0 | 0 | 68 | 44 | 69 |
| | | 0 | 1 | 68 | | 69 |
| 94 | 44 | 1 | 0 | 42 | 35 | 43 |
| | | 1 | 1 | 43 | | 44 |
| 95 | 35 | 0 | 0 | 20 | 54 | 21 |
| | | 0 | 1 | 21 | | 22 |
| 96 | 54 | 1 | 0 | 66 | | 67 |
| | | 1 | 1 | 67 | 33 | 68 |
| 97 | 33 | 1 | 0 | 14 | | 15 |
| | | 1 | 1 | 15 | 54 | 16 |
| 98 | 54 | 1 | 0 | 66 | | 67 |
| | | 1 | 1 | 67 | 33 | 68 |

FIG. 13I

©2012 Erich Schmitt (17 U.S.C. 401

| present inputs | | | | | |
|---|---|---|---|---|---|
| i | AD | k | DA | m | DA |
| 99 | | 78 | | | |
| | 1 | | 1 | | |
| 100 | 1 | 79 | 0 | | |
| | | | | | |
| 101 | | | | 22 | |
| | 1 | | | | 1 |
| 102 | | 80 | | | |
| | 1 | | 1 | | |
| 103 | 1 | | | 23 | 0 |
| | | | | | |
| 104 | 0 | | | 24 | 0 |
| | | | | | |
| 105 | | 81 | | | |
| | 1 | | 1 | | |
| 106 | | 82 | | | |
| | 1 | | 1 | | |
| 107 | 0 | 83 | 0 | | |
| | | | | | |
| 108 | | 84 | | | |
| | 1 | | 1 | | |
| 109 | 0 | 85 | 0 | | |
| | | | | | |

| FF' | | | | | | | GG' | | | | | | |
|---|---|---|---|---|---|---|---|---|---|---|---|---|---|
| p | | | | p+ 1 | | gph. | p | | | | p+ 1 | | gph. |
| i | FF' | AD | DA | #F | FF' | no. | i | GG' | AD | DA | #G | GG' | no. |
| 99 | 53 | 1 | 0 | 62 | | 63 | 99 | 33 | 1 | 0 | 14 | | 15 |
| | | 1 | 1 | 63 | 45 | 64 | | | 1 | 1 | 15 | 54 | 16 |
| 100 | 45 | 1 | 0 | 46 | 35 | 47 | 100 | 54 | 1 | 0 | 66 | 43 | 67 |
| | | 1 | 1 | 47 | | 48 | | | 1 | 1 | 67 | | 68 |
| 101 | 35 | 1 | 0 | 22 | | 23 | 101 | 43 | 1 | 0 | 38 | | 39 |
| | | 1 | 1 | 23 | 54 | 24 | | | 1 | 1 | 38 | 44 | 39 |
| 102 | 54 | 1 | 0 | 66 | | 67 | 102 | 44 | 1 | 0 | 42 | | 43 |
| | | 1 | 1 | 67 | 43 | 68 | | | 1 | 1 | 43 | 43 | 44 |
| 103 | 43 | 1 | 0 | 38 | 43 | 39 | 103 | 43 | 1 | 0 | 38 | 44 | 39 |
| | | 1 | 1 | 39 | | 40 | | | 1 | 1 | 38 | | 39 |
| 104 | 43 | 0 | 0 | 36 | 44 | 37 | 104 | 44 | 0 | 0 | 40 | 33 | 41 |
| | | 0 | 1 | 36 | | 37 | | | 0 | 1 | 41 | | 42 |
| 105 | 44 | 1 | 0 | 42 | | 43 | 105 | 33 | 1 | 0 | 14 | | 15 |
| | | 1 | 1 | 43 | 33 | 44 | | | 1 | 1 | 15 | 54 | 16 |
| 106 | 33 | 1 | 0 | 14 | | 15 | 106 | 54 | 1 | 0 | 66 | | 67 |
| | | 1 | 1 | 15 | 55 | 16 | | | 1 | 1 | 67 | 33 | 68 |
| 107 | 55 | 0 | 0 | 68 | 35 | 69 | 107 | 33 | 0 | 0 | 12 | 55 | 13 |
| | | 0 | 1 | 69 | | 70 | | | 0 | 1 | 13 | | 14 |
| 108 | 35 | 1 | 0 | 22 | | 23 | 108 | 55 | 1 | 0 | 70 | | 71 |
| | | 1 | 1 | 23 | 54 | 24 | | | 1 | 1 | 71 | 35 | 72 |
| 109 | 54 | 0 | 0 | 64 | 33 | 65 | 109 | 35 | 0 | 0 | 20 | 54 | 21 |
| | | 0 | 1 | 65 | | 66 | | | 0 | 1 | 21 | | 22 |

FIG. 13J

©2012 Erich Schmitt (17 U.S.C. 401

| present inputs | | | | | |
|---|---|---|---|---|---|
| i | AD | k | DA | m | DA |
| 110 | 1 | 86 | 0 | | |
| | | | | | |
| 111 | | 87 | | | |
| | 0 | | 1 | | |
| 112 | | 88 | | | |
| | 0 | | 1 | | |
| 113 | 1 | | | 25 | (0) |
| | | | | | |
| 114 | | 89 | | | |
| | 1 | | 1 | | |
| 115 | | 90 | | | |
| | 0 | | 1 | | |
| 116 | | 91 | | | |
| | 0 | | 1 | | |
| 117 | | | | 26 | |
| | 1 | | | | (1) |
| 118 | 1 | 92 | 0 | | |
| | | | | | |
| 119 | 1 | 93 | 0 | | |
| | | | | | |
| 120 | | 94 | | | |
| | 0 | | 1 | | |

| FF' | | | | | | gph. | GG' | | | | | | gph. |
|---|---|---|---|---|---|---|---|---|---|---|---|---|---|
| p | | | | p+ 1 | | | p | | | | p+ 1 | | |
| i | FF' | AD | DA | #F | FF' | no. | i | GG' | AD | DA | #G | GG' | no. |
| 110 | 33 | 1 | 0 | 14 | 34 | 15 | 110 | 54 | 1 | 0 | 66 | 43 | 67 |
| | | 1 | 1 | 15 | | 16 | | | 1 | 1 | 67 | | 68 |
| 111 | 34 | 0 | 0 | 16 | | 17 | 111 | 43 | 0 | 0 | 36 | | 37 |
| | | 0 | 1 | 17 | 54 | 18 | | | 0 | 1 | 37 | 43 | 38 |
| 112 | 54 | 0 | 0 | 64 | | 65 | 112 | 43 | 0 | 0 | 36 | | 37 |
| | | 0 | 1 | 65 | 43 | 66 | | | 0 | 1 | 37 | 43 | 38 |
| 113 | 43 | 1 | 0 | (38) | (43) | 39 | 113 | 43 | 1 | 0 | (38) | 44 | 39 |
| | | 1 | 1 | 39 | | 40 | | | 1 | 1 | (38) | | 39 |
| 114 | 43 | 1 | 0 | 38 | | 39 | 114 | 44 | 1 | 0 | 42 | | 43 |
| | | 1 | 1 | 39 | 35 | 40 | | | 1 | 1 | 43 | 43 | 44 |
| 115 | 35 | 0 | 0 | 20 | | 21 | 115 | 43 | 0 | 0 | 36 | | 37 |
| | | 0 | 1 | 21 | 45 | 22 | | | 0 | 1 | 37 | 43 | 38 |
| 116 | 45 | 0 | 0 | 44 | | 45 | 116 | 43 | 0 | 0 | 36 | | 37 |
| | | 0 | 1 | 45 | 53 | 46 | | | 0 | 1 | 37 | 43 | 38 |
| 117 | 53 | 1 | 0 | 62 | | 63 | 117 | 43 | 1 | 0 | (38) | | 39 |
| | | 1 | 1 | (63) | (45) | 64 | | | 1 | 1 | (38) | 44 | 39 |
| 118 | 45 | 1 | 0 | 46 | 35 | 47 | 118 | 44 | 1 | 0 | 42 | 35 | 43 |
| | | 1 | 1 | 47 | | 48 | | | 1 | 1 | 43 | | 44 |
| 119 | 35 | 1 | 0 | 22 | 53 | 23 | 119 | 35 | 1 | 0 | 22 | 45 | 23 |
| | | 1 | 1 | 23 | | 24 | | | 1 | 1 | 23 | | 24 |
| 120 | 53 | 0 | 0 | 60 | | 61 | 120 | 45 | 0 | 0 | 44 | | 45 |
| | | 0 | 1 | 61 | 55 | 62 | | | 0 | 1 | 45 | 35 | 46 |

©2012 Erich Schmitt (17 U.S.C. 401

FIG. 13K

| present inputs | | | | | |
|---|---|---|---|---|---|
| i | AD | k | DA | m | DA |
| 121 | 0 | 95 | 0 | | |
| 122 | 0 | 96 | 0 | | |
| 123 | 0 | 97 | 0 | | |
| 124 | | 98 | | | |
| | 0 | | 1 | | |
| 125 | 0 | 99 | 0 | | |
| 126 | | 100 | | | |
| | 1 | | 1 | | |
| 127 | | 101 | | | |
| | 0 | | 1 | | |
| 128 | 1 | 102 | 0 | | |
| 129 | 1 | 103 | 0 | | |
| 130 | 1 | 104 | 0 | | |
| 131 | | 105 | | | |
| | 1 | | 1 | | |

| FF' | | | | | | | GG' | | | | | | |
|---|---|---|---|---|---|---|---|---|---|---|---|---|---|
| p | | | | p+ 1 | | gph. | p | | | | p+ 1 | | gph. |
| i | FF' | AD | DA | #F | FF' | no. | i | GG' | AD | DA | #G | GG' | no. |
| 121 | 55 | 0 | 0 | 68 | 35 | 69 | 121 | 35 | 0 | 0 | 20 | 54 | 21 |
| | | 0 | 1 | 69 | | 70 | | | 0 | 1 | 21 | | 22 |
| 122 | 35 | 0 | 0 | 20 | 55 | 21 | 122 | 54 | 0 | 0 | 64 | 43 | 65 |
| | | 0 | 1 | 21 | | 22 | | | 0 | 1 | 65 | | 66 |
| 123 | 35 | 0 | 0 | 68 | 35 | 69 | 123 | 43 | 0 | 0 | 36 | 35 | 37 |
| | | 0 | 1 | 69 | | 70 | | | 0 | 1 | 37 | | 38 |
| 124 | 35 | 0 | 0 | 20 | | 21 | 124 | 35 | 0 | 0 | 20 | | 21 |
| | | 0 | 1 | 21 | 45 | 22 | | | 0 | 1 | 21 | 53 | 22 |
| 125 | 45 | 0 | 0 | 44 | 45 | 45 | 125 | 53 | 0 | 0 | 60 | 45 | 61 |
| | | 0 | 1 | 45 | | 46 | | | 0 | 1 | 61 | | 62 |
| 126 | 45 | 1 | 0 | 46 | | 47 | 126 | 45 | 1 | 0 | 46 | | 47 |
| | | 1 | 1 | 47 | 34 | 48 | | | 1 | 1 | 47 | 45 | 48 |
| 127 | 34 | 0 | 0 | 16 | | 17 | 127 | 45 | 0 | 0 | 44 | | 45 |
| | | 0 | 1 | 17 | 54 | 18 | | | 0 | 1 | 45 | 35 | 46 |
| 128 | 54 | 1 | 0 | 66 | 33 | 67 | 128 | 35 | 1 | 0 | 22 | 45 | 23 |
| | | 1 | 1 | 67 | | 68 | | | 1 | 1 | 23 | | 24 |
| 129 | 33 | 1 | 0 | 14 | 34 | 15 | 129 | 45 | 1 | 0 | 46 | 53 | 47 |
| | | 1 | 1 | 15 | | 16 | | | 1 | 1 | 47 | | 48 |
| 130 | 34 | 1 | 0 | 18 | 45 | 19 | 130 | 53 | 1 | 0 | 62 | 55 | 63 |
| | | 1 | 1 | 19 | | 20 | | | 1 | 1 | 63 | | 64 |
| 131 | 45 | 1 | 0 | 46 | | 47 | 131 | 55 | 1 | 0 | 70 | | 71 |
| | | 1 | 1 | 47 | 34 | 48 | | | 1 | 1 | 71 | 35 | 72 |

FIG. 13L

©2012 Erich Schmitt (17 U.S.C. 401

| present inputs | | | | | |
|---|---|---|---|---|---|
| i | AD | k | DA | m | DA |
| 132 | 0 | 106 | 0 | | |
| 133 | 1 | 107 | 0 | | |
| 134 | | | | 27 | |
| | 1 | | | | (1) |
| 135 | | 108 | | | |
| | 1 | | 1 | | |
| 136 | 0 | 109 | 0 | | |
| 137 | | 110 | | | |
| | 0 | | 1 | | |
| 138 | | | | 28 | |
| | 0 | | | | (1) |
| 139 | | | | 29 | |
| | 0 | | | | (1) |
| 140 | 1 | 111 | 0 | | |
| 141 | | 112 | | | |
| | 1 | | 1 | | |
| 142 | | | | 30 | |
| | 0 | | | | (1) |

| FF' | | | | | | |
|---|---|---|---|---|---|---|
| p | | | | p+ 1 | | gph. |
| i | FF' | AD | DA | #F | FF' | no. |
| 132 | 34 | 0 | 0 | 16 | 53 | 17 |
| | | 0 | 1 | 17 | | 18 |
| 133 | 53 | 1 | 0 | 62 | 55 | 63 |
| | | 1 | 1 | 63 | | 64 |
| 134 | 55 | 1 | 0 | (70) | 44 | 71 |
| | | 1 | 1 | (70) | 44 | 71 |
| 135 | 44 | 1 | 0 | 42 | | 43 |
| | | 1 | 1 | 43 | 33 | 44 |
| 136 | 33 | 0 | 0 | 12 | 54 | 13 |
| | | 0 | 1 | 13 | | 14 |
| 137 | 54 | 0 | 0 | 64 | | 65 |
| | | 0 | 1 | 65 | 43 | 66 |
| 138 | 43 | 0 | 0 | (36) | 44 | 37 |
| | | 0 | 1 | (36) | 44 | 37 |
| 139 | 44 | 0 | 0 | 40 | | 41 |
| | | 0 | 1 | (41) | (35) | 42 |
| 140 | 35 | 1 | 0 | 22 | 53 | 23 |
| | | 1 | 1 | 23 | | 24 |
| 141 | 53 | 1 | 0 | 62 | | 63 |
| | | 1 | 1 | 63 | 45 | 64 |
| 142 | 45 | 0 | 0 | 44 | | 45 |
| | | 0 | 1 | (45) | (53) | 46 |

| GG' | | | | | | |
|---|---|---|---|---|---|---|
| p | | | | p+ 1 | | gph. |
| i | GG' | AD | DA | #G | GG' | no. |
| 132 | 35 | 0 | 0 | 20 | 54 | 21 |
| | | 0 | 1 | 21 | | 22 |
| 133 | 54 | 1 | 0 | 66 | 43 | 67 |
| | | 1 | 1 | 67 | | 68 |
| 134 | 43 | 1 | 0 | (38) | 44 | 39 |
| | | 1 | 1 | (38) | 44 | 39 |
| 135 | 44 | 1 | 0 | 42 | | 43 |
| | | 1 | 1 | 43 | 43 | 44 |
| 136 | 43 | 0 | 0 | 36 | 35 | 37 |
| | | 0 | 1 | 37 | | 38 |
| 137 | 35 | 0 | 0 | 20 | | 21 |
| | | 0 | 1 | 21 | 53 | 22 |
| 138 | 53 | 0 | 0 | 60 | | 61 |
| | | 0 | 1 | (61) | (55) | 62 |
| 139 | 55 | 0 | 0 | (68) | 44 | 69 |
| | | 0 | 1 | (68) | 44 | 69 |
| 140 | 44 | 1 | 0 | 42 | 35 | 43 |
| | | 1 | 1 | 43 | | 44 |
| 141 | 35 | 1 | 0 | 22 | | 23 |
| | | 1 | 1 | 23 | 55 | 24 |
| 142 | 55 | 0 | 0 | (68) | 44 | 69 |
| | | 0 | 1 | (68) | 44 | 69 |

FIG. 13M

©2012 Erich Schmitt (17 U.S.C. 401

| i | AD | k | DA | m | DA |
|---|---|---|---|---|---|
| 143 | 1 | 113 | 0 | | |
| | | | | | |
| 144 | 1 | | | 31 | (0) |
| | | | | | |
| 145 | | 114 | | | |
| | 0 | | 1 | | |
| 146 | | 115 | | | |
| | 1 | | 1 | | |
| 147 | 1 | 116 | 0 | | |
| | | | | | |
| 148 | 1 | 117 | 0 | | |
| | | | | | |
| 149 | 1 | 118 | 0 | | |
| | | | | | |
| 150 | 1 | | | 32 | (0) |
| | | | | | |
| 151 | | 119 | | | |
| | 0 | | 1 | | |
| 152 | | 120 | | | |
| | 0 | | 1 | | |
| 153 | 0 | 121 | 0 | | |
| | | | | | |

| FF' | | | | | | |
|---|---|---|---|---|---|---|
| p | | | | p+ 1 | | |
| i | FF' | AD | DA | #F | FF' | graph 9. |
| 143 | 53 | 1 | 0 | 62 | 55 | 63 |
| | | 1 | 1 | 63 | | 64 |
| 144 | 55 | 1 | 0 | (70) | 44 | 71 |
| | | 1 | 1 | (70) | | 71 |
| 145 | 44 | 0 | 0 | 40 | | 41 |
| | | 0 | 1 | 41 | 35 | 42 |
| 146 | 35 | 1 | 0 | 22 | | 23 |
| | | 1 | 1 | 23 | 54 | 24 |
| 147 | 54 | 1 | 0 | 66 | 33 | 67 |
| | | 1 | 1 | 67 | | 68 |
| 148 | 33 | 1 | 0 | 14 | 34 | 15 |
| | | 1 | 1 | 15 | | 16 |
| 149 | 34 | 1 | 0 | 18 | 45 | 19 |
| | | 1 | 1 | 19 | | 20 |
| 150 | 45 | 1 | 0 | (46) | (35) | 47 |
| | | 1 | 1 | 47 | | 48 |
| 151 | 35 | 0 | 0 | 20 | | 21 |
| | | 0 | 1 | 21 | 45 | 22 |
| 152 | 45 | 0 | 0 | 44 | | 45 |
| | | 0 | 1 | 45 | 53 | 46 |
| 153 | 53 | 0 | 0 | 60 | 34 | 61 |
| | | 0 | 1 | 61 | | 62 |

| GG' | | | | | | |
|---|---|---|---|---|---|---|
| p | | | | p+ 1 | | |
| i | GG' | AD | DA | #G | GG' | graph 9. |
| 143 | 44 | 1 | 0 | 42 | 35 | 43 |
| | | 1 | 1 | 43 | | 44 |
| 144 | 35 | 1 | 0 | (22) | (45) | 23 |
| | | 1 | 1 | 23 | | 24 |
| 145 | 45 | 0 | 0 | 44 | | 45 |
| | | 0 | 1 | 45 | 35 | 46 |
| 146 | 35 | 1 | 0 | 22 | | 23 |
| | | 1 | 1 | 23 | 55 | 24 |
| 147 | 55 | 1 | 0 | 70 | 34 | 71 |
| | | 1 | 1 | 71 | | 72 |
| 148 | 34 | 1 | 0 | 18 | 54 | 19 |
| | | 1 | 1 | 19 | | 20 |
| 149 | 54 | 1 | 0 | 66 | 43 | 67 |
| | | 1 | 1 | 67 | | 68 |
| 150 | 43 | 1 | 0 | (38) | 44 | 39 |
| | | 1 | 1 | (38) | | 39 |
| 151 | 44 | 0 | 0 | 40 | | 41 |
| | | 0 | 1 | 41 | 54 | 42 |
| 152 | 54 | 0 | 0 | 64 | | 65 |
| | | 0 | 1 | 65 | 33 | 66 |
| 153 | 33 | 0 | 0 | 12 | 55 | 13 |
| | | 0 | 1 | 13 | | 14 |

FIG. 13N

©2012 Erich Schmitt (17 U.S.C. 401

| i | AD | k | DA | m | DA |
|---|---|---|---|---|---|
| 154 | 0 | | | 33 | |
| | | | | | 1 |
| 155 | 0 | 122 | 0 | | |
| | | | | | |
| 156 | 0 | 123 | 0 | | |
| | | | | | |
| 157 | | 124 | 0 | | |
| | 1 | | | | |
| 158 | | | | | |
| | 1 | 125 | 1 | | |

| FF' | | | | | | |
|---|---|---|---|---|---|---|
| | p | | | p+ 1 | | |
| i | FF' | AD | DA | #F | FF' | graph 9. |
| 154 | 34 | 0 | 0 | 16 | | 17 |
| | | 0 | 1 | 17 | 54 | 18 |
| 155 | 54 | 0 | 0 | 64 | 33 | 65 |
| | | 0 | 1 | 65 | | 66 |
| 156 | 33 | 0 | 0 | 12 | 54 | 13 |
| | | 0 | 1 | 13 | | 14 |
| 157 | 54 | 1 | 0 | 66 | 33 | 63 |
| | | 1 | 1 | 67 | | 64 |
| 158 | 33 | 1 | 0 | 14 | | 15 |
| | | 1 | 1 | 15 | 55 | 16 |

| GG' | | | | | | |
|---|---|---|---|---|---|---|
| | p | | | p+ 1 | | |
| i | GG' | AD | DA | #G | GG' | graph 9. |
| 154 | 55 | 0 | 0 | 68 | | 69 |
| | | 0 | 1 | 68 | 44 | 69 |
| 155 | 44 | 0 | 0 | 40 | 33 | 41 |
| | | 0 | 1 | 41 | | 42 |
| 156 | 33 | 0 | 0 | 12 | 55 | 13 |
| | | 0 | 1 | 13 | | 14 |
| 157 | 55 | 1 | 0 | 70 | 34 | 71 |
| | | 1 | 1 | 71 | | 72 |
| 158 | 34 | 1 | 0 | 18 | | 19 |
| | | 1 | 1 | 19 | 53 | 20 |

FIG. 13O

©2012 Erich Schmitt (17 U.S.C. 401

©2012 Erich Schmitt (17 U.S.C. 401

| #F | natural Number | => dec equiv | #F end binary code | #F | natural Number | => dec equiv | binary code |
|---|---|---|---|---|---|---|---|
| 0 | 0 | 2 | 000010 | 38 | 32 | 9 | 001001 |
| 1 | 1 | 53 | 110101 | 39 | 33 | 28 | 011100 |
| 2 | 2 | 61 | 111101 | 40 | 34 | 49 | 110001 |
| 3 | 3 | 42 | 101010 | 41 | 35 | 24 | 011000 |
| 4 | 4 | 62 | 111110 | 42 | 36 | 25 | 011001 |
| 5 | 5 | 60 | 111100 | 43 | 37 | 20 | 010100 |
| 6 | 6 | 18 | 010010 | 44 | 38 | 6 | 000110 |
| 7 | 7 | 41 | 101001 | 45 | 39 | 3 | 000011 |
| 8 | 8 | 46 | 101110 | 46 | 40 | 40 | 101000 |
| 9 | 9 | 47 | 101111 | 47 | 41 | 7 | 000111 |
| 10 | 10 | 38 | 100110 | 48 | 42 | 26 | 011010 |
| 11 | 11 | 37 | 100101 | 49 | 43 | 23 | 010111 |
| 12 | 12 | 5 | 000101 | 50 | 44 | 1 | 000001 |
| 13 | 13 | 54 | 110110 | 51 | 45 | 4 | 000100 |
| 14 | 14 | 55 | 110111 | 52 | 46 | 31 | 011111 |
| 15 | 15 | 11 | 001011 | 53 | 47 | 59 | 111011 |
| 16 | 16 | 14 | 001110 | 54 | 48 | 13 | 001101 |
| 17 | 17 | 35 | 100011 | 55 | 49 | 36 | 100100 |
| 18 | 18 | 34 | 100010 | 56 | 50 | 15 | 001111 |
| 19 | 19 | 19 | 010011 | 57 | 51 | 8 | 001000 |
| 20 | 20 | 17 | 010001 | 58 | 52 | 43 | 101011 |
| 21 | 21 | 45 | 101101 | 59 | 53 | 50 | 110010 |
| 22 | 22 | 51 | 110011 | 60 | 54 | 39 | 100111 |
| 23 | 23 | 57 | 111001 | 61 | 55 | 58 | 111010 |
| 24 | 24 | 44 | 101100 | 62 | 56 | 30 | 011110 |
| 25 | 25 | 16 | 010000 | 63 | 57 | 22 | 010110 |
| | | | | 64 | 58 | 48 | 110000 |
| 28 | 26 | 52 | 101110 | 65 | 59 | 56 | 111000 |
| 29 | 27 | 33 | 100001 | 66 | 60 | 27 | 011011 |
| 30 | 28 | 29 | 011101 | 67 | 61 | 12 | 001100 |
| 31 | 29 | 32 | 100000 | 68 | 62 | 21 | 010101 |
| | | | | 69 | 63 | 10 | 001010 |
| 34 | 30 | 0 | 000000 | - | | | |
| 35 | 31 | 63 | 111111 | | | | |

FIG. 30

| #G | natural Number | => dec equiv | #G end binary code | #G | natural Number | => dec equiv | binary code |
|---|---|---|---|---|---|---|---|
| 0 | 0 | 46 | 101110 | 36 | 32 | 23 | 010111 |
| 1 | 1 | 47 | 101111 | 37 | 33 | 24 | 011000 |
| 2 | 2 | 39 | 100111 | ~ | | | |
| 3 | 3 | 6 | 000110 | 40 | 34 | 16 | 010000 |
| 4 | 4 | 48 | 110000 | 41 | 35 | 56 | 111000 |
| 5 | 5 | 44 | 101100 | 42 | 36 | 45 | 101101 |
| 6 | 6 | 14 | 001110 | 43 | 37 | 7 | 000111 |
| 7 | 7 | 60 | 111100 | 44 | 38 | 42 | 101010 |
| 8 | 8 | 40 | 101000 | 45 | 39 | 5 | 000101 |
| 9 | 9 | 30 | 011110 | 46 | 40 | 9 | 001001 |
| 10 | 10 | 38 | 100110 | 47 | 41 | 4 | 000100 |
| 11 | 11 | 13 | 001101 | 48 | 42 | 41 | 101001 |
| 12 | 12 | 50 | 110010 | 49 | 43 | 49 | 110001 |
| 13 | 13 | 20 | 010100 | 50 | 44 | 54 | 110110 |
| 14 | 14 | 37 | 100101 | 51 | 45 | 12 | 001100 |
| 15 | 15 | 26 | 011010 | 52 | 46 | 32 | 100000 |
| 16 | 16 | 36 | 100100 | 53 | 47 | 61 | 111101 |
| 17 | 17 | 59 | 111011 | 54 | 48 | 25 | 011001 |
| 18 | 18 | 31 | 011111 | 55 | 49 | 2 | 000010 |
| 19 | 19 | 11 | 001011 | 56 | 50 | 43 | 101011 |
| 20 | 20 | 22 | 010110 | 57 | 51 | 10 | 001010 |
| 21 | 21 | 28 | 011100 | 58 | 52 | 29 | 011101 |
| 22 | 22 | 27 | 011011 | 59 | 53 | 19 | 010011 |
| 23 | 23 | 1 | 000001 | 60 | 54 | 33 | 100001 |
| | | | | 61 | 55 | 52 | 110100 |
| 26 | 24 | 3 | 000011 | 62 | 56 | 53 | 110101 |
| 27 | 25 | 21 | 010101 | 63 | 57 | 8 | 001000 |
| 28 | 26 | 63 | 111111 | 64 | 58 | 15 | 001111 |
| 29 | 27 | 55 | 110111 | 65 | 59 | 51 | 110011 |
| 30 | 28 | 0 | 000000 | 66 | 60 | 18 | 010010 |
| 31 | 29 | 58 | 111010 | 67 | 61 | 57 | 111001 |
| 32 | 30 | 35 | 100011 | ~ | | | |
| 33 | 31 | 34 | 100010 | 70 | 62 | 62 | 111110 |
| ~ | | | | 71 | 63 | 17 | 010001 |

FIG. 31

| # F | | DEC equiv | binary code |
|---|---|---|---|
| 3 | 4 | | |
| 43 | 33 | 0 | 0000 |
| 43 | 43 | 1 | 0001 |
| 45 | 55 | 2 | 0010 |
| 45 | 45 | 3 | 0011 |
| 33 | 54 | 4 | 0100 |
| 33 | 33 | 5 | 0101 |
| 54 | 53 | 6 | 0110 |
| 54 | 54 | 7 | 0111 |
| 53 | 45 | 8 | 1000 |
| 53 | 53 | 9 | 1001 |
| 34 | 35 | 10 | 1010 |
| 34 | 34 | 11 | 1011 |
| 55 | 34 | 12 | 1100 |
| 55 | 55 | 13 | 1101 |
| 35 | 43 | 14 | 1110 |
| 35 | 35 | 15 | 1111 |

FIG. 34A

| # G | | DEC equiv | binary code |
|---|---|---|---|
| 3 | 4 | | |
| 45 | 45 | 0 | 0000 |
| 45 | 55 | 1 | 0001 |
| 43 | 43 | 2 | 0010 |
| 43 | 33 | 3 | 0011 |
| 54 | 54 | 4 | 0100 |
| 54 | 53 | 5 | 0101 |
| 33 | 33 | 6 | 0110 |
| 33 | 54 | 7 | 0111 |
| 53 | 53 | 8 | 1000 |
| 53 | 45 | 9 | 1001 |
| 34 | 34 | 10 | 1010 |
| 34 | 35 | 11 | 1011 |
| 55 | 55 | 12 | 1100 |
| 55 | 34 | 13 | 1101 |
| 35 | 35 | 14 | 1110 |
| 35 | 43 | 15 | 1111 |

FIG. 34B

ABSTRACTION AND DE-ABSTRACTION OF A DIGITAL DATA STREAM

CLAIM OF PRIORITY

This application claims priority under 35 U.S.C. § 119(e) to provisional U.S. Patent Application 61/675,373, filed on Jul. 25, 2012, entitled: "Abstraction and De-Abstraction of a Digital Data Stream", the entire contents of which are hereby incorporated by reference.

COPYRIGHT NOTICE

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

BACKGROUND

This disclosure relates to computer-based computational techniques involving random and non-random data sequences for use with various applications.

For example, known techniques for data compression are redundancy-based data compression procedures. Such techniques include both lossy and lossless data compression techniques. Typically, lossless data compression allows for about a 1:1 compression ratio for random data, and about 2:1 and less for minimal data loss or higher compression with concomitant higher loss, for non-random data sequences compression ratios. These ratios result because most compression techniques are statistically based, and thus the compression ratio dependent on the statistical distribution of the zeros (0) and ones (1) in the data being compressed.

Cryptography is widely used in modern systems and communications. Among the known types of cryptography are symmetric-key cryptography and public key cryptography. In symmetric key encryption both sender and receiver share the same key (or different keys that are related in an easily computable way). Symmetric key ciphers are implemented as either block ciphers or stream ciphers. A block cipher enciphers input in blocks of plaintext as opposed to individual characters, the input form used by a stream cipher. Stream ciphers, in contrast to the 'block' type, produce an arbitrarily long stream of key material, which is combined with the plaintext bit-by-bit or character-by-character. In a stream cipher, the output stream is produced based on a hidden internal state which changes as the cipher operates. That internal state is initially set up using the secret key.

In contrast to symmetric-key, another type of cryptography is public-key cryptography. In public key cryptography there is a private key and a public key. The public key is freely distributed, while its paired private key is kept secret. In a public-key encryption, the public key is used for encryption, while the private or secret key is used for decryption.

Cryptographic hash functions are a third type of cryptographic algorithm. They take a message of any length as input, and output a short, fixed length hash which can be used in (for example) a digital signature. For good hash functions, it should be very difficult to find two messages that produce the same hash.

Message authentication codes (MACs) are much like cryptographic hash functions. In a message authentication code, a secret key is applied to the message to produce a MAC or a MAC tag. The message and MAC tag are transmitted, and a secret key at a receiver is used to authenticate the hash value (MAC) upon receipt. If the same secret keys were used and if the message was not altered then the receiver can have confidence that the message received was the actual message sent by the authentic sender.

Transmission of data across networks is widely used. Exemplary transmission techniques involve packet mode transmission and circuit switched networks. Generally a formatted unit of data includes a header that contains address and control information and a payload that contains data. Packets and cells are common examples of such formatted units of data.

Memory and storage are also widespread. Memories are generally regarded as semiconductor based and often used for high speed random access. Memories are typically used in main memory and cache memory. In contrast, storage systems are typically slower speed and involve optical or magnetic storage devices such as disk storage. However, some types of storage systems that are finding more acceptance are semiconductor based. Generally, storage systems are persistent meaning that data are not lost when power is removed.

Virtual memory is a memory management technique that virtualizes various forms of computer data storage (such as random-access memory and disk storage), allowing a program to be designed as though there is only one kind of memory, "virtual" memory, which behaves like directly addressable read/write memory (RAM).

Hash functions are techniques that map large data sets of variable length, called keys, to smaller data sets of a fixed length. The results of applying a hash function are, e.g., hash values or hashes. These types of hash functions are not to be confused with cryptographic hash functions discussed above.

SUMMARY

Described is a process of abstraction-de-abstraction of digital information from a data stream. Abstraction reduces a bit stream of a finite, yet arbitrary length or size without the loss of any data. De-abstraction recovers from an abstracted bit stream the finite original data bit string without the loss of any data. Abstraction/de-abstraction is independent of the statistical distribution and length of the original data bit string.

According to an aspect of the present invention, a device implemented method of producing a representation of an input bit string to reduce the size of the string, includes providing to a device an input string having a finite length, calculating by the device from the input string a set of abstraction codes and returning by the device the set of abstraction codes as the reduced size representation of the input string.

According to an additional aspect of the present invention, a device for producing a representation of an input bit string includes a processor, memory in communication with the processor, and logic to configure the processor to receive the input bit string having a finite length, calculate from the input bit string a set of abstraction codes and return the set of abstraction codes as a reduced size representation of the input string.

According to an additional aspect of the present invention, a computer program product tangibly stored on a computer readable storage device for producing a representation of an input bit string includes instructions for causing a processor to provide the input string having a finite length, calculate from the input string a set of abstraction codes and return the set of abstraction codes as a reduced size representation of the input string.

Embodiments may include one or more of the following as well as other features.

Calculating the set of abstraction codes includes iteratively determining a set of functions based on bits in the input string, and when the length of the input bit string has been reached by the iterative determining, transforming by the device the final set of functions into the abstraction codes. The set of the abstraction codes and the length L of the input bit string is the reduced size representation of the input bit string. The set of codes are bit codes and the set of bit codes being two codes with each code being six bits in length. The set of codes are bit codes and the set of bit codes being two codes with each code being five bits in length. The set of codes are bit codes and the set of bit codes being two codes with each code being four bits in length. A table is included in an application program that executes on a processor to perform abstraction, the table including values of functions for a present set of inputs and values of a next set of inputs. The aspects further include iteratively choosing the functions by evaluating each bit of the input bit string according to a set of present inputs and initial state to provide the functions and the next set of inputs. Calculating the abstraction codes includes iteratively evaluating a DA bit according to a bit position of the input bit string, by testing for a limit condition for the bit position when a limit condition is not encountered, using the data bit from the input bit string according to the bit position; and when a limit condition is encountered, substituting for the data bit from the input bit string according to the bit position, a limit bit from the limit bit table according to an index value of the limit string. A limit condition occurs when for a present input of the AD bit or the DA bit, the computed functions have the same values for either the AD and/or the DA input bits.

According to an additional aspect of the present invention, a device implemented method of producing a reduced size representation of an input bit string of finite length includes receiving by a device an input bit string of a finite length L, iteratively, calculating by the device, according to the length L of the input bit string, a set of functions, by determining a data bit value according to permissibility conditions; when a permissible condition is encountered, obtaining interim values of the set of functions from a table, with the interim values of the set of functions being the next states of the functions; and when the length of the input bit string has been reached by the iterative calculating producing a final set of functions, transforming by the device the final set of functions into abstraction codes, with together with the length L of the input bit string provides abstracted representation of the input bit string.

Aspects also include device and computer program products.

Embodiments may include one or more of the following as well as other features.

The set of codes are bit codes and the set of bit codes being two codes with each code being six bits in length. The set of codes are bit codes and the set of bit codes being two codes with each code being five bits in length. The set of codes are bit codes and the set of bit codes being two codes with each code being four bits in length. The table is included in an application program that executes on a processor to perform the method on the device. Also included is iteratively determining the functions by evaluating each bit of the input bit string according to the set of AD bits and initial state values to provide subsequent functions and next state values. Also included is retrieving a limit bit from a table of limit bits, where the number of bits in the limit bit table is indexed from an initial index to L/3, forming an AD bit string of bits with the number of bits in the AD bit string is indexed from an initial index to (L+L/3). Testing a data bit further includes iteratively determining a DA bit according to a bit position of the input bit string, by testing for a limit condition for the bit position when a limit condition is not encountered, using the data bit from the input bit string according to the bit position, and when a limit condition is encountered, substituting for the data bit from the input bit string according to the bit position, a limit bit from the limit bit table according to an index value of the limit string. A limit condition occurs when for a present input of the AD bit or the DA bit, the computed functions #F and/or #G have the same values for either the AD and/or the DA input bits. The input bit string has an index k, and determining when the index k reaches the length L of the input bit string; and when k has reached the length L, outputting final values of the computed functions #F and #G.

The aspects further include outputting the transformed abstraction codes that along with the length L provide the abstracted representation of the input bit string. The aspects further include loading the table into in the device, and wherein the table includes a data structure stored in said memory, the data structure including a table including plural rows, with each row representing a function and with each row including a set of present inputs, including a state value, an AD value and a DA value, and a next set of present inputs including a set of transition values for each transition level of the function. The aspects further include generating the table by the device, storing the table as a data structure in memory, the data structure including a table including plural rows, with each row representing a function and with each row including a set of present inputs, including a state value, an AD value and a DA value, and a next set of present inputs including a set of transition values for each transition level of the function. The aspects further include determining the length L of the input bit string. The length L of the input bit string is received. The length L of the input bit string is fixed.

According to an additional aspect of the present invention, a memory device for storing a table accessible by a computer program product being executed by a processor that abstracts a set of codes to represent an input bit string or de-abstracts a set of codes over a string length to recover an input bit string, the memory includes a data structure stored in said memory, the data structure including a table including plural rows, with each row representing a function and with each row including a set of present inputs, including a state value, an AD value and a DA value and a next set of present inputs including a set of transition values for each transition level of the function.

Embodiments may include one or more of the following as well as other features.

The table of the data structure is a first sub-table for a first, function type comprising plural rows for the first function type, and the data structure includes a second sub-table for a second different function type, the second sub-table further including plural rows, with each row representing a function of the second function type and with each row including columns that include a set of present inputs, including a state value, an AD value and a DA value, and a next set of present inputs including a set of transition values for each transition level of the second function type. The function represented by the plural rows of the table is a first function type and the columns are first columns associated with the first function type, and the rows further comprise second columns, associated with a second, different function type, the second columns including: a set of present inputs, including a state value, an AD value and a DA value; and a next set of present inputs including a set of transition values for each transition level of the second function. The table includes rows that have permissible and non-permissible values for the function. The table includes only rows that have permissible values for the function. The sub-tables each include rows that have permissible and non-permissible values for at least one of the first and second function types. The sub-tables each include only rows that have permissible values for the first and second function types. The table includes rows that have permissible and non-permissible values for at least one of the first and second function types. The table includes only rows that have permissible values for the first and second function types.

According to an additional aspect of the present invention, a device implemented method for recovering an input bit string that has a finite length L from a set of abstraction codes includes receiving by a device the set of abstraction codes, transforming the set of abstraction codes into functions, iteratively, calculating by the device, interim functions, iterating over the length L of the input bit string, by testing a DA bit according to permissibility conditions, determining the correct DA bit value when a permissible condition was encountered, substituting a limit string value for the DA bit when a non-permissible condition was encountered, storing either the substituted or determined correct DA bit, determining next interim values of the functions; and when the length of the input bit string has been reached by the iterative calculating, transferring the recovered input bit string.

According to an additional aspect of the present invention, a device implemented method for recovering an input bit string that has a finite length L from a set of abstraction codes, the method includes receiving by a device the set of abstraction codes, transforming the set of abstraction codes into functions, iteratively, calculating interim functions, by the device iterating over the length L of the input bit string determining next interim values of the functions, and when the length of the input bit string has been reached by the iterative calculating, transferring the recovered input bit string.

According to an additional aspect of the present invention, a device for recovering an input bit string that has a finite length L from a set of abstraction codes, the device includes a computing element configured to receive the set of abstraction codes, transform the set of abstraction codes into functions, iteratively calculate interim functions, iterating over the length L of the input bit string, by test a DA bit according to permissibility conditions, determine the correct DA bit value when a permissible condition was encountered, substitute a limit string value for the DA bit when a non-permissible condition was encountered, store either the substituted or determined correct DA bit, determine next interim values of the functions; and when the length of the input bit string has been reached by the iterative calculating, transfer the recovered input bit string.

According to an additional aspect of the present invention, a device for recovering an input bit string that has a finite length L from a set of abstraction codes, the device includes a computing element configured to receive the set of abstraction codes, transform the set of abstraction codes into functions, iteratively, calculate interim functions, iterating over the length L of the input bit string to determine next interim values of the functions; and when the length of the input bit string has been reached, transfer the recovered input bit string.

According to an additional aspect of the present invention, a computer program product stored on a computer readable storage device to recovering an input bit string that has a finite length L from a set of abstraction codes, the computer program product includes instructions to receive the set of abstraction codes, transform the set of abstraction codes into functions, iteratively calculate interim functions, iterating over the length L of the input bit string, by test a DA bit according to permissibility conditions, determine the correct DA bit value when a permissible condition was encountered, substitute a limit string value for the DA bit when a non-permissible condition was encountered, store either the substituted or determined correct DA bit, determine next interim values of the functions; and when the length of the input bit string has been reached by the iterative calculating, transfer the recovered input bit string.

According to an additional aspect of the present invention, a computer program product stored on a computer readable storage device to recovering an input bit string that has a finite length L from a set of abstraction codes, the computer program product includes instructions to receive the set of abstraction codes, transform the set of abstraction codes into functions, iteratively, calculate interim functions, iterating over the length L of the input bit string to determine next interim values of the functions; and when the length of the input bit string has been reached, transfer the recovered input bit string.

According to an additional aspect of the present invention, a device implemented method of storing an input bit stream of finite length includes receiving by a storage device an input bit string of a finite length L, producing by the storage device a set of abstraction codes using an abstraction engine, storing by the device the set of abstraction codes into a storage medium, the set of codes corresponding to an abstracted representation of the input string.

A storage device includes an interface configured to receive an input bit string of a finite length L, an abstraction engine configured to produce a set of abstraction codes, a storage medium to store the set of codes corresponding to an abstracted representation of the input string.

Aspects also include a computer program product.

Embodiments may include one or more of the following as well as other features.

The set of codes are two codes with each code being six bits in length. The set of codes are two codes with each code being five bits in length. The set of codes are two codes with each code being four bits in length. The data store is selected from the group consisting of an optical medium a magnetic medium and a semiconductor based medium. The abstraction engine is configured for iteratively, calculating by the abstraction engine a set of function codes, by determining a data bit value according to permissibility conditions; when a permissible condition is encountered, obtaining interim values of the set of function codes from a table; and when the length of the input bit string has been reached by the iterative calculating producing a final set of function codes, transforming by the engine the final set of function codes into the abstraction codes. The aspects further include determining the length of the input bit string. The aspects further include receiving the length of the input bit string. Determining permissibility conditions includes determining when a limit condition occurs. The input bit string has an index k, and the aspects further include determining when the index k reaches the length L of the input bit string; and when k has reached the length L, outputting final values of the computed function codes #F and #G.

According to an additional aspect of the present invention, a device implemented method of transmitting data over a network includes receiving by a device an input bit string of a finite length L, producing by the device a set of abstraction codes using an abstraction engine, forming a formatted unit of data comprising connection information and payload with the payload comprising the set of abstraction codes that represent the input bit string.

According to an additional aspect of the present invention, a network device includes an interface configured to receive an input bit string of a finite length L, an abstraction engine configured to produce a set of abstraction codes, a storage device to store the set of abstraction codes corresponding to an abstracted representation of the input string; and a formatted unit of data forming engine that produces a formatted unit of data from a payload that comprises the set of abstraction codes retrieved from the storage device and connection information.

Aspects also include a computer program product.

Embodiments may include one or more of the following as well as other features.

The set of abstraction codes are two abstraction codes with each code being six bits in length. The set of abstraction codes are two abstraction codes with each code being five bits in length. The set of abstraction codes are two abstraction codes with each code being four bits in length. The aspects further include storing by the device the set of abstraction codes into a storage medium, the set of abstraction codes corresponding to an abstracted representation of the input string, retrieving the set of abstraction codes.

The abstraction engine is configured for iteratively, calculating by the abstraction engine a set of function codes, by iteratively retrieving a prior value of the function codes stored in memory, iteratively evaluating a data bit value according to permissibility conditions; when a permissible condition is encountered, obtaining, new values of the set of function codes from a table; and when the length of the input bit string has been reached producing a final set of function codes, transforming by the engine the final set of function codes into the abstraction codes in the payload.

The aspects further include determining the length of the input bit string. The aspects further include receiving the length of the input bit string. The aspects further include determining permissibility conditions by determining when a limit condition occurs. The input bit string has an index k, the aspects further include determining when the index k reaches the length L of the input bit string; and when k has reached the length L, outputting final values of the computed function codes. Storage device store the abstraction codes according to a flow. The formatted unit of data is a fixed length cell. The formatted unit of data is a packet. The formatted unit of data is a frame.

According to an additional aspect of the present invention, a device implemented method of encrypting an input bit stream of finite length includes receiving by a device the input bit string of a finite length L, abstracting from the input bit string by an abstraction engine in the device, a set of abstraction codes, forming from the abstraction an encryption key, sending by the device the set of abstraction codes to a recipient application, the set of codes corresponding to an abstracted, encrypted representation of the input string.

Aspects also include a device and a computer program product.

Embodiments may include one or more of the following as well as other features.

The set of codes are two codes with each code being six bits in length. The set of codes are two codes with each code being five bits in length. The set of codes are two codes with each code being four bits in length. The aspects further include sending the encryption key to the recipient application. The aspects further include producing the encryption key and exchanging the encryption key with the recipient application in a secure manner. The encryption key is selected from a limit string, an address string and a code transformation. Forming from the abstraction the encryption key further includes producing of at least one of a random limit string, a random address string and a random permutation for code transformation, securing the produced at least one as the encryption key. Forming from the abstraction the encryption key further includes producing a random permutation for code transformation, securing the produced random permutation as the encryption key. Securing the produced random permutation as the encryption key comprises encrypting the encryption key with a different encryption algorithm. Aspects include sending the length of the input bit string to the recipient application. The abstraction engine is configured for iteratively, calculating by the abstraction engine interim function codes, by determining a data bit value according to permissibility conditions; when a permissible condition is encountered, obtaining interim values of the set of function codes from a table; and when the length of the input bit string has been reached by the iterative calculating producing a final set of function codes, transforming by the engine the final set of function codes into the abstraction codes. The aspects further include enabling user selection of at least one of limit string, address string and permutation of a code transformation from which the abstraction engine produces the encryption key.

According to an additional aspect of the present invention, a device implemented method of producing a hash includes receiving a key that corresponds to a stored input bit string of a finite length L, producing by the device a set of abstraction end words, storing by the device the set of abstraction end words, the set of end words corresponding to an abstracted representation of the key.

Aspects also include a device and a computer program product.

Embodiments may include one or more of the following as well as other features.

The set of codes are two codes with each code being six bits in length. The set of codes are two codes with each code being five bits in length. The set of codes are two codes with each code being four bits in length. The aspects further include applying the key through the abstraction engine to produce the ends according to i end-0 #F3,4 and #G3,4 each containing 4 bits=8 bits=order 0-7, i end-1,#F3,4 and #G3,4 each containing 4 bits=8 bits=order 8-15, i end-2,#F3,4 and #G3,4 each containing 4 bits=8 bits=order 16-23, i end-3, #F3,4 and #G3,4 each containing 4 bits=8 bits=order 24-31; and storing the end words in storage. The aspects further include iteratively, a set of abstraction codes using the abstraction engine to represent the input string. The aspects further include storing the set of abstraction codes as the representation of the input bit string. The aspects further include receiving the input bit string and storing the input string.

According to an additional aspect of the present invention, a device implemented method of producing a cryptographic hash includes providing to a device an input string having a finite length, calculating by the device from the input string a set of abstraction codes; and returning by the device the set of abstraction codes as the cryptographic hash.

According to an additional aspect of the present invention, a device configuration for abstraction includes a storage device having storage for one or more entries where the one or more entries are data units comprising plural bits in a like plurality of bit positions; and a like plurality of abstraction units fed by the storage device with each bit position coupled to one of abstraction engines, with the abstraction engines configured to produce plural abstraction codes according to bit position.

According to an additional aspect of the present invention, a device configuration for de-abstraction includes a storage device having storage for plural abstraction codes arranged according to bit positions of the storage device corresponding to data units that were used to produce the abstraction codes and a like plurality of de-abstraction units fed by the storage device with each bit position coupled to one of the de-abstraction engines, with the de-abstraction engines configured to recover plural bits from data units according to bit position The abstraction/de-abstraction can be applied to any finite sequence of binary data bits. A data bit string of finite arbitrary length L can be reduced via the abstraction process to a string of L/twelve (12) bits. That is, the abstraction ratio for any data bit string is L/12. For instance, a data bit string of one kilobyte (8192 bits or $2^{13}$) will be reduced via the ratio 8192/12 to a rate of 682:1. The abstraction rate is therefore 682:1. A data bit string of a terabyte (8.79 times $10^{12}$ or $2^{43}$) when reduced via the abstraction process to the twelve bit string will represent an abstraction rate of 733, 007,751,900: (7.33 times $10^{11}$):1. This reduction ratio of L/12 is not possible or conceivable with presently known procedures.

The advantages of the abstraction-de-abstraction processes are many. The above examples of abstraction rates will provide significant improvements and changes for many applications. A sampling of areas of application of these processes include binary data processing and data storage, large sequential memories (electronic implementation of hard disks and large memory backup systems), acoustic and video bandwidth reduction in data transmissions, cryptography (extreme security), and all similar related applications.

The abstraction-de-abstraction process has no relationship whatsoever with redundancy-based 'data compression procedures'. Prior art lossless data compression techniques typically allow a 1:1 compression rate of random data bit strings and for nonrandom data bit strings a compression ratio is dependent of the statistical distribution of the zeros (0) and ones (1) located in the bit strings. This is because commonly known data compression techniques are dependent on the level of redundancy of the data bit strings. The most commonly reported rates are 2:1 and less.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 4 is a table that depicts an arbitrary input data bit string of length L and data bit index (also referred to herein as an input string).

FIG. 5A is a table that depicts a limit data string.

FIG. 5B is a table that depicts an address string.

FIG. 6 is a table that depicts a six-group.

FIG. 7 is a table that depicts a factor structure for abstraction.

FIG. 8 is a diagram that shows the relationship of FIGS. 8A-8F.

FIGS. 8A-8F are tables that depict a factor structure for de-abstraction.

FIGS. 9-1 to 9-72 are diagrams that depict transition graphs.

FIG. 10 is a diagram that shows the relationship of FIGS. 10A-10D.

FIGS. 10A-10D are tables that depict state transitions and output functions.

FIGS. 11A and 11B are tables that depict permissible possible ending functions for #F and #G functions, respectively, using a particular one of 64! possible permutations for transformations to minimum binary code.

FIGS. 11C and 11D depict an alternative permissible, possible ending #F and #G functions with transformations to minimum binary code.

FIGS. 11E and 11F depict a still further alternative permissible, possible ending #F and #G functions with transformations to minimum binary code.

FIGS. 11G-11J alternative permissible, possible ending #F and #G functions used in storage.

FIGS. 12A-12B are tables that depict non permissible outputs for functions #F; #G.

FIG. 13 is a diagram with ellipsis showing the relationship of FIGS. 13A to 13O.

FIGS. 13A to 13O depict tables for states FF' and GG' for indices i=1-158 for abstraction of the exemplary input string of FIG. 4.

FIGS. 30 and 31 are tables that depict exemplary transformation permutations for the hashing arrangement.

FIG. 34A-34B depict tables for #F and #G functions used for providing a hashing function.

DETAILED DESCRIPTION

Figure 1:
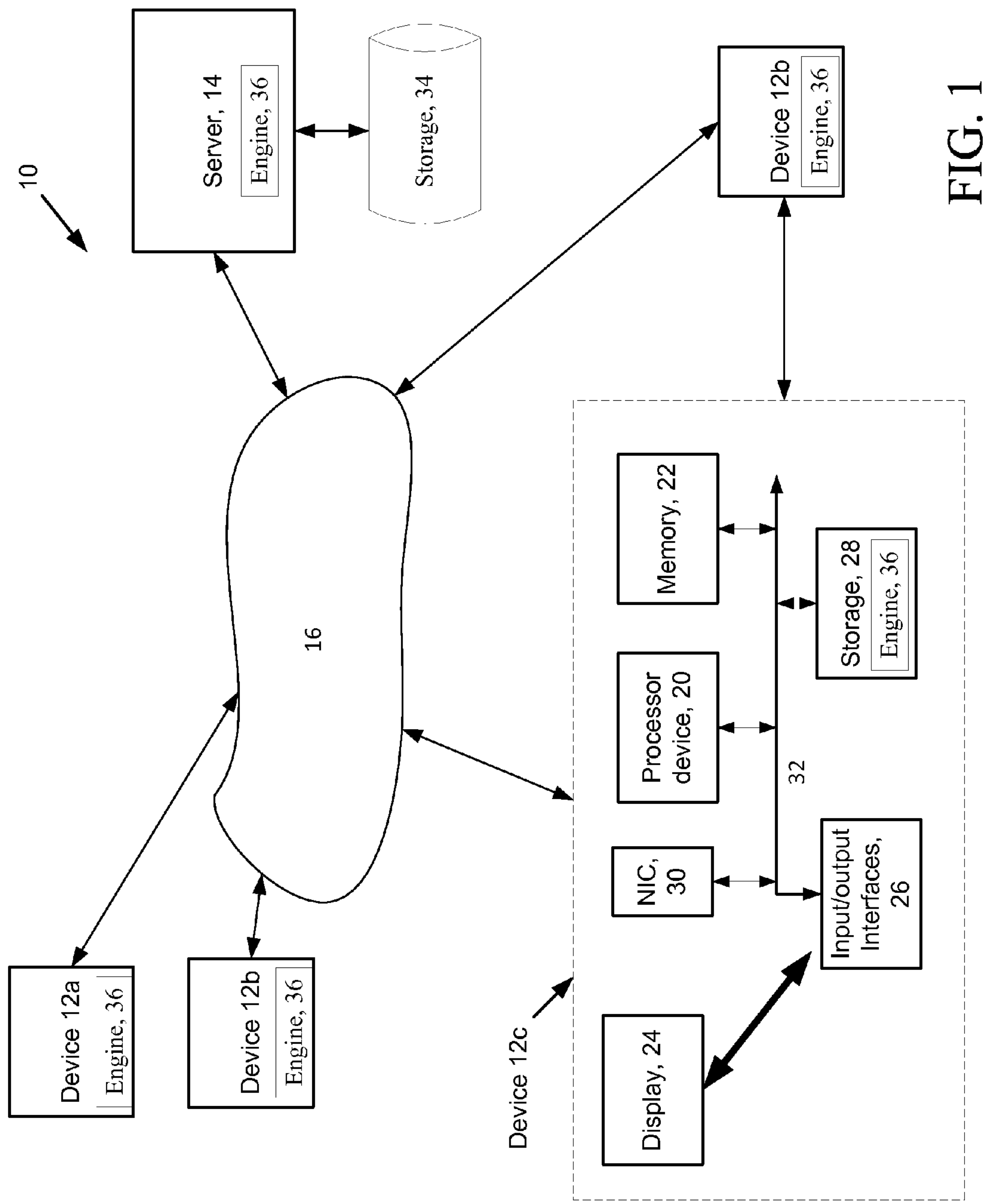
FIG. 1 depicts a system for abstraction/de-abstraction.

Referring now to FIG. 1, a system 10 is shown comprised of plural, diverse computing devices. The devices 12*a*-12*c* of the system 10 typically include (as shown for device 12*c*) a processor 20, memory 22, and storage 28, with user interfaces 26 for devices (e.g., display 24, mouse, etc.) and network interface 30 all coupled via one or more buses 32 with an abstraction/de-abstraction engine 36, shown stored in storage 28.

The abstraction/de-abstraction engine 36 will be discussed below. However, the engine 36 can be used in and/or with various computing devices, such as a server 14 or hand-held devices such as 12*a* or consumer and/or special purpose devices 12*b*, as shown. The abstraction/de-abstraction engine 36 can be implemented in software, firmware, hard wired logic or other forms such as a co-processor or as a separate card or combinations thereof. The system 10 is illustrated to show examples of how bit streams can be received and/or produced by one device that would provide an abstracted representation of the bit stream, and send the representation via a network to another one of the devices for de-abstraction and recovery of the original input bit string. Additionally, other mechanisms can be used. For example, a single engine can receive input bit strings and abstract the stream and later de-abstract the representation to produce the original input stream.

Figure 2:
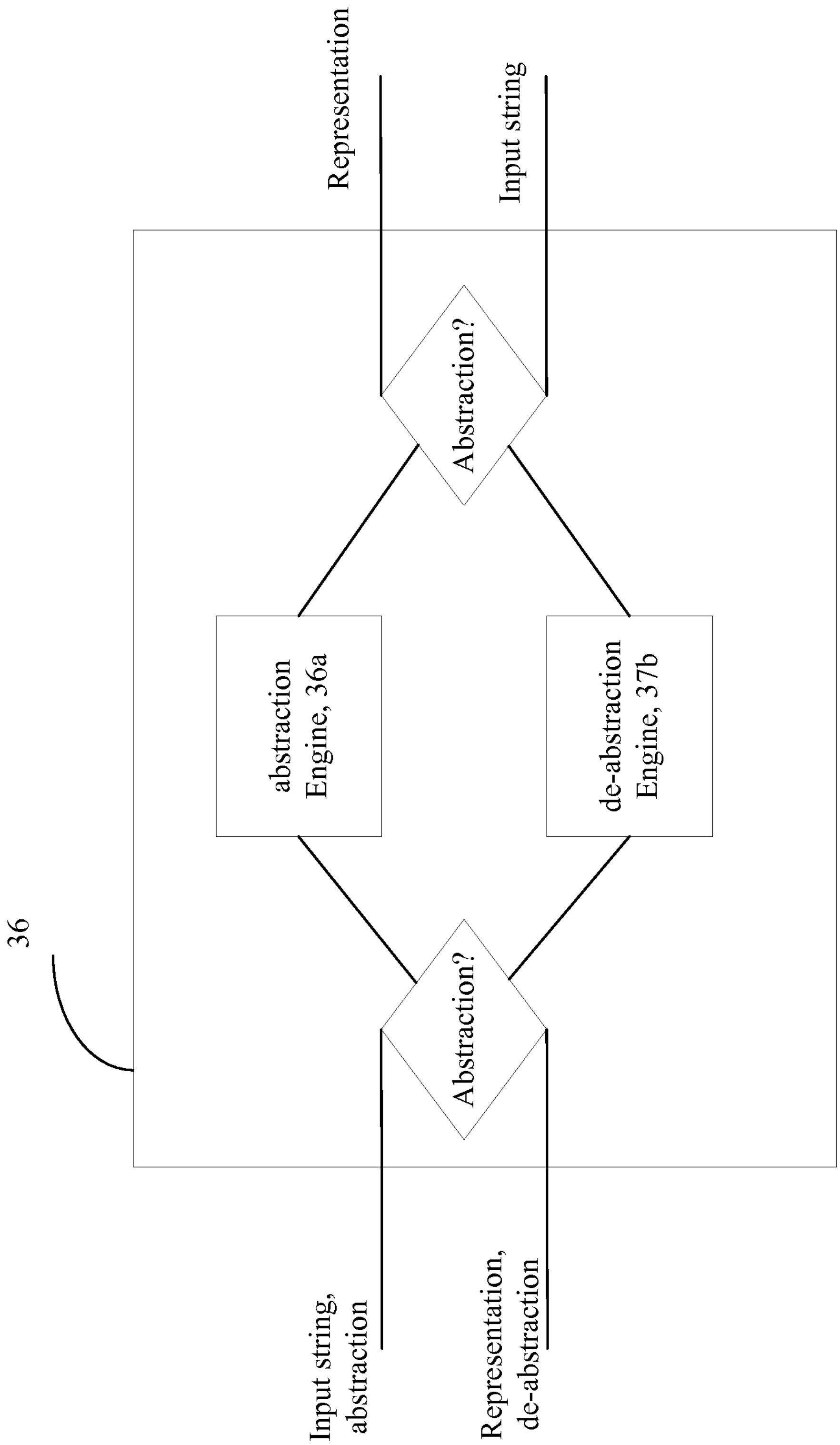
FIG. 2 is block diagram that depicts an abstraction/de-abstraction engine.

Referring now to FIG. 2, the system 10 has one or more of the devices including an abstraction/de-abstraction engine 36. The abstraction/de-abstraction engine 36 includes an abstraction engine 37*a* and a de-abstraction engine 37*b* that are implemented in software, firmware, hard wired logic or other forms such as a co-processor or separate card or combinations thereof. The abstraction/de-abstraction engine 36 is illustrated as including two separate engines, the abstraction engine 37*a* and the de-abstraction engine 37*b*. In some embodiments, the abstraction engine 37*a* and the de-abstraction engine 37*b* share code or circuitry, as appropriate, whereas in other embodiments, the abstraction engine 37*a* and the de-abstraction engine 37*b* are implemented in a combination as a dual purpose engine. In still other embodiments, the abstraction engine 37*a* and the de-abstraction engine 37*b* are implemented separately. Therefore, the reference number 36 can refer to any of these specific implementations or others as will be apparent from the context.

In some implementations, the abstraction/de-abstraction engines 36*a*, 37*b* will include logic and a table. The table is of a type described in FIG. 10, an example implementation of which is depicted in FIGS. 13A-13O, a look-up table that can be used to find values of functions given a set of present inputs and also find a next set of inputs (present +1). The logic will be of a type described below to access the table and apply the algorithm to data inputs, etc.

The abstraction/de-abstraction engine 36 when it receives an input bit string to be abstracted has that input bit string processed by the abstraction engine 37*a* and provides as an output a representation of the input bit string. The representation is two code elements (each element being, e.g., 4, 5 or 6 bits in length) and input bit string length. The code elements produced by abstraction are also generally referred to herein as "abstraction codes." The abstraction/de-abstraction engine 36 when it receives the two codes elements each element being, e.g., 4, 5 or 6 bits in length, and either receiving or determining or otherwise knowing the original input bit string length processes those inputs in the de-abstraction engine 37*b* to recover the original input bit string. The abstraction/de-abstraction engine 36 is configured for either abstraction or de-abstraction either based on an external input, such as a call or invocation, etc. of a routine to provide the requested process or by the particular use of the engine 36. For example, other ways are for the engine 36 to recognized abstraction or de-abstraction requests based on the input and so forth.

It is to be appreciated that in the description below abstraction and de-abstraction operate on or recover serial bit streams. Some applications work with bytes, words, long words, quad words etc. For those applications, the data in these formats if not in a serial format when received, are converted to a serial format to provide the input bit string, prior to abstraction, and the recovered input bit string can be converted back to the original format subsequent to de-abstraction. Conversion techniques to convert from parallel to serial formats and back are generally conventional and well-known. Alternatively, the abstraction and de-abstraction can be implemented in a parallel configuration as will be discussed below in conjunction with FIGS. 37-39, which shows examples of parallel configurations.

Figure 3A:
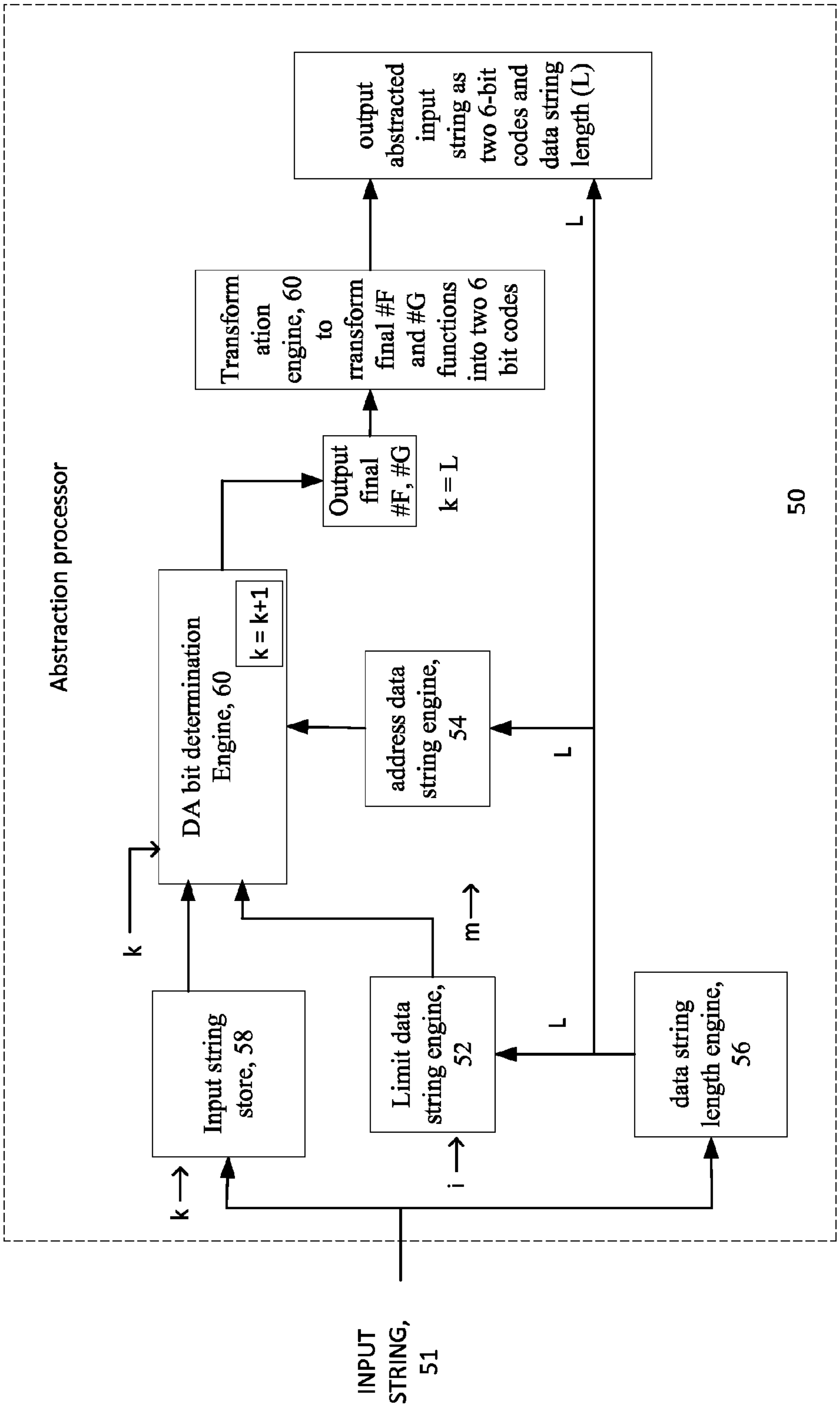
FIG. 3A is block diagram that depicts an abstraction engine.

Referring now to FIG. 3A an abstraction engine 50 is shown. (A de-abstraction engine is described below in conjunction with FIG. 18 and a combined process is described in FIGS. 20A and 20B.) The abstraction engine 50 is executed by processor 12 (FIG. 1) or can be implemented in hardcoded logic, firmware, etc., as appropriate. The abstraction engine 50 includes a limit bit string engine 52, an address bit string engine 54 and a data string length engine 56.

An input bit string 51 is fed to the abstraction engine 50 and typically is stored in a buffer that can reside in memory or computer storage, as in FIG. 1. The abstraction engine 50 forms in the limit bit string engine 52, the limit bit string as in FIG. 4 below from the input bit string length, and forms in the address bit string engine 54 the address bit string as in FIG. 5 using the input bit string length. The input bit string length L is either supplied as an input (not shown) along with the input bit string 51 or is determined by the data string length engine 56, as shown. In general, each different length of an input string will have a different length of limit and AD strings.

The abstraction engine 50 determines DA bits in a DA bit determination engine 60 by evaluation of each bit of the input bit string and detecting non-permissible states that require substitution of a limit data bit for a calculated DA bit. That is, the process starts at the initial bit of the input data string, k=1 and continues to k=L selecting the DA bit either from the input bit string or the limit bit string according to evaluated limit conditions, producing functions #F and #G (function types) as will be described below. Functions #F and #G are used in evaluation of the next bit in the input bit string. Final values (end values) of #F and #G are arrived at when the bit at k=L has been evaluated and these end values of #F and #G are used in producing the abstraction codes that represent the input string, as will be discussed below.

When the DA bit determination engine 60 has evaluated the produced functions #F, #G to k=L, the produced functions #F, #G at k=L are considered the final functions. That is, the entire input stream has been evaluated (i.e., evaluated from k=1 to k=L) and the abstraction engine 50 uses a transformation engine 64 to transform the final (or end) #F and #G functions into two bit codes. Exemplary bit code lengths include two six bit codes, two five bit codes and two four bit codes. These transformed codes along with the original input data length (L) are outputted, as a compact representation, i.e., "compressed" representation of the original input data string, meaning a representation of the original input with a reduction in the number of bits.

Figure 3B:
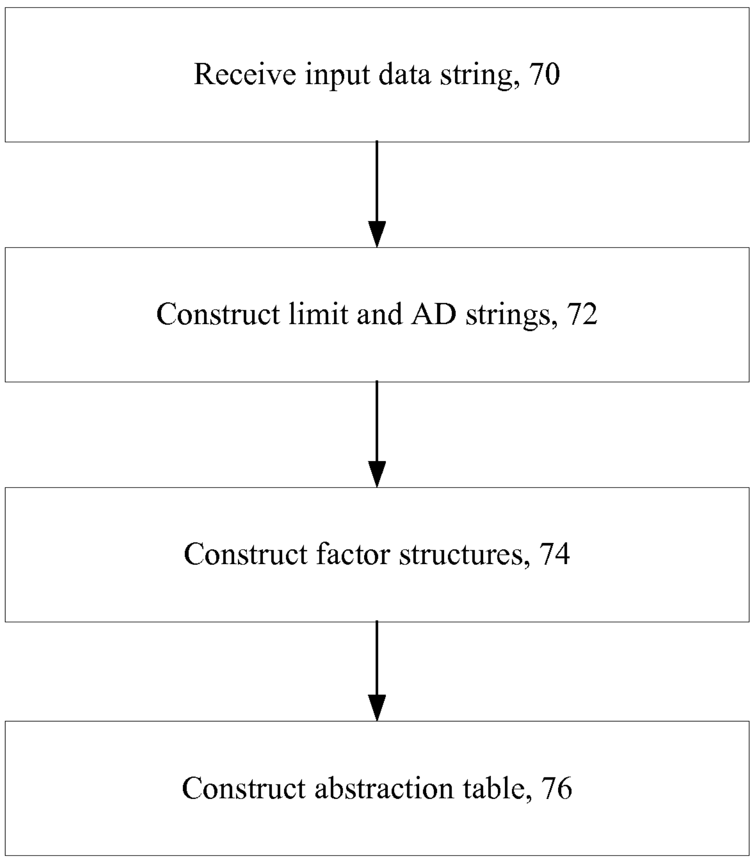
FIG. 3B is a flow chart that depicts a process for constructing an abstraction table for use in abstraction.

Referring now to FIG. 3B, the system 10 receives 70 the input bit string and from the length of that data string constructs 72 the limit and AD strings. These strings can be stored in tables and used in de-abstraction. Factor structures used for abstraction are also constructed 74 by use of group theory, discussed below generally, and a new recursion concept in particular, here by use of a non-commutative six-group, as discussed below. From these constructs an abstraction table is produced 76. The abstraction table (FIG. 10) can be generated on the fly or supplied with an application (software or hardware) or can be loaded into devices through applications that will abstract input bit strings and de-abstract representations of the input bit strings to recover the original input bit strings.

Figures 1, 9:
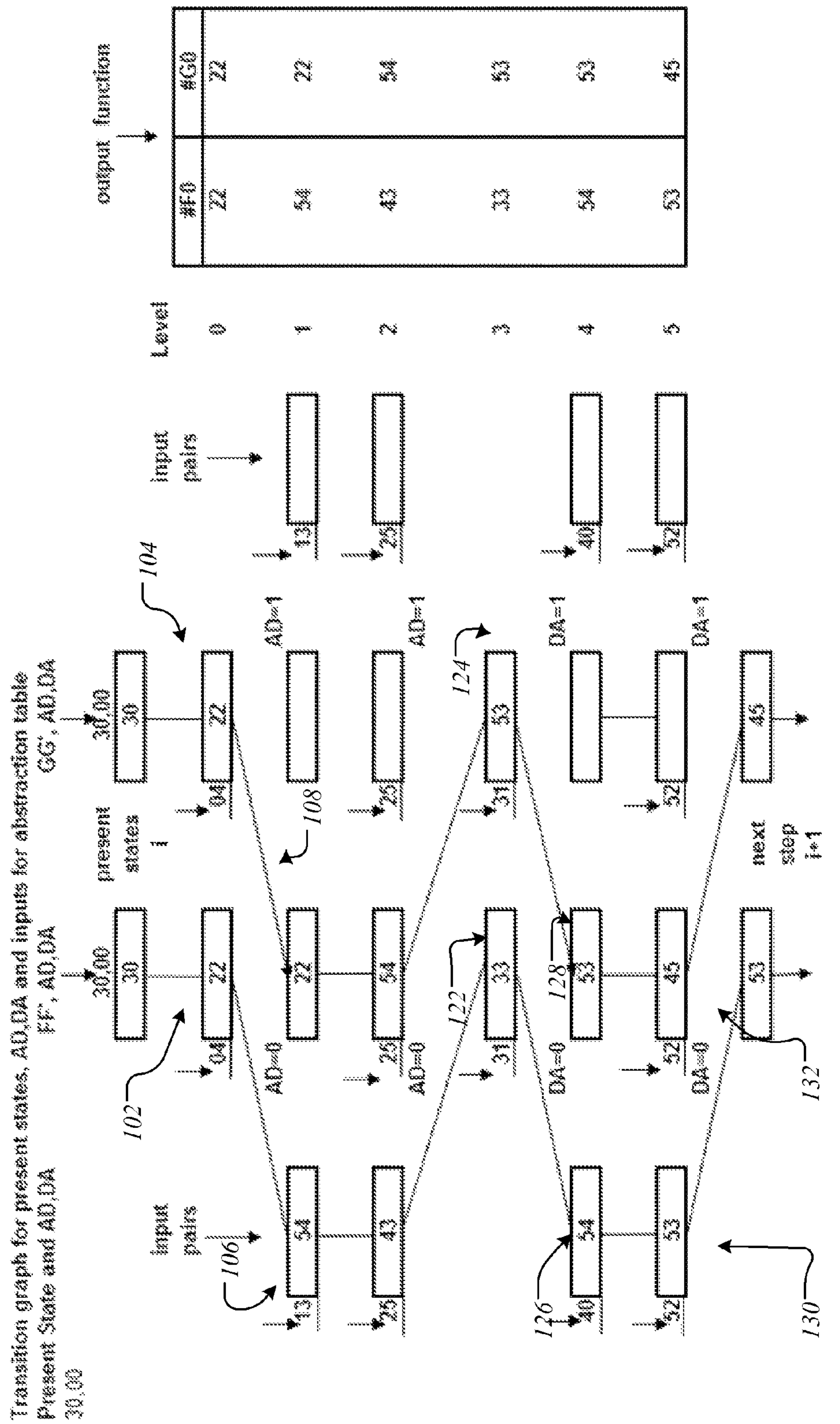
Figures 2, 9:
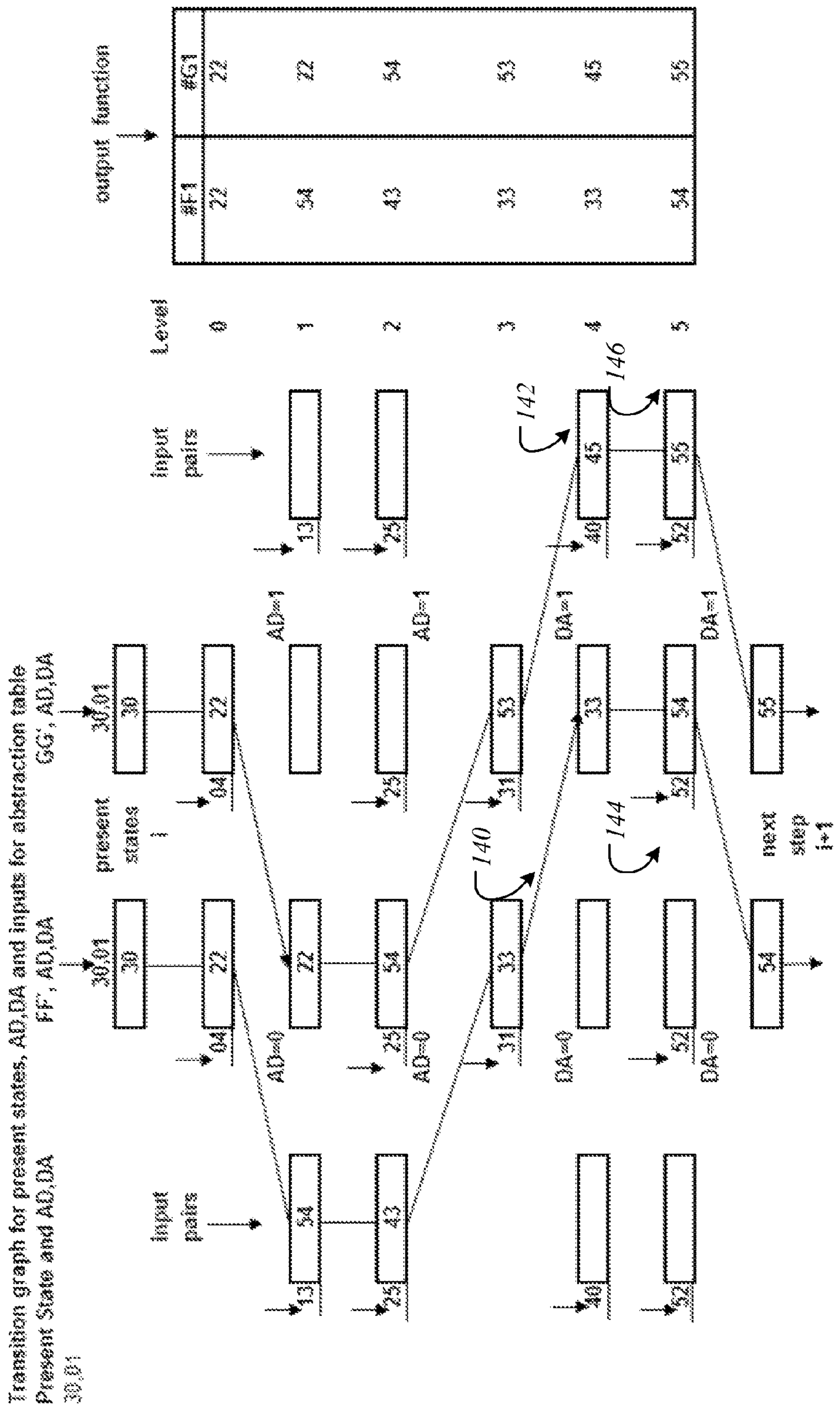
Figures 3, 9:
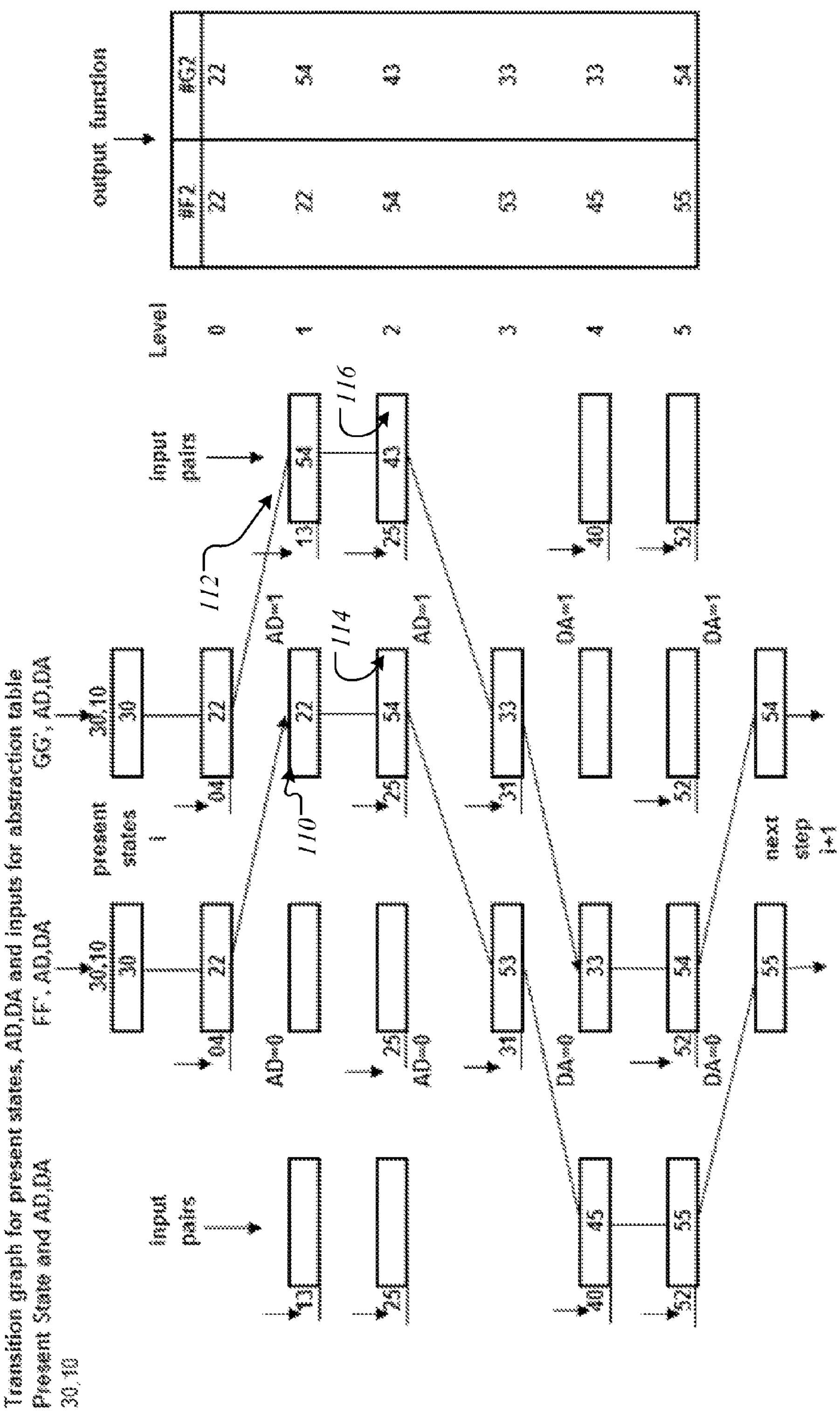
Figures 4, 9:
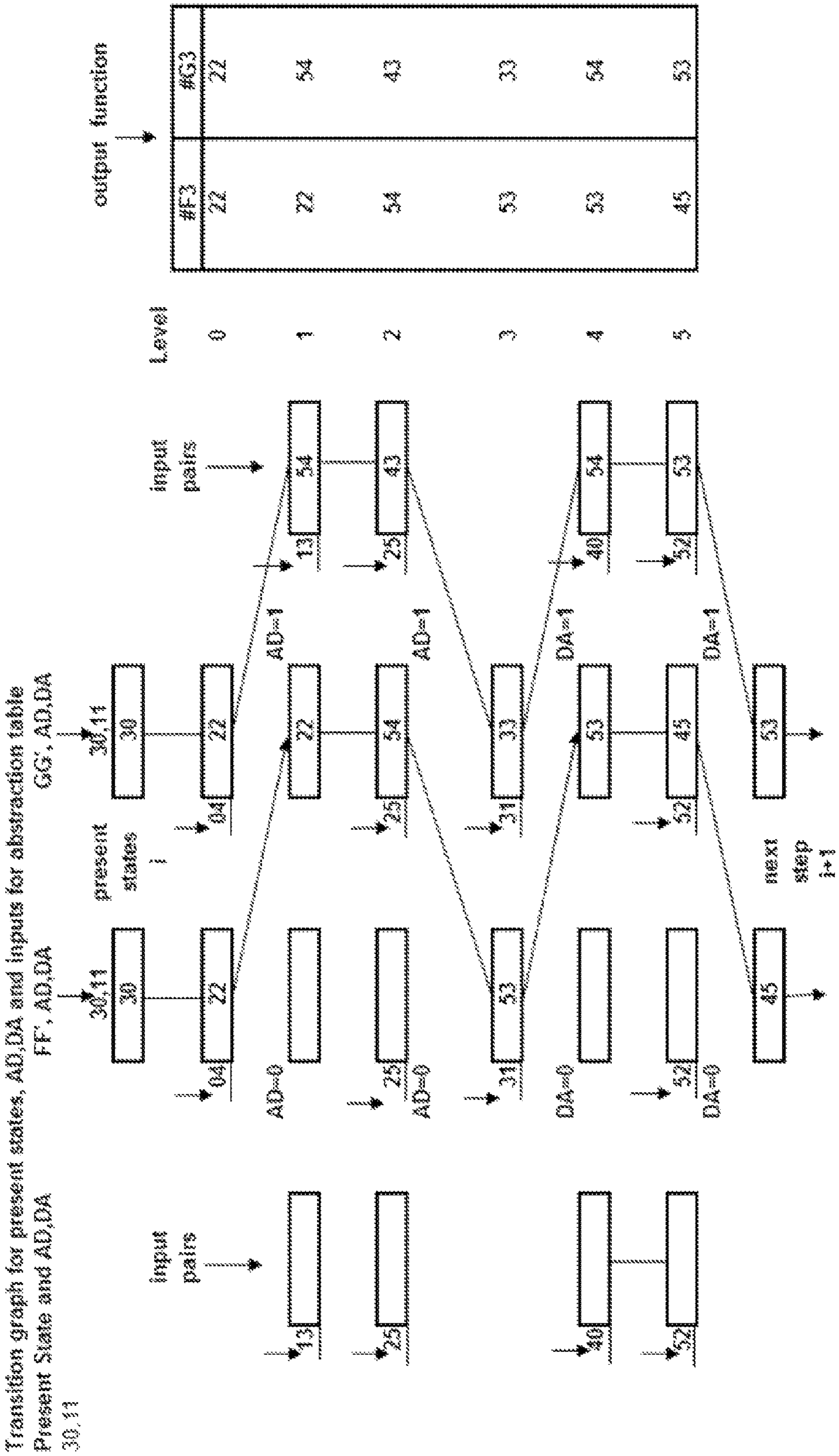

Referring now to FIG. 4, an example of an input bit string to be abstracted is shown. In the table of FIG. 4, the "Order DA string" columns represent the bit positions of "an index k" and the "DA Element" columns represent data values of the input data bit string. FIG. 4 shows an example of a bit string of length (L) where L=125. The sequence of the data bit string is ordered by the index k. The k order is a natural number that starts at 1 and continues up to L (125), where k defines the bit position in the input stream.

Referring now to FIG. 5A, a limit bit string table is shown. The limit bit string is determined by the engine 36 in accordance with the length (L) of the input data string. The engine 36 defines the limit data string, with a sequence or index (m) as shown, where m is the order of the 'limit' data bits. The limit bit string can be dynamically generated by the system and stored as a table in storage or memory. The limit bit string is provided as a random sequence of bits. These 'limit' data bits are inserted during the abstraction process, anytime a 'limit' condition occurs (see FIG. 10A and FIG. 10B). This insertion is used as a mechanism to overcome the limit condition, as discussed below. The length of the limit bit string ($L_{DA}$) is determined by the system according to $L_{DA}$=q*L, where nominally q=0.33. Thus, here $L_{DA}$=(⅓)*L, where in the case of the exemplary input bit string of FIG. 2 is $L_{DA}$=(⅓)*125=41.

Plural such sequences can be generated and used to make limit data strings of an arbitrary length. The engine 36 can accept a sequence of any length. These sequences can be generated by random bit number generators for example those types of generators available in libraries of compilers (e.g. the c++ compiler).

Figures 5, 9:
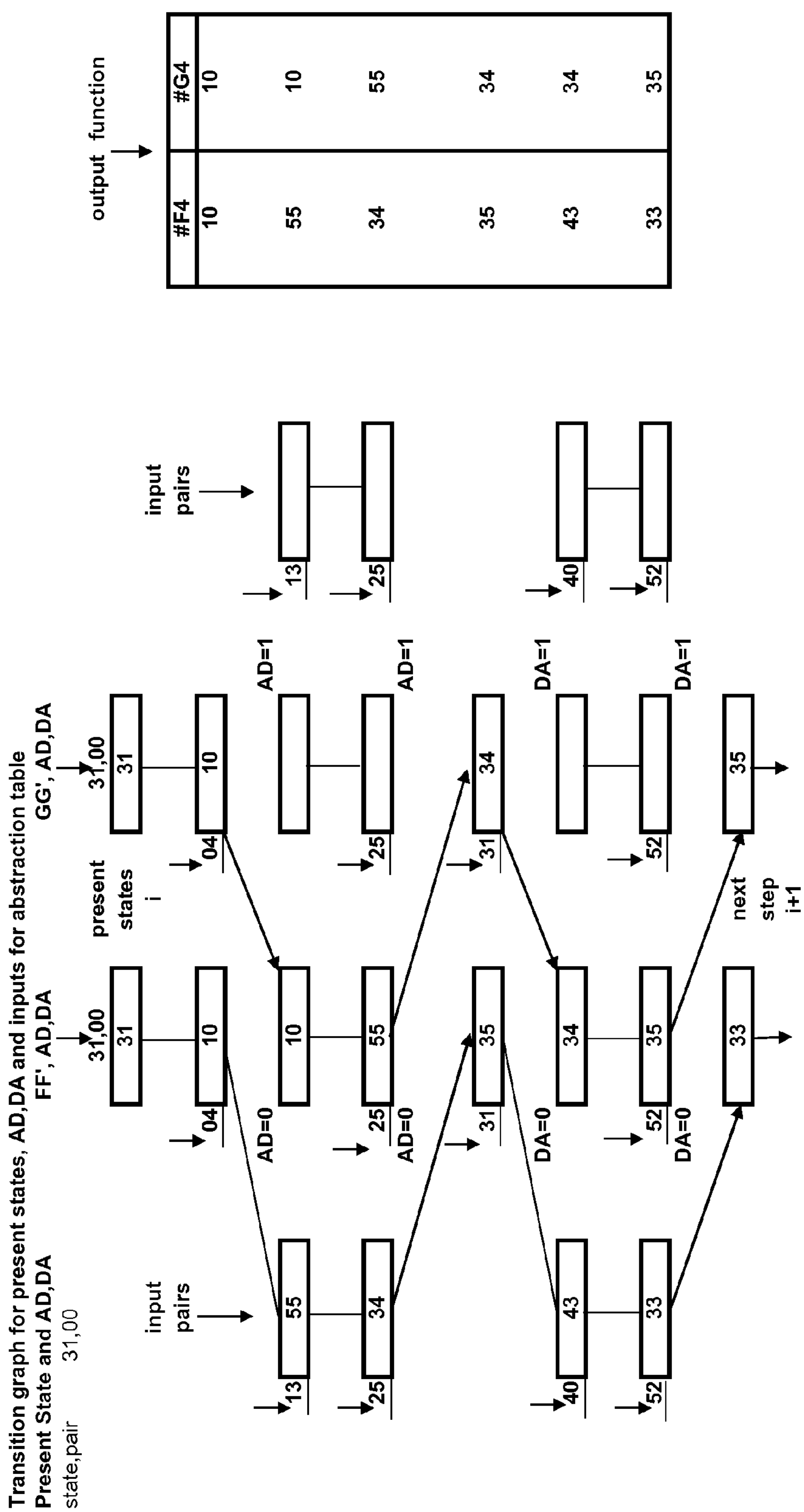
Figures 6, 9:
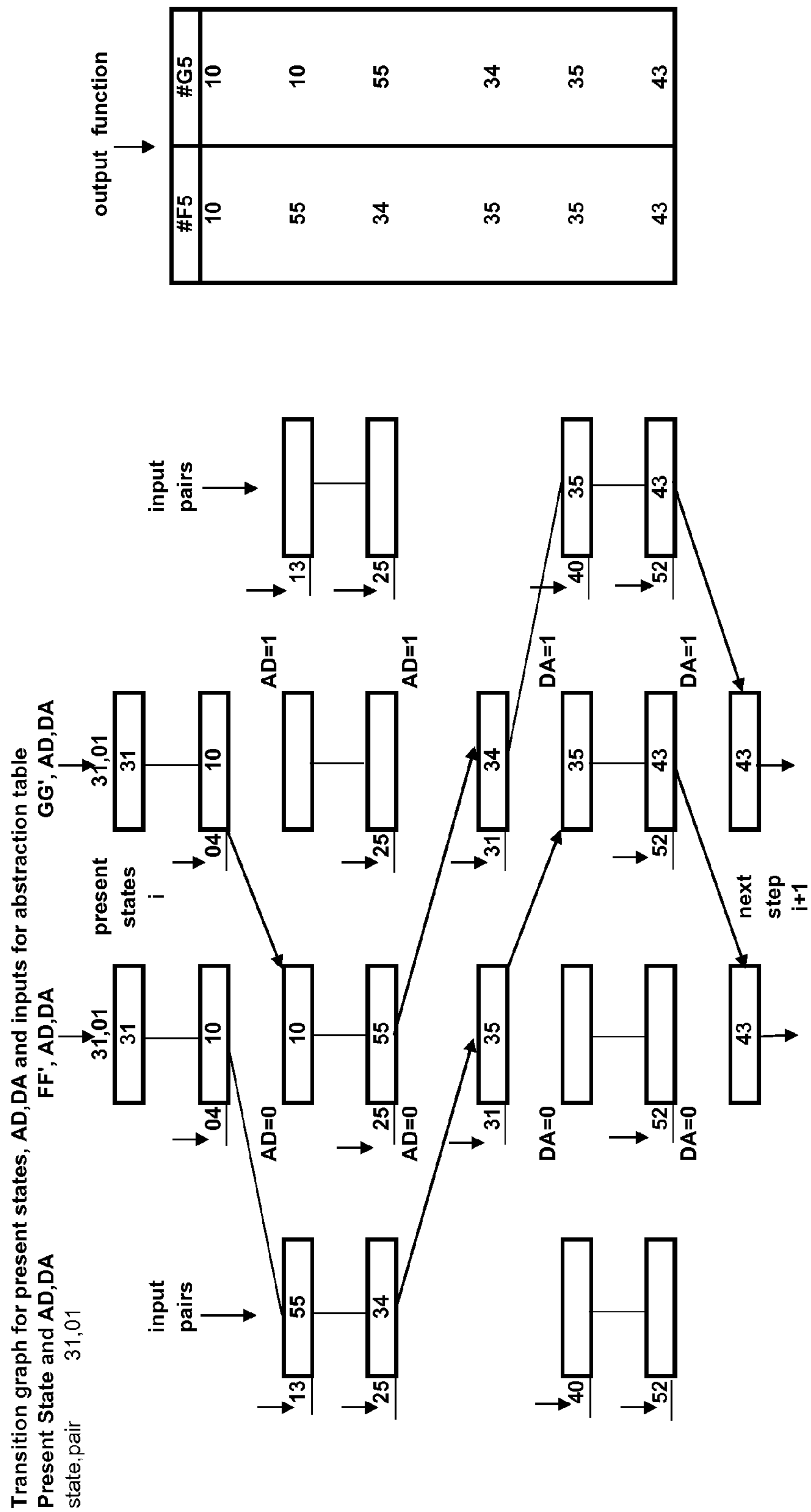
Figures 7, 9:
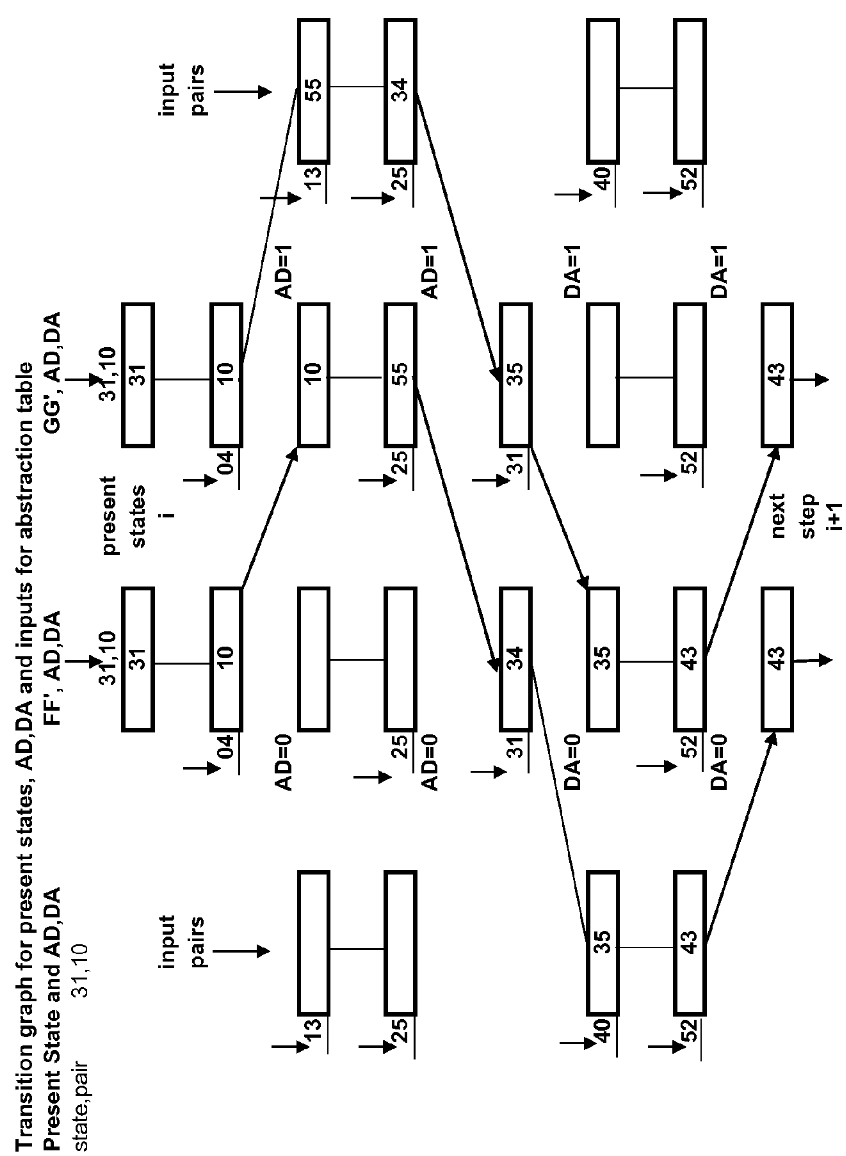
Figures 8, 9:
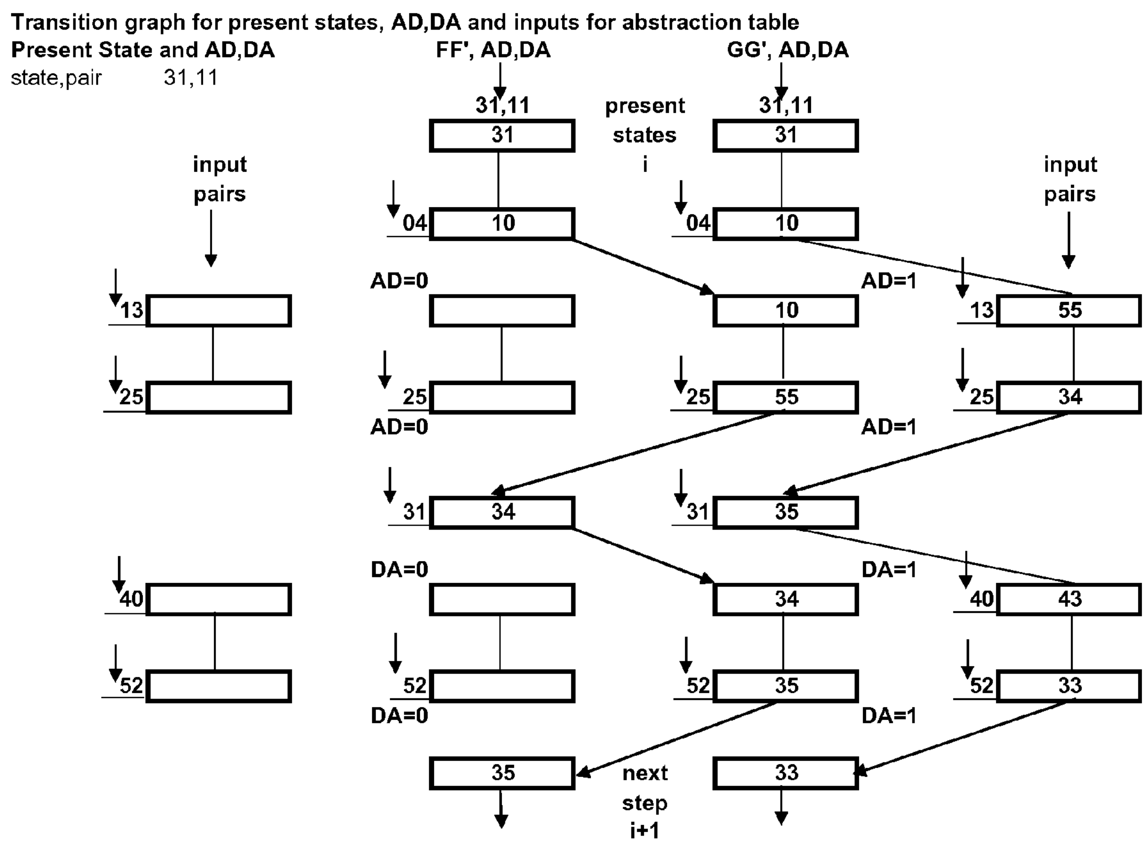
Figure 9:
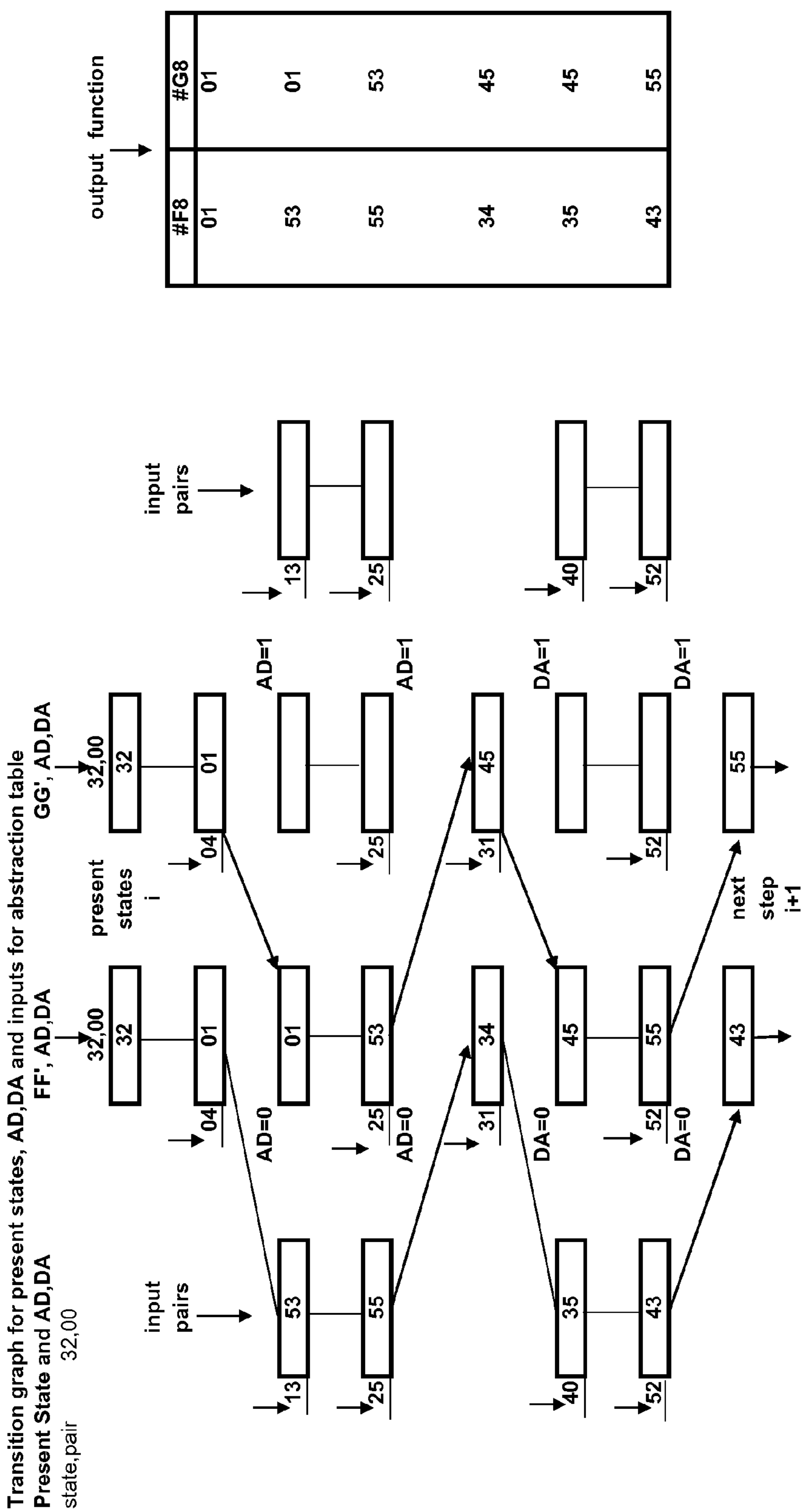
Figures 9, 10:
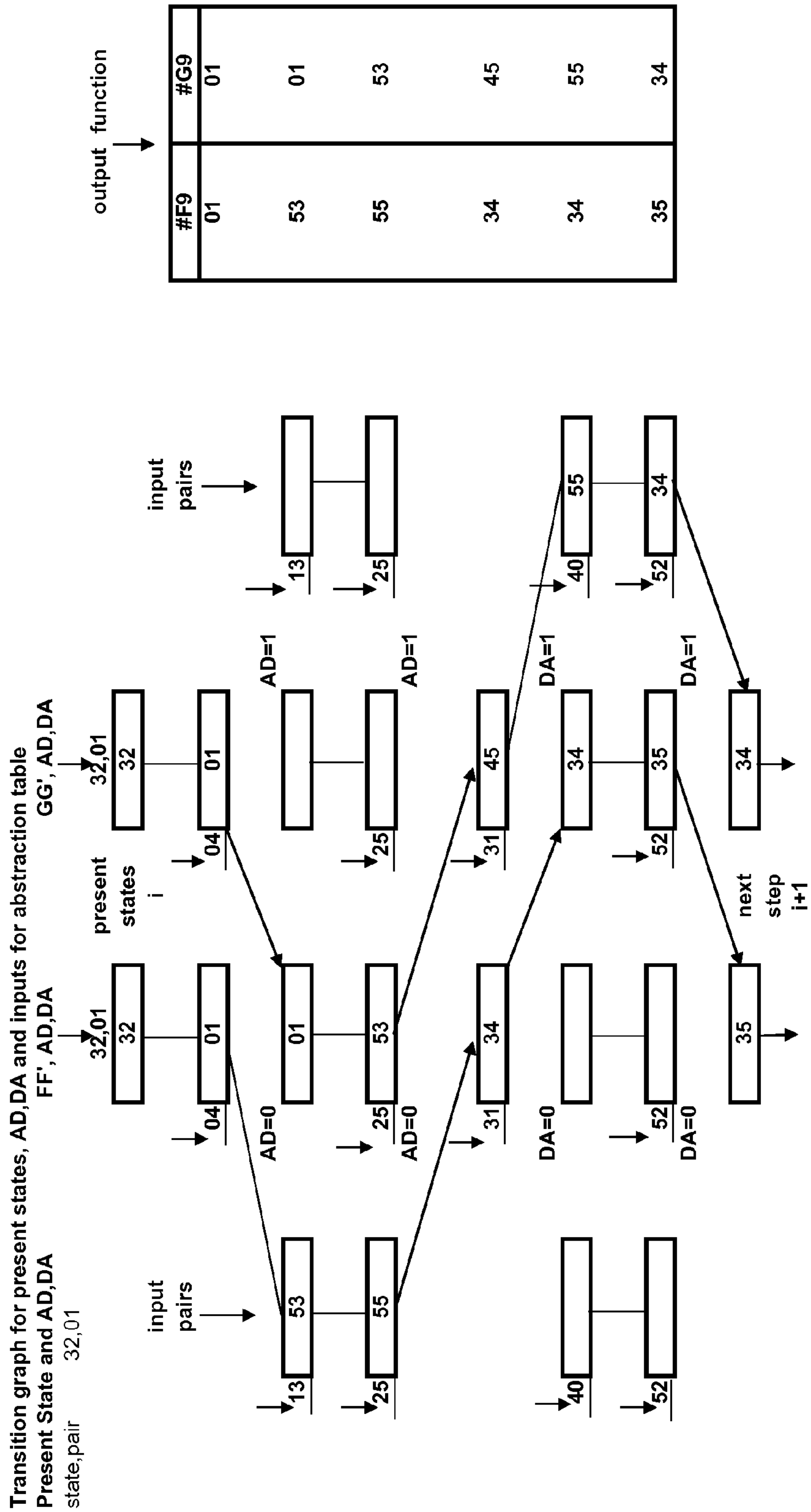
Figures 9, 10, 11:
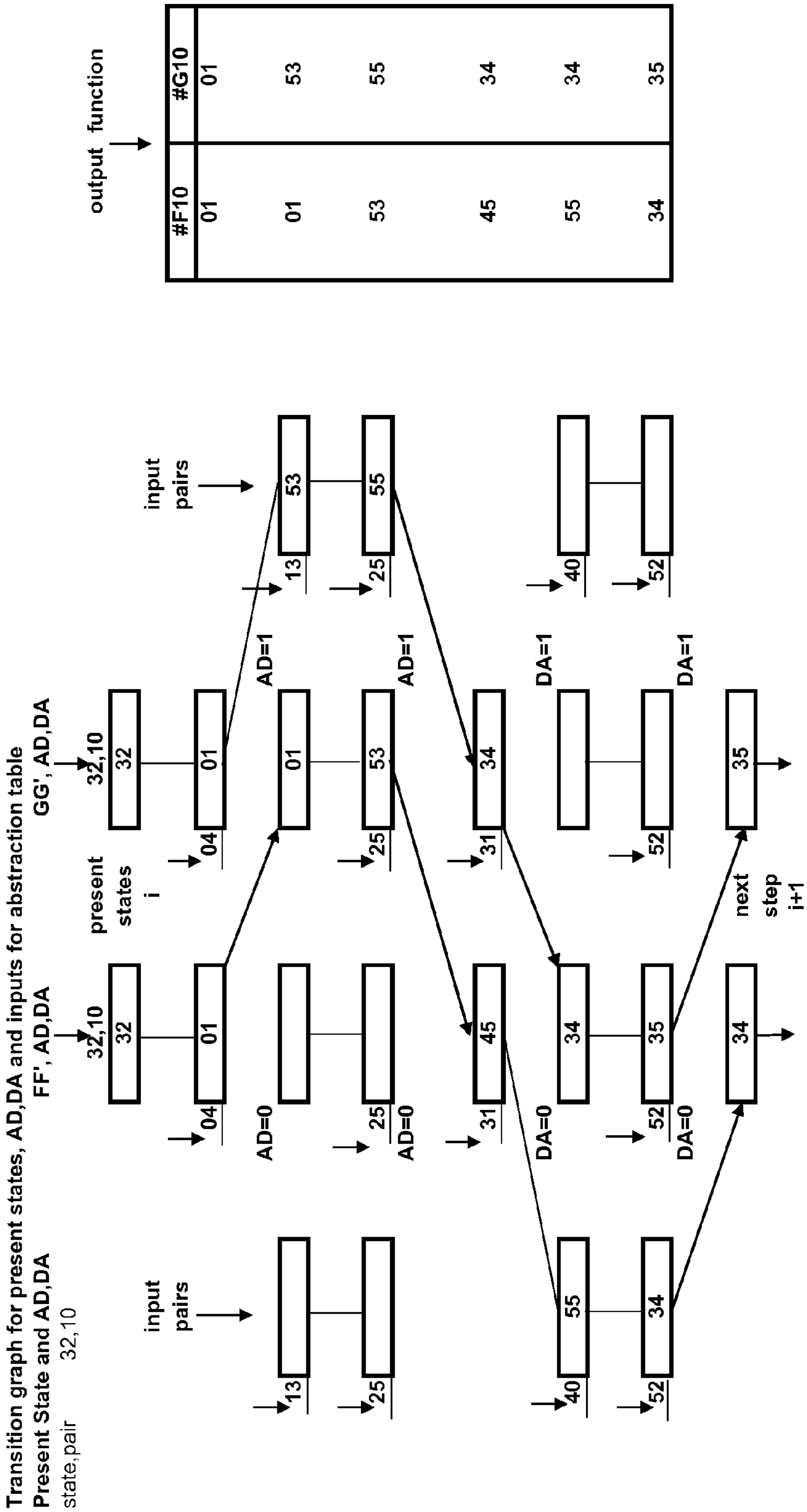

Rather than using a library, random permutations (32 or 64) for FIG. 11A #F and FIG. 11B for #G can be generated manually. One technique is by use of a commercially available bingo-machine. The machine can be loaded with 32 or 64 balls (numbers on balls from 0 to 31 or from 0 to 63). The machine is operated to spill out balls one at a time to get the first permutation, reloaded and repeated 31 times for the 32-permutation or 63 times for the 64-permutation. The numbers can be written and placed them in FIG. 11A #F to generate the random binary codes or 11B for #G to generate the random binary codes.

Referring now to FIG. 5B, an address bit string table (AD bit string) is shown. In the table of FIG. 5B, the index (i) defines the bit position in the AD bit string. The AD bit string is also determined by the system. The AD bit string is also generated by random bit number generators for example those types of generators available in libraries of compilers (e.g. the c++ compiler) or manually. The length of i is the sum of k and m. That is, the length of the address string is determined in accordance with the length (L) of the input bit string and the length ($L_{DA}$) of the limit bit string or the length of address string ($L_{AD}$)=(L)+($L_{DA}$). In the example, the sum of k and m is 125+41, which corresponds to i=166. This value is 1.33 times L. In the example in FIGS. 13A-13O, the "used i" is 158 and the "used m" is 32 or in other words there are reserve bits provided in "i" and "m."

The actual value used to determine the sizes of the limit string and address string can vary from 0.33 L and 1.33 L. For example, it may be possible to have the factor "q" be in a range that is about 0.25 and higher. However, a higher value of q would not necessary serve any practical purpose but to increase the sizes of the limit and address strings and increase the amount of unused portions of those strings.

Thus, through FIGS. 5A and 5B, the system defines two strings of bits, here shown as tables, but which could be generated, as needed, the sequence of which is defined by indexes m and i as shown, where m is the order of the 'limit' data bits and i defines the bit position in the AD bit string. The sum of the two strings k and m provides an ordered index i for the abstraction process to be described below. The bit strings defined by indexes m and i are generated and stored as a table, or generated as needed by the engine 36, using random processes. The order elements "k" (of order 1 to L), "m" (of order 0 to M), and "i" (of order 0 to I) are all natural numbers (including "0"). These indexes represent the positions of the data bits element in the input, DA and AD strings respectively.

The process of "Abstraction" involves producing a set of two, bit strings from the input bit string (of FIG. 4), which along with the known length of the input bit string identically describes/represents the input bit string (also referred to herein as the original input bit string). That is, abstraction starts with a user defined data bit string (input data string) of finite length L. This user defined data bit string is a string of any length and any values that represent an input to be abstracted. That is, the input bit string can be a random bit string or a non-random bit string.

Referring now to FIG. 6, a non-commutative six-group is shown. A six-group is well-known in abstract mathematics. One such example is in a book entitled: "An Introduction to the Theory of Groups" by George W. Politis, International Textbook Company, Scranton Pa. 1968, the contents of which are incorporated herein by reference in its entirety. On page 50, of that book in Table 13, the author provides a representation of a six-group, numbers from 0 to 5. On page 51, the author describes a group "G" as a non-ABELIAN (which is a non-commutative) group of order 6. In mathematics, a non-abelian group (or a non-commutative group) is a group (G, *) in which there are at least two elements a and b of G such that a*b≠b*a. Any other non-ABELIAN group of order 6 is isomorphic to G. In exercise 61 in that book, the author shows that S3 (see example 4, page 4) is isomorphic to the group G above.

Below are the representations of the six-group G and the isomorphic symmetric group S3.

| G ⟷ | S3 |
|---|---|
| 0 | $P0 = \begin{bmatrix} 0 & 1 & 2 \\ 0 & 1 & 2 \end{bmatrix}$ |
| 1 | $P1 = \begin{bmatrix} 0 & 1 & 2 \\ 2 & 0 & 1 \end{bmatrix}$ |
| 2 | $P2 = \begin{bmatrix} 0 & 1 & 2 \\ 1 & 2 & 0 \end{bmatrix}$ |
| 3 | $P3 = \begin{bmatrix} 0 & 1 & 2 \\ 1 & 0 & 2 \end{bmatrix}$ |
| 4 | $P4 = \begin{bmatrix} 0 & 1 & 2 \\ 2 & 1 & 0 \end{bmatrix}$ |
| 5 | $P5 = \begin{bmatrix} 0 & 1 & 2 \\ 0 & 2 & 1 \end{bmatrix}$ |

Note that each of the two groups of three values are enclosed in the same set of parentheses. The representations of the six-group G and the isomorphic symmetric group S3 are related by reverse triplets as follows:

| G-pairs ⟷ | S3-pairs |
|---|---|
| 0,4 | P0, P4<br>0 1 2, 2 1 0<br>→ ← |
| 1,3 | P1, P3<br>2 0 1, 1 0 2<br>→ ← |
| 2,5 | P2, P5<br>1 2 0, 0 2 1<br>→ ← |
| 3,1 | P3, P1<br>1 0 2, 2 0 1<br>→ ← |
| 4,0 | P4, P0<br>2 1 0, 0 1 2<br>→ ← |
| 5,2 | P5, P2<br>0 2 1, 1 2 0<br>→ ← |

The G pairs of the non-commutative six-group are used to construct the six columns of the unique, new factor structure shown in FIG. 7.

Referring now to FIGS. 7 and 8, for the abstraction process a mapping function of 36 rows and 6 columns is constructed (FIG. 7), whereas for the de-Abstraction process a mapping function of 36 rows and 36 columns is constructed (FIG. 8). Thus, in most applications because the six columns of the abstraction table (FIG. 7) are included in the de-abstraction table (FIG. 8) it is sufficient to only use the de-abstraction table for both abstraction and de-abstraction.

However, there may be situations where an application only performs abstraction and another application that receives the results of abstraction and performs de-abstraction. In those situations, it would be sufficient to have the abstraction table (FIG. 7), in the abstraction application and the de-abstraction table in the de-abstraction application.

The six-group matrix discussed above is used for the function mapping. For each row pair (aa'), times column pair (bb'), there is a calculated result pair (cc') that is calculated according to the six-group table theory mentioned above. The tables are produced with all row/column pairs for FIGS. 7 and 8 produced similarly according to the following equation.

$c=a\cdot b\cdot a'\cdot b'$ $c'=b\cdot a\cdot b'\cdot a'$

An example calculation is given below:

Example

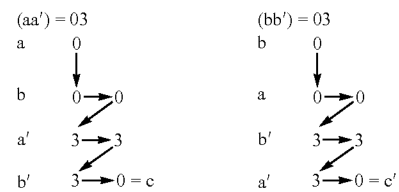

(03)·(03)=>(00) as shown in FIG. 8A by the arrow 79.

Figures 9, 10, 11, 12:
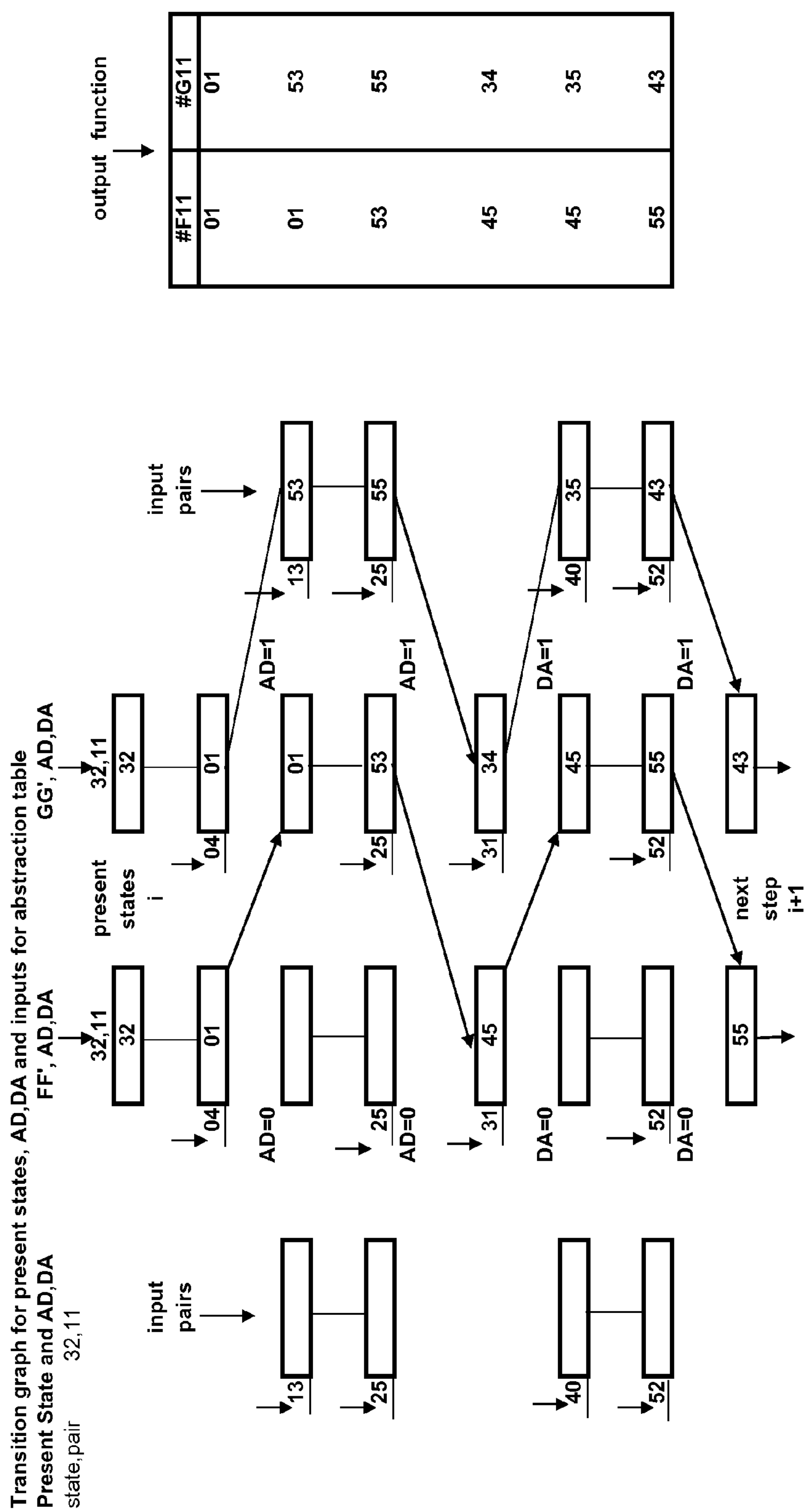
Figures 9, 10, 11, 12, 13:
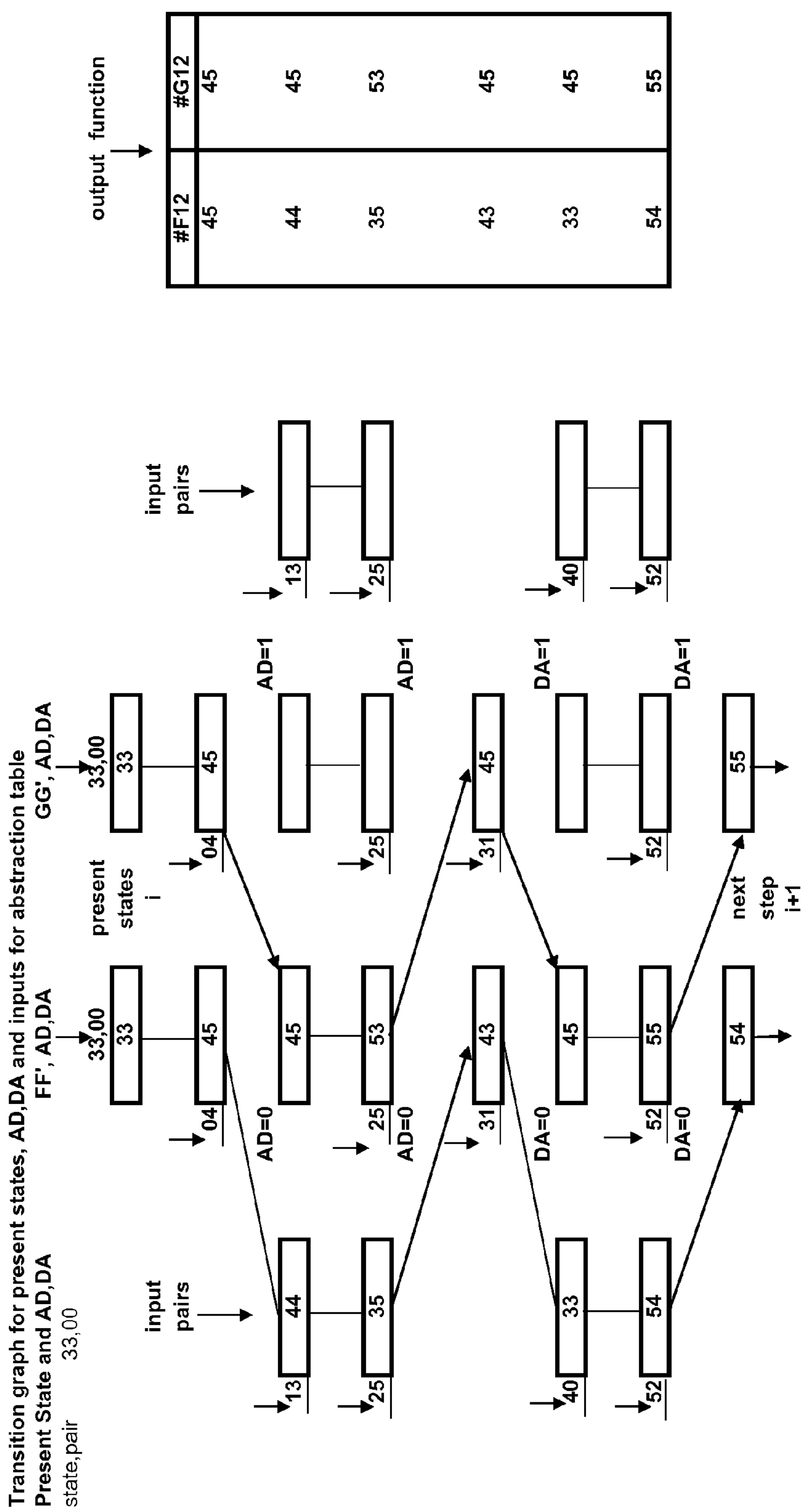
Figures 9, 10, 11, 12, 13, 14:
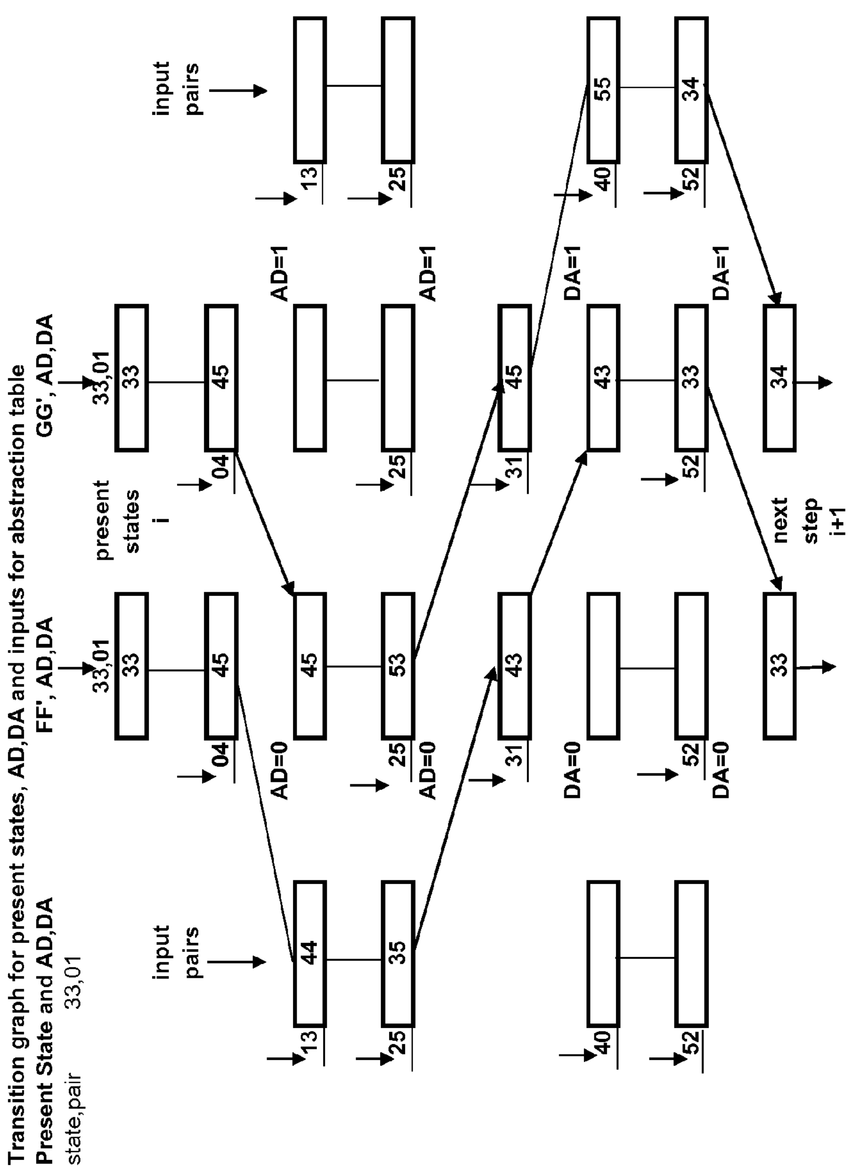
Figures 9, 10, 11, 12, 13, 14, 15:
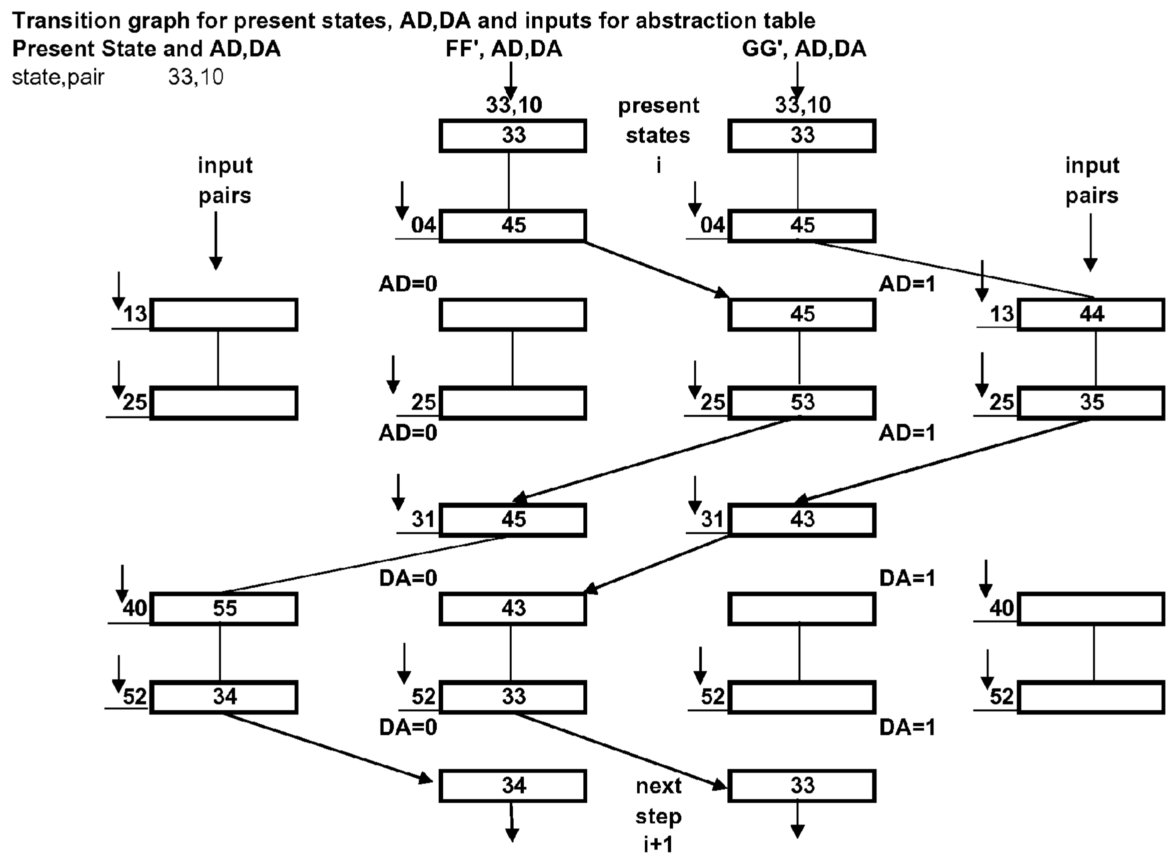
Figures 9, 10, 11, 12, 13, 14, 15, 16:
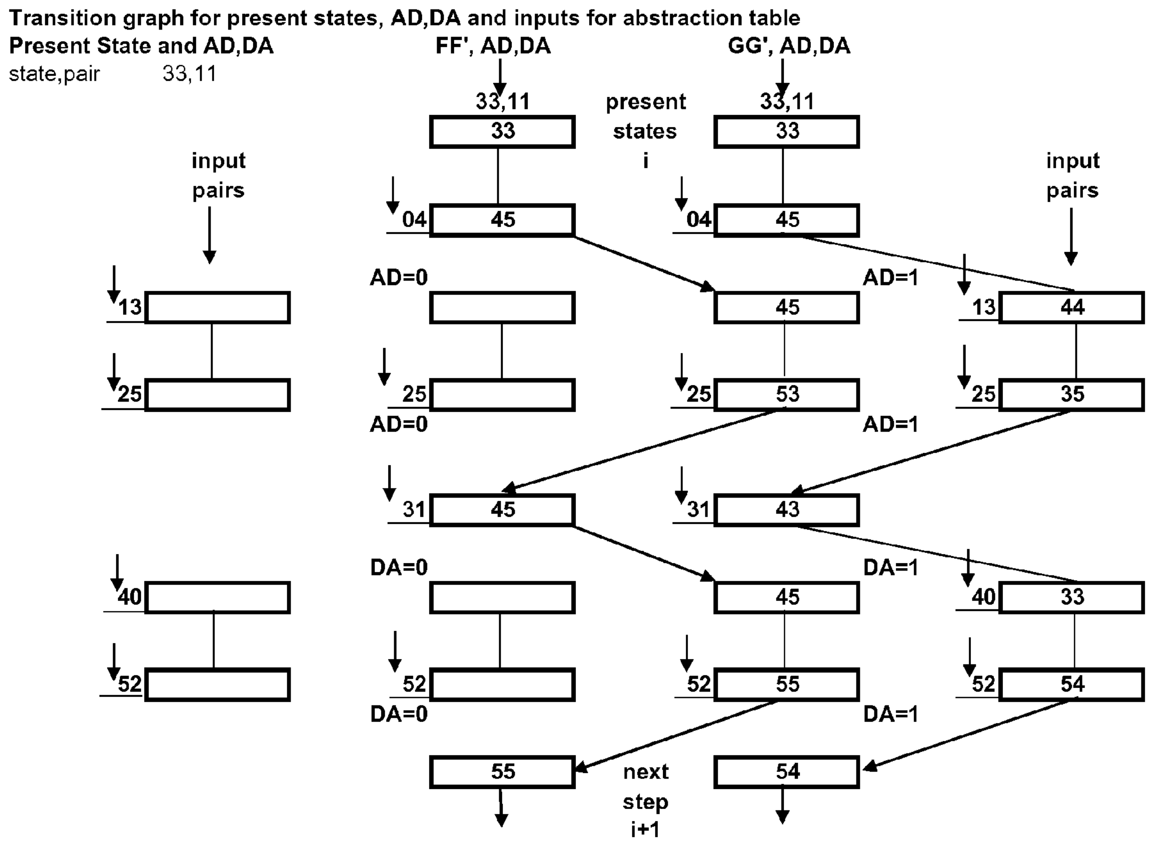
Figures 9, 10, 11, 12, 13, 14, 15, 16, 17:
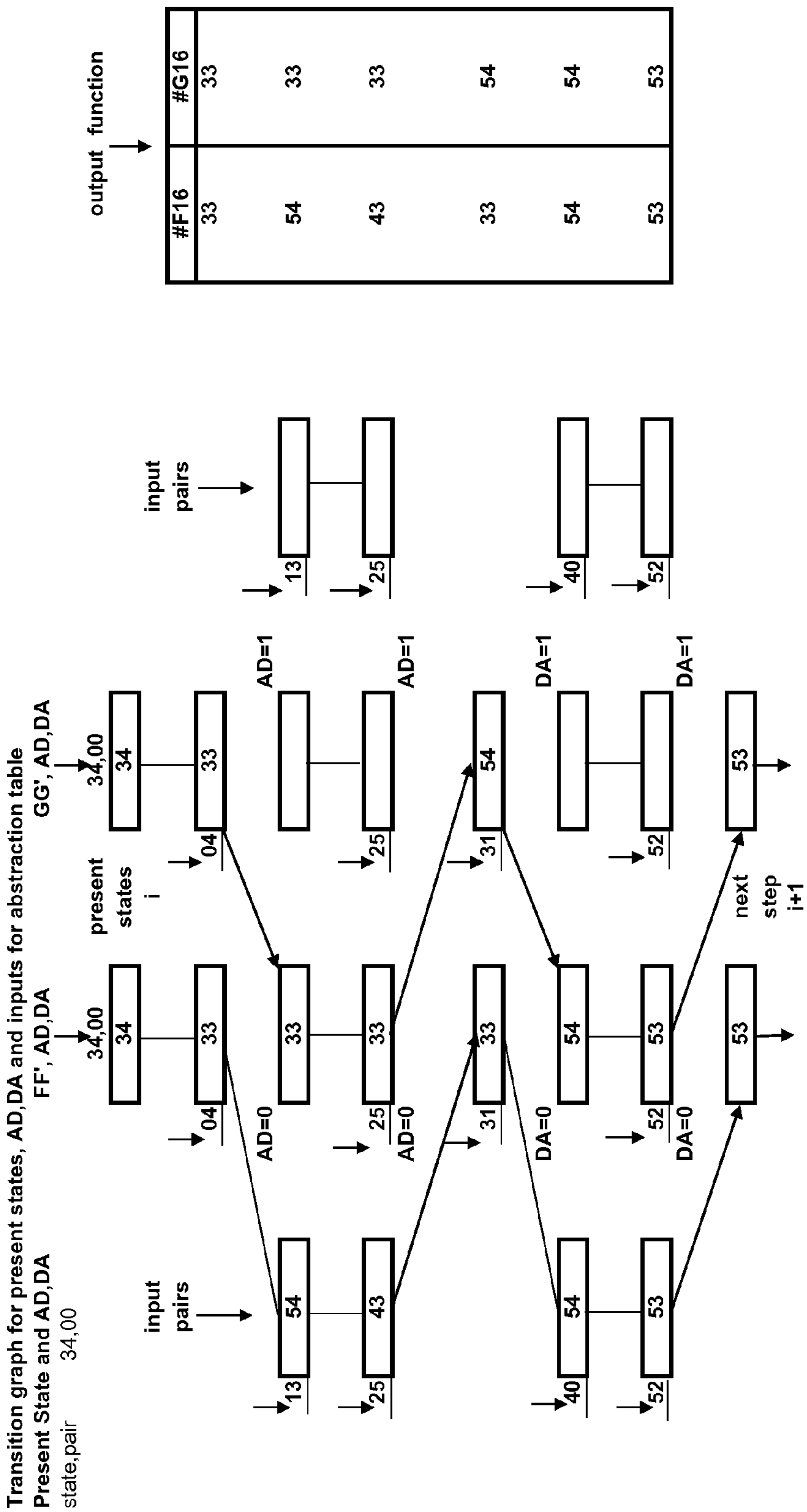
Figures 9, 10, 11, 12, 13, 14, 15, 16, 17, 18:
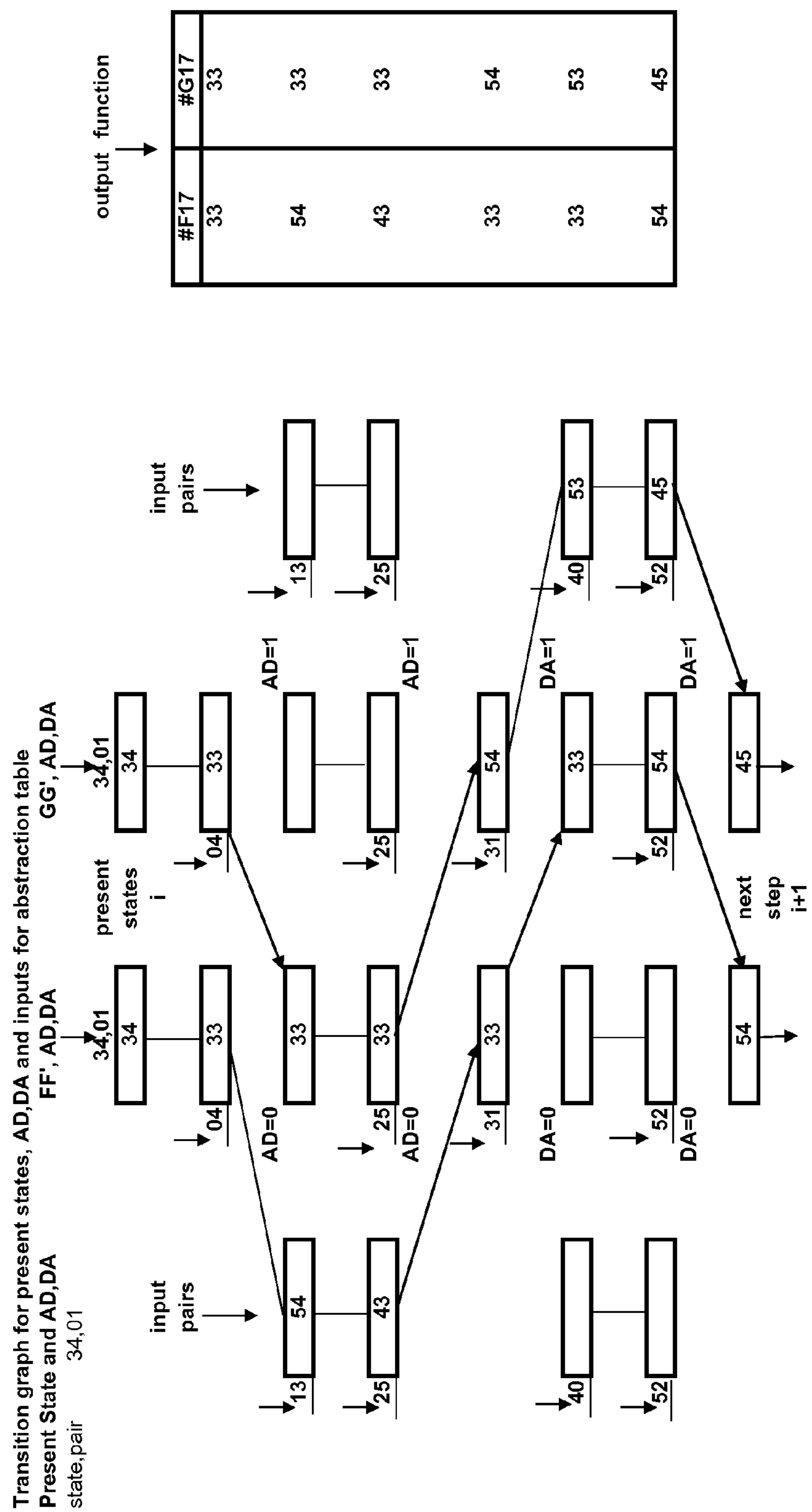
Figures 9, 10, 11, 12, 13, 14, 15, 16, 17, 18, 19:
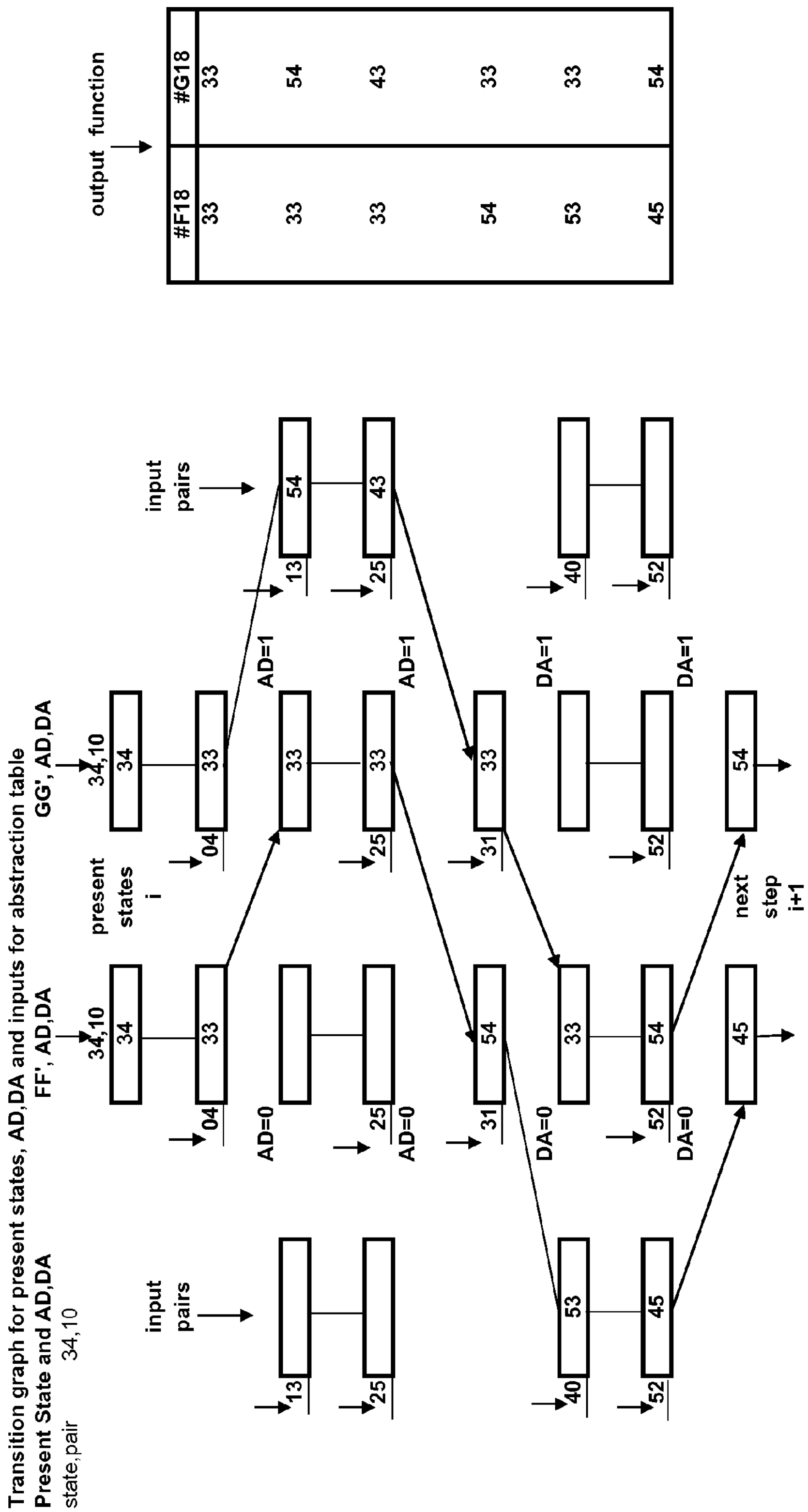
Figures 9, 10, 11, 12, 13, 14, 15, 16, 17, 18, 19, 20:
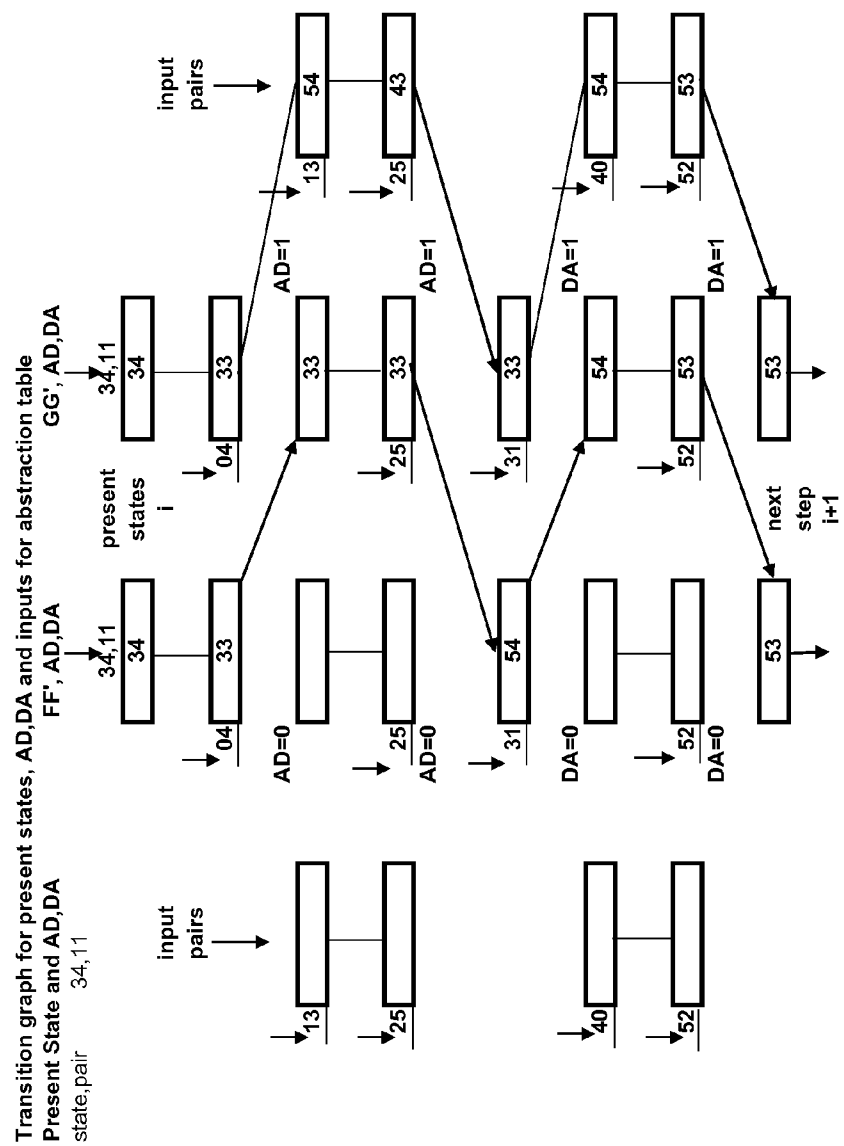
Figures 9, 10, 11, 12, 13, 14, 15, 16, 17, 18, 19, 20, 21:
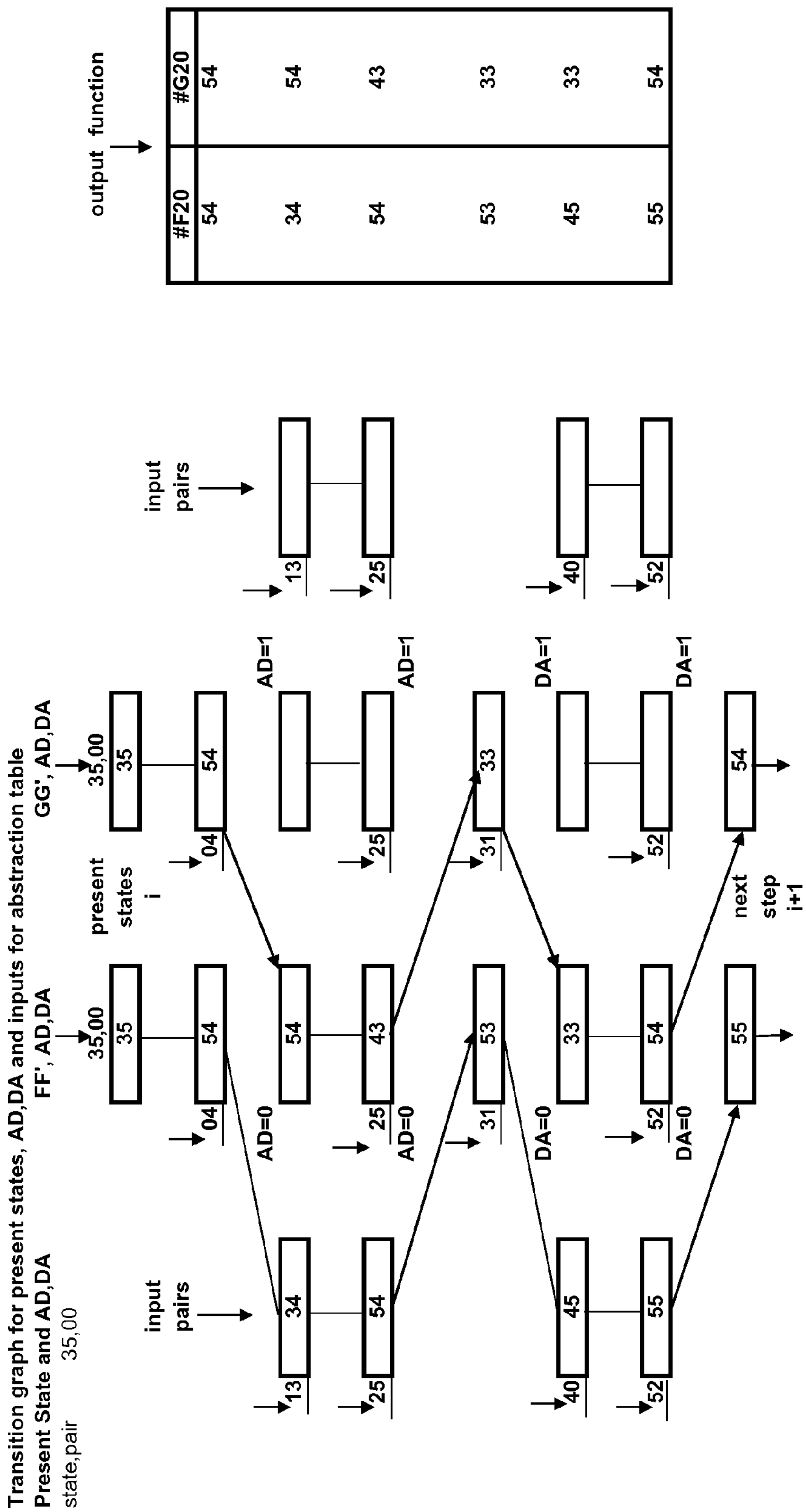
Figures 9, 10, 11, 12, 13, 14, 15, 16, 17, 18, 19, 20, 21, 22:
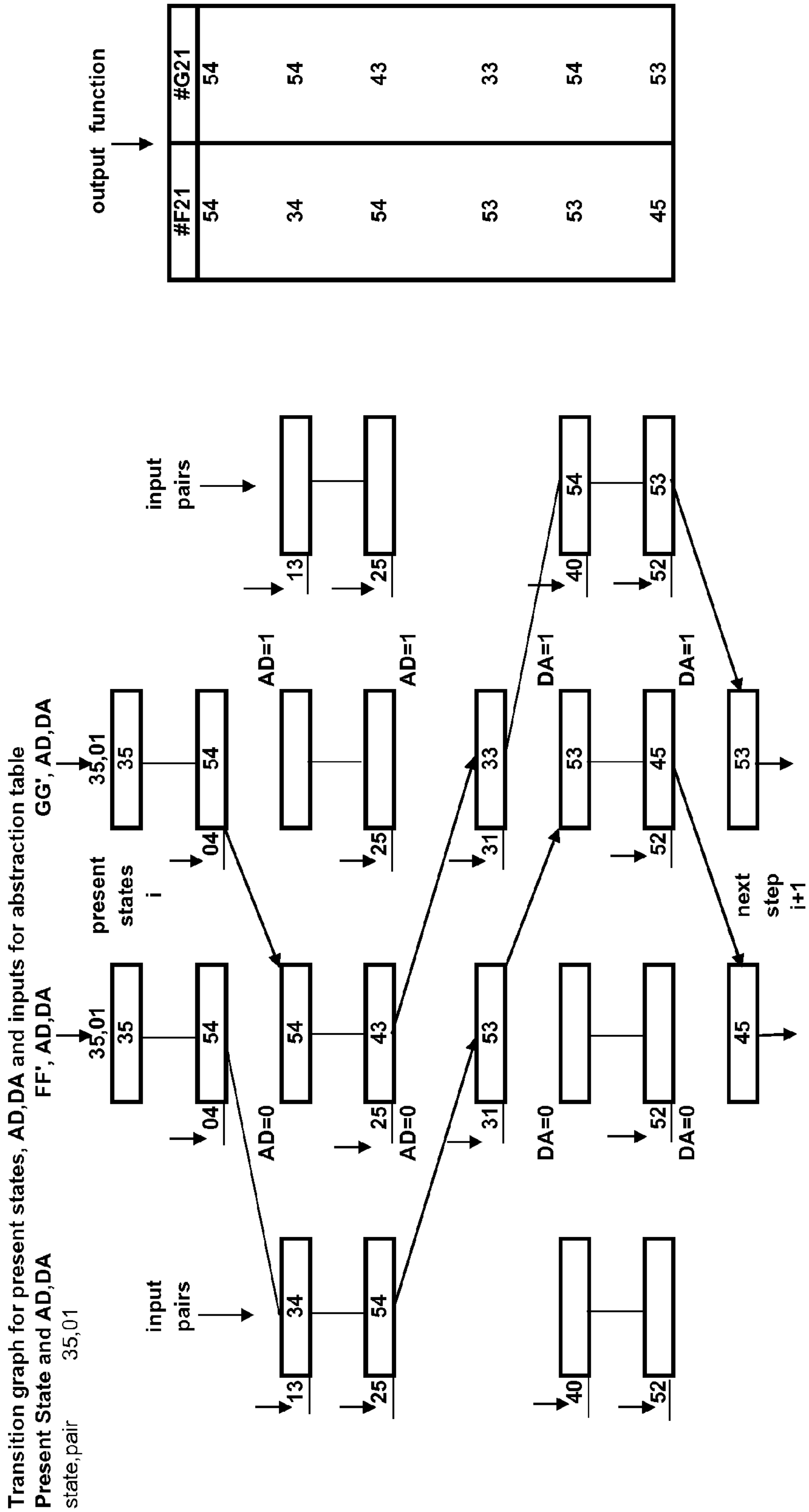
Figures 9, 10, 11, 12, 13, 14, 15, 16, 17, 18, 19, 20, 21, 22, 23:
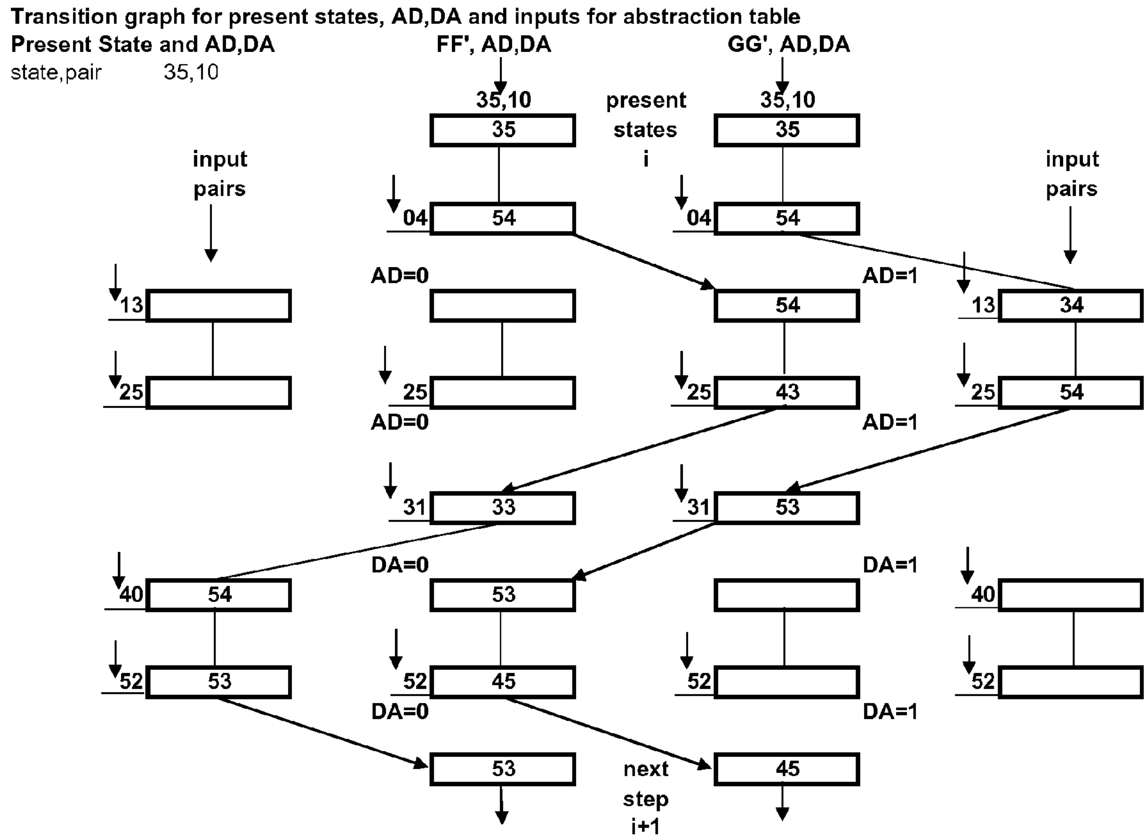
Figures 9, 10, 11, 12, 13, 14, 15, 16, 17, 18, 19, 20, 21, 22, 23, 24:
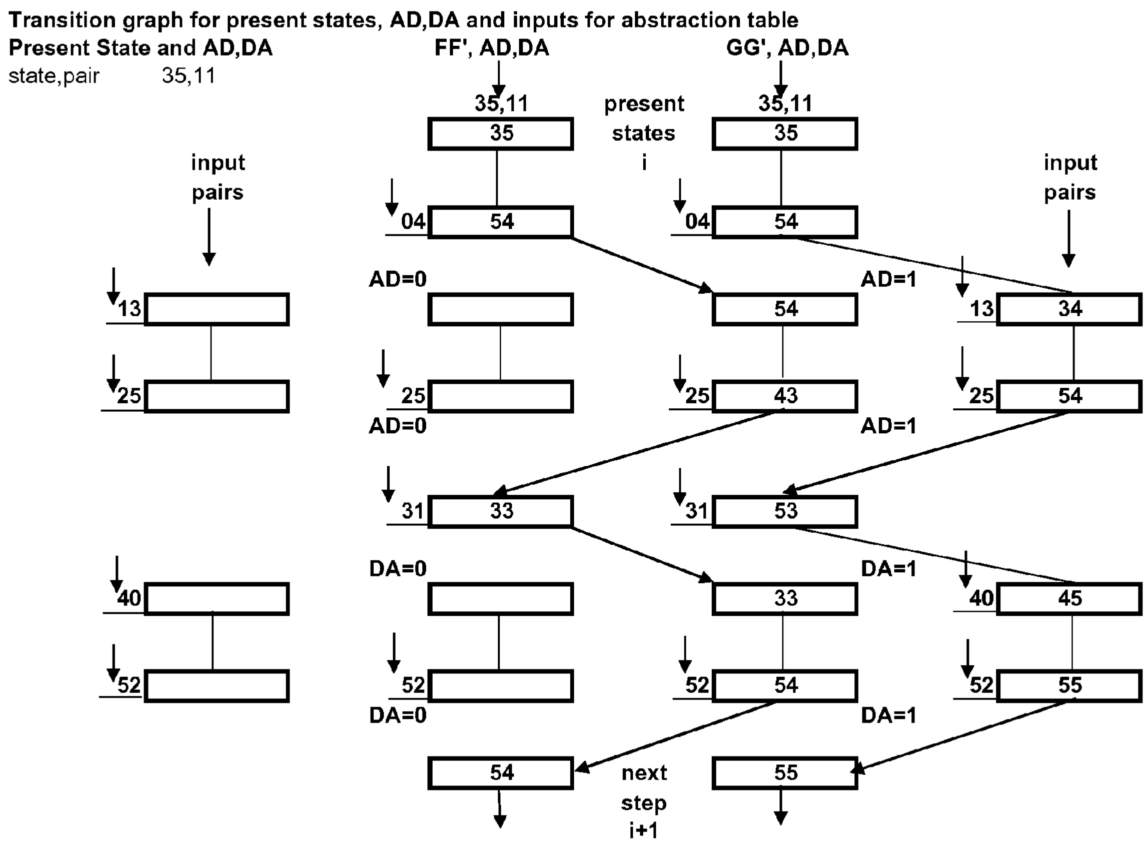
Figures 9, 10, 11, 12, 13, 14, 15, 16, 17, 18, 19, 20, 21, 22, 23, 24, 25:
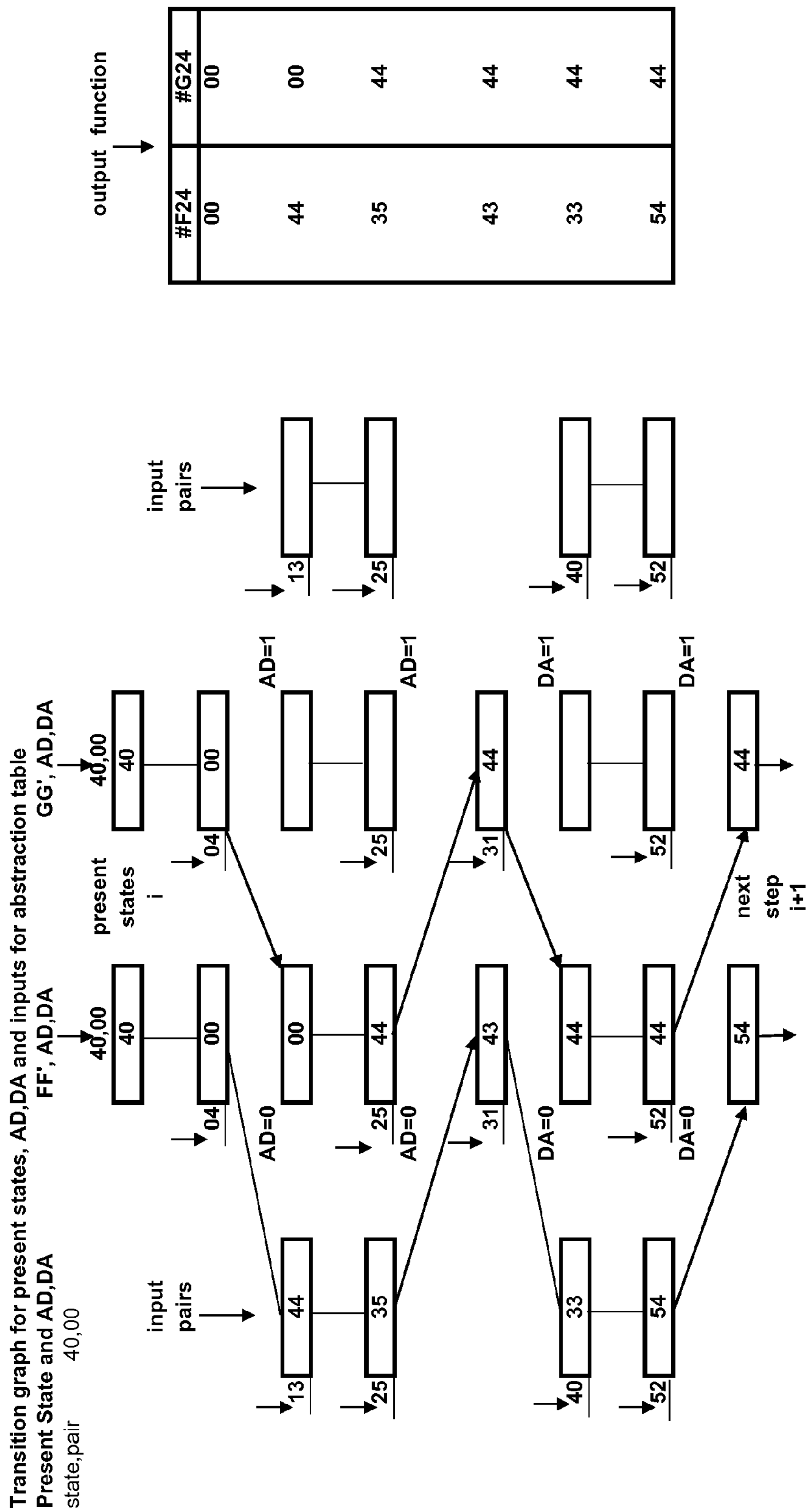
Figures 9, 10, 11, 12, 13, 14, 15, 16, 17, 18, 19, 20, 21, 22, 23, 24, 25, 26:
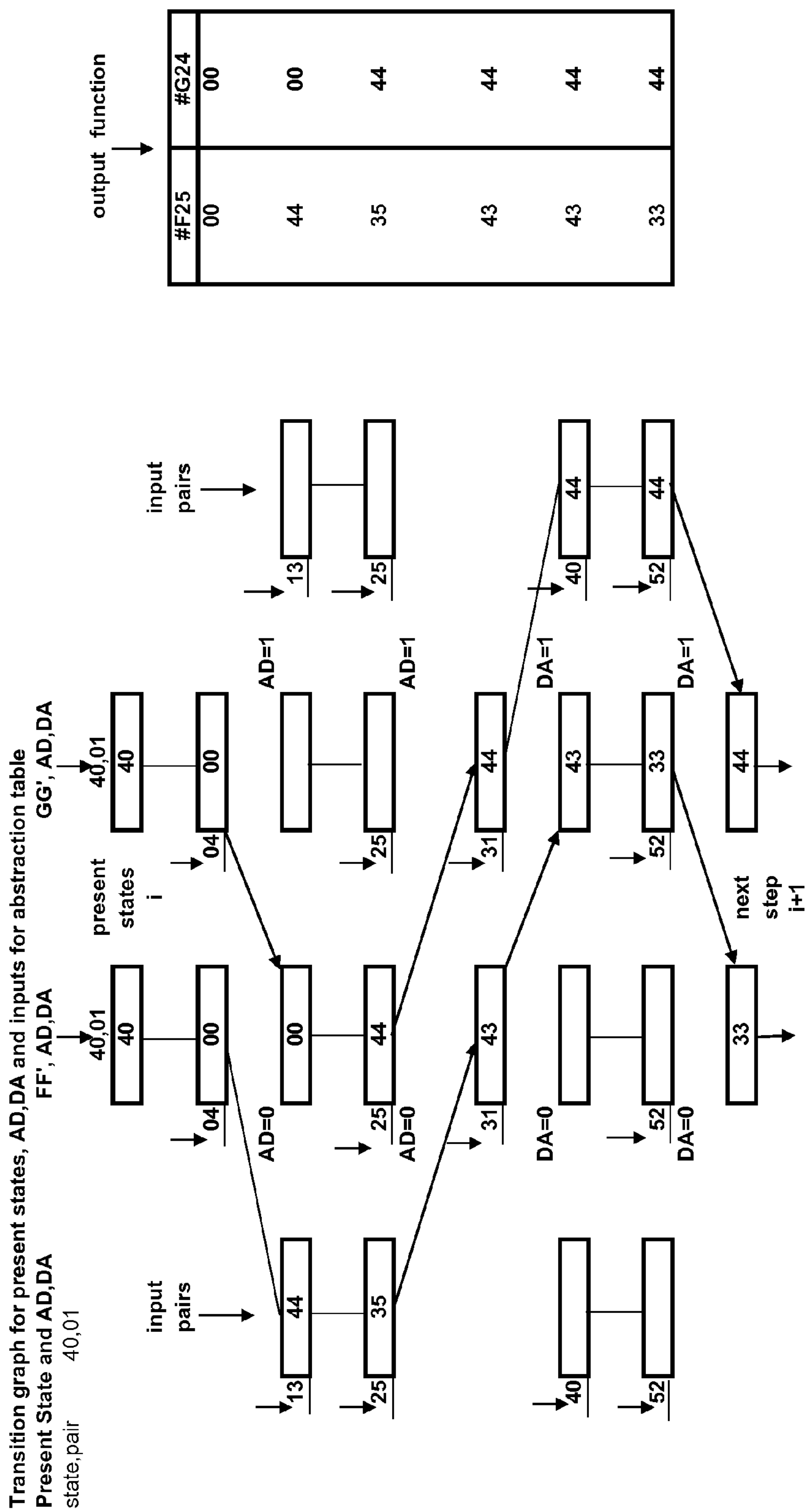
Figures 9, 10, 11, 12, 13, 14, 15, 16, 17, 18, 19, 20, 21, 22, 23, 24, 25, 26, 27:
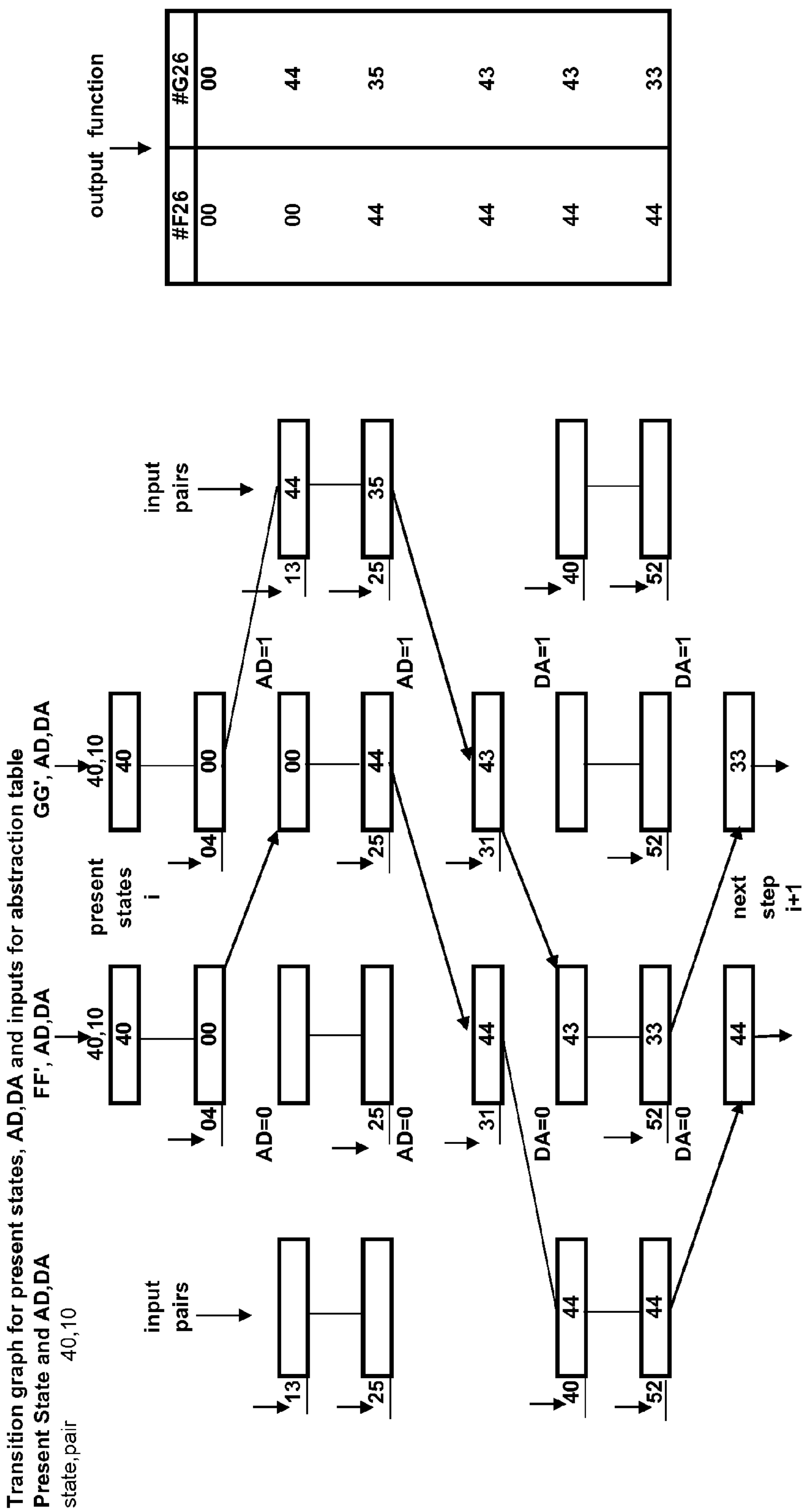
Figures 9, 10, 11, 12, 13, 14, 15, 16, 17, 18, 19, 20, 21, 22, 23, 24, 25, 26, 27, 28:
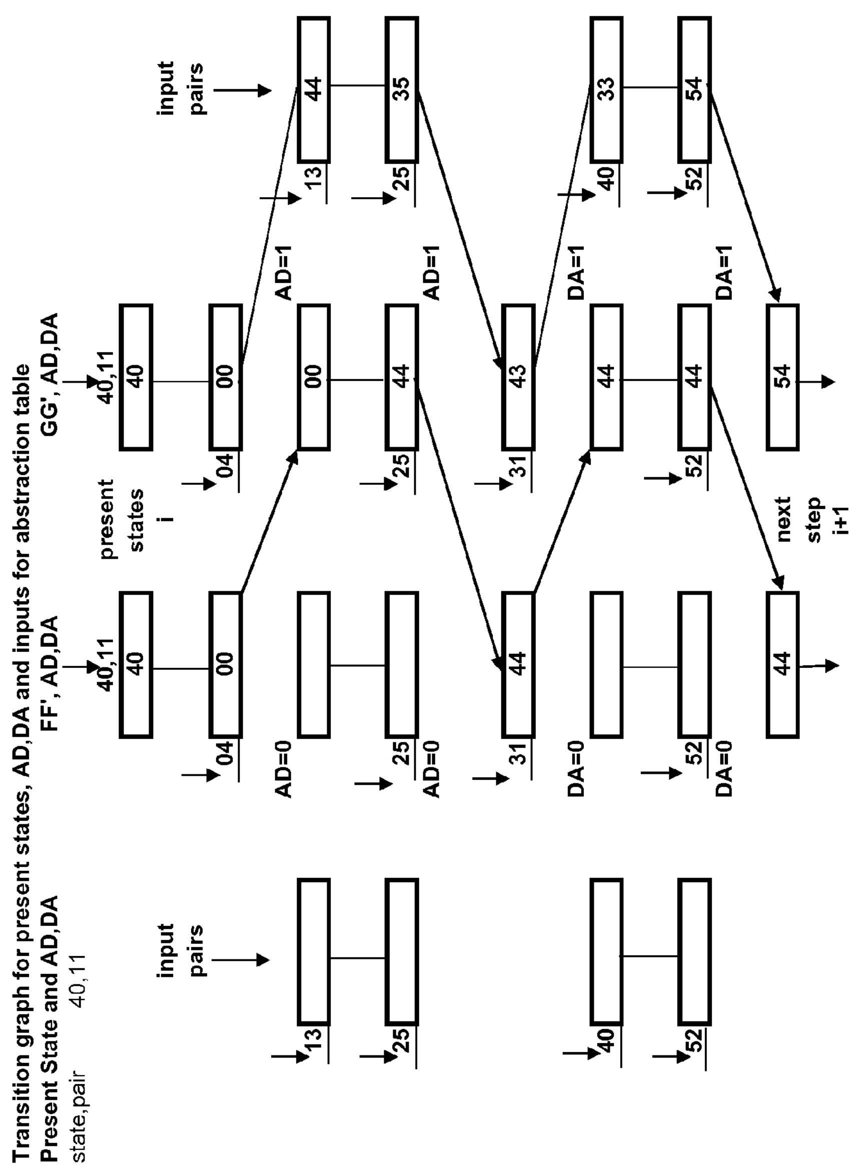
Figures 9, 10, 11, 12, 13, 14, 15, 16, 17, 18, 19, 20, 21, 22, 23, 24, 25, 26, 27, 28, 29:
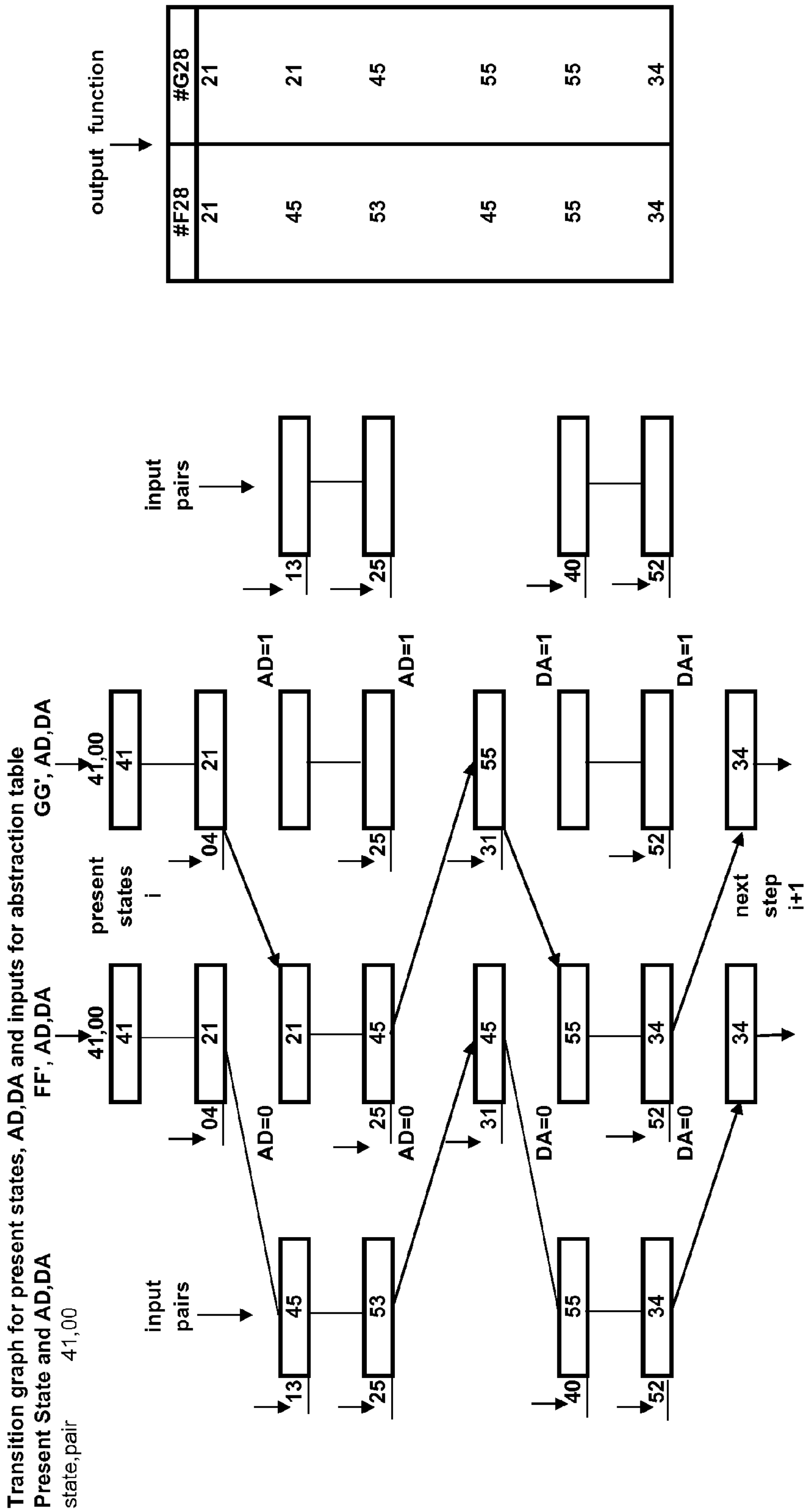
Figures 9, 10, 11, 12, 13, 14, 15, 16, 17, 18, 19, 20, 21, 22, 23, 24, 25, 26, 27, 28, 29, 30:
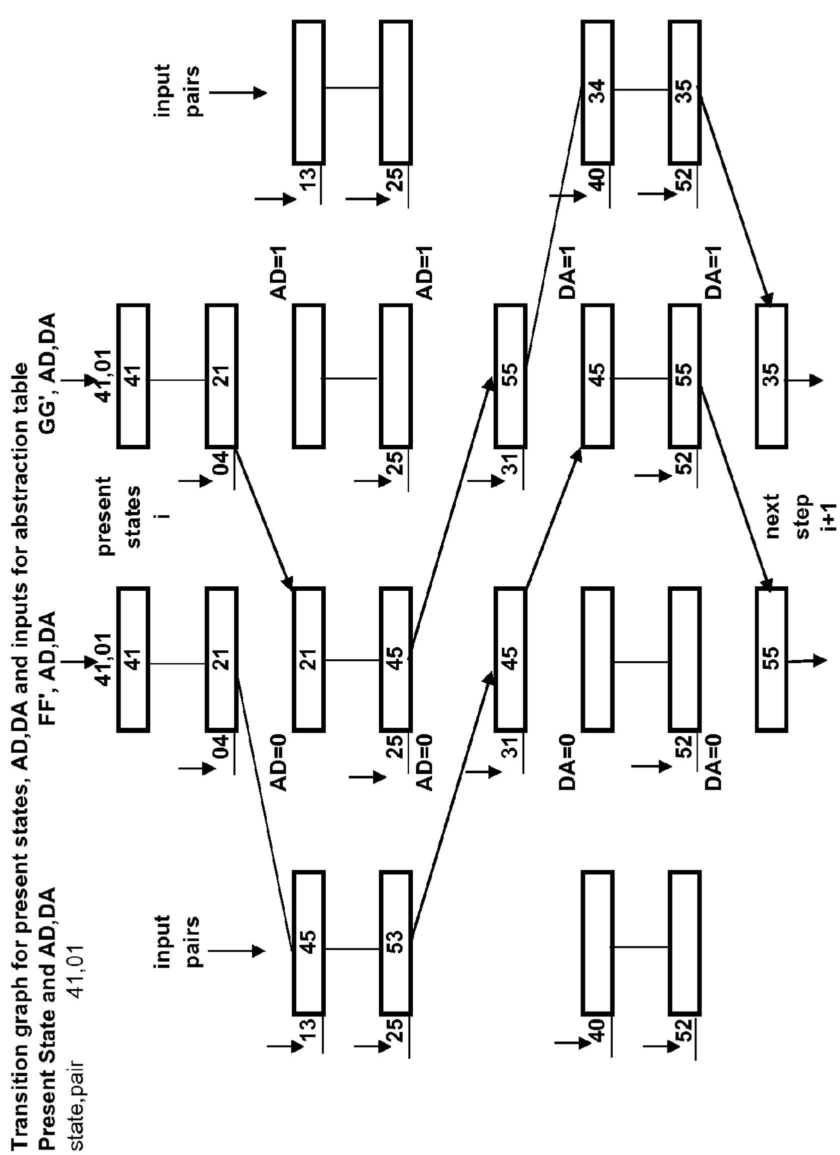
Figures 9, 10, 11, 12, 13, 14, 15, 16, 17, 18, 19, 20, 21, 22, 23, 24, 25, 26, 27, 28, 29, 30, 31:
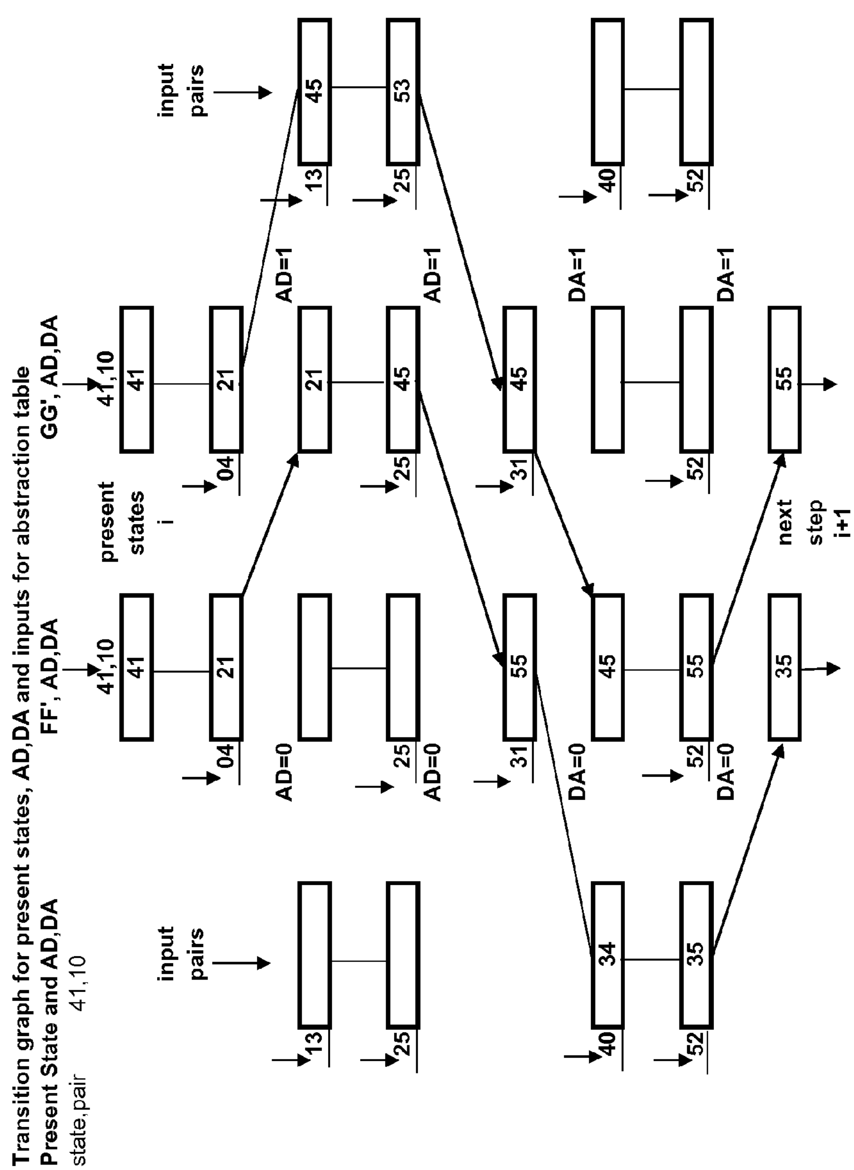
Figures 9, 10, 11, 12, 13, 14, 15, 16, 17, 18, 19, 20, 21, 22, 23, 24, 25, 26, 27, 28, 29, 30, 31, 32:
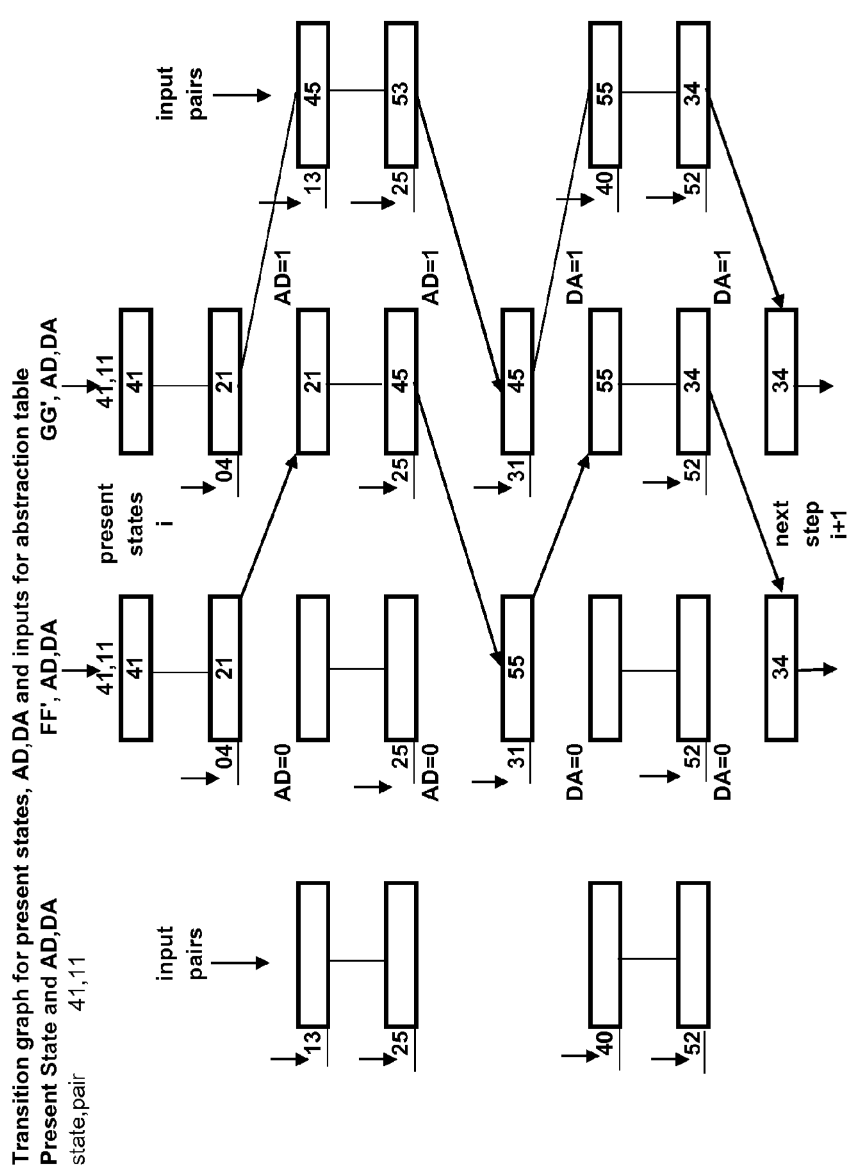
Figures 9, 10, 11, 12, 13, 14, 15, 16, 17, 18, 19, 20, 21, 22, 23, 24, 25, 26, 27, 28, 29, 30, 31, 32, 33:
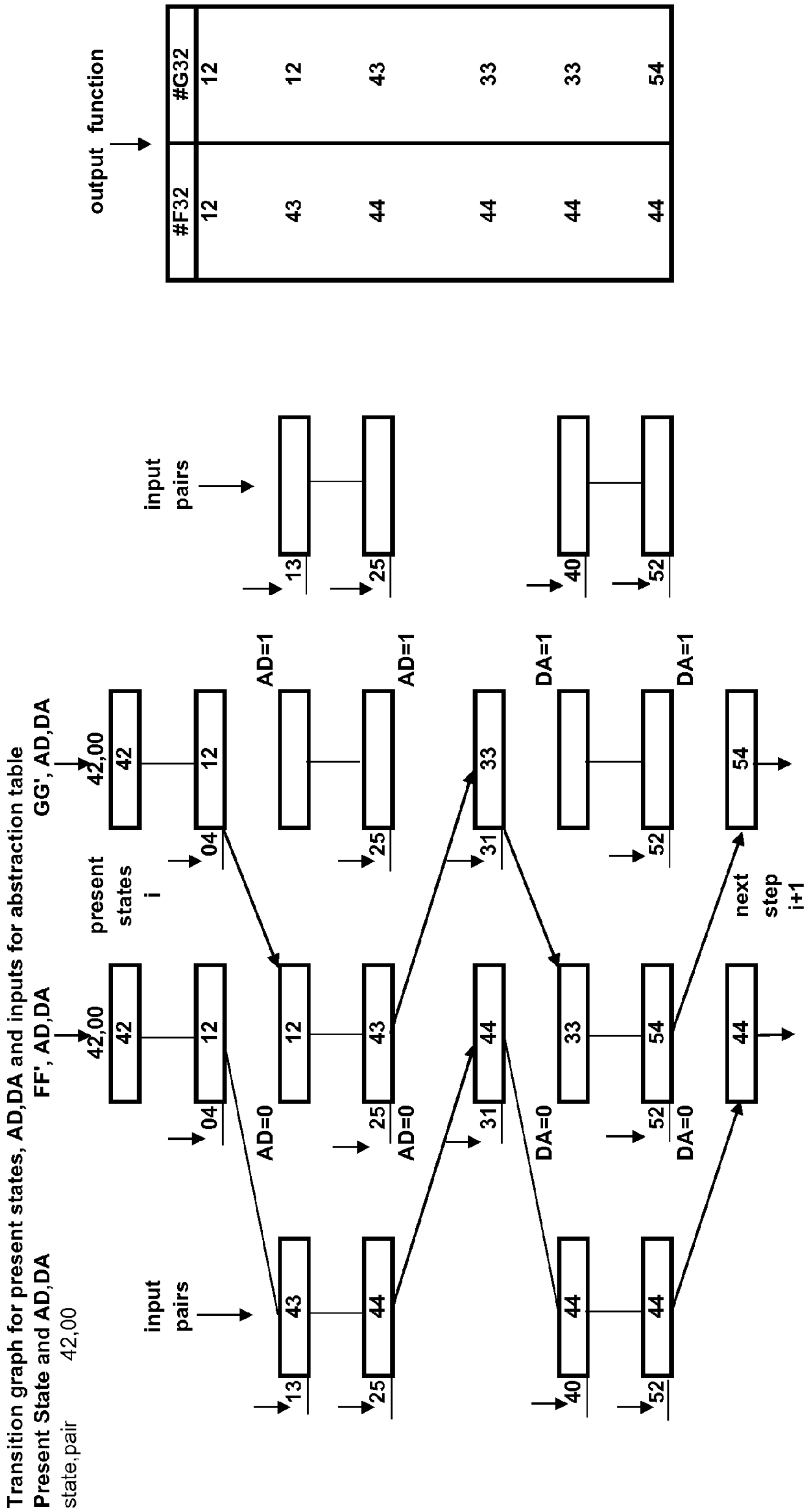
Figures 9, 10, 11, 12, 13, 14, 15, 16, 17, 18, 19, 20, 21, 22, 23, 24, 25, 26, 27, 28, 29, 30, 31, 32, 33, 34:
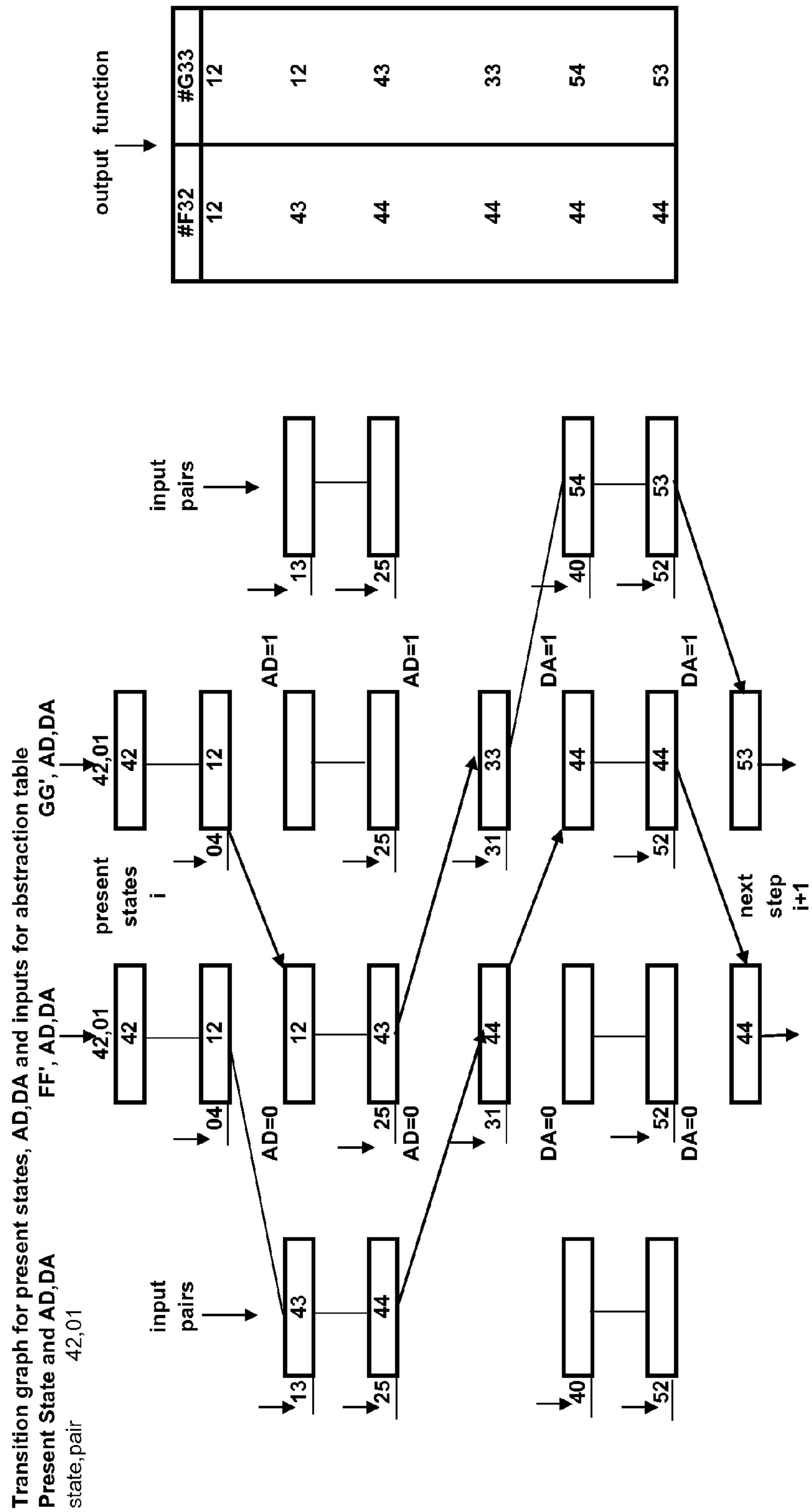
Figures 9, 10, 11, 12, 13, 14, 15, 16, 17, 18, 19, 20, 21, 22, 23, 24, 25, 26, 27, 28, 29, 30, 31, 32, 33, 34, 35:
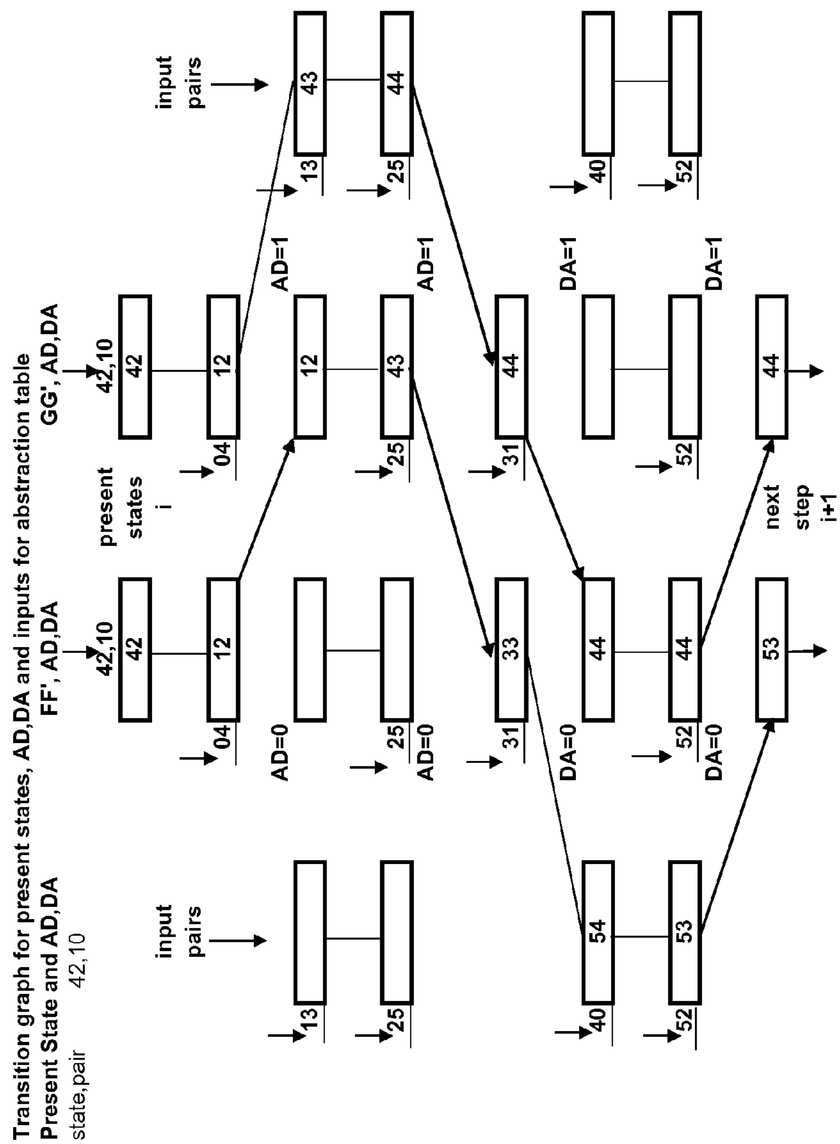
Figures 9, 10, 11, 12, 13, 14, 15, 16, 17, 18, 19, 20, 21, 22, 23, 24, 25, 26, 27, 28, 29, 30, 31, 32, 33, 34, 35, 36:
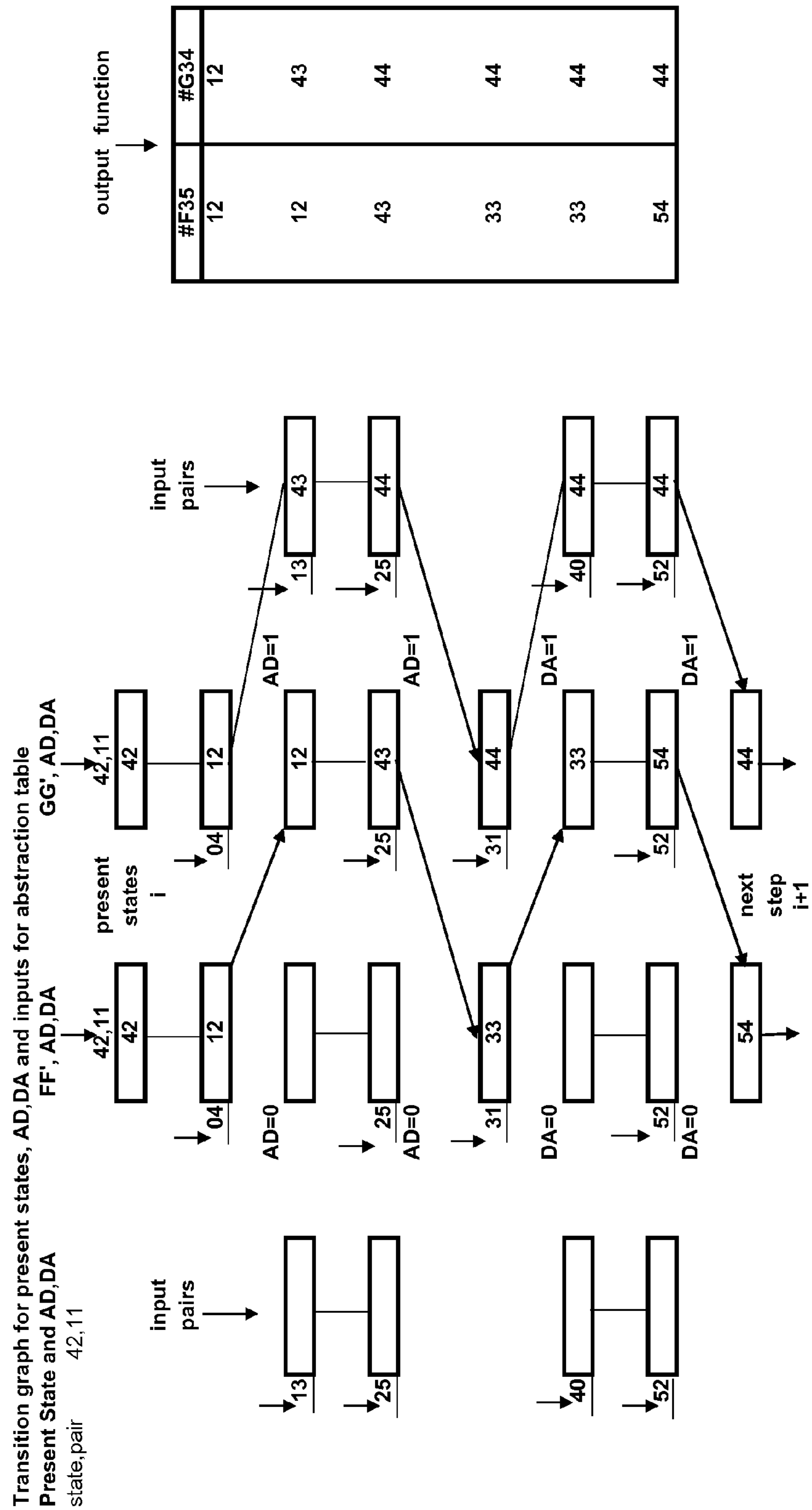
Figures 9, 10, 11, 12, 13, 14, 15, 16, 17, 18, 19, 20, 21, 22, 23, 24, 25, 26, 27, 28, 29, 30, 31, 32, 33, 34, 35, 36, 37:
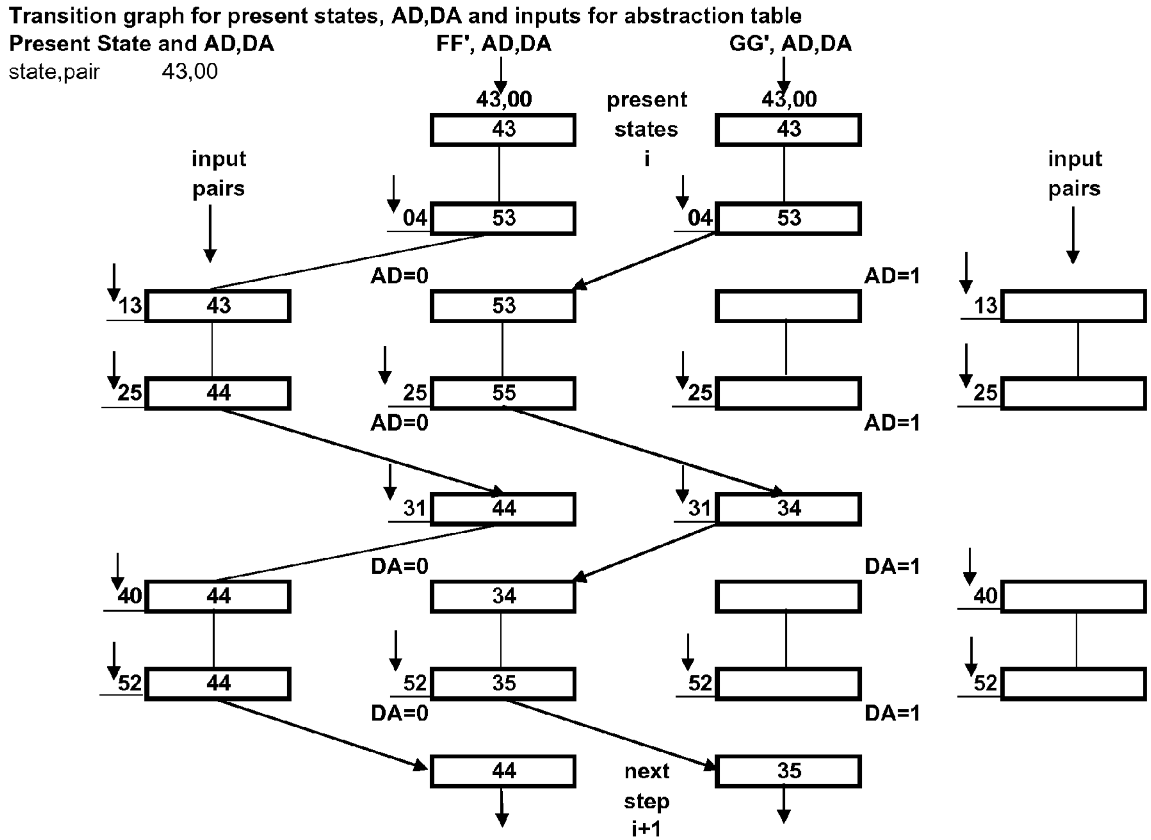
Figures 9, 10, 11, 12, 13, 14, 15, 16, 17, 18, 19, 20, 21, 22, 23, 24, 25, 26, 27, 28, 29, 30, 31, 32, 33, 34, 35, 36, 37, 38:
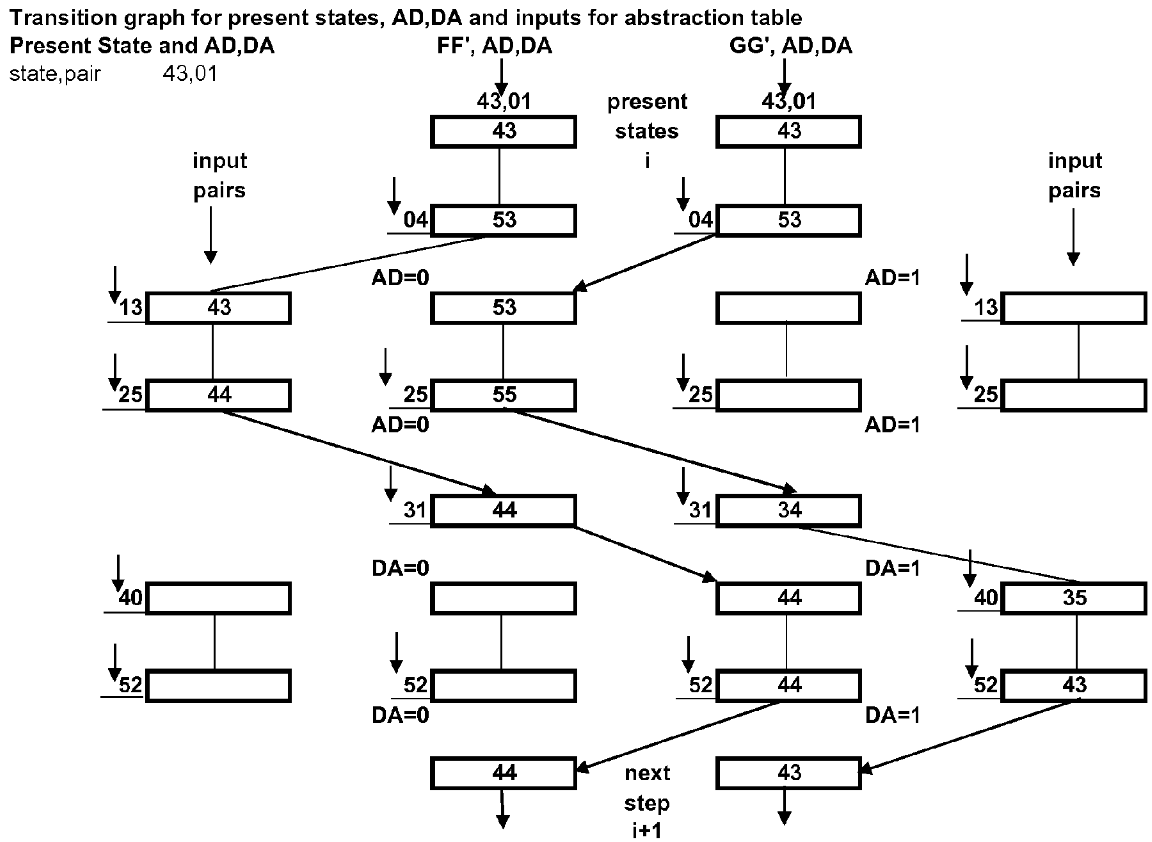
Figures 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39:
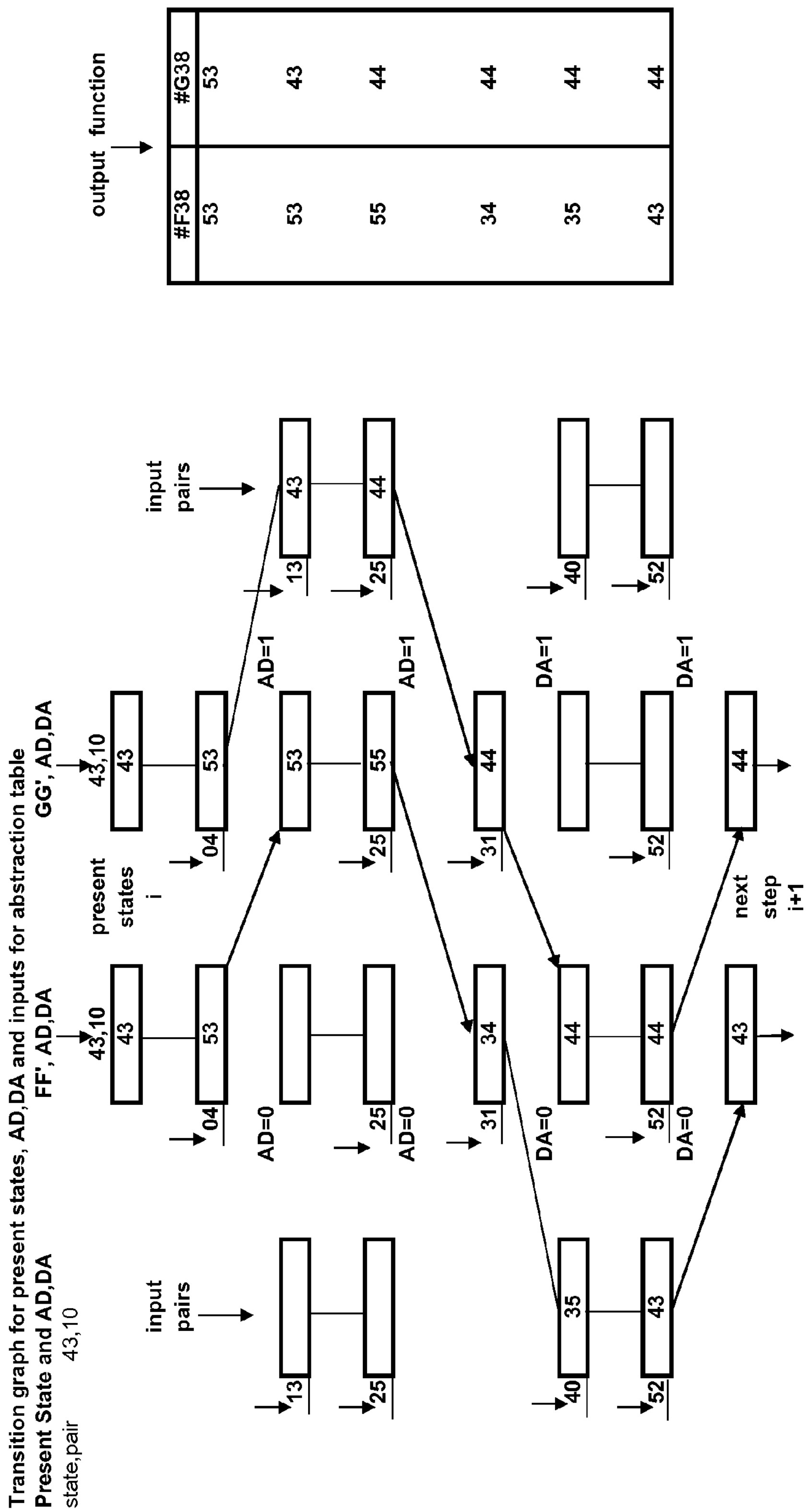
Figures 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40:
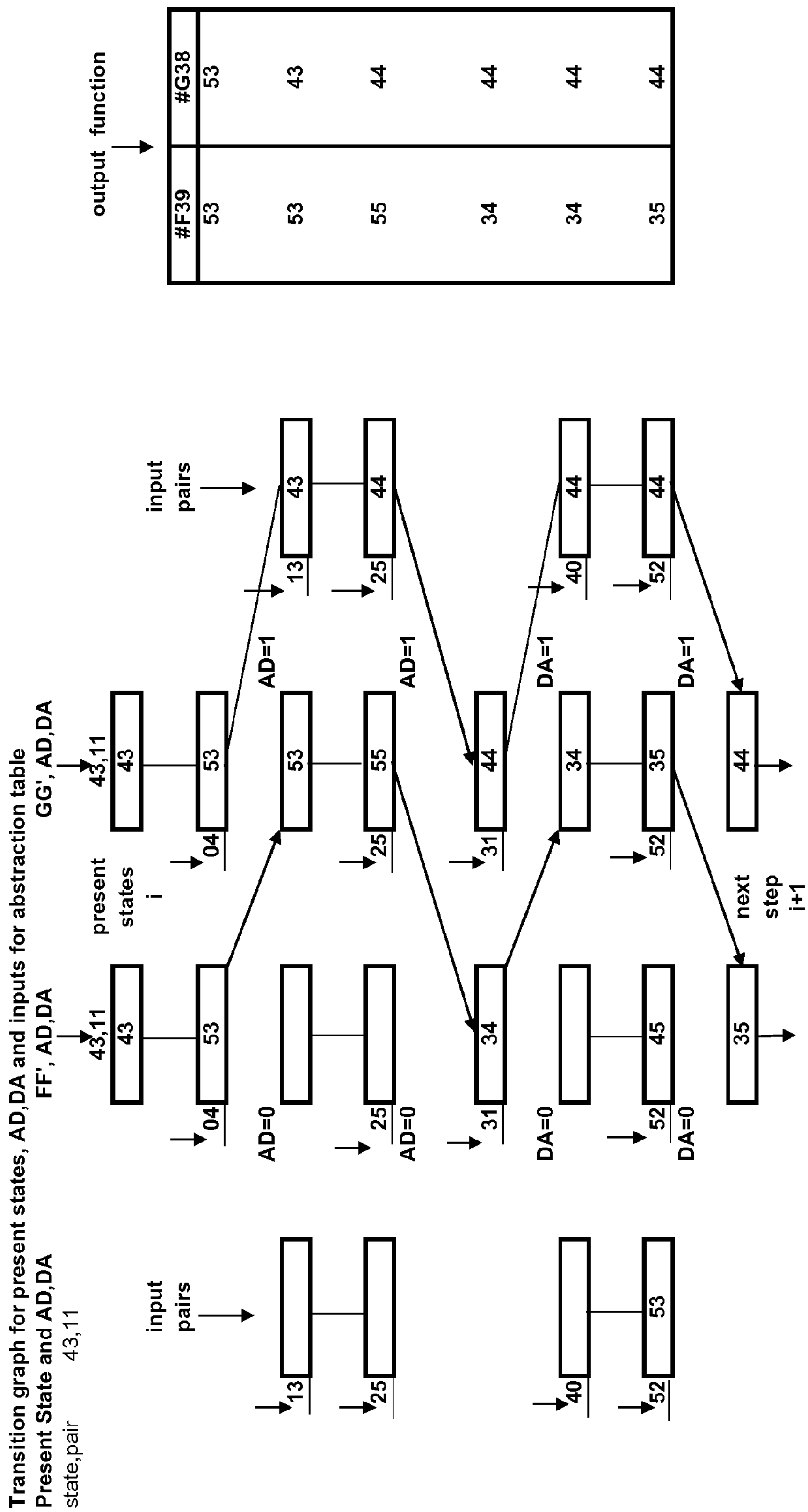
Figures 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41:
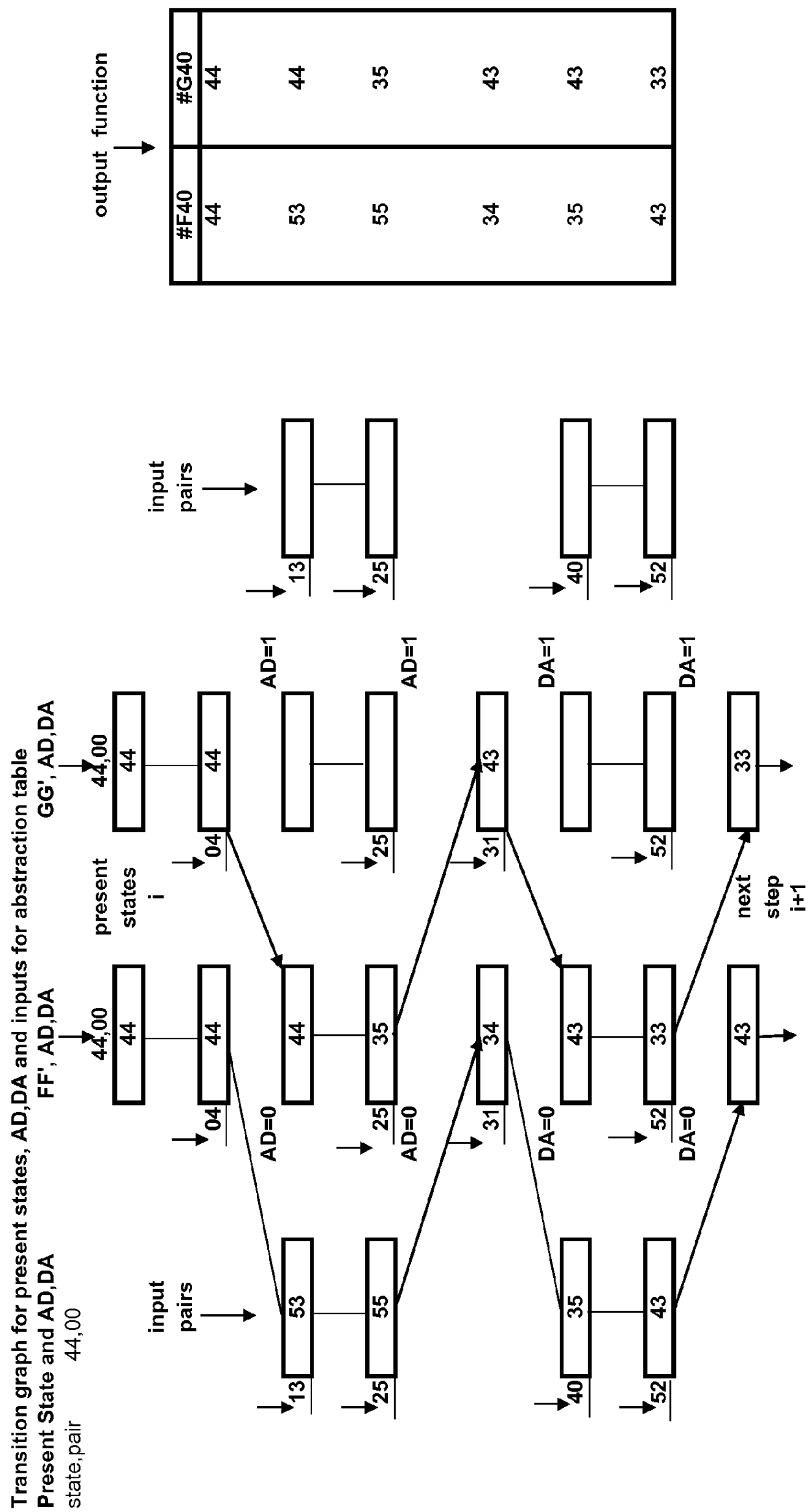
Figures 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42:
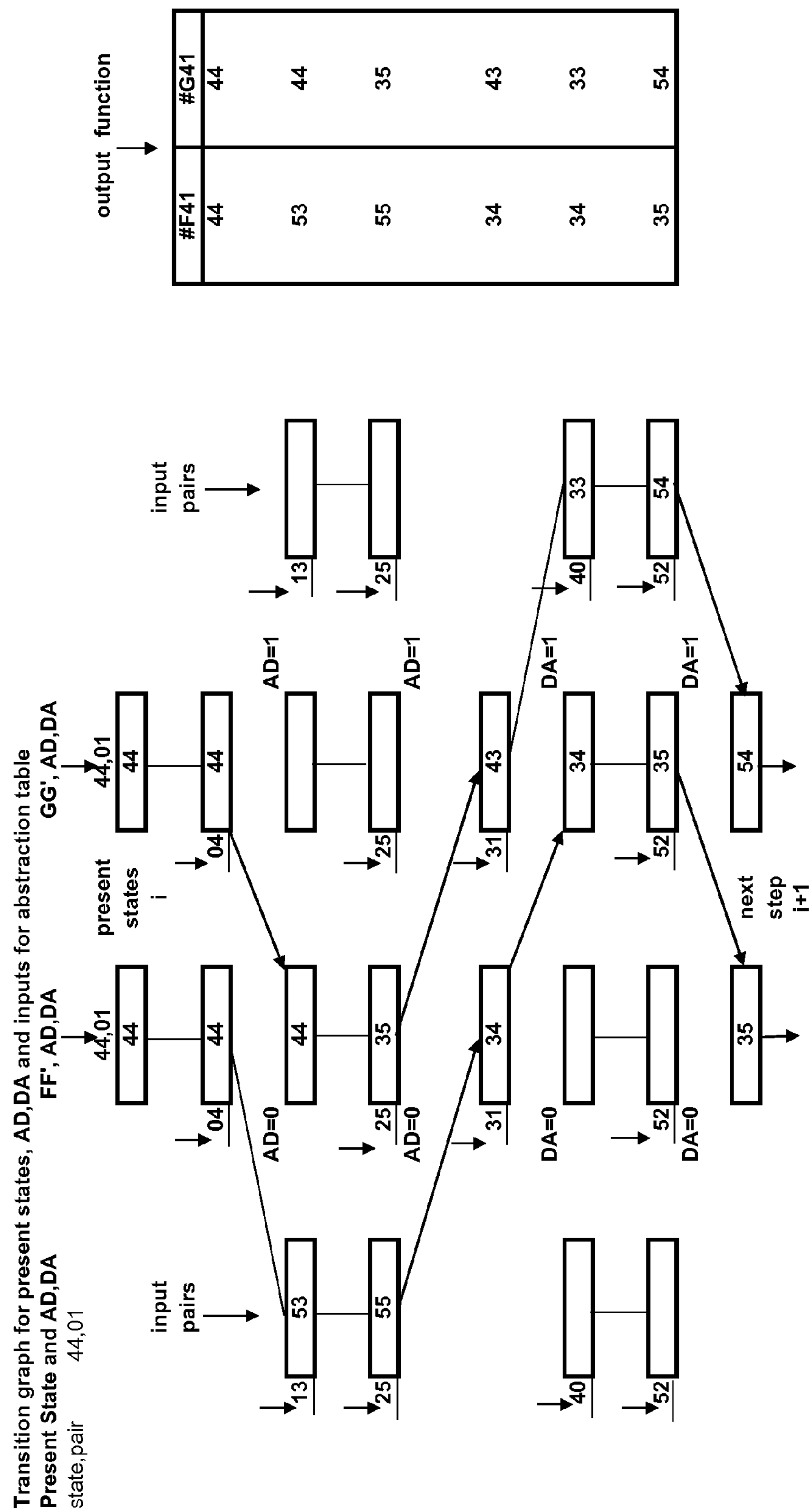
Figures 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43:
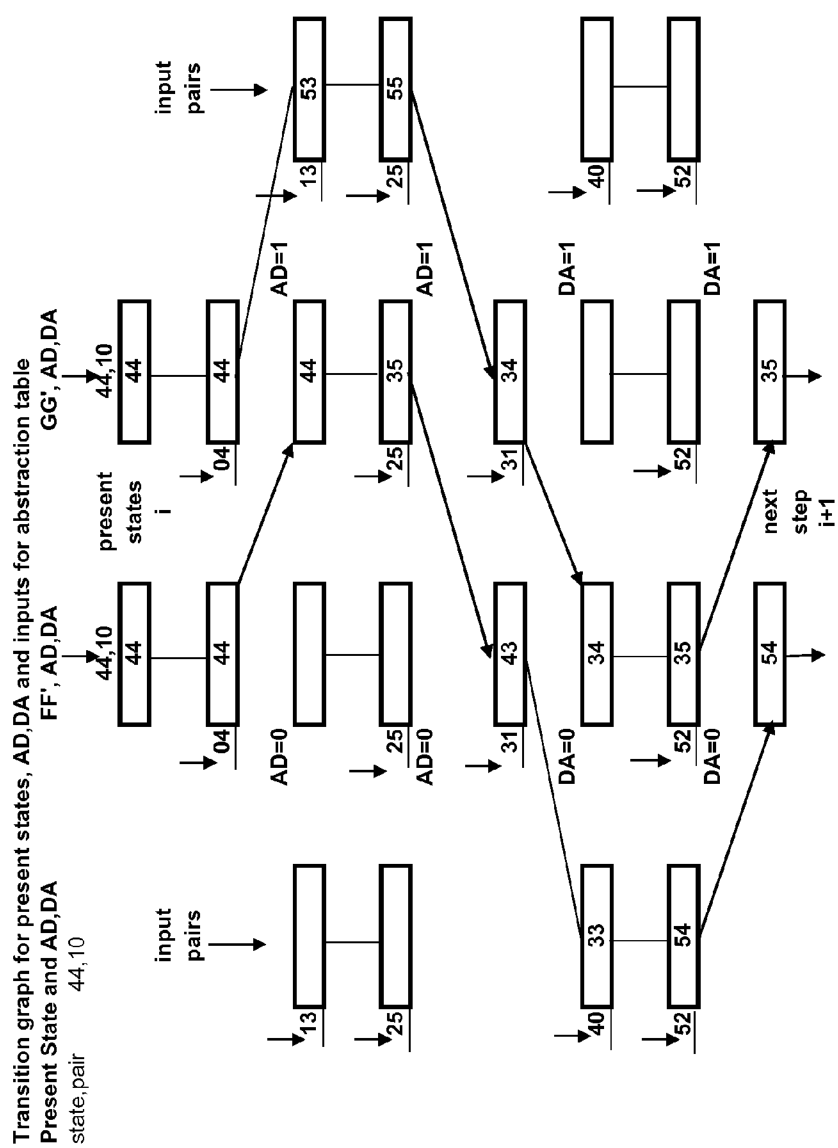
Figures 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44:
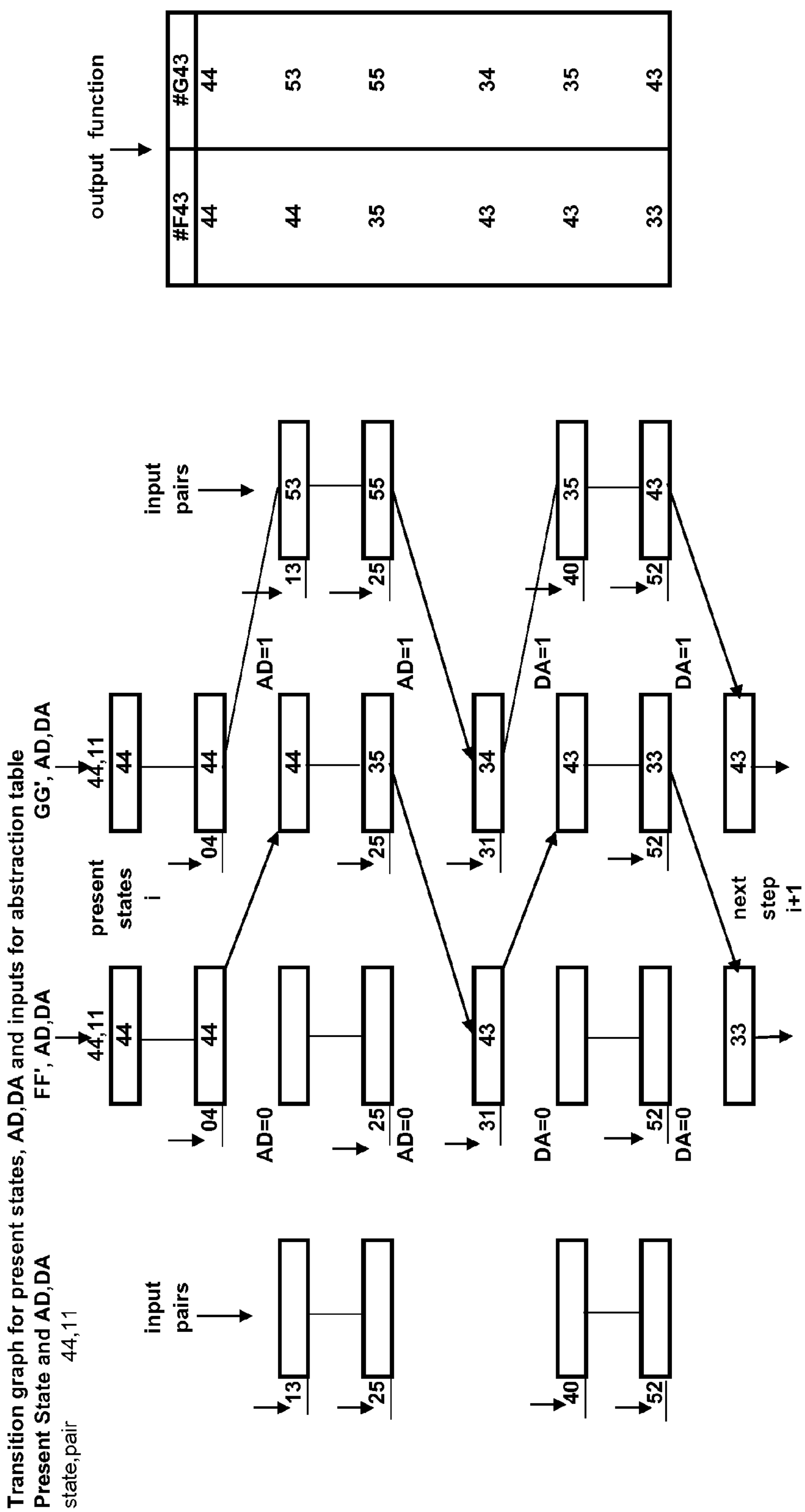
Figures 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45:
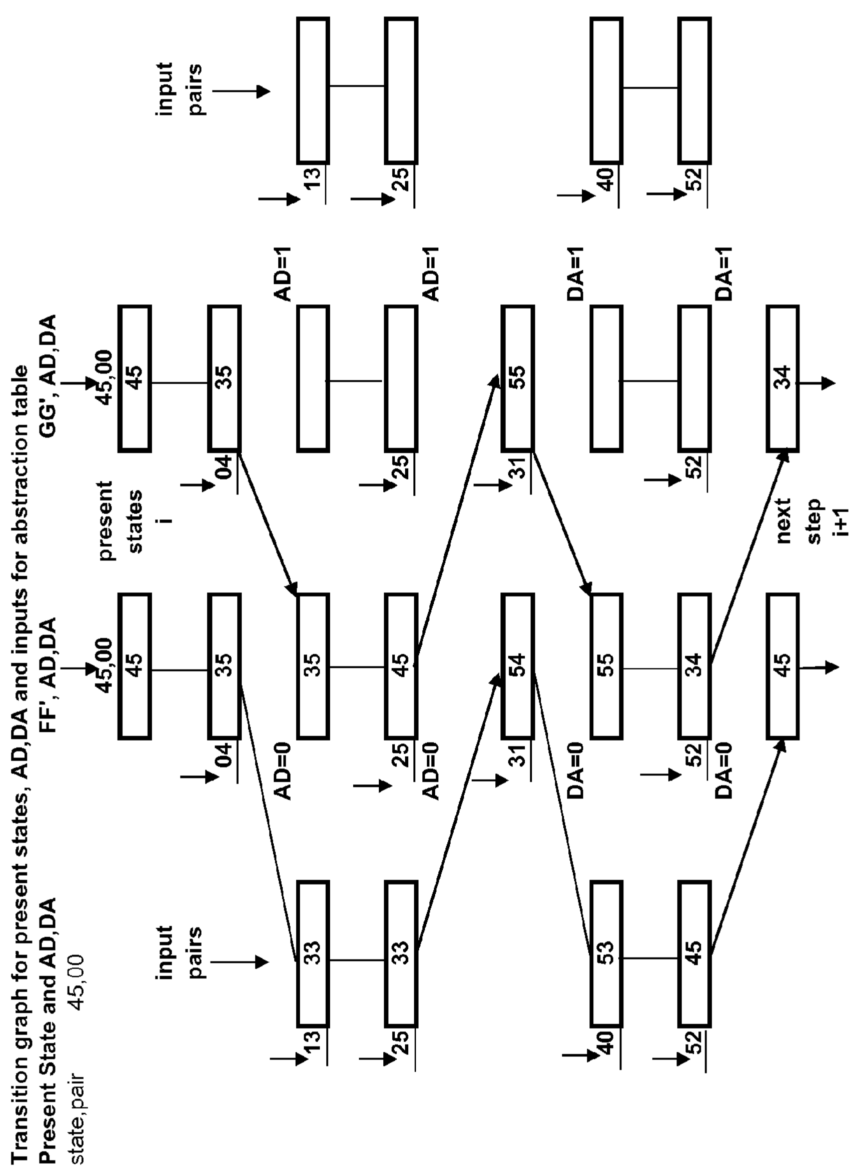
Figures 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46:
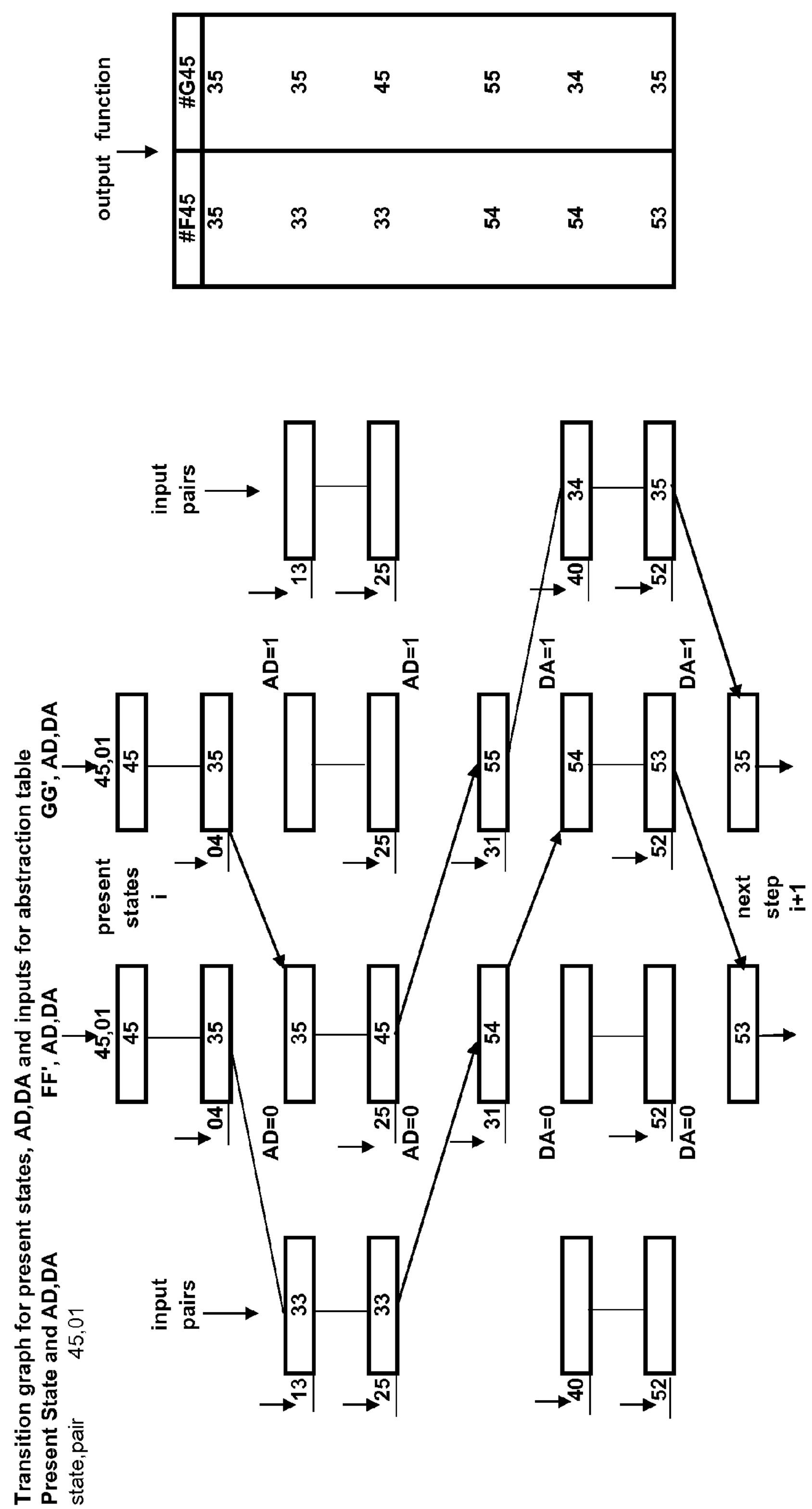
Figures 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47:
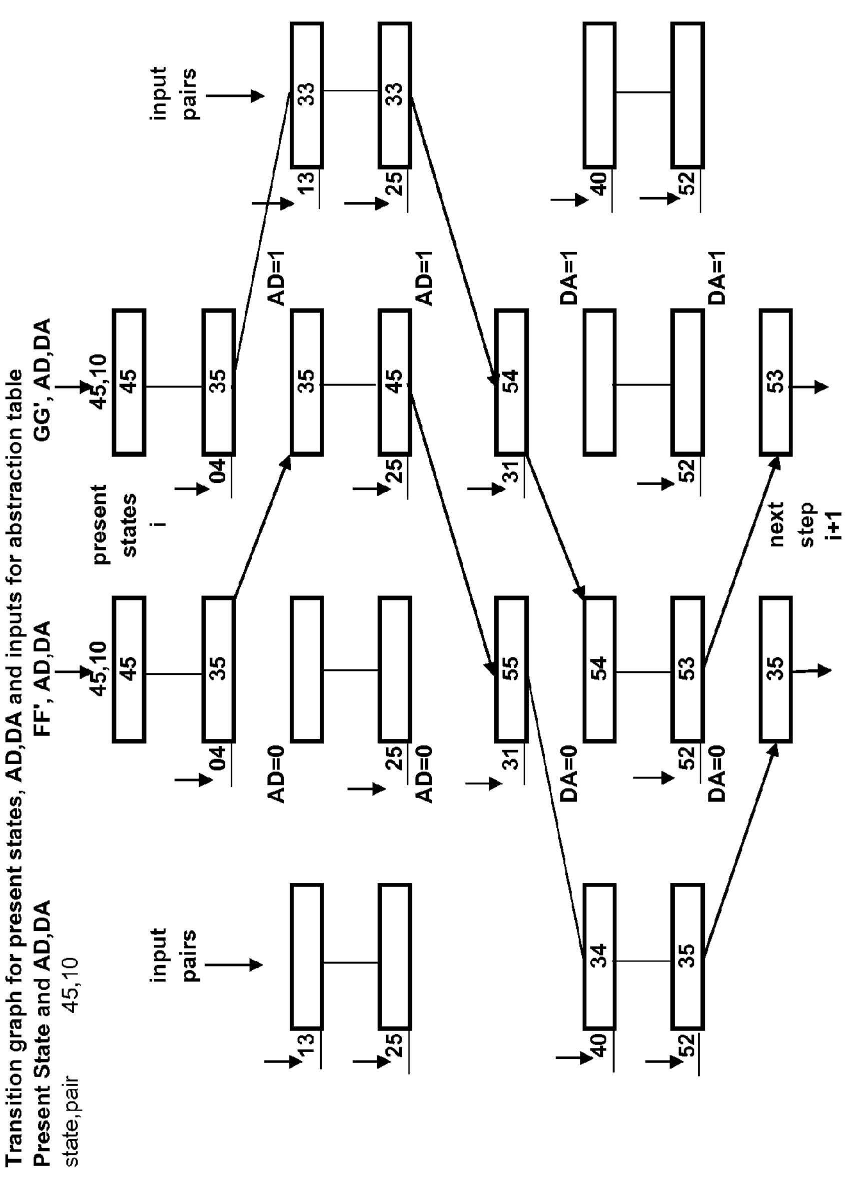
Figures 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48:
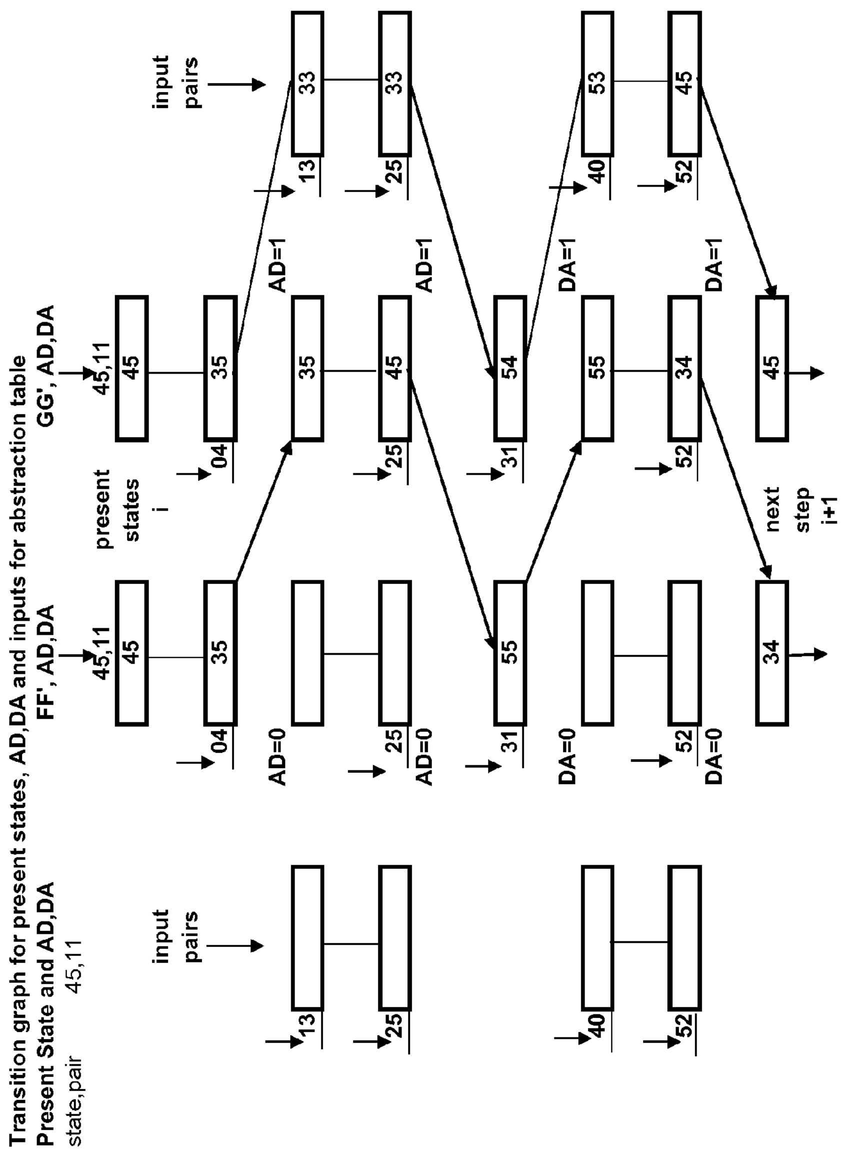
Figures 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49:
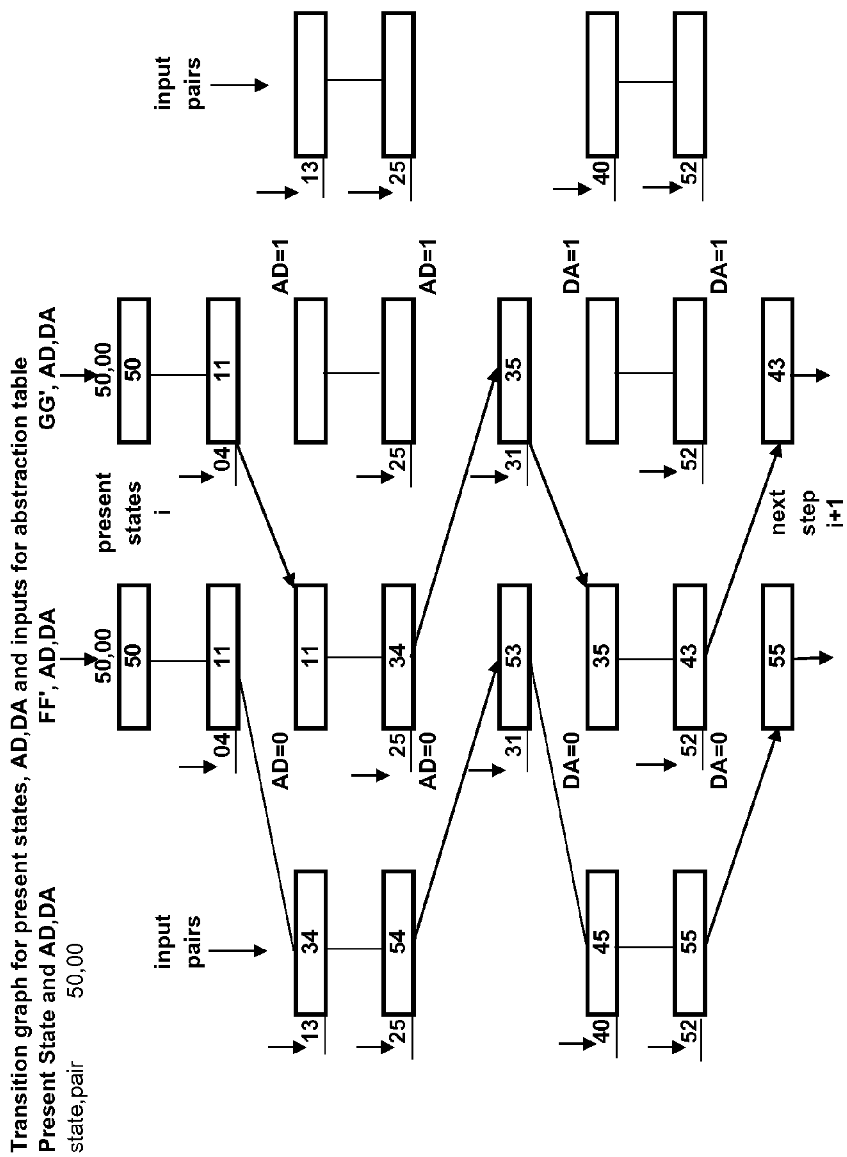
Figures 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50:
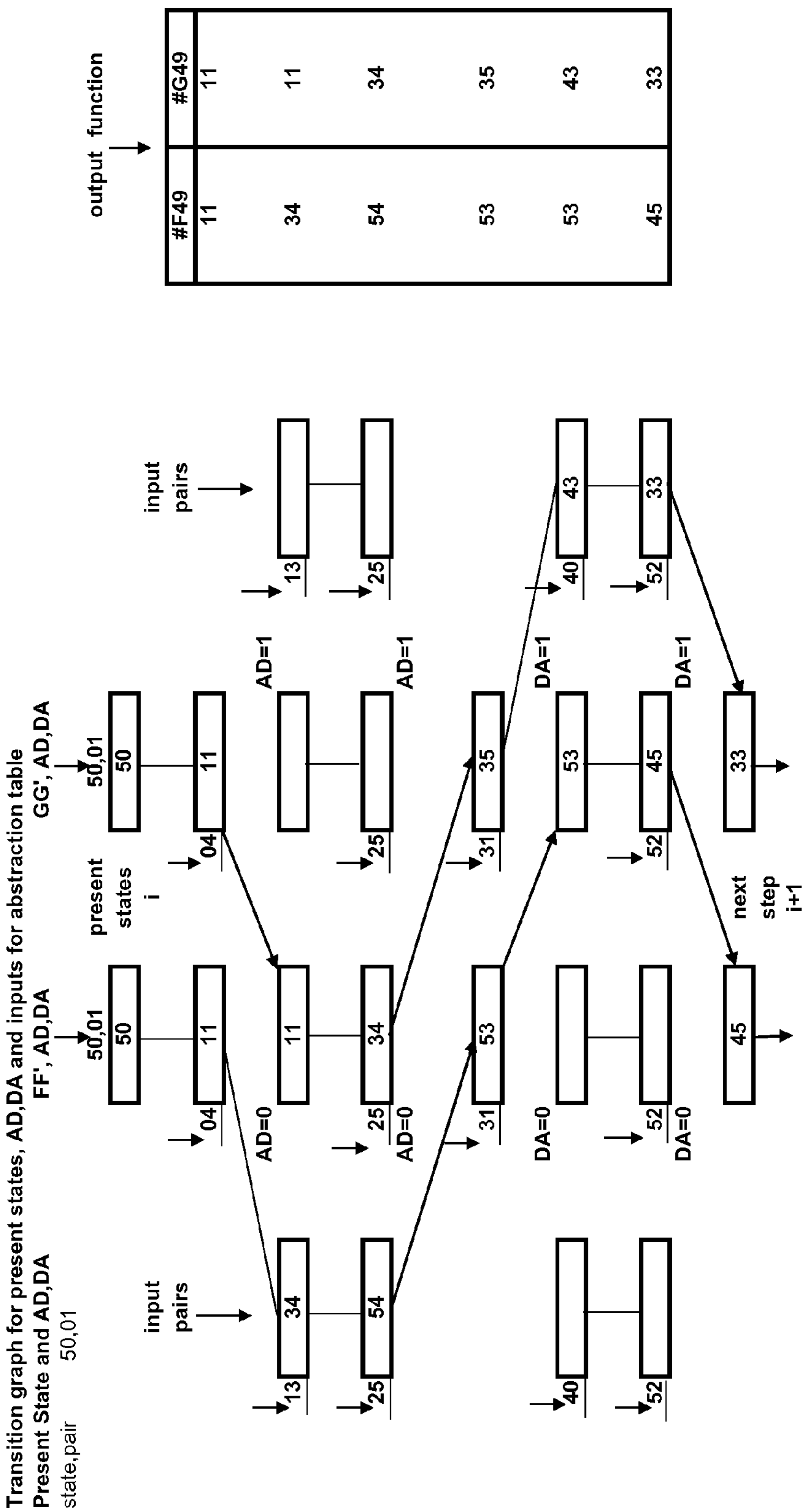
Figures 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51:
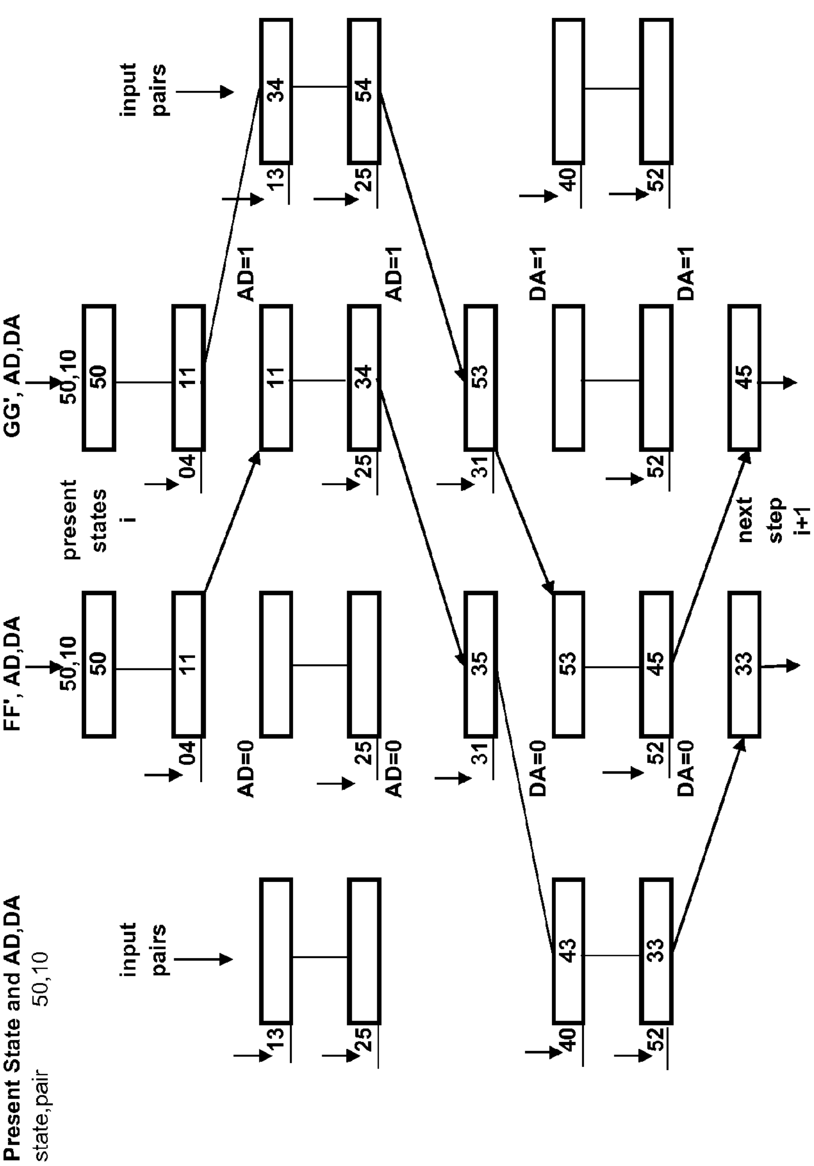
Figures 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52:
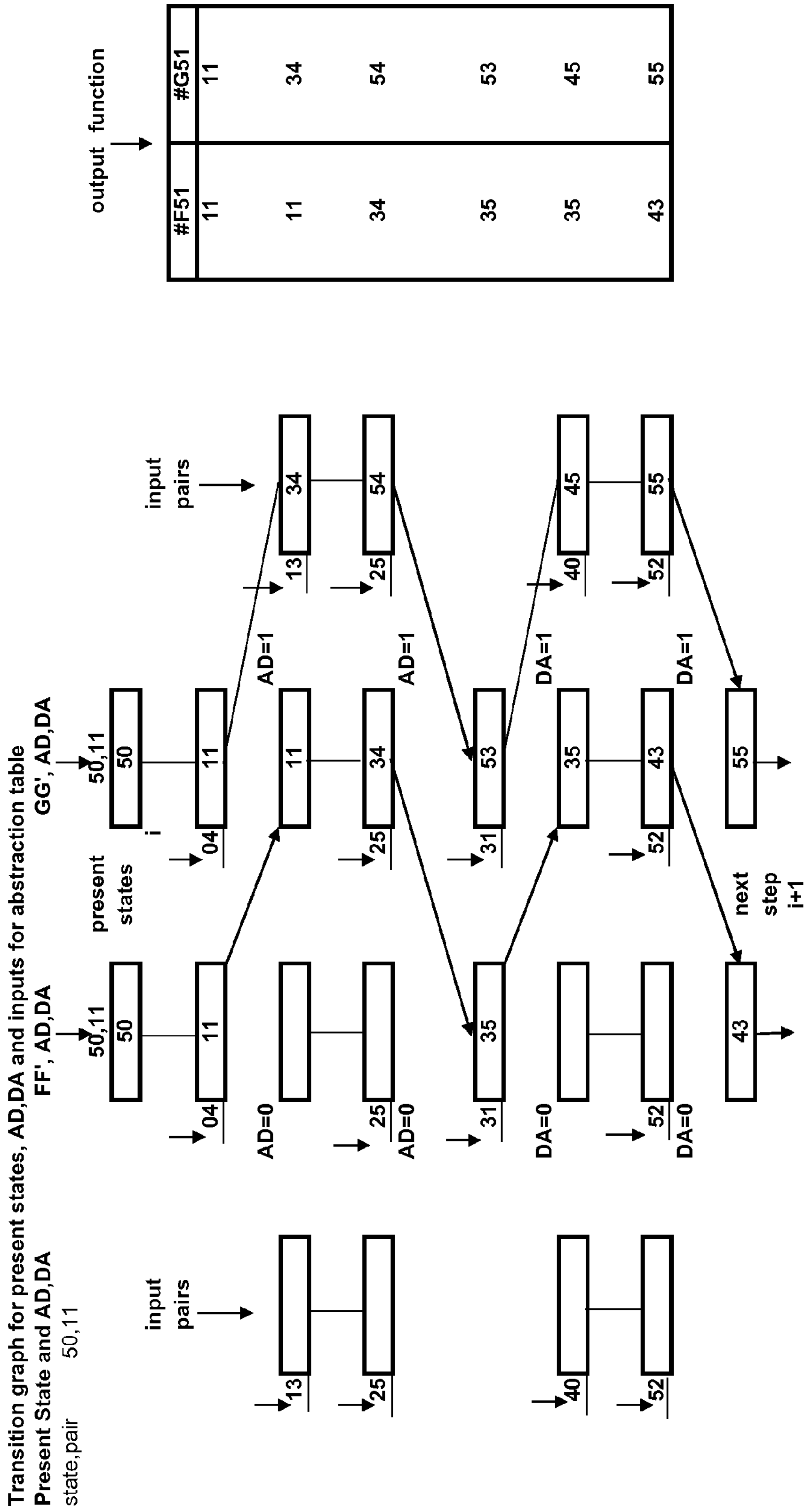
Figures 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53:
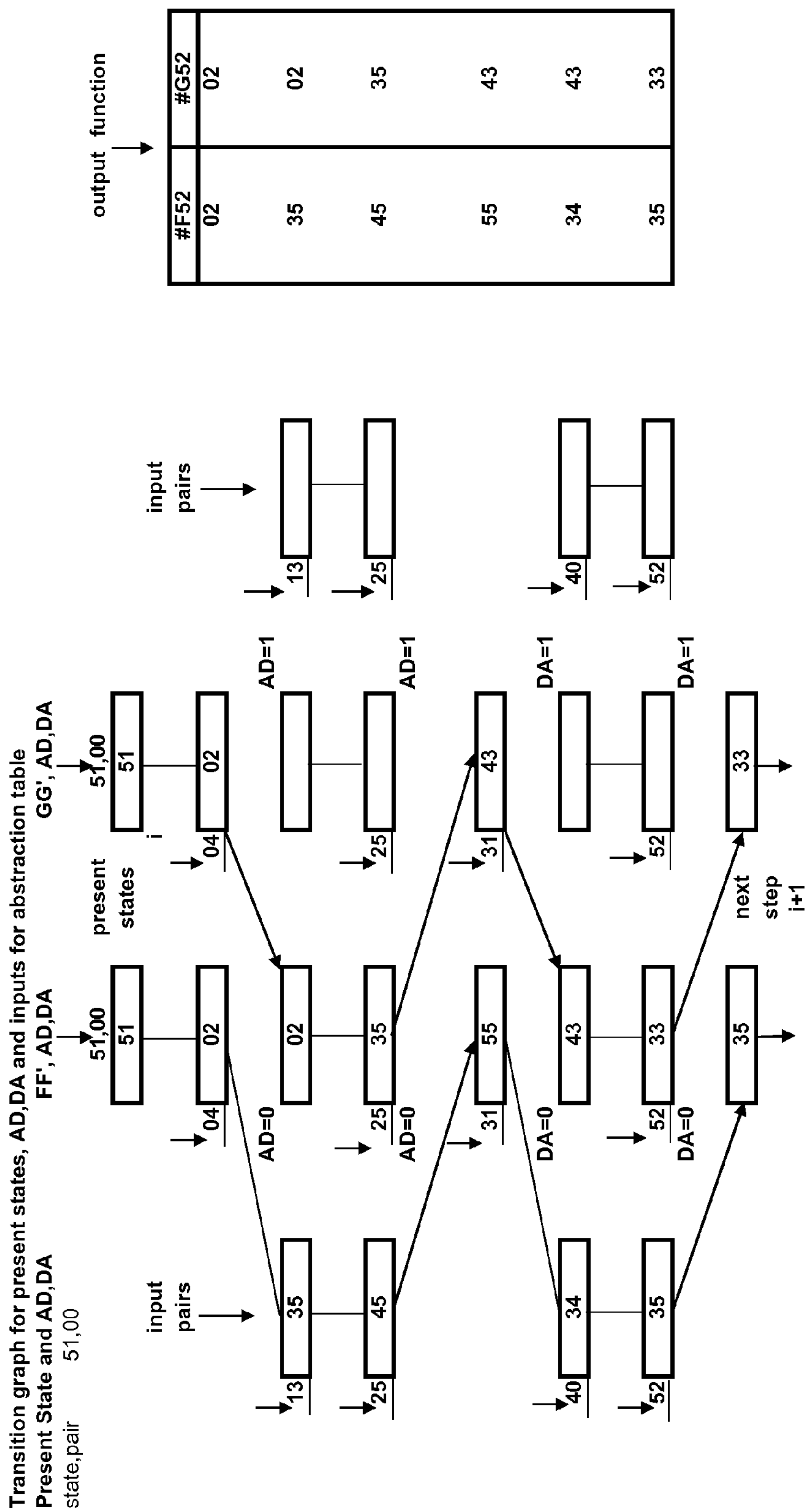
Figures 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54:
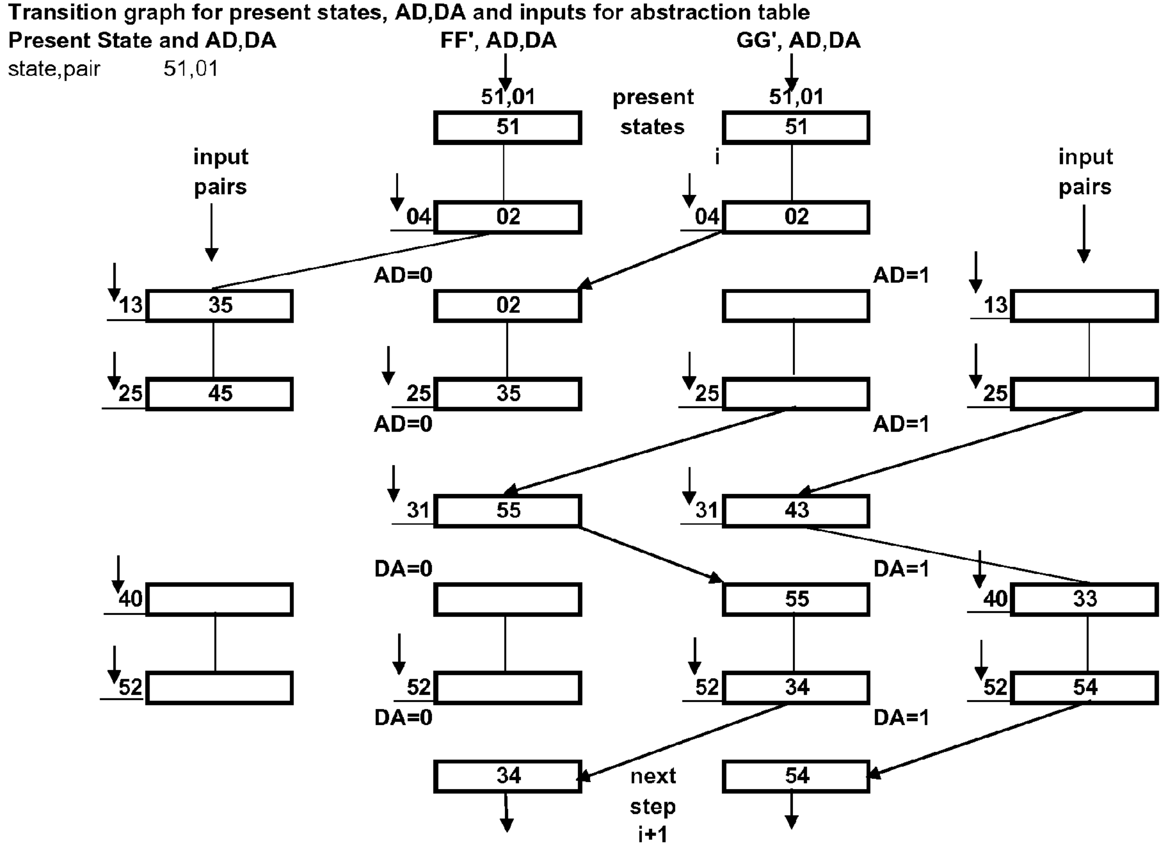
Figures 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55:
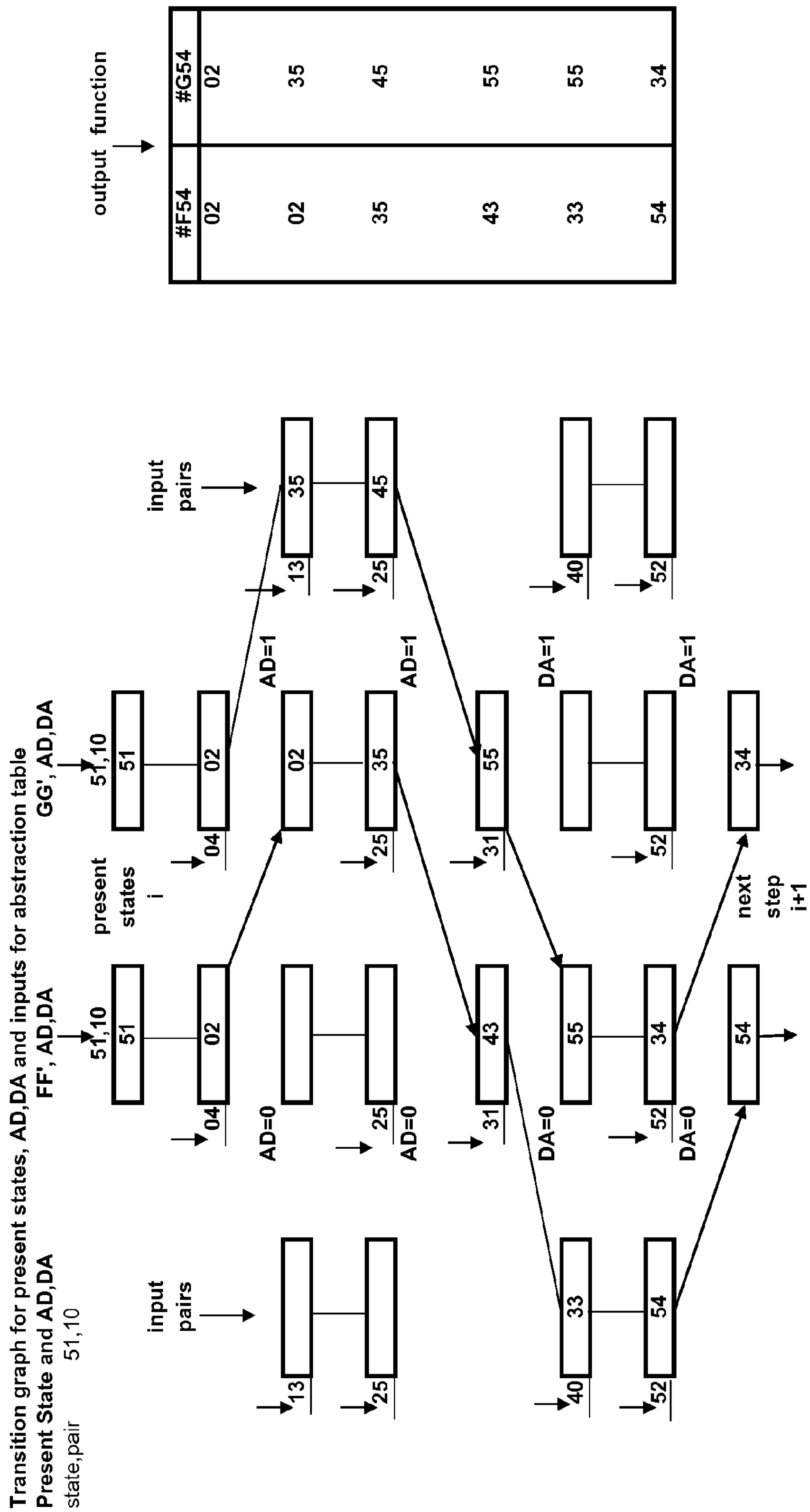
Figures 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56:
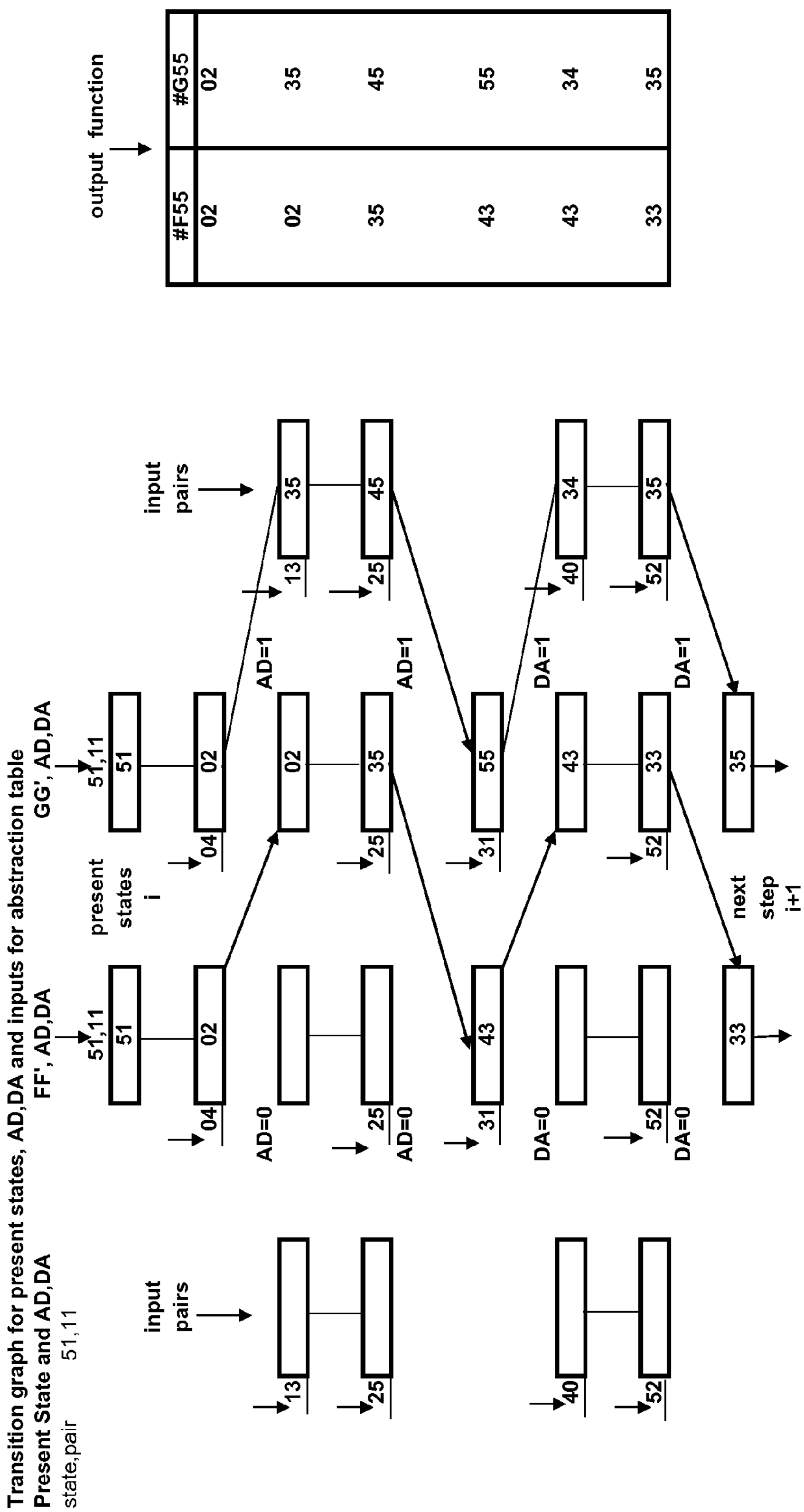
Figures 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57:
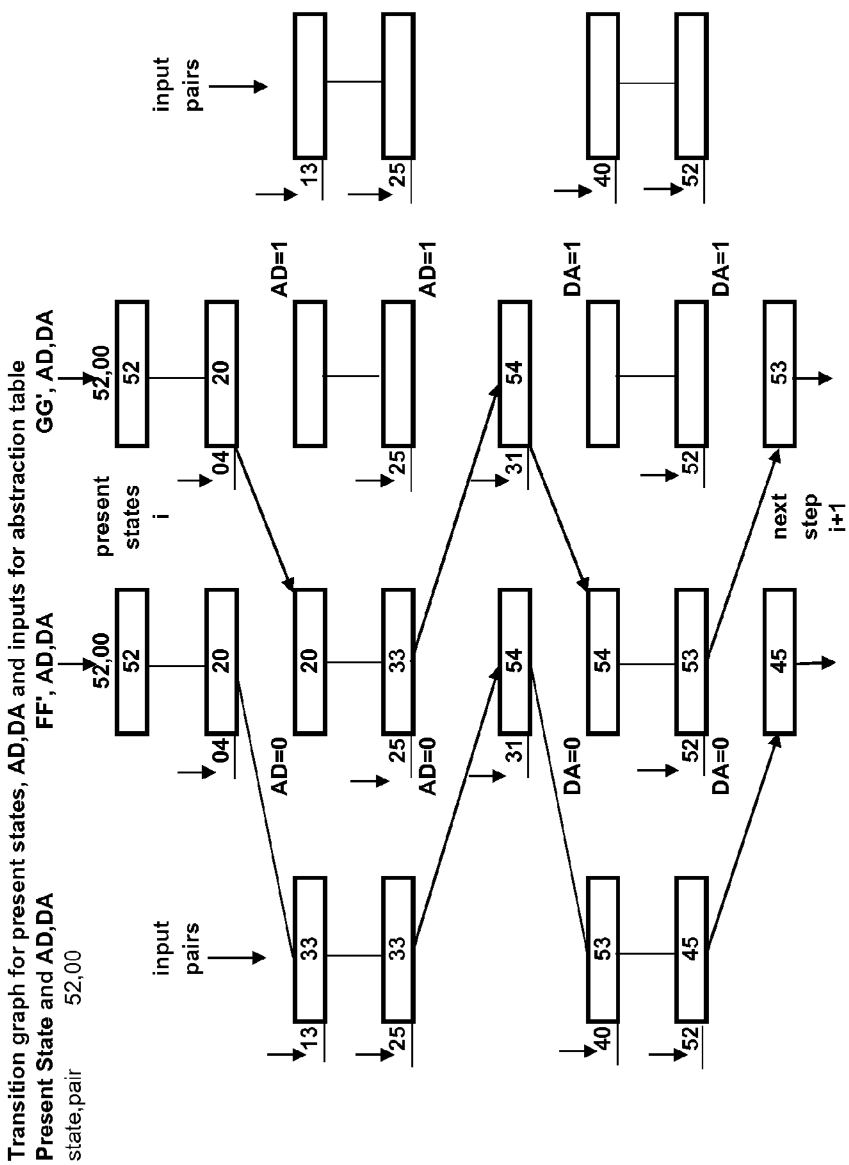
Figures 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58:
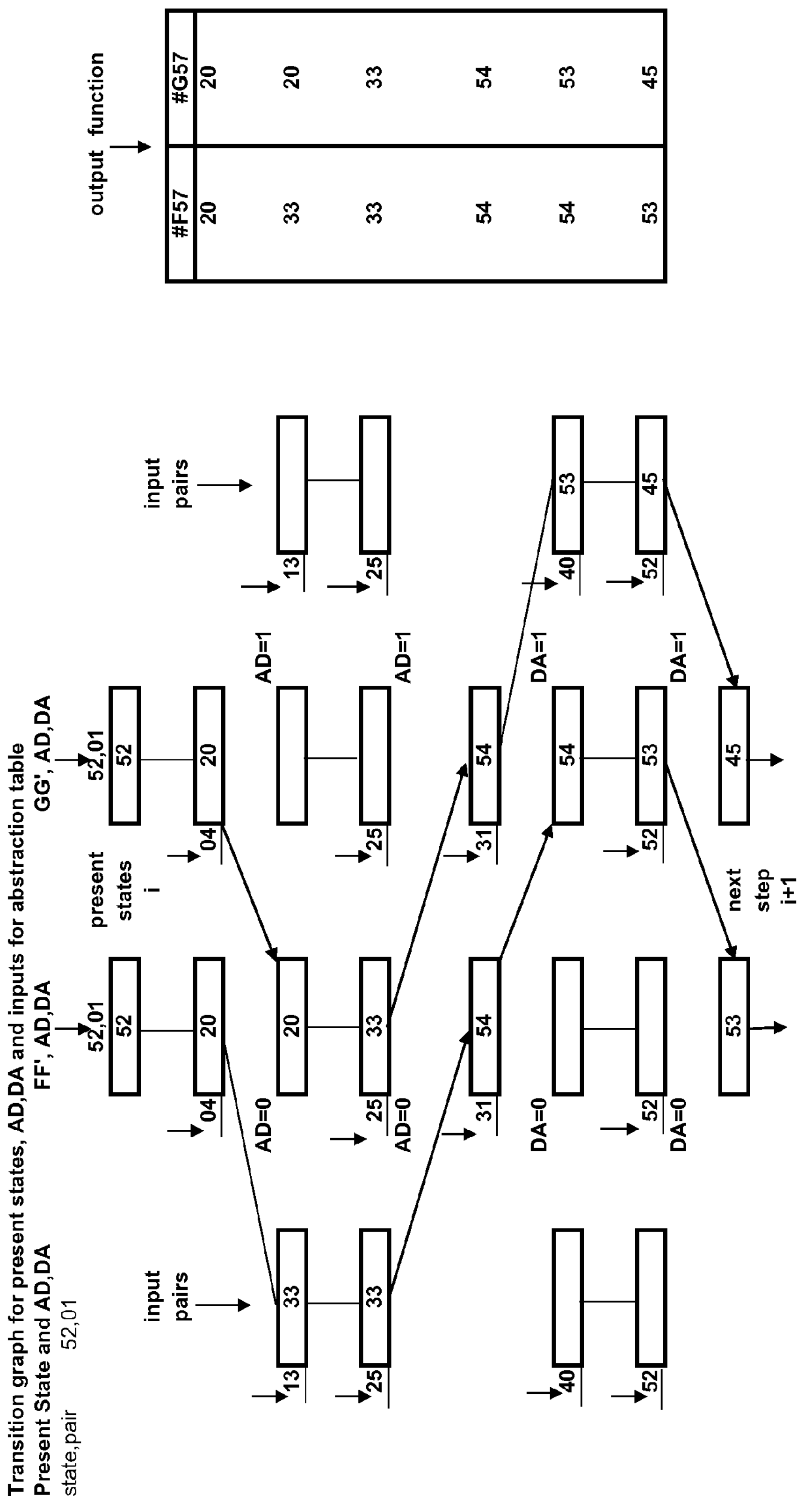
Figures 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59:
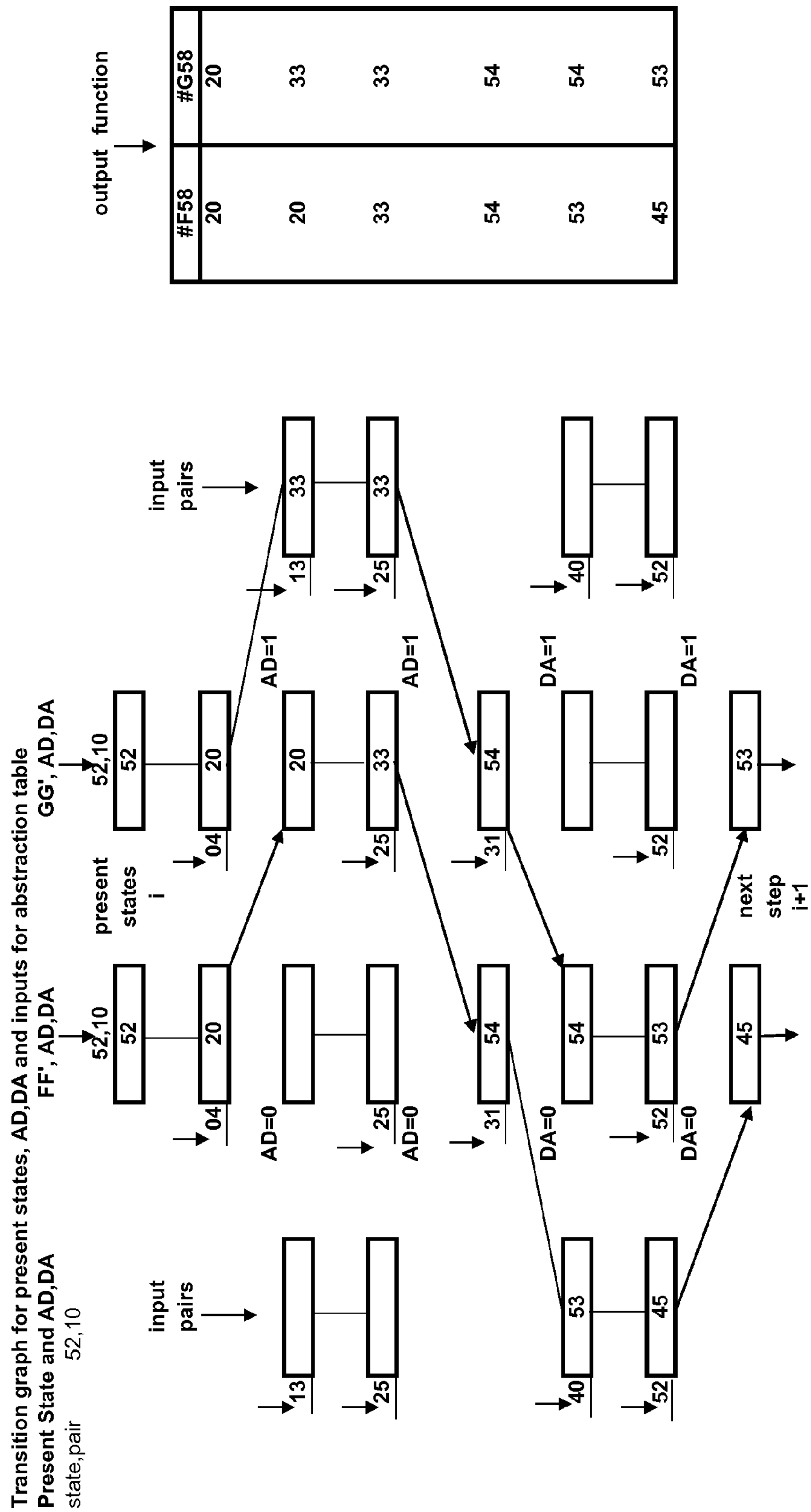
Figures 9, 60:
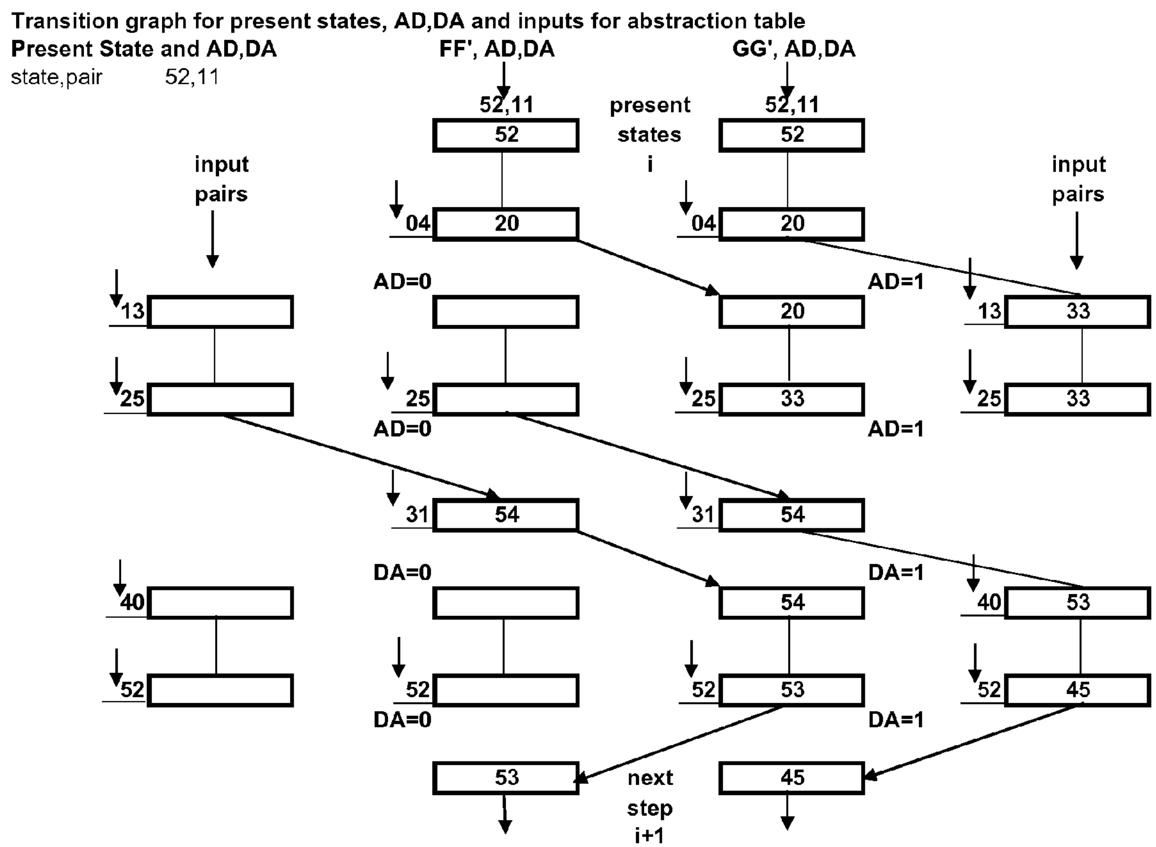
Figures 9, 61:
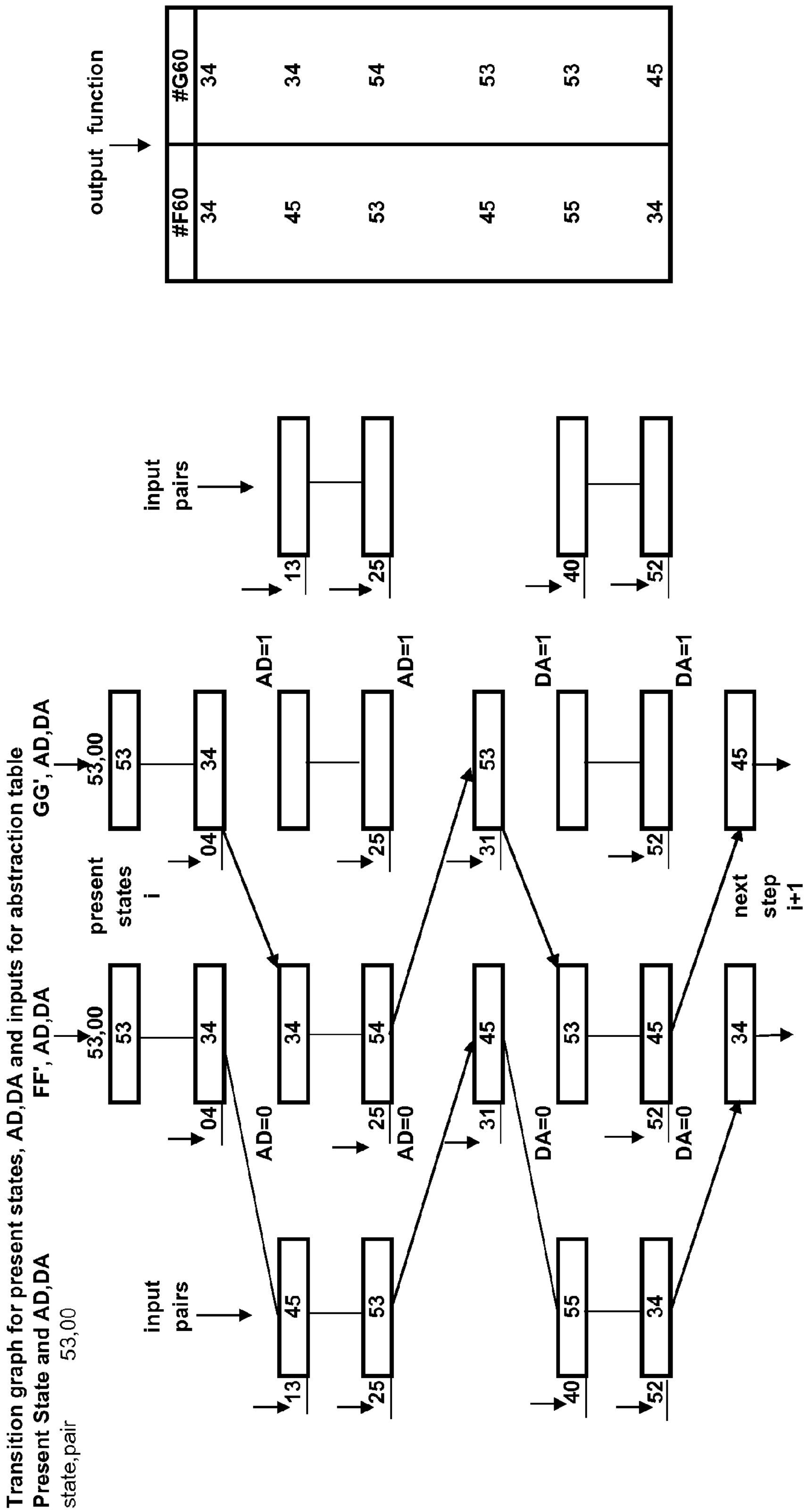
Figures 9, 62:
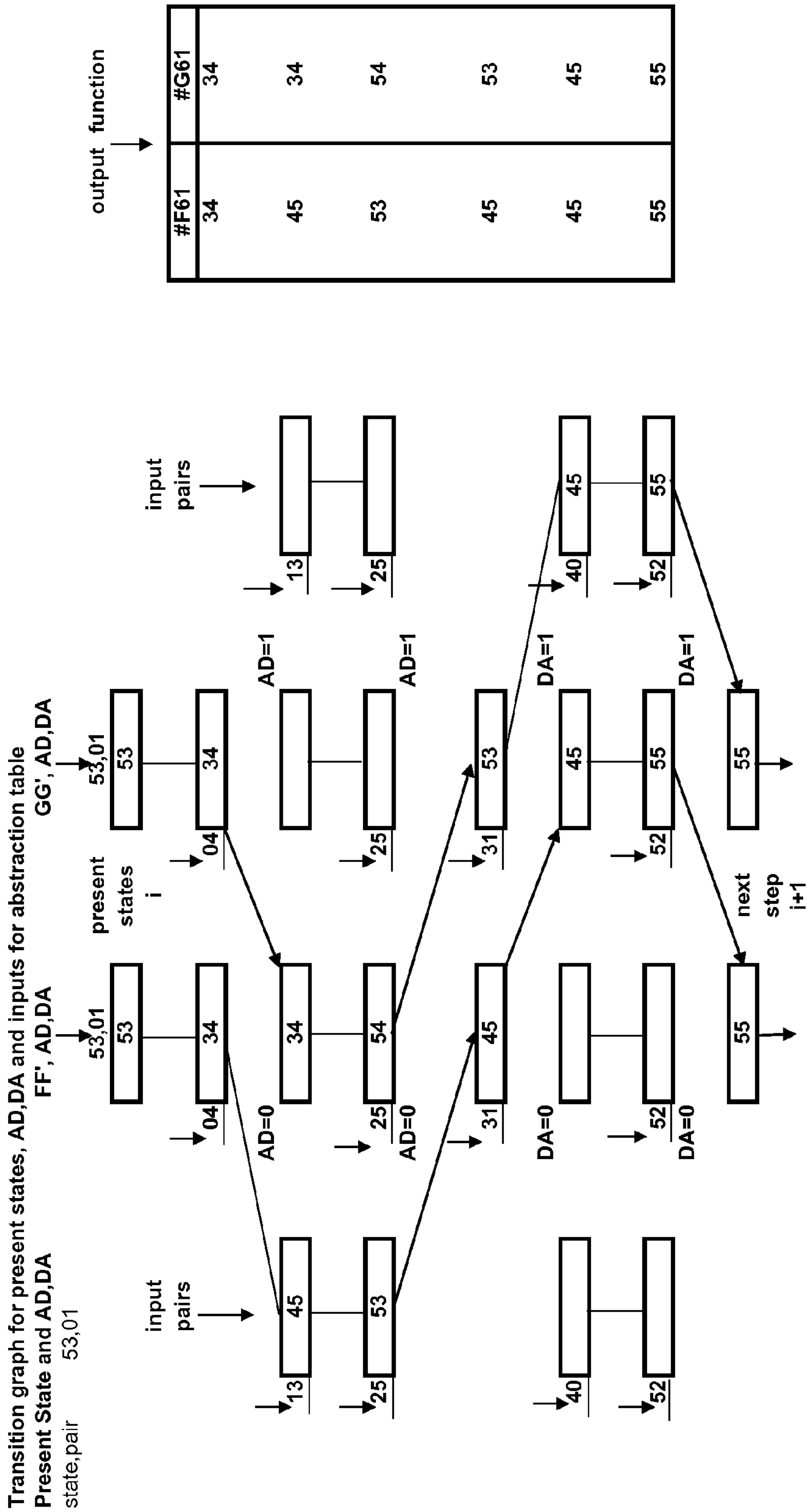
Figures 9, 63:
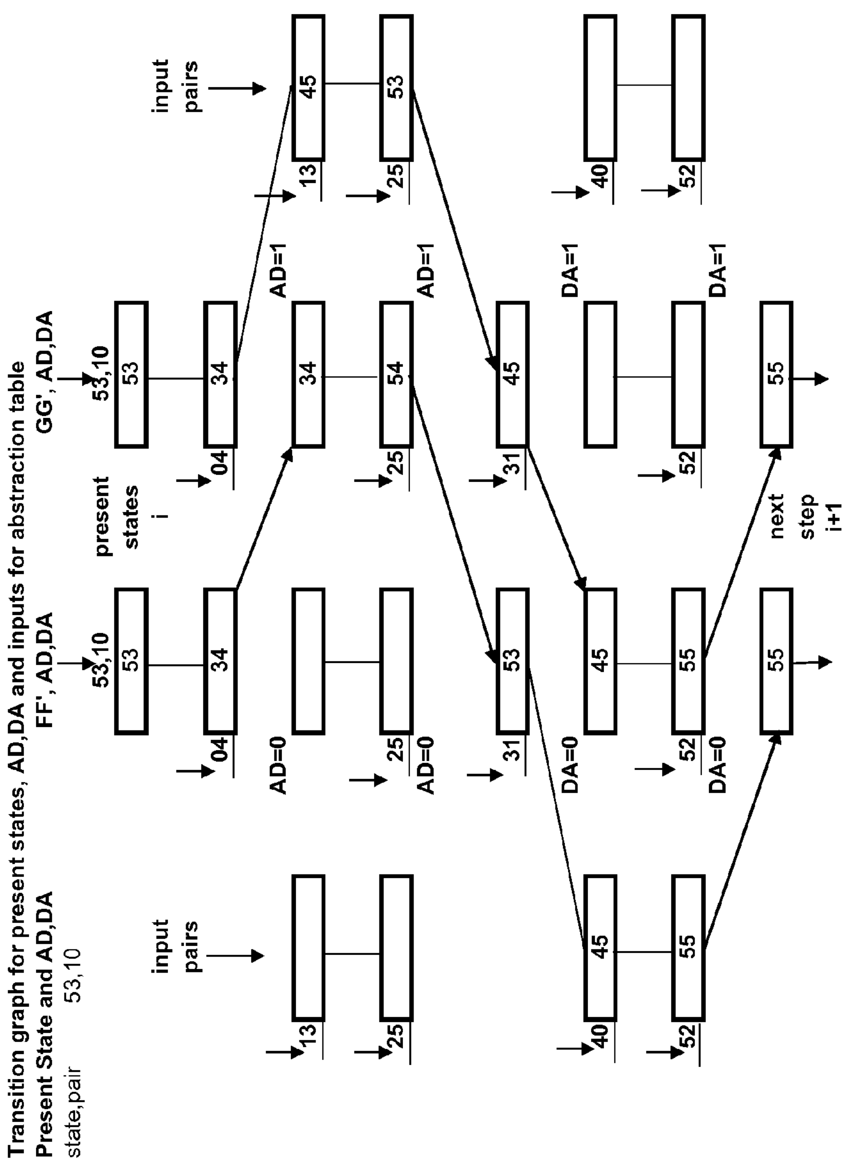
Figures 9, 64:
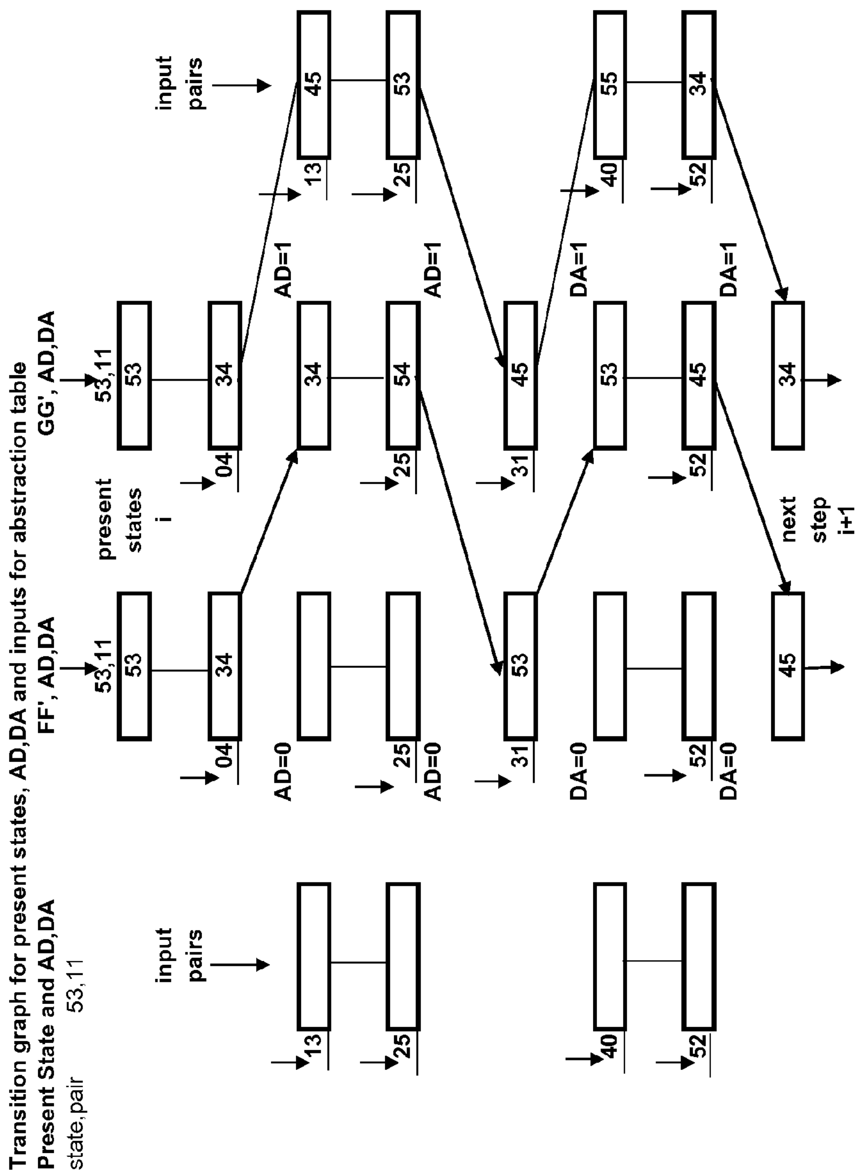
Figures 9, 65:
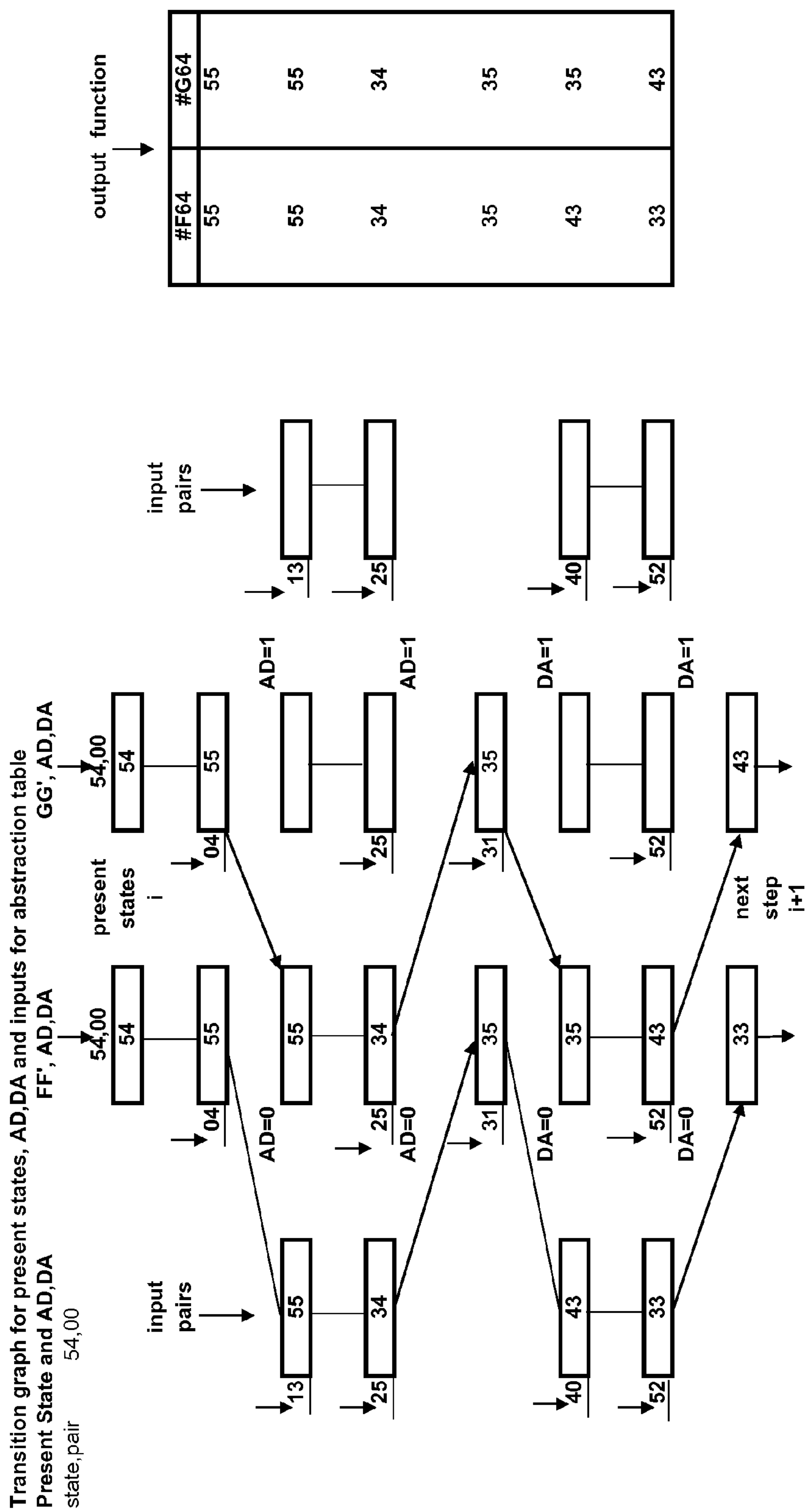
Figures 9, 66:
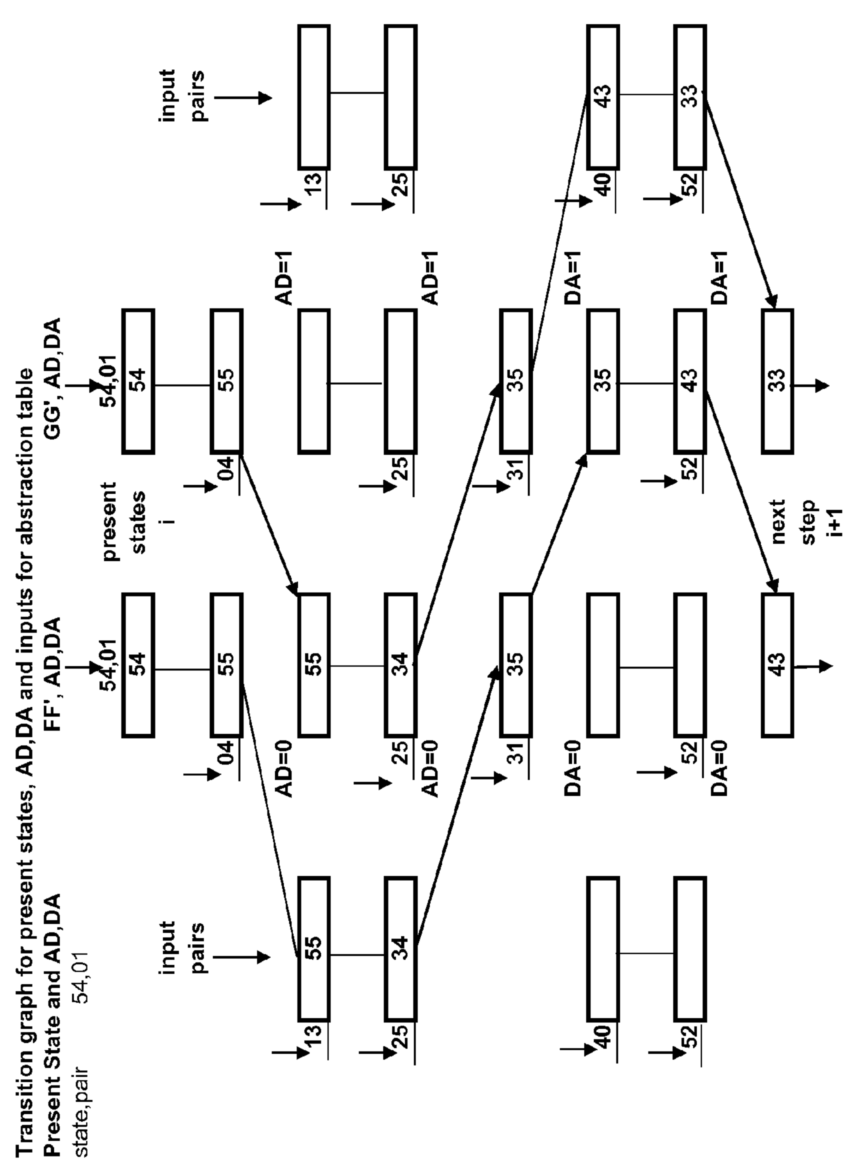
Figures 9, 67:
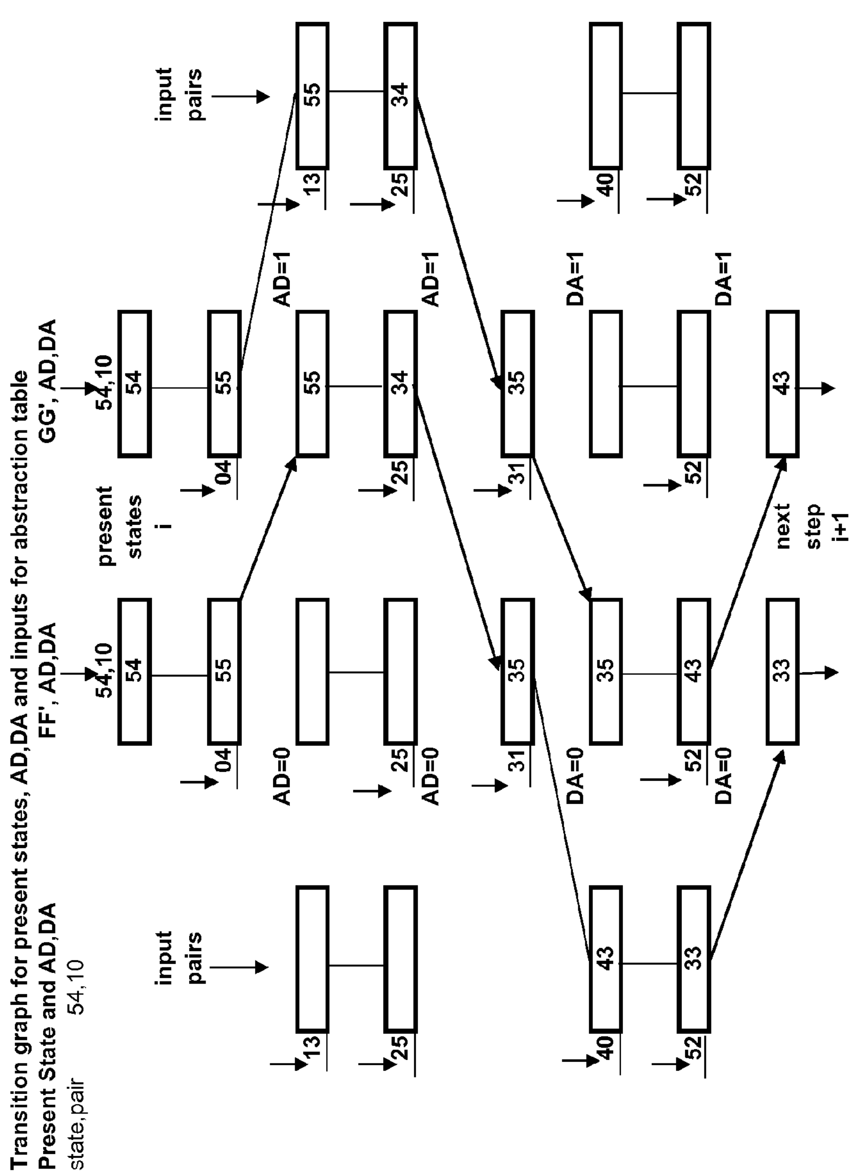
Figures 9, 68:
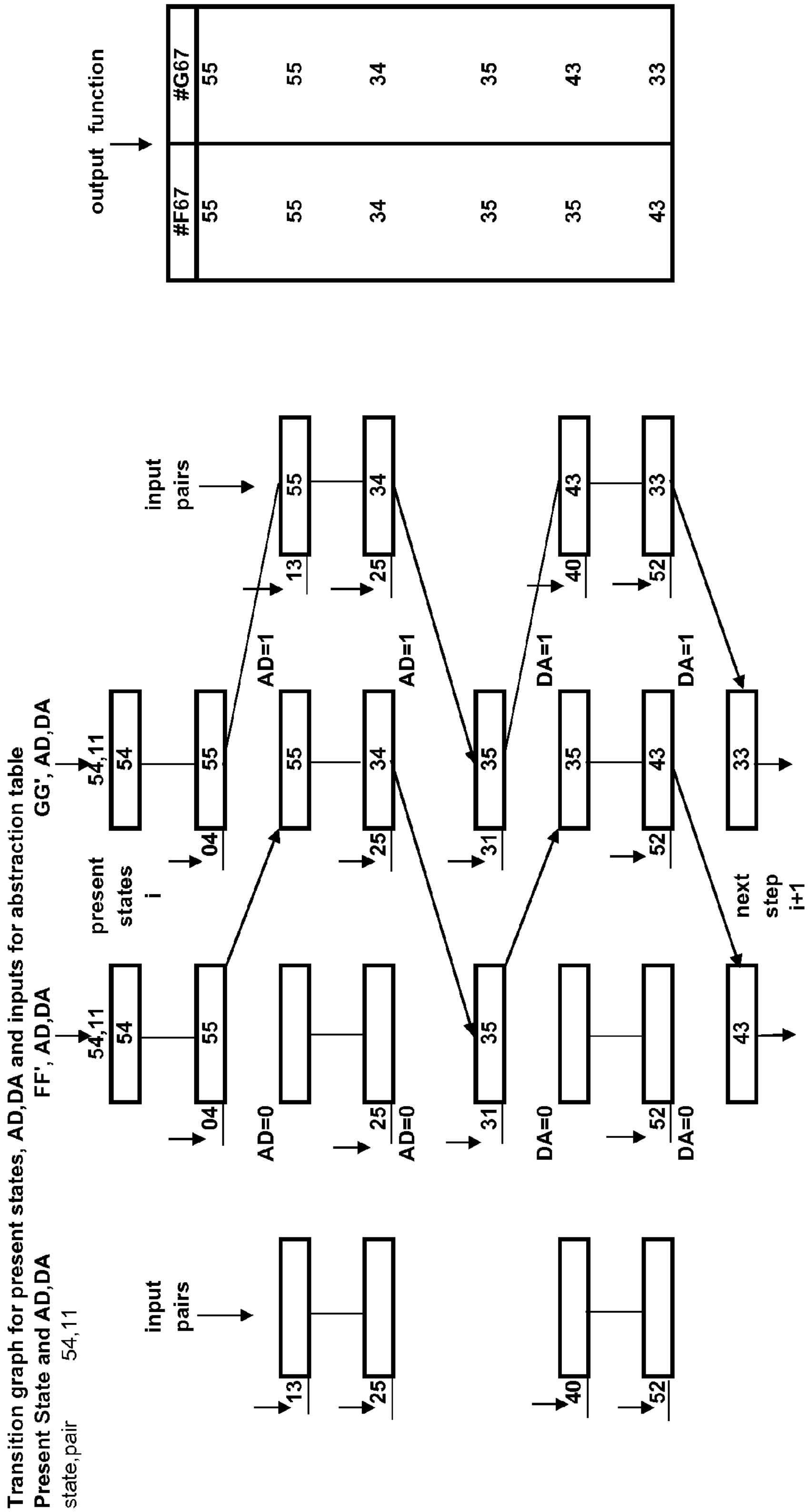
Figures 9, 69:
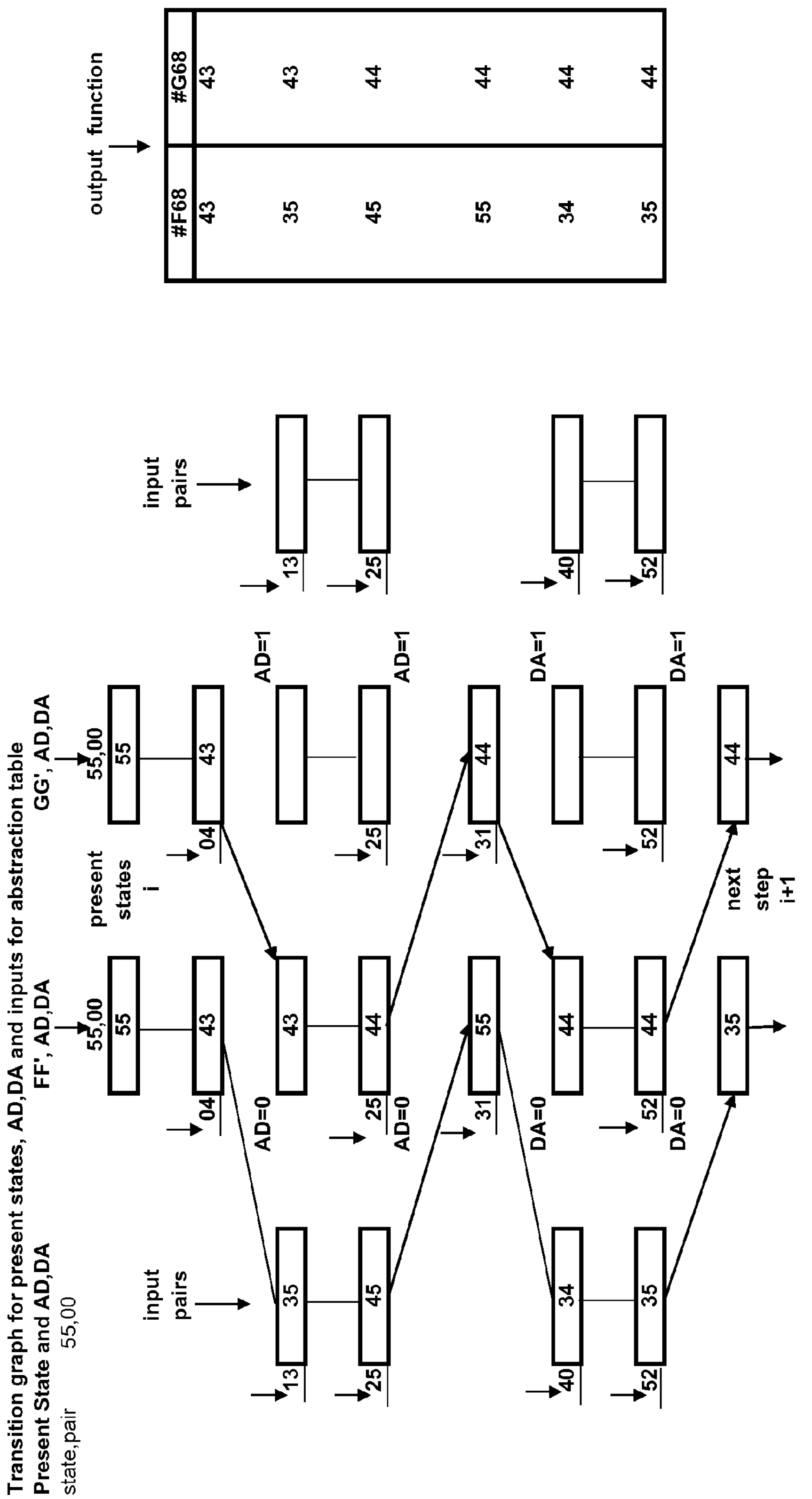
Figures 9, 70:
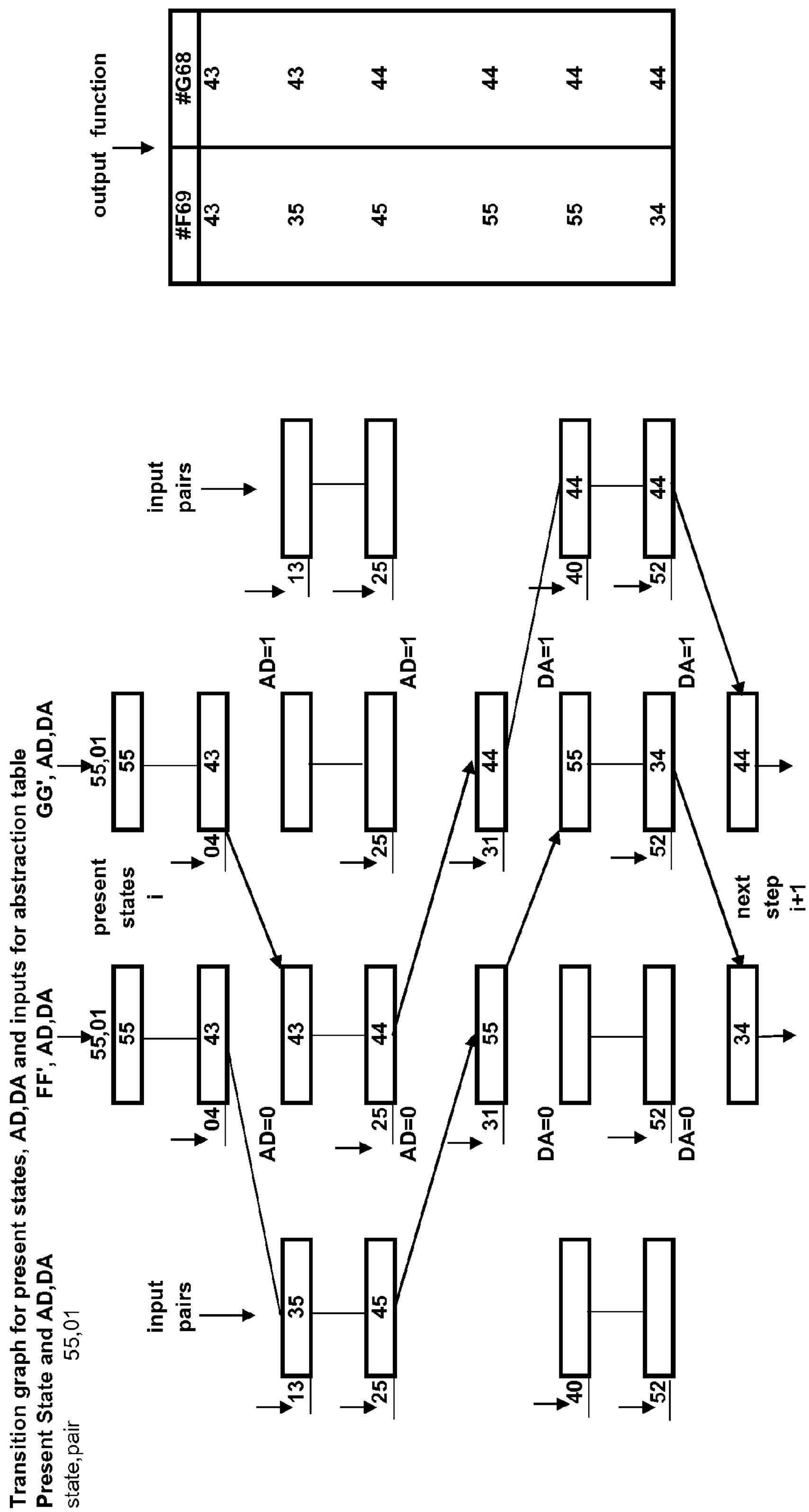
Figures 9, 71:
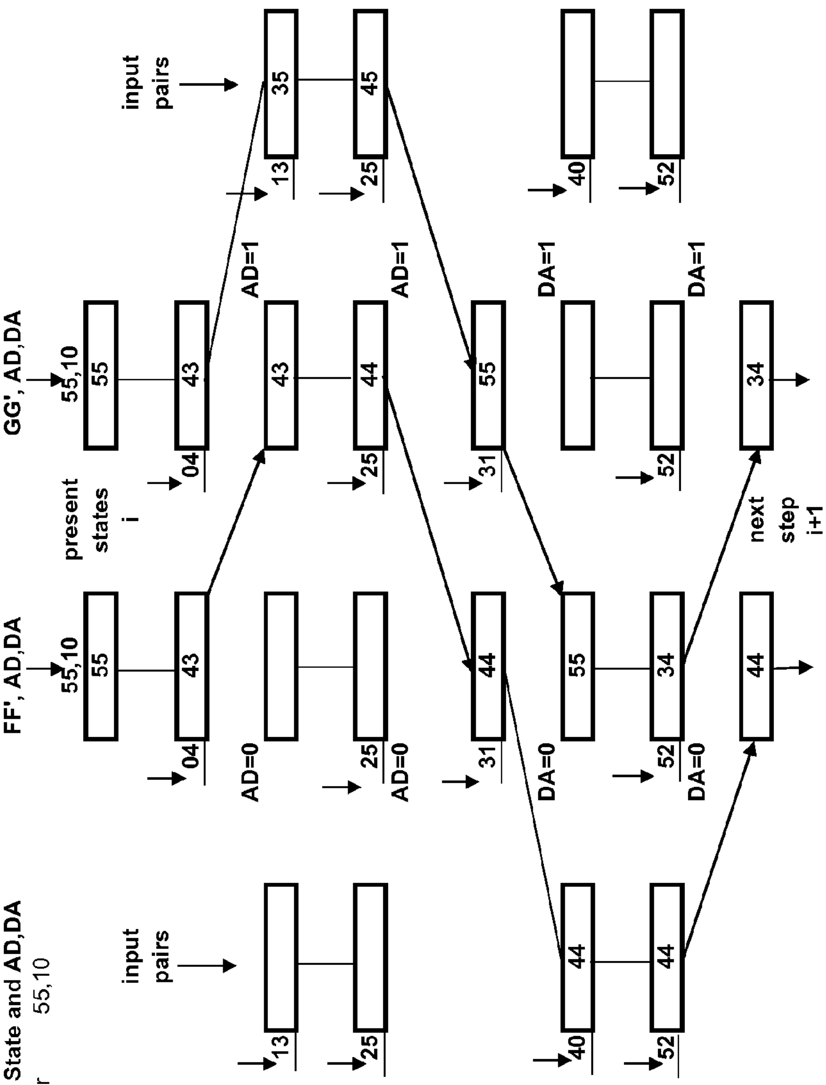
Figures 9, 72:
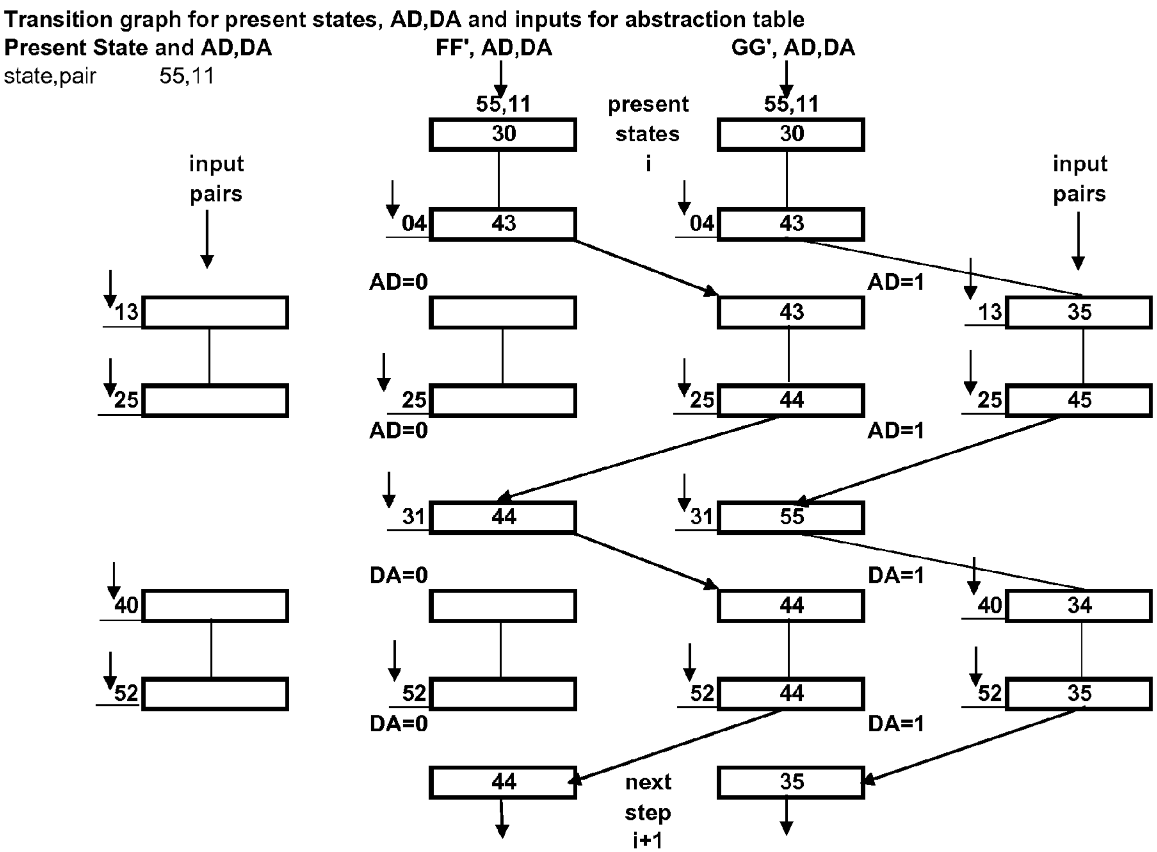
Figure 14:
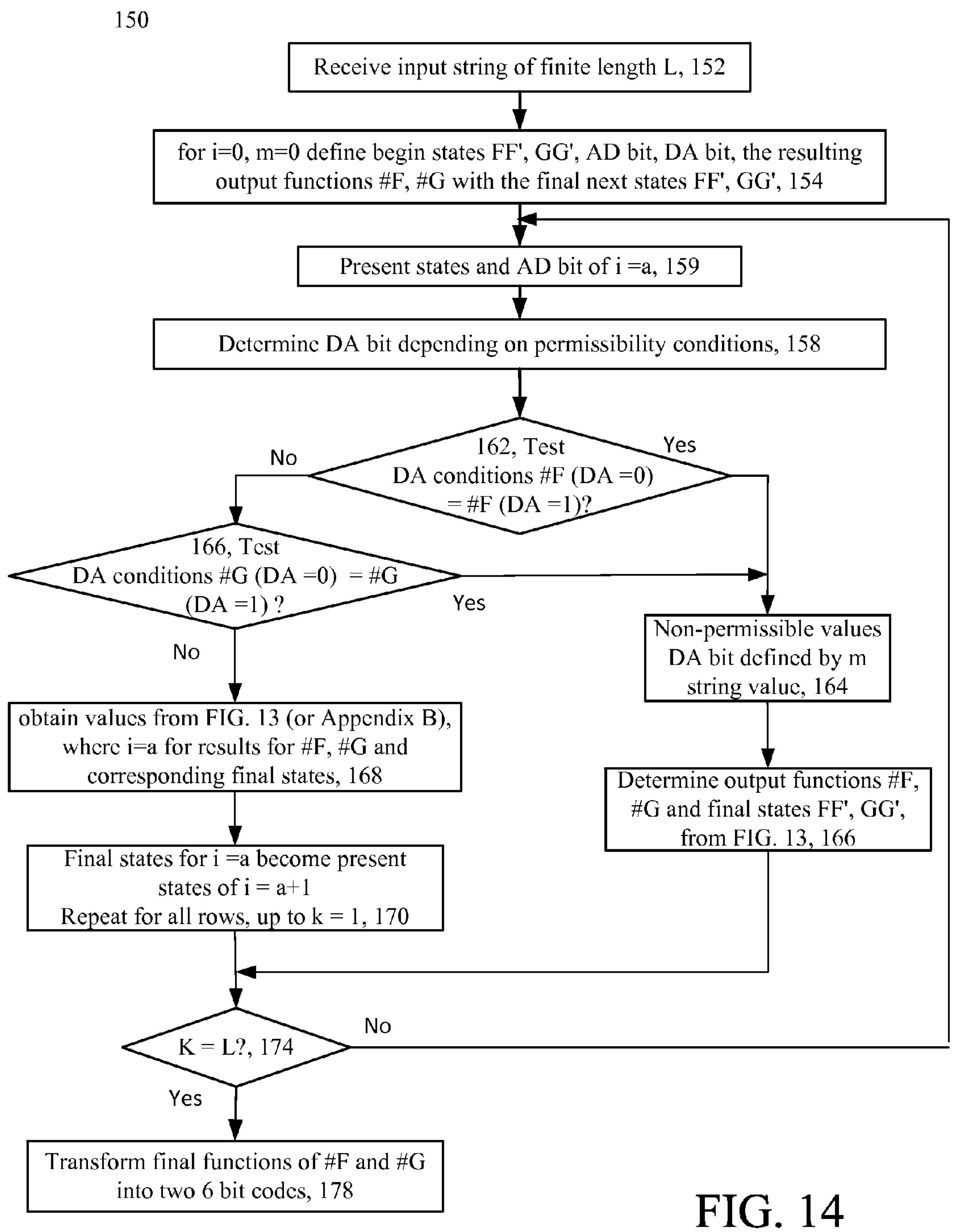
FIG. 14 is a flow chart of an abstraction process.
Figure 15:
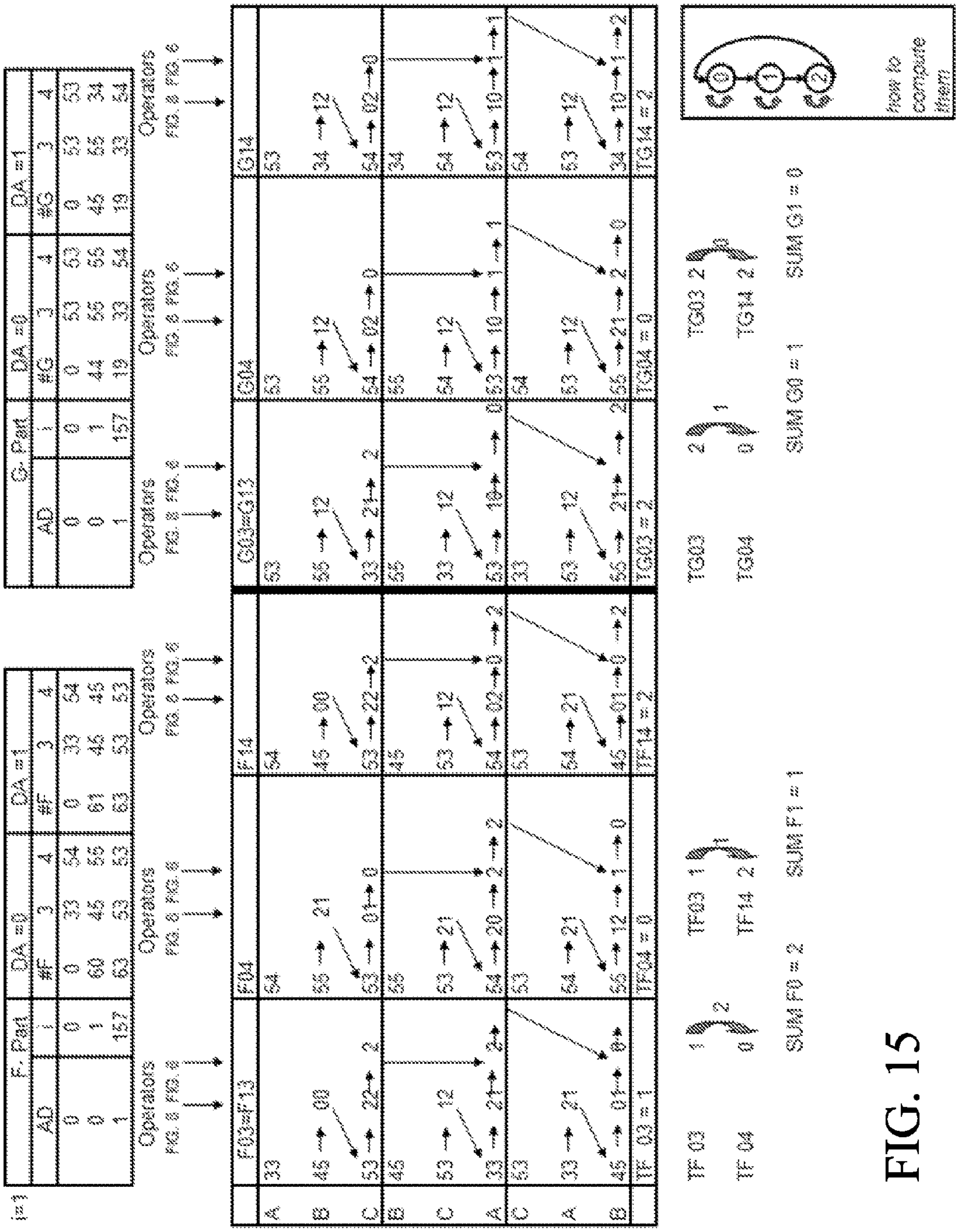
FIGS. 15-17 are diagrams that depict de-abstraction examples for i=1, i=3, i=7, respectively.
Figure 16:
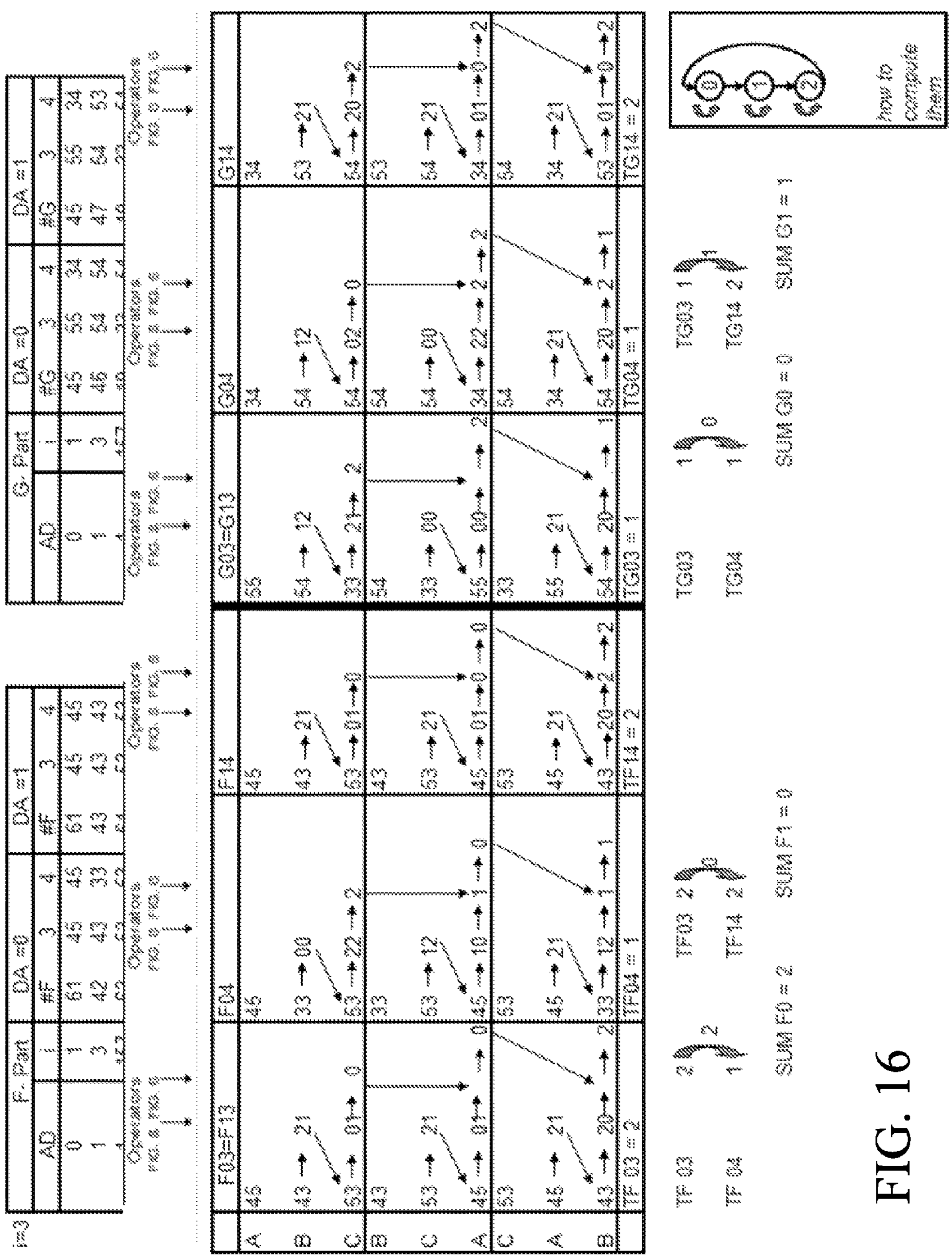
Figure 17:
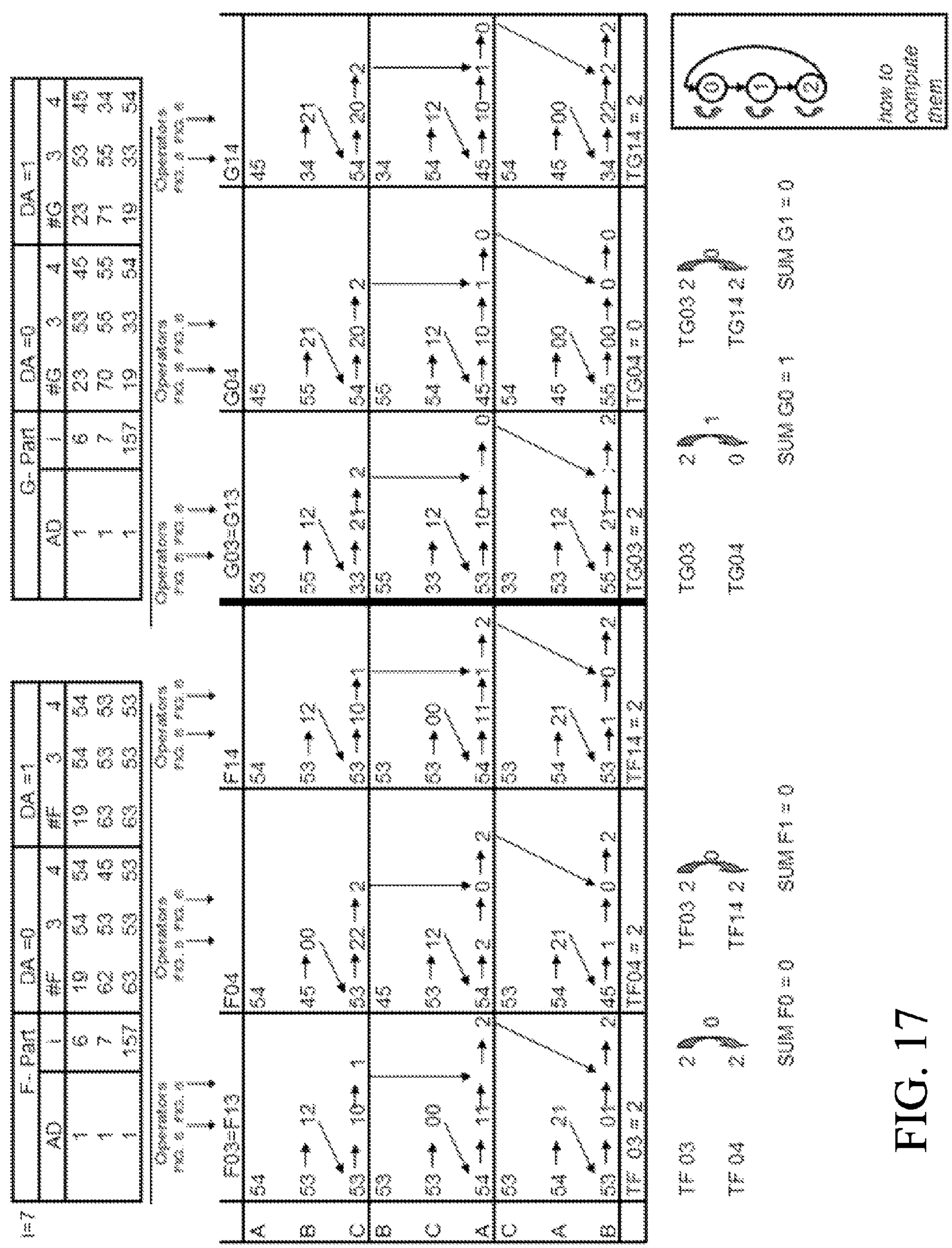
Figure 18:
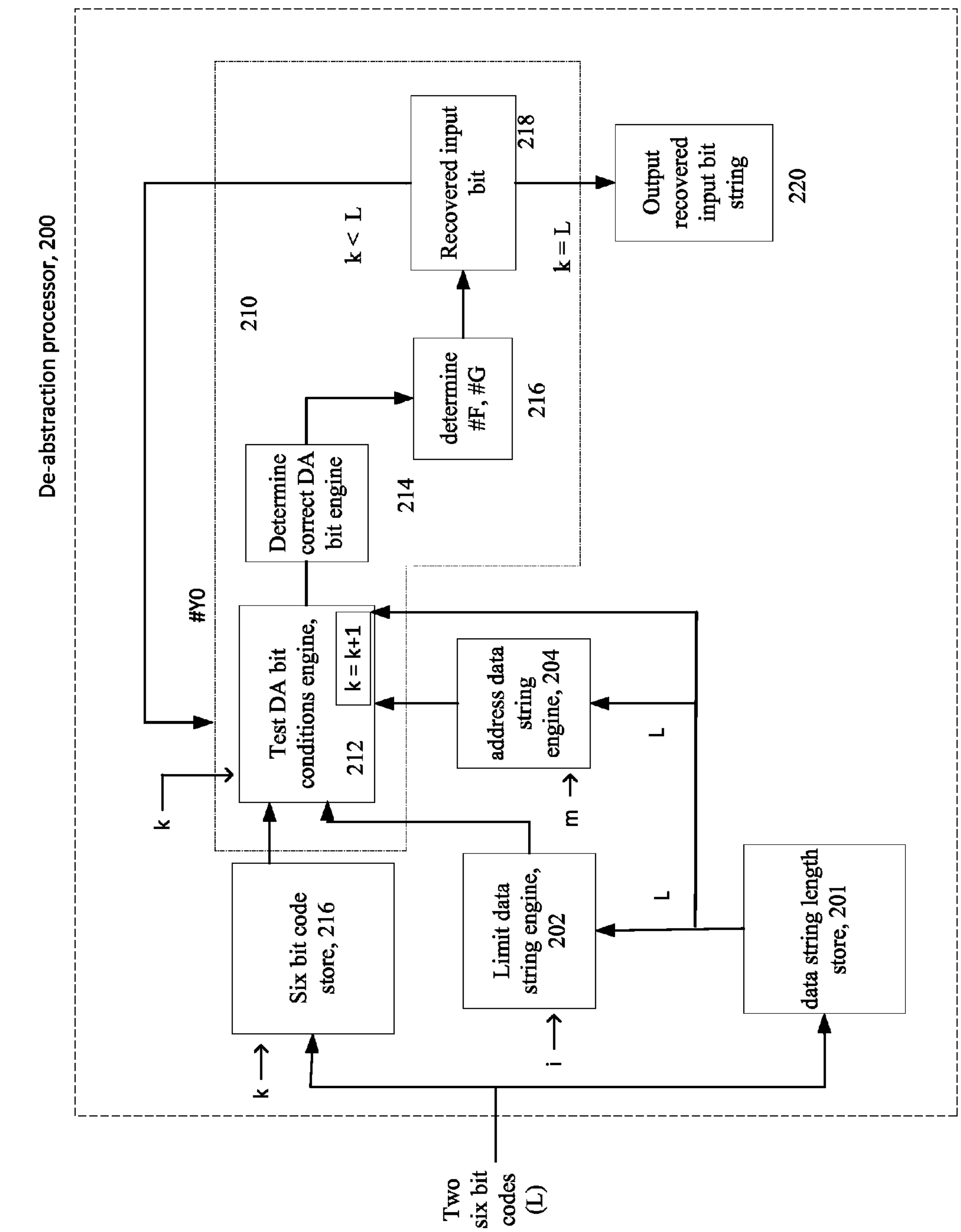
FIG. 18 is block diagram that depicts a de-abstraction engine.
Figure 19:
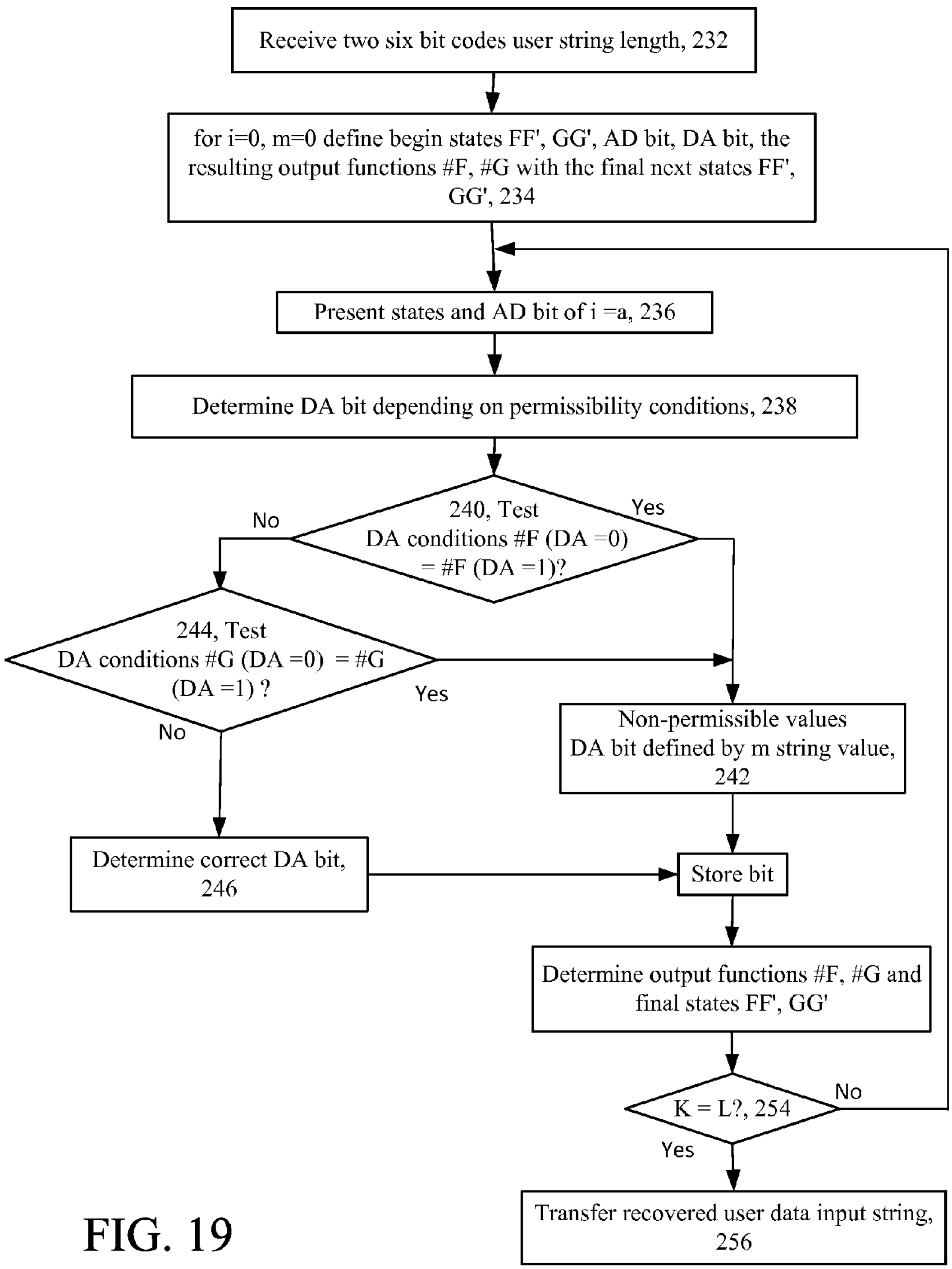
FIG. 19 is a flow chart of a de-abstraction process.

Referring now to FIGS. 9-1 to 9-72, the columns 04, 13, 25, 31, 40, 52 (from FIG. 7) are used for transition and output functions in the abstraction graphs. These columns are selected because these elements (04, 13, 25, 31, 40, 52) are reverse sequence pairs and isomoric, meaning identity or similarity of form. In FIGS. 9-1 to 9-72 from inputs 13, 25, 40 and 52 (the columns from the table of FIG. 7) output functions #Fi and #Gi for each possible state are determined according to the 36×6 table (FIG. 7) mentioned above. FIGS. 9-1 to 9-4 show exemplary ones of such graphs.

Referring now to FIG. 9-1, the process starts with beginning or initial states for FF' and GG' as the values "30" for both, and 00 for AD, DA (as shown in FIG. 9-1 as "30,00"). The input pairs are the value of FF' or GG' from the previous state (or the initial state) and the inputs 04, 13, 25, 31, 40 and 52 (the columns from the table of FIG. 7).

The value of the AD bit controls operations in the first 3 "positions" (e. g., levels) 0, 1, 2 of FIG. 9-1.

For AD=0, the input "04" controls the transition for the F-part and the G-part at position 0 according to:

$F0,0=FF'=30\times04=22$ (see ref. no. 102)

$G0,0=30\times04=22$ (see ref. no. 104)

For AD=0 at position 1, only the F-part is transformed by the input 13, the G-part copies the G0,0 value.

$F0,1=F0,0\times13=22\times13=54$ (see ref. no. 106)

$G0,1=G0,0=22$ (see ref. no. 108)

Similarly, the DA bit controls the elements in position (e. g., levels) 3, 4, 5. For position 3, for DA=0, the input 31 controls the transition for the F-part and G-part according to:

$F0,3=F0,2\times31=43\times31=33$ (see ref. no. 122)

$G0,3=G0,2\times31=54\times31=53$ (see ref. no. 124)

For DA=0 at position 4, only the F-part is transformed by the input 40, the G-part copies the G0,3 value.

$$F0,4=F0,3\times 40=33\times 40=54 \quad \text{(see ref. no. 126)}$$

$$G0,4=G0,3=53 \quad \text{(see ref. no. 128)}$$

At position 5, both parts would be transformed by 52 (see refs. 130 and 132). The final values of #F0, #G0 provide the inputs for the next state step (i+1) when applied (See FIGS. 13A-13O).

As shown in FIG. 9-2, with begin states for FF' and GG' as the values "30" for both, and 01 for AD, DA (shown in FIG. 9-2 as "30,01"). For the case DA=1 at position 4, F0,4 copies F0,3, (see ref. no. 140) G0,4 changes to G0,4=G0, 3×40, (see ref. no. 142).

At position 5 both parts would transform by 52, (see ref nos. 144 and 146).

$$F0,5=F0,4\times 52=54\times 52=53 \quad G0,5=G0,4\times 52=53\times 52=45$$

As shown in FIG. 9-3, for the case AD=1, with begin states for FF' and GG' as the values "30" for both, and 10 for AD, DA (shown in FIG. 9-3 as "30,10"). The input pairs are the values of FF' or GG' from the previous state (or the initial state) and the inputs 04, 13, 25, 31, 40 and 52 are from the columns from the table of FIG. 7.

For AD=1, at position 1 F0,1 copies F0,0 (see ref. no. 110) and G0,1 changes to G0,1×13=54 (see ref. no. 112).

At position 2 both parts transform by 25 (see ref nos. 114, 116).

$$F0,2=F0,1\times 25=54\times 25=43 \quad G0,2=G0,1\times 25=22\times 25=54$$

Similarly, the functions #F3 and #G3 are determined as in FIG. 9-4 for FF' and GG' as the values "30" for both, and 11 for AD, DA (shown in FIG. 9-4 as "30,10").

FIGS. 9-1 to 9-4 depict an exemplary set of the abstraction graphs. In actuality, there are seventy-two (72) such abstraction graphs (18 such sets one for each state, and 4 graphs for each state corresponding to the four possible values of AD,DA) starting with state "30" inputs "00 01 10 and 11" as illustrated, and ending with state "55" inputs 00 01 10 11". FIGS. 9-5 to 9-72 included herewith depict the remaining ones of the 72 such transition graphs. There are 72 graphs because there are 18 beginning and final states and each final state is the next beginning state to the graph and each beginning state has 4 possibilities of AD, DA, (i.e., 18*4=72). In a similarily manner the remaining transition graphs of FIGS. 9-5 to 9-72 are provided, but the detailed discussion can be omitted for brevity.

The graphs represent a set of eighteen states, namely 30, 31, 32, 33, 34, 35, 40, 41, 42, 43, 44, 45, 50, 51, 52, 53, 54, 55. For each of those states there are four pairs of elements for AD DA. These pairs are 00,01,10,11 for each state. All possible transition and output functions of the graph are listed in FIGS. 10A-D corresponding to states FF' and GG' respectively. FIGS. 10A-D are tables that summarize results calculated from the graphs and that in embodiments form part of the engine 36 for both abstraction and de-abstraction.

Referring now to FIGS. 10A-10D, among the two sets of 72 functions representing #F and #G there are two sets of 8 functions corresponding to #F and #G that are identical. These are denoted as "circled entries" in the tables of FIG. 10B and FIG. 10C. These functions are comprised of four pairs with two identical elements each. These two sets of four pairs contain data bits that are non-permissible as ending output functions and states, thus leaving 64 remaining permissible end output functions and states. The first set of columns in the tables of FIGS. 10-10D represent #F and the second set of columns in the tables of FIGS. 10-10D represent #G.

Referring now to FIGS. 11A-11F, the permissible, possible ending functions for #F and #G obtained from the abstraction tables in FIGS. 10A-10D are shown. The non-permissible functions that were indicated in FIGS. 10A-10D are not included in FIGS. 11A-11F, and the absence of those non-permissible functions is represented as gaps in the order in FIGS. 11A-11F. The permissible end functions are transformed into an optimal binary code in the indicated columns.

Six Bit Codes

Referring now to FIGS. 11A-11B, in particular, the mapping to the binary code is the identity element of the symmetric group S 64. There are 64! possible permutations. Any permutation can be used for additional security. That is, since any permutation can be used that means that there are 64! possible permutations for each end #F and end #G to consider. The possible number of permutation is 64! times 64!, where here "!" is used to indicate a factorial operation.

$$(64!=1.268\times 10^{89};64!\times 64!=2.537\times 10^{178})$$

As shown in the tables of FIGS. 11A and 11B there are six binary elements each for "#F end" and "#G end" resulting in 12 bits for the description of the user requested abstraction (FIG. 1, data bit string k of length L). The particular transformation of the "#F end" and "#G end" functions into the 12 bits provides the abstraction codes, as a pair of 6 bit codes.

Five Bit Codes

Referring now to FIGS. 11C and 11D, in an alternative set of possible ending functions there are 32 permissible, possible ending functions for #F and #G obtained from the abstraction tables in FIGS. 10A-10D. The non-permissible functions that were indicated in FIGS. 10A-10D are not included in FIGS. 11C-11D, and the absence of those non-permissible functions is represented as gaps in the order in FIGS. 11C-11D.

The permissible end functions are transformed into an optimal binary code in the second column. The mapping to the binary code is the identity element of the symmetric group S 32. There are 32! possible permutations. Any permutation can be used. That is, since any permutation can be used that means that there are 32! possible permutations for each end #F and end #G exist.

$$(32!=2.63\times 10^{35};32!\times 32!=6.92\times 10^{70})$$

Where here "!" is used to indicate the factorial operation

Further in the tables of FIGS. 11C and 11D there are five binary elements each for "#F end" and "#G end" resulting in 10 bits for the description of the user requested abstraction (FIG. 1, data bit string k of length L). The particular transformation of the "#F end" and "#G end" functions into the 10 bits provides the abstraction codes, as a pair of 5 bit codes.

Four Bit Codes

Referring now to FIGS. 11E and 11F, in another alternative set of possible ending functions (using DA columns 3 and 4 from FIGS. 10A-F for states FF' and GG") there are 16 permissible, possible ending functions for #F and #G obtained from the abstraction tables in FIGS. 10A-10F. The non-permissible functions that were indicated in FIGS. 10A-10F are not included in FIGS. 11E and 11F, and the absence of those non-permissible functions is represented as gaps in the order in FIGS. 11E and 11F.

The permissible end functions are transformed into an optimal binary code in the second column. The mapping to the binary code is the identity element of the symmetric group S 16. There are 16! possible permutations. Any permutation can be used. That is, since any permutation can be used that means that there are 16! possible permutations for each end #F and end #G to consider.

$$(16!=2.09\times10^{13};16!\times16!=4.377\times10^{26})$$

Where here "!" is used to indicate the factorial operation

Further in the tables of FIGS. 11E and 11F there are four binary elements each for "#F end" and "#G end" resulting in 8 bits for the description of the user requested abstraction (FIG. 1, data bit string k of length L). The particular transformation of the "#F end" and "#G end" functions into the 8 bits provides the abstraction codes, as a pair of 4 bit codes, which can be thus represented as a byte.

Referring now back to FIGS. 10A-10D, for the five bit codes none of states 30, 31, 32, 40, 41, 42, 50, 51, or 52 are possible intermediate or end states. The permissible intermediate and end states are 33, 34, 35, 43, 45, 53, 54 and 55. State 44 is also not a permissible end state. Thus, there are 8 states for #F and #G each state has four possibilities of AD 0, 1 and DA 0,1. Thus, there are 32 possible functions number of states times number four possibilities of AD/DA or 8×4 (AD/DA)=32. That is 32 functions for #F, #G it is sufficient to transmit 5 bits.

Referring now to FIGS. 12A-12B, the non-permissible output functions and states obtained from FIGS. 10A-10D are shown. In the first row, the present state of FF' is "40" and the present AD/DA is "10" that is transformed into the output function #F26 with the end state of "44." On the GG' side the present state of 40 with present AD/DA of 00 is transformed into the output function #G 24 also with an end state "44", as shown. The remaining non-permissible output function and state transitions are listed and obtained in the same way. These non-permissible conditions define a "limit" situation in the abstraction process. This "limit" situation occurs when either one or both of #F or #G occur as non-permissible conditions. See FIGS. 13A-13O for details.

The abstraction and de-abstraction process are similar and an implementation where the process can share functionality is shown below.

For purposes of demonstration, the input bit string of L=125 as shown in FIG. 4 is used. Similarly a 'limit' data sequence of length 41 bits and an AD length of 166 will be considered. Since the 'limit' condition depends on the statistical distribution of the user string k, the 'limit' conditions cannot be predicted. That is, in applications of any finite sequence of user data bits, the distribution can be of any type including the "all 0 sequence" and the "all 1 sequence." Random distributions for the sequences i and m are used because the process can handle all user types of distributions.

The limit string needs to be no longer than one third of L. In some instances fewer bits are needed than the full ⅓ length of L. This means that 41 bits are needed in the example above where L is 125 bits. In turn this requires an AD length of 166 which is 125 plus 41.

During both abstraction and de-abstraction processes, the processes stop when a final permissible output function occurs at L=125. The length of the user bit string L is 125. Therefore, for abstraction whenever a final permissible output function occurs at L=125 user bits the abstraction process stops and outputs a representation of the input bit string, as two bit codes and the string length L. For de-abstraction, whenever a final permissible output function occurs at L=125 user bits the de-abstraction process stops and outputs the original input bit string. At the string length L=125 all user data bits have been exactly recovered because the de-abstraction process is applied step by step for each permissible bit to find the correct data bit for all 125 bits in sequence.

Of note, is that for the present example, the "m" 'limit' string order is up to and including 32 and the "i" order (L plus 32) is thus 158. So there are enough elements of m and i provided to complete the task. Other user strings of lengths different than L=125 may use a different number of resulting "m" elements of such 'limit' strings that had order lengths up to the length of one third of L. However, these other strings lengths will not overrun the available number of the "m" 'limit' string order and the "i" order.

Abstraction Details Example

Referring now to FIG. 13A, the three illustrated portions (a), (b) and (c) will be used to explain the determination of #F and #G for a first portion of the bit positions (i). The remaining determinations of #F and #G for the remaining bit positions (i) are given in the tables in FIGS. 13B-13O and discussion of which need not be repeated for brevity.

The beginning condition is denoted as a "present" condition in FIG. 13A and the result, the next input is denoted as "present +1" condition in FIG. 13A. The system defines the beginning states of FF' and GG'. The beginning states are defined in row 0 with beginning states for AD and DA leading to the output functions #F and #G, with the corresponding final states in the last element, as defined by the system. In FIG. 13A, the i index column defines the beginning state of FF', the corresponding AD bit 0 is defined by the "i" index (FIG. 4) and DA bit 0 is defined by the "m" index (FIG. 3).

The beginning state of GG' has the same AD and DA bit information, namely 0,0 in this case. These beginning conditions will lead to the present +1 conditions that lead to the output functions #F and #G as was explained above. The last element of the output function, in this case #F=0 and #G=0, are the next states, FF' and GG', namely, 53 and 45. The state 53 becomes the FF' of i=1 and the state 45 becomes the GG' of i=1, which are now the new present states. In the row i=1 the AD bit is known by the system and it is 0 for both possibilities of DA of 0 or 1.

The DA bit will either be from the "k" or "m" order depending on the permissible or non-permissible conditions. In order to determine the outcome correctly both cases of DA (0 and 1) are tested. If the resulting pair of numbers for #F and #G is different, then it is "a permissible condition." A permissible condition means that the user data bit of 1 is used as the DA bit and the resulting #F function will be 61, and the final state FF' will be 55. For the result of #G, the #G function is 45 and the final state is 35, as illustrated in FIG. 13A, for the i=1 row. These results are obtained from the tables in FIGS. 10A-D.

These final states FF', GG' of i=1 will become the present states of i=2. The same procedure as in i=1 is repeated for every row of the tables in FIGS. 13A-13O.

Abstraction Details Example

Referring Also to the Graphs of FIGS. 9-1 to 9-72

Still referring now to FIG. 13A, the three illustrated portions (a), (b) and (c) will be used to explain the beginning graph for FF' AD DA; GG' AD DA. The beginning condition is denoted as a "present" condition in FIG. 13A and the result, the next input is denoted as "present +1" condition in FIG. 13A. The system defines the beginning states of FF' and GG'. The beginning states are defined in row 0 with beginning states for AD and DA leading to the output states FF' and GG', with the corresponding final states in the last element, as defined by the system. In FIG. 13A, the i index column defines the beginning state of FF', the corresponding AD bit 0 is defined by the "i" index (FIG. 4) and DA bit 0 is defined by the "m" index (FIG. 3).

The beginning state of GG' has the same AD and DA bit information, namely 0,0 in this case. These beginning conditions will lead to the present+1 condition that leads to the output states FF' and GG' as was explained above. The elements of the graphs, in this case FIG. 9-1, shows the present state i and the next step i+1 are the next states, FF' and GG', namely, 53 and 45. The state 53 becomes the FF' of i=1 and the state 45 becomes the GG' of i=1, which are now the new present states. In the row i=1 the AD bit is known by the system and it is 0 for both possibilities of DA of 0 or 1.

The DA bit will either be from the "k" or "m" order depending on the permissible or non-permissible conditions. In order to determine the outcome correctly both cases of DA (0 and 1) are tested by using graph 2 (FIG. 9-2). If the resulting pair of numbers for #F and #G is different, then it is "a permissible condition." A permissible condition means that the user data bit of 1 is used as the DA bit, the resulting #F function is 61 and the final state FF' will be 55. For the result of #G, the #G function is 45 and the final state is 35, as illustrated in FIG. 13A, for the i=1 row and also in the graph (Appendix 9-46). These results are obtained from the tables in FIGS. 10A-D and the graphs for #F 63 and for #G 46.

These final states FF', GG' of i=1 will become the present states of i=2. The same procedure as in i=1 is repeated for providing every row of the table in FIG. 13A and the corresponding graphs, also in the tables FIGS. 13B-13O.

Some rows will result in non-permissible results as indicated in FIG. 13A by the circled entries. In the example, the i=2 row has such a result for #F where for both DA conditions of 0,1 the #F is 70. That is, for DA of 0 or 1 both lead to #F of 70 and #G of 22 and 23. Because the #F is a non permissible result, both the #F and the #G functions are considered non permissible. When this non-permissible condition occurs then the DA bit is defined by the m 'limit' string order. In this case the "m" limit string bit is 0 as given for the m=1 order shown in FIG. 3.

To continue the process, the FF' state of 55 with the AD DA input of 1 and 0 will result in an end function #F of 70 and FF' end state of 44. The GG' equivalent will yield a result end function #G of 22 and GG' end state of 45. Once again, the end states of FF'44 and GG'45 will become the present states of i=3, and so on. Note that occasionally there may be two or more non permissible conditions in a row. Such an example can be seen at i=33 and i=34, or at i=80, 81, 82 in FIGS. 13B-13O.

Reduced bit size representation

One application of the abstraction (and the inverse operation de-abstraction discussed below) is for providing a representation of the input bit string that is substantially smaller in the number of bits than the original bit length, i.e., number of bits, of the input string.

For the embodiment where six bit codes are used, at i=158 from Appendix B, all 125 data bits of user string k of length L have been defined. The final functions of #F are 63 and #G is 19. These final functions of #F are 16 and #G is 19 are transformable into two six bit codes where #F is "(1010001)" and #G is "(010011)" as shown in FIGS. 11A and 11B. This results in a twelve bit representation of the original user input bit string of length L, which was 125 bits. This representation corresponds to a reduction rate ratio (hereinafter referred to as "reduction rate" or simply "rate") of L/12. The end result of the twelve bit representation of any data string of any finite length can now be provided for any application and user data string of any finite length.

In this example, the rate obtained is 125/12, which corresponds to a rate of 10.4:1. In the user data string random data were used. Thus, this abstraction provides a high rate of data reduction for data strings of random data. For comparison, a lossless data compression of random data using prior statistically based techniques would have resulted in a rate of at most 1:1 because such known techniques rely on the presence of statistical redundancy in the data stream.

Thus, the abstracted final values of functions # F, with a value of "63" and #G with a value of "19" that are transformed into the two six bit codes from FIGS. 11A, 11B and the length of the original sequence L uniquely represents, the original user input bit string. When the determined two six bit codes and the length of the original sequence L are used in a de-abstraction process as will be discussed below these inputs will uniquely and completely recover the original input bit string without any loss of data.

For the embodiment where five bit codes are used, at i=158 from Appendix B, all 125 data bits of user string k of length L have been defined. The final functions of #F are 16 and #G is 19. These final functions of #F are 16 and #G is 19 are transformable into two five bit codes where #F is "(00100)" and #G is "(00111)" as shown in FIGS. 11C and 11D. This results in a ten bit representation of the original user input bit string of length L, which was 125 bits. This representation corresponds to a reduction rate of L/10. The end result of the ten bit representation of any data string of any finite length can now be provided for any application and user data string of any finite length.

Thus, the abstracted final values of functions #F, with a value of "16" and #G with a value of "19" that are transformed into the two five bit codes from FIGS. 11C, 11D and together with the length of the original sequence L, uniquely represents, the original user input bit string. When the determined two five bit codes and the length of the original sequence L are used in a de-abstraction process these inputs uniquely and completely recover the original input bit string without any loss of data.

In this example, the rate obtained is 125/10, which corresponds to a rate of 12.5:1. As with the 6 bit embodiment, this abstraction provides a high rate of data reduction for data strings of random data.

For the embodiment where four bit codes are used, at i=158 from Appendix B, all 125 data bits of user string k of length L have been defined. The final functions of #F is 16 and #G is 19. These final functions of #F 16 and #G 19 are transformable into two four bit codes where #F is "(0101)" and #G is "(0111)" as shown in FIGS. 11E and 11F. This results in an eight bit representation of the original user input bit string of length L, which was 125 bits. This representation corresponds to a reduction rate of L/8. The end result of the eight bit representation of any data string of any finite length can now be provided for any application and user data string of any finite length. It is permissible for these four bit codes to have the same codes represent different values of #F and/or #G. Whenever element pairs in #F 3,4 and in #G 3,4 are equal, then the element pairs belong to the same class. For instance, for #F 3,4 the pair 43/33 is equal in 4 places and it transforms to the 4-bit code 0000, and as shown in FIG. 11F the pair 45/45 occurs 4 times and transforms to the 4-bit code 0000. All the other cases can be obtained similarly.

Thus, the abstracted final values of functions #F, with a value of 16 and #G with a value of "19" that are transformed into the two four bit codes from FIGS. 11E, 11F and together with the length L of the original input stream, uniquely represents in a compressed form, the original input bit string. When the determined two four bit codes and the length of the original sequence L are used in a de-Abstraction process these inputs uniquely and completely recover the original input bit string without any loss of data.

In this example, the rate obtained is 125/8, which corresponds to a rate of 15.625:1. As with the 6 bit and 5 bit embodiments, this abstraction provides a high rate of data reduction for data strings of random data.

For many applications, the length of the original bit string will already be known by both the abstraction and de-abstraction processes and thus that length will not need to be transmitted. In other embodiments, the length will be constant and repetitive transmissions of abstraction codes need only carry the length in one, e.g., the first transmission of abstraction codes. In other embodiments, the length is not known or the length may vary this in those cases the length is transmitted with the abstraction codes.

In the data reduction and rate calculations above the bit string representing the length is ignored. In the examples above, for an input bit string of length 125 that would require an additional nine extra bits in the representation. However, these extra bits are ignored in these calculations to better illustrate the high data reduction/rates attainable, because as should now be observed for very large input bit strings, the additional amount of bits that are required to represent the length would not materially affect the overall data reduction rates.

Thus, the abstracted representation of the input bit string (when L is transmitted) can be such as:

Six Bit Codes
Code Code L
(010001) and (010011) and (1111101)
Five Bit Codes
Code Code L
(00100) and (00111) and (1111101)
Four Bit Codes
Code Code L
(0100) and (0011) and (1111101)

As mentioned L can be inferred is many applications and thus L need not be included in the representation. Now it is also observed that a byte can be used to represent the codes for the four bit string.

Referring now to FIG. 14, an abstraction process 150 is shown. The abstraction process 150 receives 152 an input bit string of finite length L. For i=0, m=0 the process 150 defines 154 beginning or initial states FF', GG', AD bit, DA bit, the resulting output functions #F, #G with the final next states FF', GG', as discussed above.

Iteratively, using the table in FIGS. 13A-13O that contains remaining tables (or generating the table on the fly using the principles set out above) for 156 the present states and AD bit of i=a, (where a is a value between 1 and L) the process determines 158 the DA bit depending on permissibility conditions. The process tests 162 the DA functions #F (DA=0)=≠F (DA=1). If the tested values are equal, the DA bit is a non-permissible value, and the DA bit is thus defined 164 by the "m" string value. The process determines the output functions #F, #G, final states FF' and GG' from FIG. 13A for the DA bit value defined by the "m" string (limit string). If the tested values are not equal, the process tests 166 the DA functions #G (DA=0)=#G (DA=1). Again if equal, the DA bit is a non-permissible value and the DA bit is defined 164 by the "m" string value.

If both tested values of #F and #G are not equal these are permissible conditions, and the process obtains 168 the next values from FIG. 13, where i=a, for results for #F, #G and corresponding final states. Illustratively, to further explain for i=1 the permissible condition user data bit of 1 will be used, the result #F will be 61 and final state is 55; result #G is 45 and final state is 35. Other values will be retrieved from the table in FIG. 13A according to the value of "i" and results #F and #G. The final states for i=a, become 170 the present states of i=a+1. This process is repeated for all rows up to k=L (see tables in Appendix B).

As mentioned above, certain values in FIGS. 13A-13O are circled to indicate non-permissible conditions for functions #F and/or #G. Note that in FIGS. 13A-13O, the values are fixed for given defined beginning states for FF' and GG' and DA, AD and k-sequence etc. Accordingly, the values in FIG. 13 would be different for different beginning states. When k=L has been reached, 174 the abstraction process transforms 178 the final functions # F END, # G END into two 6 bit codes (or five or four bit codes).

The two six bit codes in combination with the original input bit string length (L) uniquely represent the input bit string (abstraction). In the alternative embodiments, the two five bit or two four bits codes can be used along with the original input bit string length L to uniquely represent the input bit string.

De-Abstraction Details Example

De-abstraction is the process of taking the uniquely represented two six-bit codes (or five or four bit codes) and the original user input bit string length L and operating on those inputs to recover the original user input bit string. In de-abstraction, portions of the abstraction process are repeated except that because the non-permissible conditions are known by the AD string of i and the DA string of m, the output function and state transition can therefore always be obtained as in the abstraction process and testing the data bit for permissible states need not be performed.

At each permissible condition the present state FF' and GG' and the present AD bit (FIG. 4 "i" index) are known. The present states of index i=1 are 53 and 45. The AD bit is 0. However, what is not known is the DA bit that was applied during abstraction. Thus, both the DA=0 and DA=1 conditions are tested to determine the result. The test results for #F are 60 for DA=0 and 61 for DA=1, and correspondingly for GG' the results are 44 for DA=0 and 45 for DA=1. Since the two numbers for each case are different these are defined as permissible conditions.

At this point, a determination of which DA bit has been applied is reconstructed. In order for de-abstraction to occur, the #F and #G functions at the following steps are considered, namely, the previous step i-1, present step i, and the final step i end. In addition, for both cases of DA=0 and DA=1 the corresponding elements for AD and DA in FIGS. 10A-10D of DA columns 3 and 4 for both FF' and GG' will be provided.

Referring back to FIGS. 10A-10D, out of the 18 elements (30, 31, 32, 33, 34, 35, 40, 41, 42, 43, 44, 45, 50, 51, 52, 53, 54, 55), only a subset of 9 elements occurs in columns 3 and 4 of all functions #F and #G in FIGS. 10A-10D. These nine elements are 33, 34, 35, 43, 44, 45, 53, 54, and 55. However, the element 44 is known as a non-permissible element since permissible conditions are known, as discussed above. Thus, out of "64" possible output function values for each #F and #G function, the number of values is reduced to 8 that can be used for an 8 element structure for each #F and #G.

Referring now to FIG. 15, which shows a de-abstraction example for i=1 (AD=0; DA=1), the de-abstraction process operates using the following rule.

Rule:

If SUM F0−SUM G0<SUM G1−SUM F1=>DA=0;

If SUM G1−F1<SUM F0−SUM G0=>DA=1

Applied:

SUM F0−SUM G0=2−1=1 SUM G1−SUM F1=0−1=−1

−1<1=>DA=1

Furthermore, one can pre-compute all 8×8×8=512 possible triplet results for any application case. That is, the six triplets for each step "i" in the de-abstraction process can be obtained by a table look up for each triplet for the address "previous element", "present element", and "end element." This address vector has 9 bits, 3 bits for each triplet. At each address, the triplet result bit of any triplet 0 or 1 or 2 is stored and used according to FIG. 15.

In the example i=3 in FIG. 16, the top left and right sections show the representation of the three elements and the three functions.

Referring now to FIG. 16, which shows a de-abstraction example for i=3 (AD=1; DA=1), the de-abstraction process operates using the following rule.

Rule:

If SUM F0−SUM G0<SUM G1−SUM F1=>DA=0; If SUM G1−F1<SUM F0−SUM G0=>DA=1

Applied:

SUM F0−SUM G0=2−0=2 SUM G1−SUM F1=1−0=1

1<2=>DA=1

Referring now to FIG. 17, which shows a de-abstraction example for i=7 (AD=1; DA=0), the de-abstraction process operates using the following rule.

Rule:

If SUM F0−SUM G0<SUM G1−SUM F1=>DA=0;

If SUM G1−F1<SUM F0−SUM G0=>DA=1

Applied:

SUM F0−SUM G0=0−1=−1 SUM G1−SUM F1=0−0=0

−1<0=>DA=0

As seen there are four triplet elements, columns 3 and 4 for DA=0 and DA=1 for both F and G functions. Of note, the F03 and the F13 as well as G03 and G13 are the same. As seen in the next step these triplets will only undergo one triplet computation as described next. The triplets F03 and F13 as well as triplets G03 and G13 are identical, that is, only F03 and G03 need be computed, which is true for all corresponding possible triplets.

The triplet computation has three permutations of the given triplets in the upper tables which are called A, B, C. The first computation is the triplet A, B, C, the second is B, C, A, and the third is C, A, B. This triplet permutation computation is the same for all columns, namely

F03=F13, F04, F14,

G03=G13, G04, G14.

The first column will now be described in detail as follows. The operator computations are given by FIG. 8 and FIG. 6. For the first triplet A,B,C, the computation of A□B□C. which is 33□45□53=>22 which will be reduced to the first element of the number, namely, 2 (where □ is an operator as in FIG. 8 (the 36×36 matrix) which gives a value for each row times column). The same technique is used for triplets B, C, A, and C, A, B yielding the following results of 1 and 1 respectively.

The three triplet permutation results 2, 1, 1, are transformed by the operator in FIG. 6. The result of 2°1°1=>1 is shown. In detail, 2°1=>0, and 0°1=>1. The final Triplet F 03 result is represented as TF 03=1. As used herein "°" is an operator as in the six-group FIG. 6 (details in FIGS. 15-17). All other results are derived the same way.

The results are TF 04=0, TF 14=2 and TG 03=2, TG 04=0, TG 14=2. The triplet function result of TF 03 and TF 13 and TG 03 and TG 13 serve as reference values for further computations with the TF 04, TF 14 and TG 04, TG 14. The pairs TF 03 and TF 04, TF 03 and TF 14 as well as TG 03 and TG 04, TG 03 and TG 14 are relative pairs. That is, the pair TF03 and TF04; the pair TF03 and TF14; the pair TG03 and TG04; and the pair TG03 and TG14 are pairs of interest to be considered during de-abstraction.

The de-abstraction computes the directional distances of the relative pairs. Below are listed all the possible directional distance computations. This is shown on the lower right side of FIG. 16.

In these 4 pairs the elements TF03 and TG03 are reference elements. The TF04, TF14 and TG04, TG14 are related by the distances for instance by the graph "how to compute" in each of FIGS. 15-17. This results in the following transition.

0→0=0, 0→1=1, 0→2=2

1→0=2, 1→1=0, 1→2=1

2→0=1, 2→1=2, 2→2=0

The results of the directional distance of the four pairs are shown on the lower section of FIG. 16. Specifically, the result for TF 03 and TF 04 is 2, TF 03 and TF 14 is 1, TG 03 and TG 04 is 1, TG 03 and TG 14 is 0. These results are listed as SUM F0=2, SUM F1=1 and SUM G0=1, SUM G1=0.

The rule mentioned above is applied to determine the correct DA bit of the de-abstraction process. Again, the rule is:

IF SUM F0−SUM G0<SUM G1−SUM F1=>DA=0.

IF SUM G1−SUM F1<SUM F0−SUM G0=>DA=1.

The rule applied to the example yields the following:

SUM F0−SUM G0=2−1=1

SUM G1−SUM F1=0−1=−1

Because −1<1 it follows that DA=1. This is the only correct result. In summary the solution to the question of which result of 0 or 1 for the DA of index step 1 is DA=1. The results for all other permissible states are obtained in the same manner. The de-abstraction process stops when the complete user string k with length L has been recovered that is when the de-abstraction has evaluated L number of iterations.

As shown in Appendix B, at i=158, the k-element is 125 which is the length of the user bit string, and that corresponds to the stop condition to terminate the de-abstraction process. At that time, the m value is 32. In other words here are 125+32=158 iterations. The system recognizes this as the STOP condition because the length L of the user bit string is known.

Referring now to FIG. 18 a de-abstraction engine 200 is shown. The de-abstraction engine 200 is executed by processor 12 (FIG. 1) or can be implemented in hardcoded logic, as appropriate. The de-abstraction engine 200 includes a limit bit string table 202 and an address bit string table 204. The de-abstraction engine 200 can also include a code store 206. An input of the codes and the input bit string length (L) 201 is fed to the de-abstraction engine 200 and typically are stored in a buffer such as code store 216 that can reside in memory or computer storage, as in FIG. 1. The de-abstraction engine 200 accesses the limit bit string table 202 that stores the limit bit string as in FIG. 5A and accesses the address bit string table 204 that stores, the address bit string as in FIG. 5B using the input bit string length. The input bit string length L is either supplied as part of the input along with the codes and can be stored in the input bit string length store 201 or is otherwise inferred as discussed above.

The de-abstraction engine 200 determines DA bits in a DA bit determination engine 210 by evaluating each possible DA bit for permissible conditions looking for non-permissible states that require substitution of a limit data bit from the limit string table for the calculated DA bit. The a DA bit determination engine 210 also includes a DA bit test engine 212. The DA bit test feeds an engine 214 that determines the correct DA bit and an engine 216 that determines the next values of #F, #G and that feeds an engine 218 to recover the input bit, which is outputted or otherwise stored 220. The engine 200 starts at the value of the input data string length, k=1 and continues to k=L, selecting the DA bit either from a calculated bit or the limit bit string according to the evaluated limit conditions, and produces functions #F and #G that are used in the next evaluation. When the DA bit determination engine 60 has evaluated to k=L, the produced bits that were outputted are the recovered, original input bit string.

Referring now to FIG. 19, a de-abstraction process 230 is shown. The de-abstraction process 230 receives 232 an input bit string of the two six bit codes and the length L of the original user input bit string. For i=0, m=0 the process defines 234 beginning or initial states FF', GG', AD bit, DA bit, the resulting output functions #F, #G with the final next states FF', GG', as discussed above.

Iteratively, for the present states 236 and AD bit of i=a, (where a is a value between 1 and L), the process determines 238 the DA bit depending on permissibility conditions. The process tests 240 the DA functions #F (DA=0)=#F (DA=1). If the tested values are equal, the DA bit is a non permissible value, and the DA bit is thus defined 242 by the “m” string value. If the tested values are not equal, the process tests 244 the DA functions #G (DA=0)=#G (DA=1). Again, if equal the DA bit is a non permissible value and the DA bit is defined by the “m” string value 242. If both tested values of #F and #G are not equal these are permissible conditions, and the process determines the correct DA bit 246. The bit is stored 248. The output values of functions #F and #G and final states FF' and GG' are determined (retrieved) 252, where the final states for i=a, become the present states of i=a+1. This process is repeated for all rows up to k=L. When k=L has been reached, 254 the de-abstraction process has recovered the original user data bit string and the string can be stored 256, transferred etc.

Data Recovery

The de-abstraction process can recover an input bit string that has a finite length L from the set of abstraction codes. The de-abstraction process receives the set of abstraction codes and transforms the set of abstraction codes into functions. These functions correspond to the final or end functions that were calculated during abstraction and which were transformed into the abstraction codes. The de-abstraction process iteratively calculates interim functions, by iterating over the length L of the input bit string. The de-abstraction process tests a DA bit according to permissibility conditions, determining the correct DA bit value when a permissible condition was encountered and substituting a limit string value for the DA bit when a non-permissible condition was encountered. The de-abstraction process stores either the substituted or determined correct DA bit and determines next interim values of the functions. When the length of the input bit string has been reached the original input bit string has been recovered.

Process Flow Abstraction and De-Abstraction

Figure 20A:
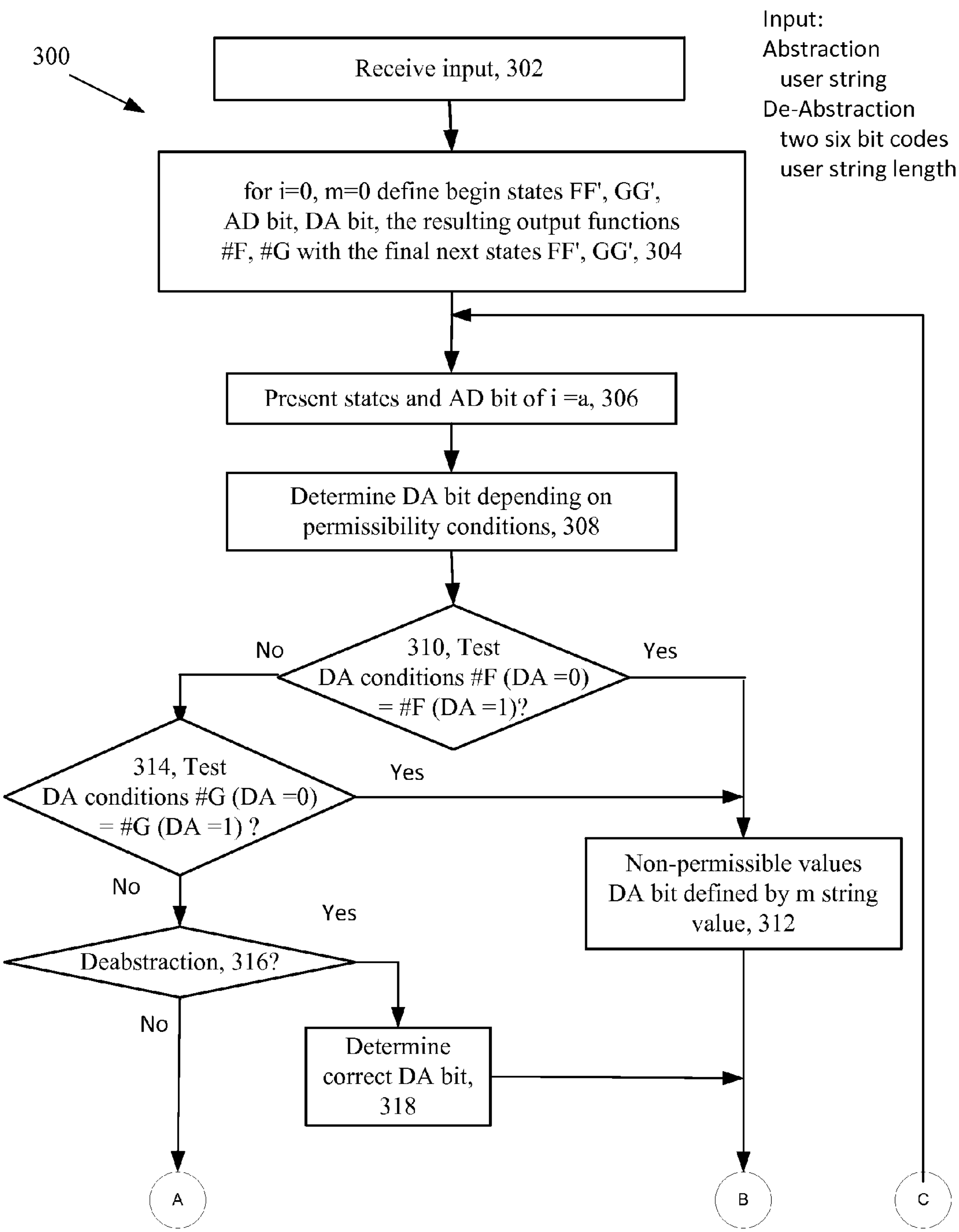
FIGS. 20A and 20B are flow charts depicting abstraction/de-abstraction processing.
Figure 20B:
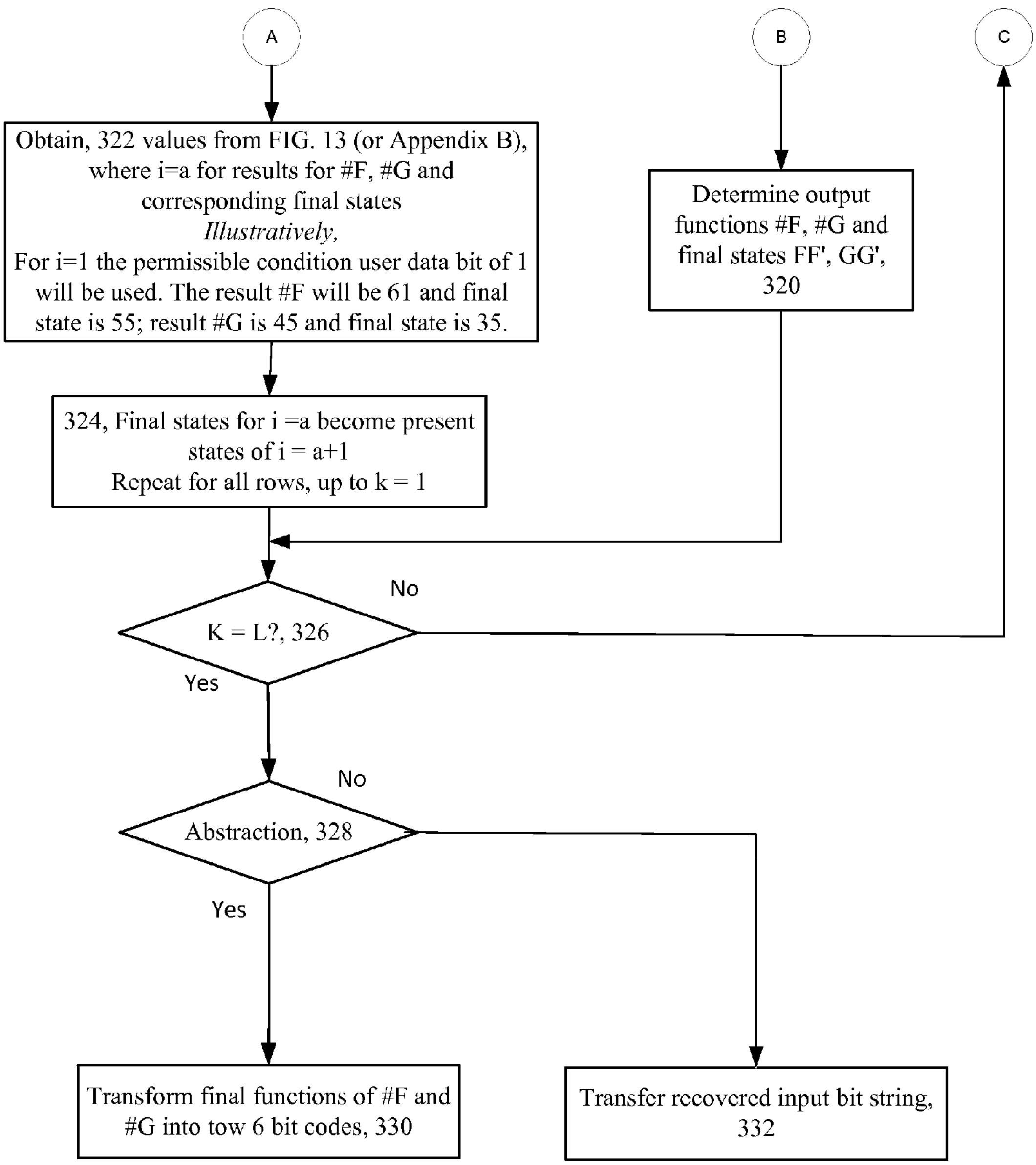
Figure 21:
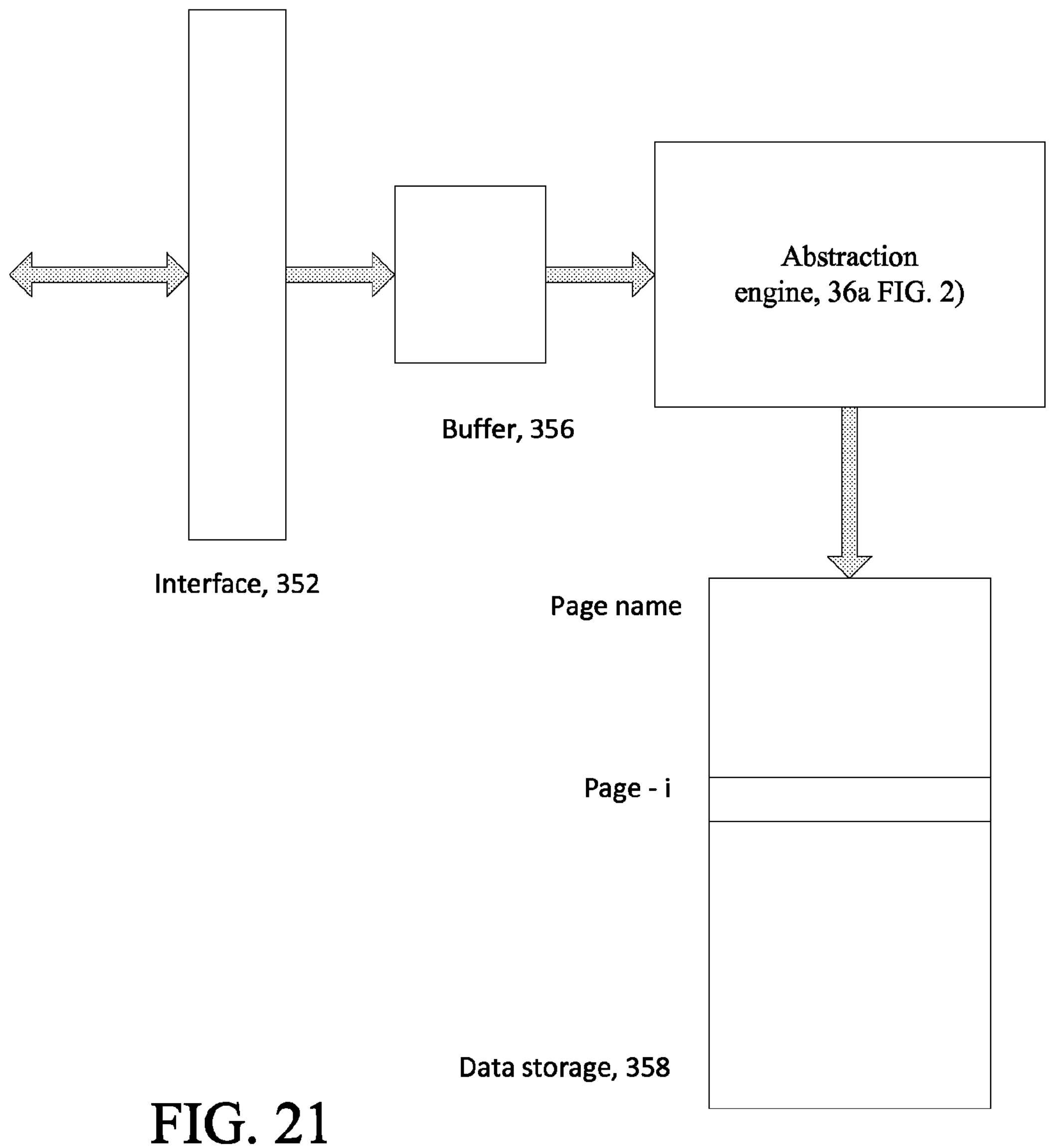
FIGS. 21 and 22 are block diagrams that depict write and read hardware implementations for storage/memory using abstraction/de-abstraction.
Figure 22:
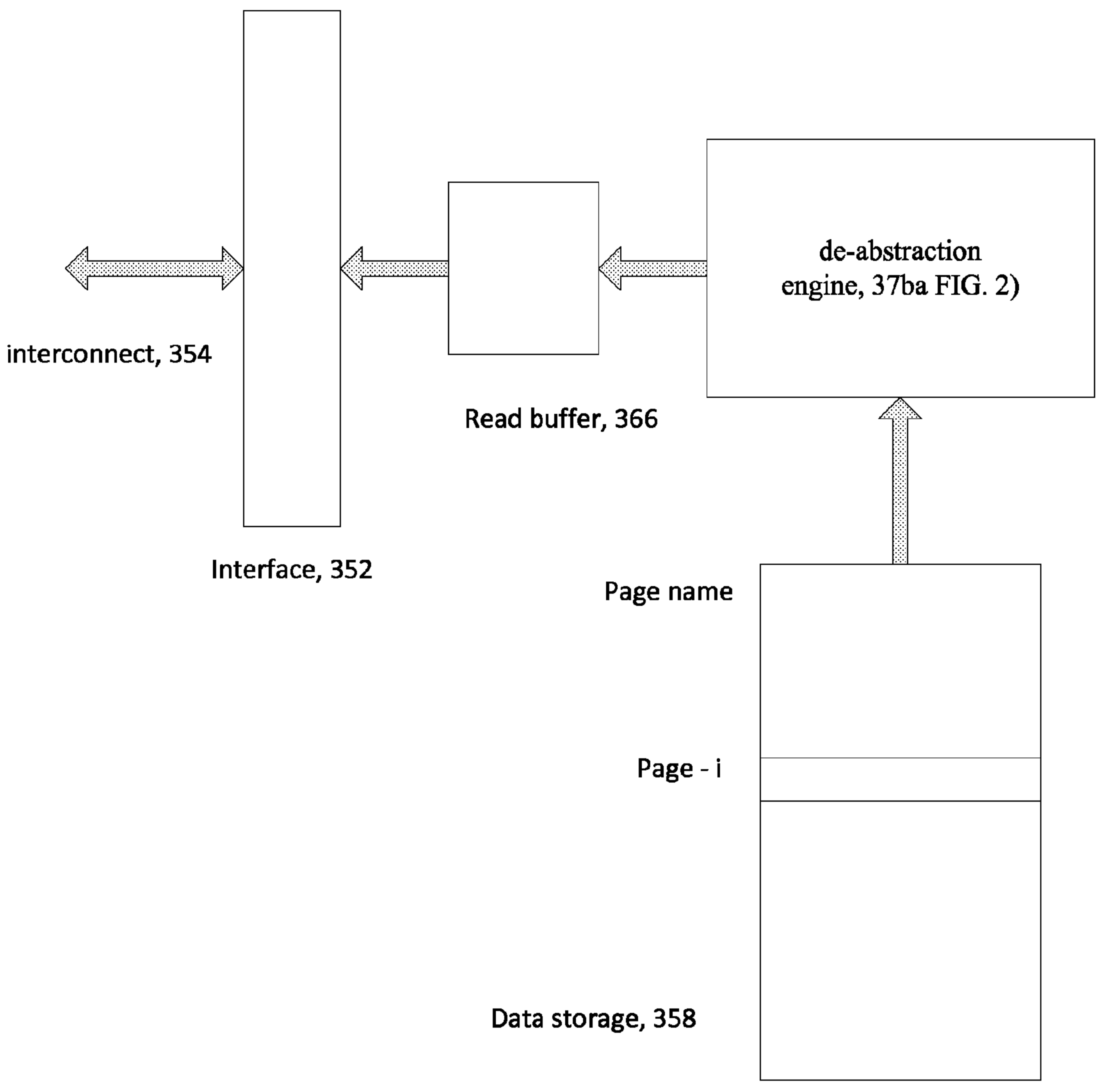
Figure 23:
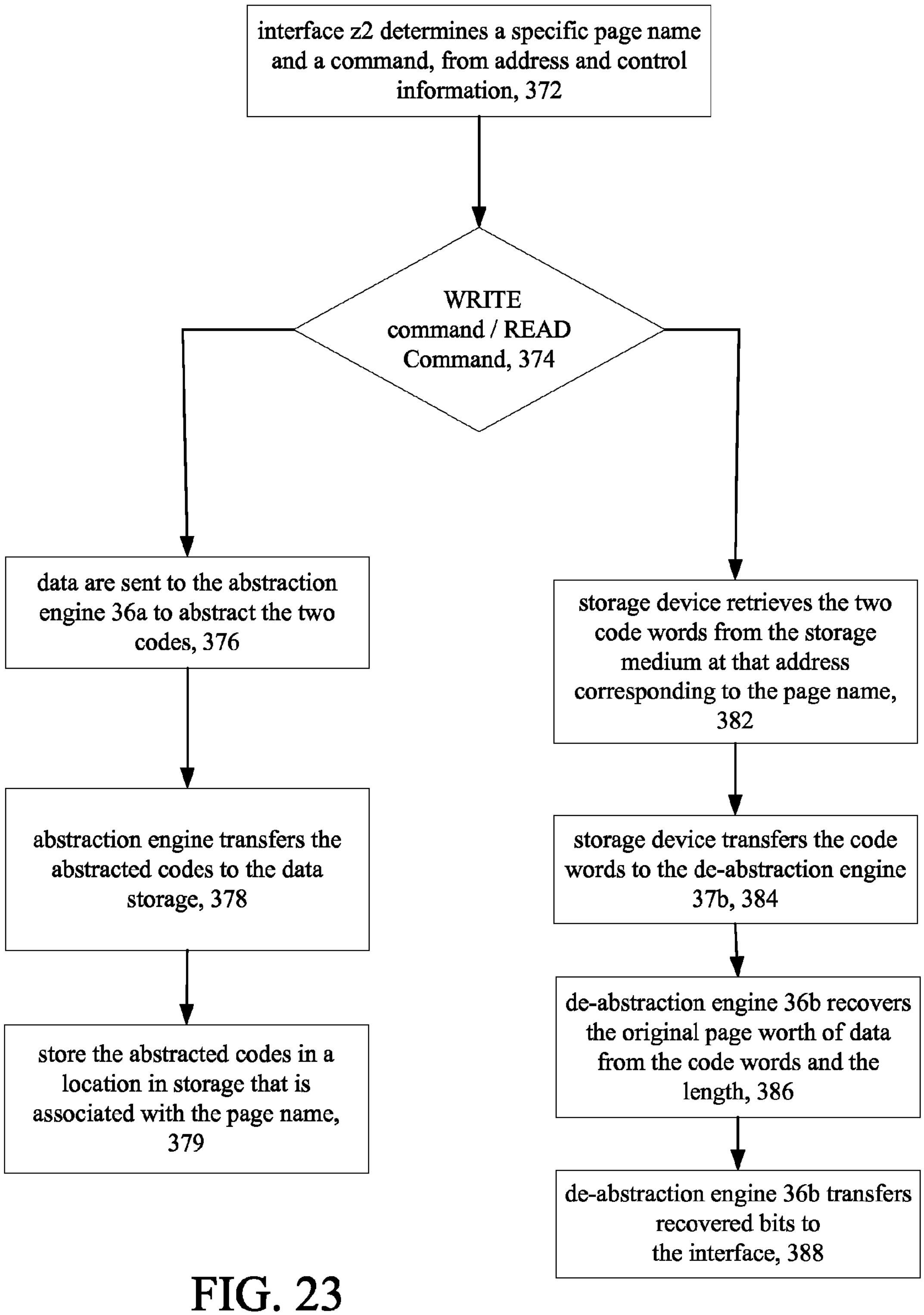
FIG. 23 is a flow chart that depicts write and read operations for storage/memory using abstraction/de-abstraction.
Figure 24:
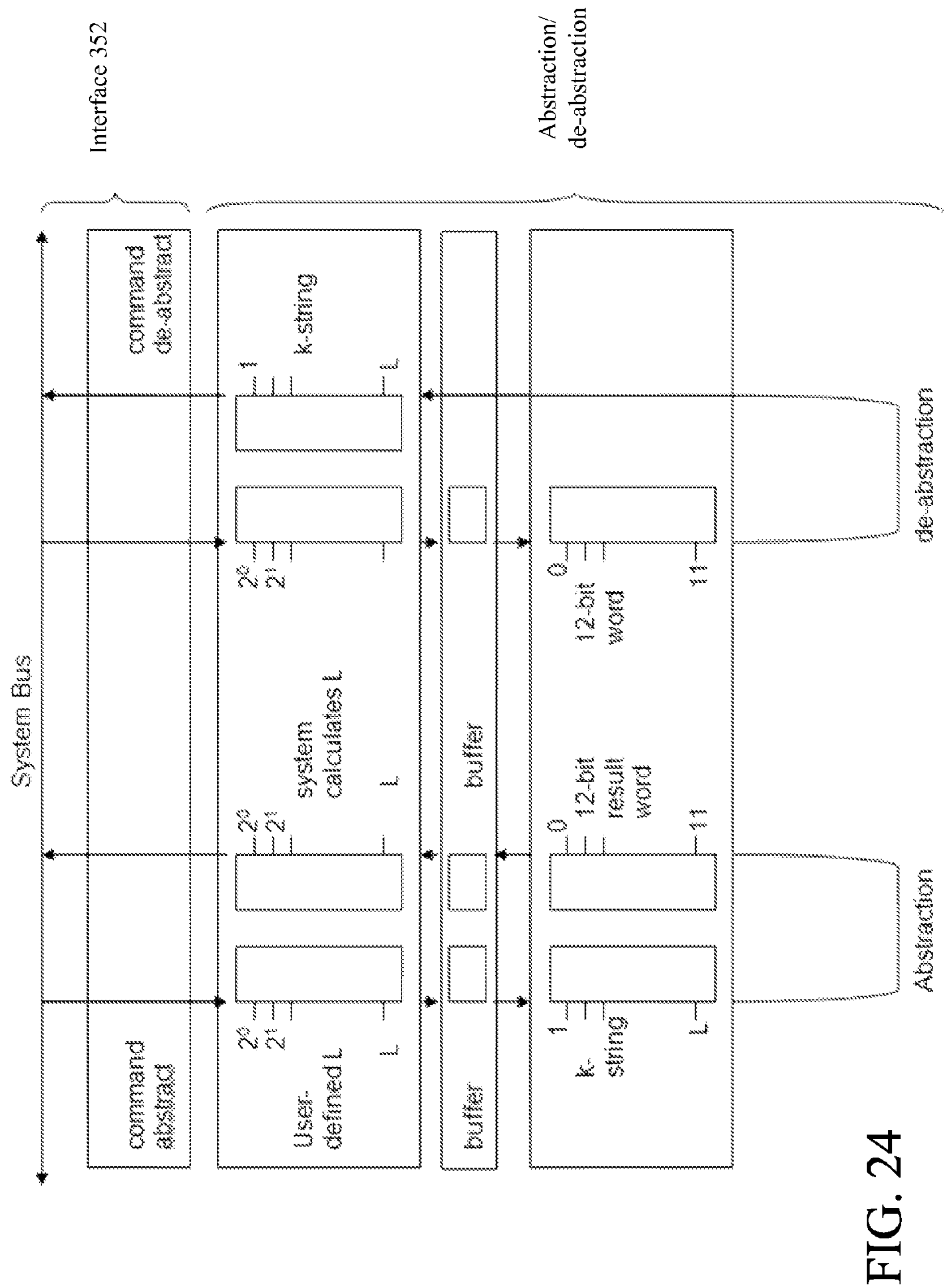
FIG. 24 is a block diagram that depicts write and read hardware implementations for storage/memory using abstraction/de-abstraction and length determinations.
Figure 25:
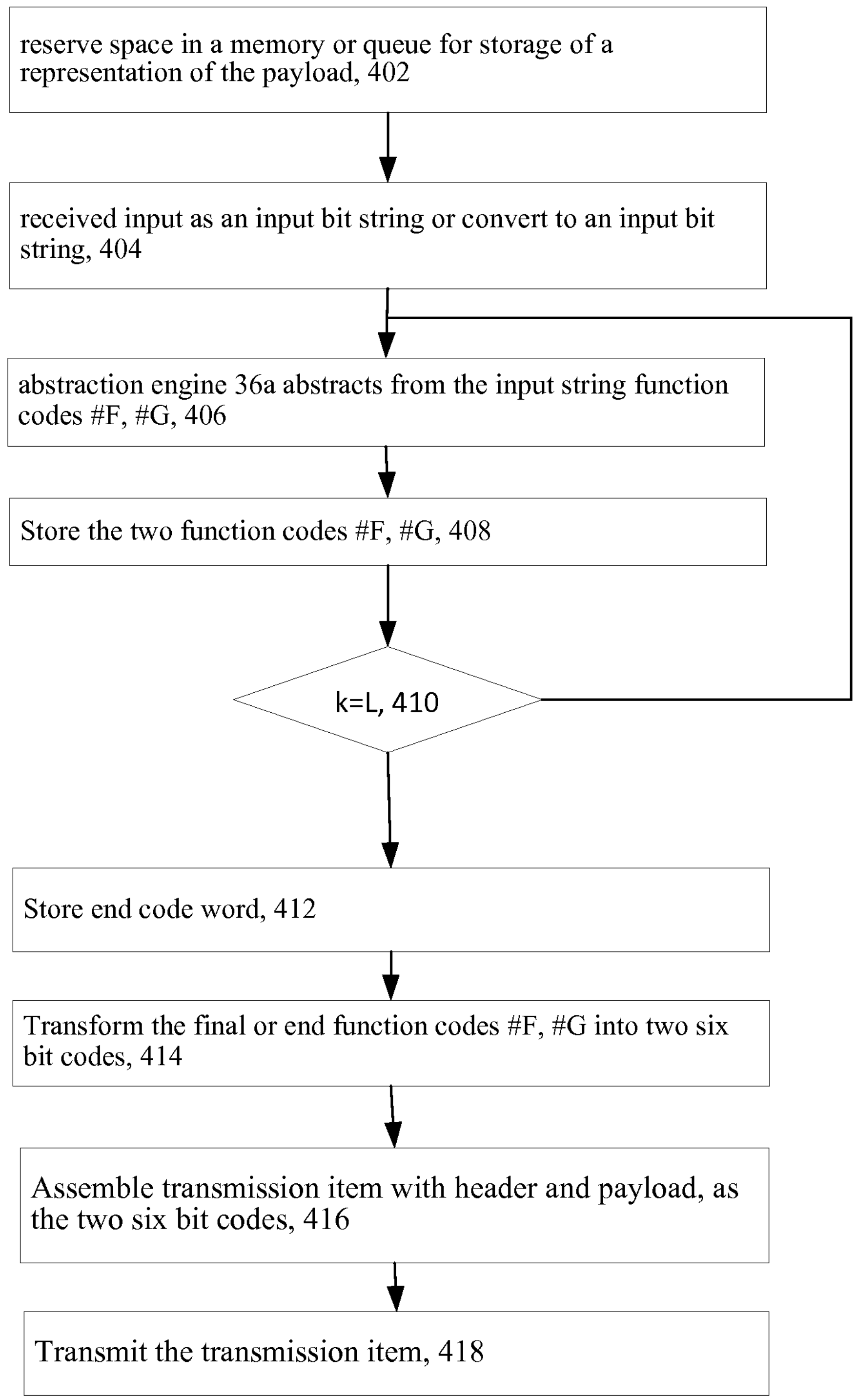
FIG. 25 is a flow chart that depicts transmission item formation for network transmission using abstraction.
Figure 26:
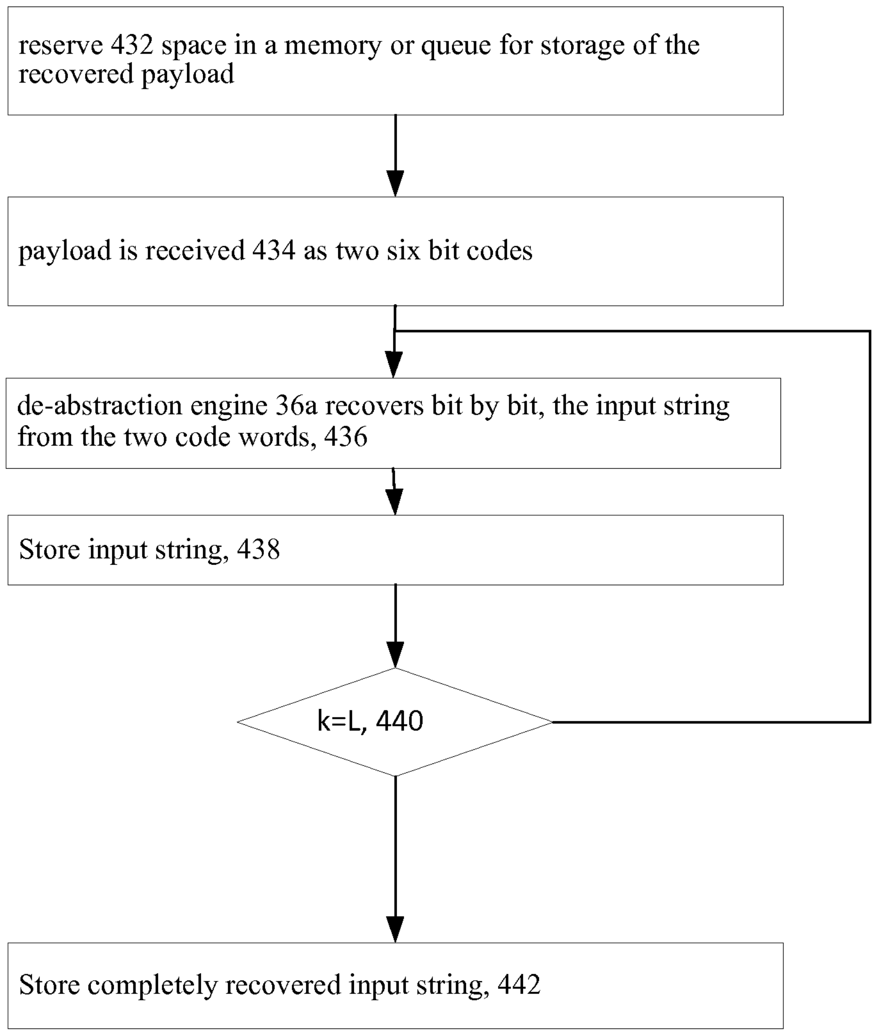
FIG. 26 is a flow chart that depicts transmission item payload recovery using de-abstraction.
Figure 27:
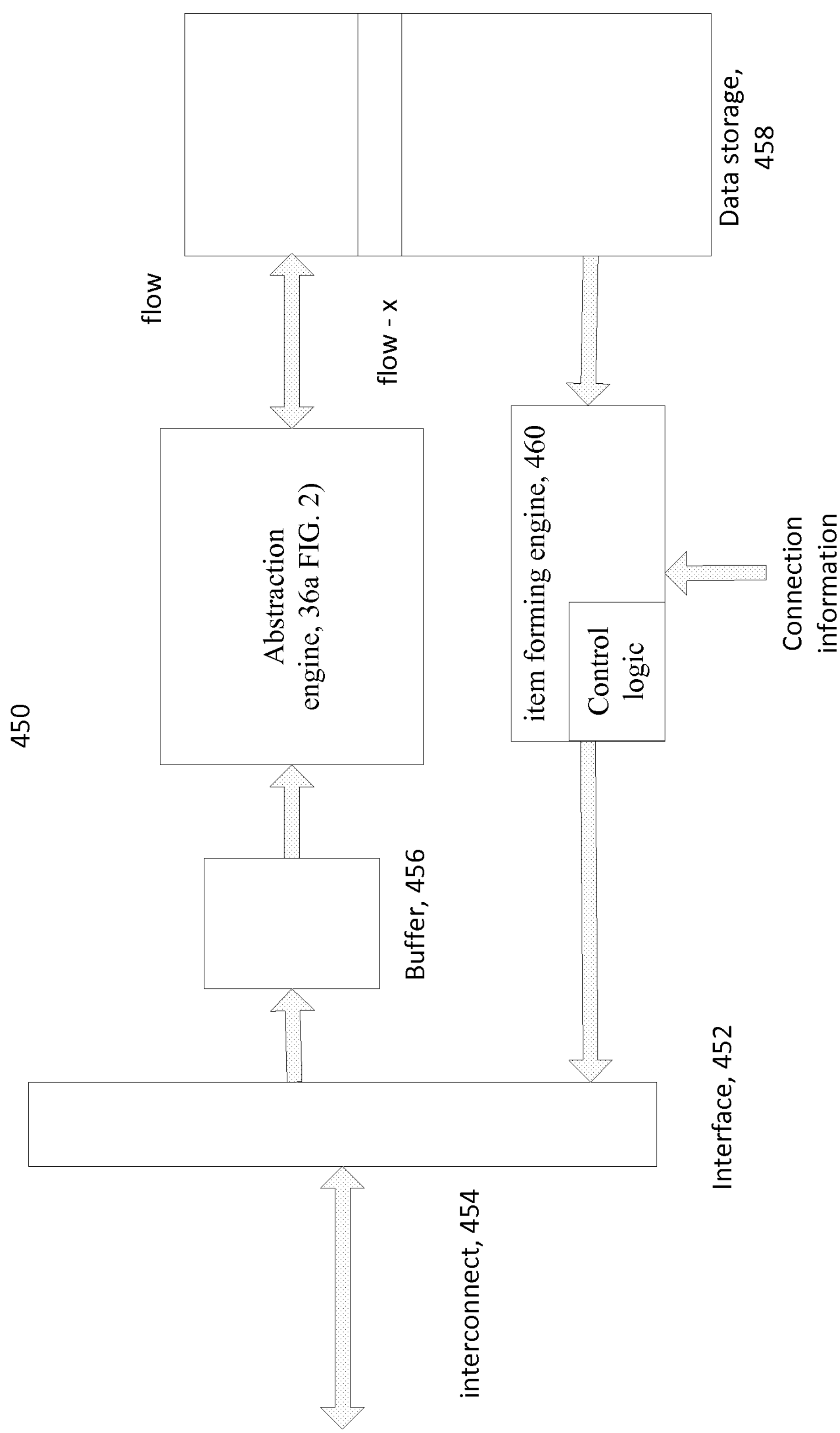
FIGS. 27 and 28 are block diagrams that depict item forming and payload extraction implementations using abstraction/de-abstraction.
Figure 28:
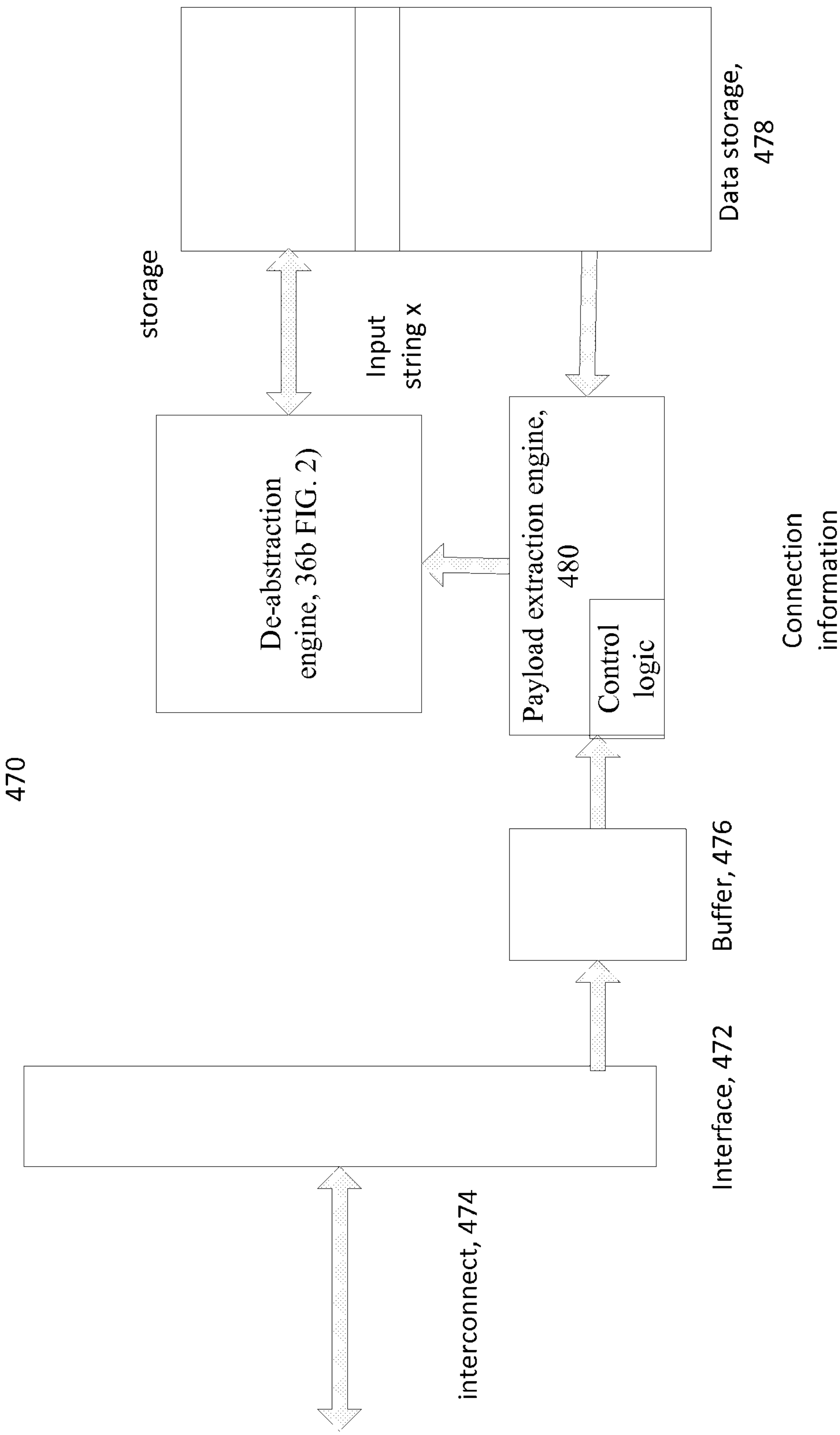

Referring now to FIGS. 20A, 20B, a combined abstraction and de-abstraction process 300 is shown. While in FIGS. 15 and 18, separate abstraction and de-abstraction processes were described such that separate abstraction and de-abstraction, e.g., routines, engines, modules and circuitry could be implemented according to the particular application, the abstraction and de-abstraction processes can be combined into a combined abstraction and de-abstraction process 300 that can share circuitry, code, etc.

The combined abstraction and de-abstraction process 300 receives 302 an input bit string of finite length L. For abstraction, the inputs are the user string and optionally the length L of the user string. The length L can either be determined by the system or supplied with the user string. For de-abstraction, the inputs are two codes and L, the length of the original user string. The codes are either six bit, five bit or four bit codes depending on the transformation that was used to arrive at the codes during abstraction, as discussed above.

For i=0, m=0 the process 300 defines 304 beginning or initial states FF', GG', AD bit, DA bit, the resulting output functions #F, #G with the final next states FF', GG'. For the present states and AD bit of i=a 306, the process 300 determines 308 the DA bit depending on permissibility conditions. The process tests 310 the DA conditions #F (DA=0)=#F (DA=1). If equal, the DA bit is a non permissible value and the DA bit is defined 312 by the m string value. If not equal the process tests 314 the DA conditions #G (DA=0)=#G (DA=1). If equal the DA bit is a non-permissible value, and the DA bit is defined 312 by the “m” string value. If not equal, the process 300 determines 316 if the process 300 is performing de-abstraction.

If the process 300 is performing de-abstraction, the process 300 determines 318 the correct DA bit, determines 320 output functions #F and #G and final states FF', GG'. If the process 300 is not de-abstraction, and thus is abstraction, the process 300 obtains 322 values from FIGS. 13A-13O, where i=a for results for #F, #G and corresponding final states. Illustratively, to explain this feature, for i=1 the permissible condition for user data bit of 1 will be used, the result #F will be 61 and final state is 55; result #G is 45 and final state is 35. Other values will be retrieved from the table in FIGS. 13A-13O according to the value of “i” and results #F and #G. Final states for i=a become 324 the present states of i=a+1.

This process 300 is repeated 326 for all rows up to k=L. Once k=L, the process again determines 328 whether abstraction or de-abstraction was being performed. If abstraction, the process transforms 330 the final functions F END, #G END into two bit codes (6 bit, 5 bit or 4 bit), as discussed above. These two codes in combination with the original input length uniquely represent the input bit string (abstraction). If the process was performing de-abstraction, the process transfers 332 the recovered input bit string without any loss in data.

Also as mentioned above, certain values are circled in FIGS. 13A-13O, to indicate non-permissible conditions for #F and/or #G. Values in FIGS. 13A-13O are fixed given defined beginning states for FF' and GG' DA, AD and k-sequence etc. Accordingly, the values in FIGS. 13A-13O would be different for different beginning states. FIGS. 13A-13O is produced step by step by the abstraction process in the abstraction. In the de-abstraction part the abstraction process is repeated the same way.

Storage Device Implementation

Referring now to FIG. 21, an exemplary implementation of the abstraction/de-abstraction for a storage device 350 is shown. The storage device 350 includes an interface 352, an interconnect 354, a buffer 356, abstraction engine 37*a* and a data store 358 (optical, magnetic, ferroelectric, or semiconductor based storage). The storage device also includes conventional circuitry (not shown) required to write and read to/from the storage medium. This circuitry would vary depending on the technology employed for the storage medium. Moreover, this circuitry (not shown) would be fed by results (codes) from the abstraction engine 37*a* for storage of the codes into the storage medium 358 at an assigned storage location during WRITE operations and this circuitry (not shown) would also for READ operations feed the de-abstraction engine 37*b* with code words retrieved (or READ) from the assigned storage location in the storage medium 358.

While in some embodiments the data store is a storage medium that is an optical or a magnetic medium based, in other embodiments the storage medium is semiconductor-based devices. For non-volatile storage applications (and long-term persistent storage) the semiconductor storage medium 358 is typically non-volatile memory, (NVM) that retains stored information when power to the device is removed. Examples of suitable non-volatile memory include flash memory, ferroelectric RAM (F-RAM), MRAM (Magnetoresistive RAM). Memory devices such as DRAM or SRAM can be volatile or nonvolatile depending on whether the devices are continuously powered.

In some implementations, the long-term persistent storage can be accomplished by use of static/dynamic random access memory with un-interruptible power supplies (with appropriate back-up systems) in which volatile memory with continuous power application is used to provide non-volatility. Flash Memories are nonvolatile since they are self-contained. In addition, the above mentioned examples, new technologies such as F-RAM and MRAM are non-volatile.

The device 350 includes an interface 352 that interfaces the device to a system (not shown) via an interconnect typically a storage bus 354. The interface 352 receives data for storage from computer memory (main memory and/or cache memory not shown) over, e.g., the storage bus 354. The storage bus 354 can involve any of the well-known storage bus standards such as SCSI (Small Computer System Interface) or IDE (Integrated Drive Electronics) ATA (AT Attachment) or proprietary standards or standards that will be developed. The storage bus 354 would typically include data, address and control information (either as separate bus lines or separate transfer segments. The interface 352 can be a parallel or serial interface 352. Other implementations of the interconnect and thus the interface 352 besides a bus can include a high speed switching network, such as a fabric or a crossbar or a storage channel such as Fibre Channel. The principles involved in the storage implementation of abstraction/de-abstraction are not governed by the type of interface 352 employed.

Semiconductor Implementation

Described below is a mechanism for storage based on "pages," a fixed-length contiguous block of data that is used in, e.g., virtual memory systems. Typically, a page also referred to as "a memory page" or a "virtual page" is the smallest unit of data that is transferred between computer memory and storage. While, various page sizes can be employed, page size is typically governed by processor architecture and/or operating system. The number of pages depends on the size of the virtual memory supported by the computer architecture. In this embodiment the storage medium is a semiconductor based medium.

The storage device 350 includes in addition to the interface 352, the buffer 356 that is coupled to the interface 352. While the interface 352 receives data from the interconnection 354, and may include formatting of the data for storage, the interface 354 sends the data to the buffer 356 interposed between the abstraction engine 37*a* (FIG. 2) and the interface 352. The buffer 356 in general can be of any size, and in general will be of a size that is sufficient to ensure no over write of data occurs. Thus, the size is based on the rate that the data is received from the interface, and the rate at which abstraction and storage can occur. The requirements can be less than a page or several pages worth of storage. In addition, the buffer can be a FIFO (first in first out) buffer structure. In some embodiments, the buffer may be part of the interface 352. That is, the buffer size is selected in accordance with the rate at which pages are received by the interface while taking into consideration the rate at which a page can be abstracted and stored by the abstraction engine 37*a* in the semiconductor storage medium.

With this particular application, the size of data written during a write to storage is always known, and is the same as the value of L (the input string length), which in this example is 4 KB. While in this example, the data written represents a page, in some implementations it could represent more than one page (i.e., several pages could be written.) The buffer 356 will typically send the data, a word or a byte at a time, depending on the interface 352 format to the abstraction engine 37*a*. In other implementations, other buffer sizes could be used for sending data to the abstraction engine 37*a*. Knowing the size L, the abstraction engine 37*a* can immediately operate on the data as it is read from the buffer 356. The abstraction engine 36 iteratively processes the data, as discussed above, and when having processed the entire 4 KB page worth of data, has extracted two code words that provided an abstracted representation of the input data received at the interface 352.

Operations using the storage device 350, such as writing to memory or storage (WRITE) and reading from memory or storage (READ) operate on an amount of data corresponding to one (or more pages). In the simplest example, the abstraction engine 37*a* will operate on a page at a time. The example of 4 KB is a common page size. The storage device 350 typically would store many such pages in the data storage 358. For example, the data storage 358 might have $2^{30}$ pages to form a four terabyte memory (i.e., 4 KB=$2^{15}$; and $\mathbf{2}^{15}\times 2^{30}=2^{45}=4$ terabytes). The device 350 stores the page in a location page i that corresponds to an address representing the page name (or page address) obtained from the interface 352 from address information transmitted over the interconnect 354.

In FIG. 21, during the WRITE command, the buffer 356 sends a page worth of data in the proper format to the abstraction engine typically a word or byte at a time, along with the page name. In the example, the data storage 358 has a storage medium that is implemented as semiconductor memory, e.g., DRAM or SRAM or Flash Memory or F-RAM or MRAM). In this example, the data storage 358 has a size of $2^{30}$ addresses. Each address would point to a twelve bit data word (two six bit codes). In other implementations the five and four bit codes could be used.

In this example, each page name represents a 30 bit binary code address. Each page is a 4 KB bit string (32,768 bits). Thus L=32,768. The device considers each page (the 4 KB or 32,768 bit string) as an input data string, k to be abstracted. If not supplied as a string the 4 KB block can be stored in the buffer 356, read out and operated on as a string. Each page will have an independent bit string with the same order and different content. This will result in options of either, 8, 10 or 12 bit code word results. For this example, the 12 bit code word result will be used. The 12 bit code word that is produced by the abstraction engine 37*a* represents the data content of the page. Each 12 bit data word is stored and used later in the de-abstraction process via the interface 352 command and page name during a READ operation.

The 12 bit result is a preferred option of the three because the 12 bit result has a two times six bit code answers. The two times six bit codes have sixteen equivalent classes of four bit code elements each. This is shown in FIGS. 11E and 11F. The other options the two five bit and the two four bit will have a two times five bit code having equivalence classes of two elements as shown in FIGS. 11G and 11H, and one four bit result with one element as shown in FIGS. 11I and 11J. All three options lead to the same de-abstraction results because they are equivalent.

Referring now to FIG. 22, the command function READ is implemented by use of a de-abstraction engine 37*b* (FIG. 2). In the example, the page name (30 bit address) follows the command READ to the proper address of the $2^{30}$ addresses that contains the 12 bit word of the corresponding abstraction. The storage medium through read circuitry (not shown) retrieves the 12 bit code word at that address. This 12 bit code word along with the length L (which in this example is fixed and thus known as 32,768 bits) can be de-abstracted to recover the original input string without data loss. The de-abstraction engine 37*b* is fed by the code words retrieved from the storage medium 358 at the value of the page name or page address, here page-i. The de-abstraction engine 37*b* sequentially produces, starting at bit position 1 (k=1) and ending at 32,768, k=32,768 (the k order), the entire content of the page (as a de-abstracted bit string of the page).

FIGS. 21 and 22 show the storage device 350 as having two separate functional blocks one for WRITE (abstraction) and one for READ (de-abstraction). However, as discussed above, an abstraction/de-abstraction engine that shares code or logic can be used.

Referring now to FIG. 23, the interface 352 determines 372 a specific page name and a command, from address and control information sent to the storage device 350 over the interconnect 354, e.g., the bus (or one of the other mechanisms). The basic commands are a WRITE command and a READ command. The interface 352 determines 374 whether it is a READ or WRITE operation. Other commands associated with the particular protocol may be used, whereas other commands that may be part of a particular known protocol may not be used.

During a WRITE command, data are sent 376 to the abstraction engine 37*a* to abstract the two codes to represent the contents of the page by operating on data from the buffer until the length 4 KB has been reached (until L has been reached). The abstraction engine transfers 378 the abstracted codes to the data storage 358 to store 379 the abstracted codes in a location in storage that is associated with the page name, e.g., as shown in FIG. 21 as Page i.

During the READ operation, the storage device 350 retrieves 382 the two code words from the storage medium at that address corresponding to the page name. The storage device 350 transfers 384 the code words to the de-abstraction engine 37*b* and the de-abstraction engine 37*b* recovers 386 the original page worth of data from the code words, and the length, again which is fixed and hence known. The de-abstraction engine 37*b* transfers 388 recovered bits either a bit at a time or in other increments to the buffer 356 and ultimately to the interface 352.

In one implementation the de-abstraction engine 37*b* will sequentially transfer bit by bit the extracted bit string to a READ buffer 366 (a buffer that can collect the bit by bit de-abstracted results and transfer them as a block to the interface 352. From the READ buffer x6, the information is sent to the interface 352.

In multiprocessor systems a listing of typically presently used page sizes are as follows:

4 KB
8 KB
64 KB
256 KB
1 KB
16 MB
256 MB
2 GB

The ratio of abstraction for a 4 KB page (e.g., the example above) is:

$$4\text{ KB}\times 2^{30}\text{ pages}=2^{15}\times 2^{30}=2^{45}\text{ bits.}$$

The abstraction process reduces to an abstraction rate R as follows:

$$R=2^{45}/2^{30}\times 12=2^{15}/12=>R=2.7\times 10^{3}:1.$$

The rate of abstraction for a 2 GB page is:

$$2\text{ GB}\times 2^{30}\text{ pages}=2^{34}\times 2^{30}=2^{64}\text{ bits.}$$

The abstraction process reduces to an abstraction rate R as follows:

$$R=2^{64}/2^{30}\times 12=2^{34}/12=>R=1.43\times 10^{9}:1.$$

For the other mentioned page sizes (as well as other pages sizes) similar calculations of the rate R can be done.

Implementation of Data Storage

Referring now to FIG. 24, a conceptual view of the storage device 350 is shown. The interface 352 interfaces the storage device 350 with a system bus. The device includes in addition to the interface an abstraction/de-abstraction engine 36 that includes length determination logic L, buffers, and a storage medium (not shown) that contains either the data corresponding to the separate and individual k strings when the command is abstraction or the separate and individual 12 bit data contents (words) when the command is de-abstraction.

As shown, if the system bus asks for storage of a certain k string (page), the device will use the abstraction engine 37*a* to generate the corresponding 12 bit data word. If the system bus requests retrieval of a 12 bit data word, the storage device uses the de-abstraction engine 37*b* to regenerate the corresponding input bit string.

The processes used here are similar to the processes used for storage based on "pages" as discussed in FIGS. 21 and 22 with one difference. In the case above, the length L of the input bit string is always known because page size is defined by the underlying architecture of the system. In the case of data storage, regarding FIG. 24, the length L can be either variable or at least not initially known.

The length L can either be transmitted with the WRITE command (abstraction) or with the READ command (de-abstraction) and the system stores the 12 bit code and optionally the length. Alternatively, the system executing a WRITE command calculates the length L from the input string during the first abstraction (for fixed lengths) and stores the 12 bit code and the length. For successive WRITE commands with fixed lengths, the system would not need to calculate or store the length.

For the READ command, the system retrieves the 12 bit result and the length. In successive read commands, the user will then provide the length L and the 12 bit result and the system applies the these as inputs to the de-abstraction engine and returns the input bit string. Alternatively, if the lengths are or can be different, the system calculates the lengths for each WRITE, stores the lengths "L" and returns the calculated "L" for the corresponding READ.

A few examples of applications of this approach include arbitrary variable data strings in database applications, audio recording, video recording, and similar applications.

Network Communication

Network communication, in principle, involves transmission and reception of data over a network that couples many systems or nodes. A packet switched network involves time sharing of a network communication channel for transmission and reception of user defined information over the communication channel. A circuit switched network involves switching of circuits to set up a dedicated path. Networks can be private networks or public networks such as the Internet.

Network communications involve a defined protocol. Protocols define formats and rules for exchanging messages among systems both in telecommunications and computing. Protocols often include signaling, authentication and error detection and correction capabilities. Many such protocols are in use today. Exemplary protocols include Ethernet, Local Talk, Token Ring, FDDI and ATM, TCI/IP etc. Communication protocols have various properties, such as whether they are connection-oriented or connectionless, whether they use circuit mode or packet switching, or whether they use hierarchical or flat addressing.

Irrespective of the protocol type and specific properties transmissions whether of packets or cells, etc., involve transmission of connection information such as connection identifiers or addresses, and data. Connection information portions of the transmissions normally define nodes, e.g., paths or systems or devices in a network over which the transmission occurs.

The data portion of the transmission is of particular interest for the abstraction/de-abstraction processing described herein. As used herein a "formatted unit of data" refers to any of the types of items carried by a network such as packets, cells, frames, etc. For example in a packet switching context, any data string in any time sharing section, independent of the length, can be abstracted at a transmitting node to two codes, e.g., abstraction codes of 12 bits or less and used as the payload of the formatted unit of data. Correspondingly, de-abstraction of the two abstraction codes in the payload of any formatted unit of data can be performed at the receiving node to recover the original input string. Thus, abstraction/de-abstraction also applies to either circuit or packet switching modes.

For protocols where the payloads can be of variable length, the payload can also include the size L of the input bit stream, whereas where the payloads are of a fixed size, the payload need not include the size L of the input bit stream. Further, where the payload is spread over plural, formatted units of data of variable lengths, the payloads can be processed as discussed below again with one or more of the transmissions including the size L.

Referring now to FIG. 25, an application will prepare a formatted unit of data, e.g., a packet or cell or frame, etc. for transmission using generally conventional techniques. However, the data portion (payload) of the formatted unit of data will be processed differently than is conventionally done. The application for processing of the payload will reserve 402 space in a memory or queue for storage of a representation of the payload. While this reservation is being made (or after the payload has been processed) the payload is processed. The payload either is received 404 as an input bit string or in situations where a series of bytes, words, etc. are received, is converted to an input bit string. The input bit string is sent to the abstraction engine 37*a*. The abstraction engine 37*a* operates 406 on the input string to abstract function codes #F, #G. The function codes #F, #G are stored 408.

Where the payload is spread over plural formatted units of data, the payload is iteratively processed until k=L, 410 again with one of the transmissions including the size L. The final or end function codes #F, #G are stored 412 and are transformed 414 into two six bit abstracted codes. The device will assemble 416 the formatted unit of data with header and payload, with the payload containing two six bit abstraction codes, and thereafter transmit 418 the formatted unit of data.

The example depicted below represents one time interval for each user with different data lengths (denoted by the dashed line between "DATA" and "end", where P stands for protocol and A stands for address. The results are described as 12 bits using 6 bit transformation of the end #F and end #G functions.

User 1 <u>P.A.</u> <u>DATA---------------end</u> Abstraction-> <u>P.A.</u> <u>12</u> <u>BITS</u> (result)
User 2 <u>P.A.</u> <u>DATA-------------------------------------end</u> Abstraction-> <u>P.A.</u> <u>12</u> BITS (result)

In general, there will be many users on a given channel at any one time due to time sharing, and over time, those users end transmissions and new users initiate new transmissions over the channel. All active users are organized by an address name and the temporary 12 bit data result of the last time interval. The 12 bit data result is used for transmission to the end node, and at the beginning of the next time interval for continued abstraction. The storage of the 12 bit result and transmission of the formatted unit of data occurs at the same time. The storage of the 12 bit result will be the unique beginning of the next time share interval of the corresponding user. The storage of the 12 bit result can occur in a memory device similar to the memory described in the storage discussion above. The memory used for storage of the payloads instead of using page names uses user names.

When a transmission of a communication is complete, the last 12 bit result is transmitted from memory, and the 12 bit data in the memory address of this user will be erased and the system will make that space and time slot available for another user. Memory management is used to organize the addresses of the memory. Existing software solutions provide translation and memory management between user names and their corresponding addresses. The final function codes along with the length of the string represent the string and which are used during de-abstraction to recover the input string. The input string can be converted back to whatever form the payload was originally in.

Referring now to FIG. 26, an application will receive a formatted unit of data, e.g., a packet or cell using generally conventional techniques. However, for recovery of the payload from the data portion of the formatted unit of data, the payload will be processed differently than is conventionally done. The application for processing of the payload will reserve 432 space in a memory or queue for storage of the recovered payload (de-abstracted payload). While this reservation is being made the payload is processed. The payload is received 434 as two six bit abstraction codes that will be processed in the de-abstraction engine 37*b* to recover the input bit string. The de-abstraction engine 37*b* operates 436 on the two bit abstraction codes to recover the input string bit by bit and the string is stored 438. When the string has been processed to reach k=L 440 the complete string has been recovered.

Where the payload is spread over plural transmissions, the payload is iteratively processed until k=L, 440. The device can stores the recovered input string 442 and can convert the string back to its original format.

Referring now to FIG. 27, a formatted unit of data forming engine 450 for forming cells, packets, etc. (according to the implemented protocol) is shown. Conventional details regarding aspects on queuing, header formation, and formatted unit of data formation, etc. are not illustrated for convenience. However, it is understood that payload (the data portion of the formatted unit of data) is at least modified to include in the payload the abstracted representation of the payload content rather than the actual content or a conventionally compressed aspect of the payload content. In an example, the formatted unit of data forming engine 450 includes an interface 452 that is coupled to an interconnect 454, an input string buffer 456 (similar in function as the buffer 356 discussed above for FIG. 21) and an abstraction engine 37*a*. The abstraction engine 37*a* forms function codes that are stored in storage 458 according to a flow name, "flow" with a flow –x illustrated. The formatted unit of data forming engine 450 also includes an item forming engine 460 with appropriate control logic that forms the formatted unit of data by combining connection information typically in a header (not shown) with a payload that is populated with a set of abstraction codes. Once the formatted unit of data is formed, it is sent to the interface for transmission according to details of the protocol.

One thing to note is that because the payload will in general be of the two abstraction codes the payloads will be smaller and hence the formatted unit of data small and thus time slots for transmission can be smaller and thus overall transmission rate of payload content higher.

Referring now to FIG. 28, a formatted unit of data payload extraction engine 470 for receiving cells, packets, etc. and removal of payload (according to the implemented protocol) is shown. Conventional details regarding aspects on queuing, header extraction, and payload extraction, etc. are not illustrated for convenience. However, it is understood that the payload extraction is at least modified to remove from the payload the abstracted representation of the payload content and to recover from that abstracted representation of the payload content the input bit stream.

In an example, the formatted unit of data payload extraction engine 470 includes an interface 472 that is coupled to the interconnect 474, an item buffer 476 (that can be used to buffer incoming formatted unit of data) and a de-abstraction engine 37*b*. The de-abstraction engine 37*b* recovers the input bit stream from function codes that are in the payload and stores the recovered input bit stream in storage 478 according to a flow name, "flow" with a "flow –x" illustrated. The formatted unit of data payload extraction engine 470 also includes a payload extraction engine 480 with appropriate control logic that extracts the payload from a received formatted unit of data. Once the payload is extracted, it is either sent to the de-abstraction engine, as shown, or can be stored in storage 478 (or another store) according to specific implementation details. Moreover, depending on the specific implementation, the storage can be the storage discussed above or can be more conventional memory.

One thing to note is that because the payload will in general be of the two abstraction codes, payloads will be smaller and hence the formatted unit of data smaller and thus time slots for reception can be smaller and thus overall reception rate of payload content higher.

Additionally, while FIGS. 27 and 28 are shown as separate devices for some embodiments, in other embodiments the functionality of these devices would be implemented in a single device that would share some of the described circuitry and/or features.

Cryptography

The abstraction/de-abstraction engine 36 can also be used for cryptography. Cryptography, in the form of encryption, involves the conversion of information from a readable state to apparent nonsense, and de-encryption, involves the conversion back of that apparent nonsense into readable text. Encryption and de-encryption and can be accomplished by the abstraction/de-abstraction engine 36. Specifically, the abstraction/de-abstraction engine 36 can be used for symmetric encryption.

Encryption

Figure 29B:
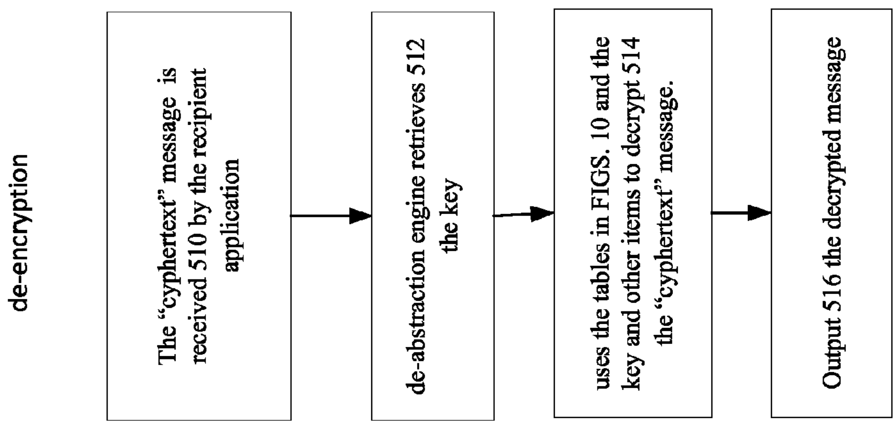
FIGS. 29A, 29B are flow charts that depict encryption/de-encryption using abstraction/de-abstraction.
Figure 29A:
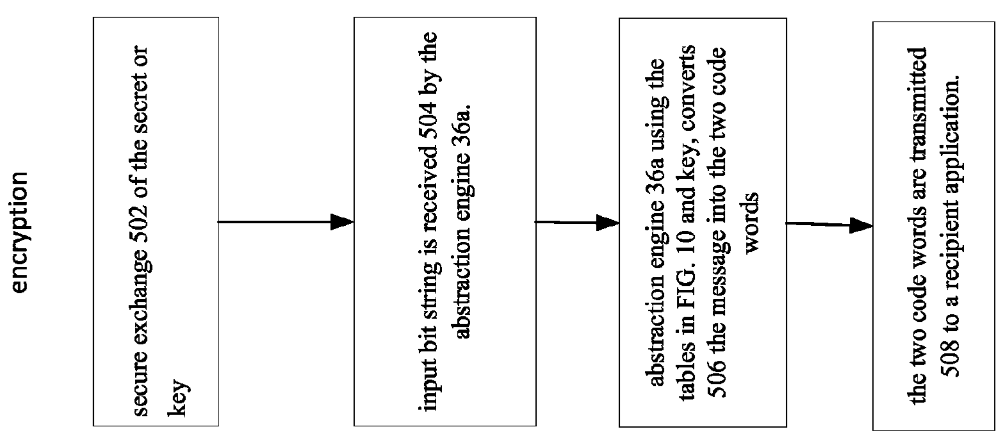
Figure 32:
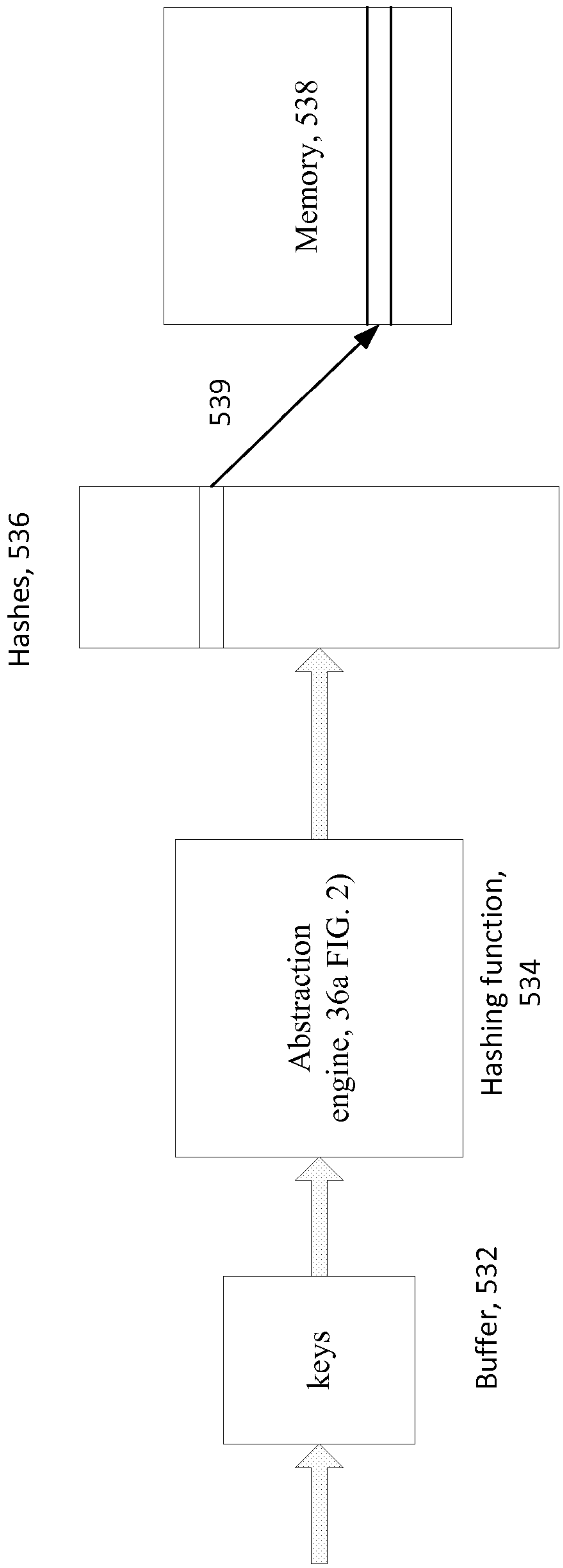
FIG. 32 depicts a block diagram for a hashing function.
Figure 33:
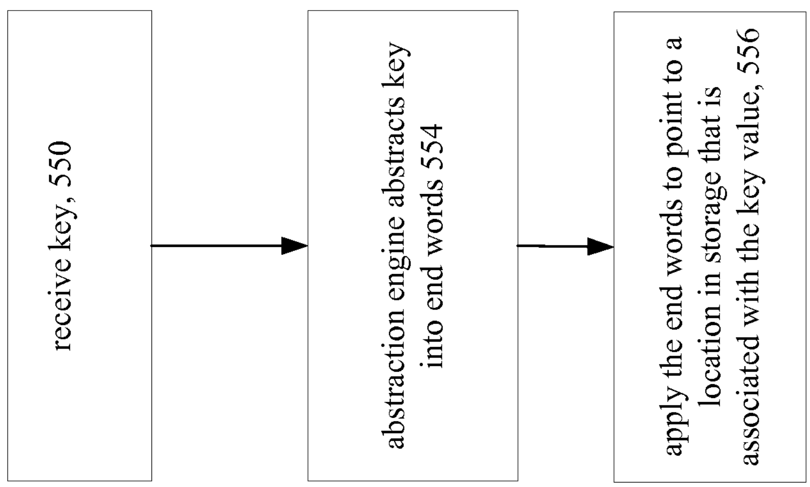
FIG. 33 depicts a flow chart for a hashing function.
Figure 35:
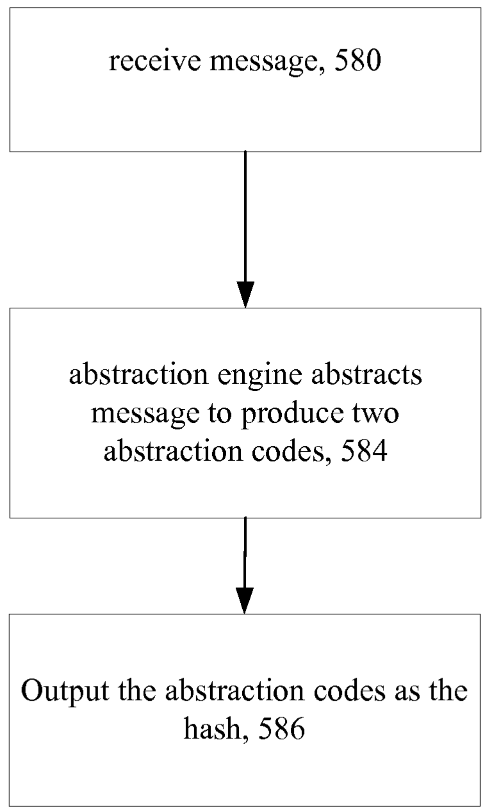
FIG. 35 depicts a flow chart for a cryptographic hash function using abstraction codes.

Referring now to FIG. 29A, as shown, there is a secure exchange 502 of a secret or key that will used to decrypt the "cyphertext." This can occur prior to or after transmission of the message. In this case, the exchange is of one or more of the limit string, AD string or the specific permutation used to transform the end #F and end #G functions, as discussed below. The selection of the type of key can be automatic, e.g., the encryption application will generate, e.g., a random permutation of for example, the transformations of the #F and #G functions. Alternatively, the type of key used for encryption can be user selectable.

An original message (i.e., input bit string) is received 504 by the abstraction engine 37*a*. This original message is in plaintext or clear text. The message is fed to the abstraction engine 37*a*, which using the tables in FIG. 10, and a specific limit string, AD string and transformation permutation converts 506 the message into two code words (and which along with the length of the string) uniquely represents the message in a compressed form.

This compressed form however is also an encrypted form because in order to convert this representation or "encrypted message" back into clear text, the "decoding" needed to recover the original information requires de-abstraction and more specifically the knowledge of how the plaintext was abstracted. Knowledge of how the plain text was abstracted requires in addition to knowledge of the abstraction/de-abstraction processing, the "secret" or "key", which here is one or more of the limit string, the address string and/or the specific permutation used for the transformation of the end #F and end #G functions (FIG. 11A-11B) into the bit codes.

Specifically regarding the transformation, recall that there are $=2.537\times10^{178}$ possible permutations for the transformation of the end #F and end #G functions, (when 6-bit code transformations are used). Thus, the two code words can be considered "cyphertext", but in a very compact form, unlike other approaches, and are transmitted 508 to a recipient application. The recipient application can be an application on the same machine that was used to encrypt the received message or can be on a different machine.

This form of encryption is akin to a symmetric form meaning that there is a secure exchange of the secret or key that would be used to decrypt the message. In this case, the exchange can be accomplished in various known ways, such as using another encryption algorithm (e.g., a public key cryptography algorithm) to secure the key and exchange the key in a secure manner or build the key into the application in a secure manner or have an unrelated exchange of the key or a manual exchange of the key and so forth.

De-Encryption

Referring now to FIG. 29B, the "cyphertext" message that is sent is received 510 by the recipient application and is subsequently decrypted (the apparent nonsense is converted into the original message. The cyphertext is fed to the de-abstraction engine 37*b*. The de-abstraction engine retrieves 512 the key, and the other items mentioned above (those of the limit string, address string and transformation permutation that were not part of the key), and using the tables in FIG. 10, the other items that were not part of the key (typically the specific limit and address strings) and the key to decrypt 514 the "cyphertext" message. Thus, any one or all of the limit bit string, address bit string and the specific permutation used for transformation of the end #F and end #G functions is/are exchanged in a secure manner (depending on which one(s) of those items is the key) with the recipient application, executing the de-abstraction. The message is decoded by the de-abstraction engine 37*b* using the tables of FIG. 10 and these items. To the extent that only one of these items, namely the limit bit string, the address bit string and the specific permutation used for transformation, is used as the key, the remaining items can be exchanged in an non-secure manner or built into the application.

The de-abstraction engine 37*b* will recover the original message (input bit stream) and output 516 that message (input bit stream). The de-abstraction engine 37*b* thus operates on the two code words over the length of the input bit stream to recover the original input bit stream.

Features of the Keys

Generation of the address bit string (index i, FIG. 5B) and the limit data bit string (index m, FIG. 5A) are produced by a random process. For example, these are generated by a random sequence generator, e.g., by a computer operating system library or manually, as discussed above. Thus, for specific security between two users, a unique separate random process for string i and string m are used. In addition, at the end of the abstraction, the possible 64 elements of 2×6 bits are transformed by two random permutations, one for the function end #F and one for the function end #G.

FIGS. 30 and 31 show two random permutations of the 64 elements. One permutation is for end #F function and one for end #G function. Each of the end #F and end #G functions has $64!=1.26\times10^{89}$ random permutations. Together, the total number of random permutations is $64!\times 64!=1.58\times10^{178}$ possibilities, as mentioned previously. This requirement provides extreme security even without consideration of the random limit strings and address strings. The transformation with these random permutations at the end of abstraction will be used in opposite direction at the beginning of de-abstraction.

Accordingly, the general modern cryptography assumption that a strong cryptographic algorithm is based around computational hardness assumptions, making such algorithms hard to break in practice by any adversary, is provided by this approach, with the added advantage that transmission or storage of the cypher is very compact. While as with any computational encryption it is theoretically possible to break, it is infeasible to do so with the abstraction process described. This scheme is thus a computationally secure mechanism.

Hash Function

A hash function is an algorithm or routine that maps large data sets of variable length items referred to herein as "hash keys" or "keys" to smaller data sets of a fixed length. For example, persons' names have a variable length. This information could be hashed to a single integer serving as an address to a memory. The values produced by a hash function are called "hash values."

Referring now to FIG. 32, a buffer 532 can store keys that are applied to a hashing function 534 that uses the abstraction engine 37*a*. The abstraction engine 37*a* provides hashes 536 that are used to map the keys to an index 539. In general, a hashing function 536 may map several different keys to the same index, e.g., a location in memory 538 (termed a collusion that should be avoided/minimized) where a record at the index 539 associated with the key is stored. Therefore, each index 539 of a hash table is associated with a set of one or more data records, rather than a single data record. The abstraction engine 37*a* produces hash values for very large-sized keys requiring various fixed length index results. For example, a 128 byte key (1024 bits) might require from 8-32 bit index results.

Referring now to FIG. 33, to produce a hash value, the system receives 550 the key, here the 128 byte key. The system abstracts 554 the 1024 bits into four "end words" end-0 to i end-3. The system applies 556 the end words to point to a location in memory associated with the key value. The end words are as follows:

i end-0 #F3,4 and #G3,4 each containing 4 bits=8 bits=order 0-7, end-1,#F3,4 and #G3,4 each containing 4 bits=8 bits=order 8-15, end-2,#F3,4 and #G3,4 each containing 4 bits=8 bits=order 16-23, end-3,#F3,4 and #G3,4 each containing 4 bits=8 bits=order 24-31, These four sets of functions #F, #G are the permissible ends of the hash function based on abstraction of the 1024 bits.

Referring now to FIGS. 34A and 34B, these figures show 4-bit minimal representations of the abstractions for #F and #G for 4 bit codes. In case where six bit or five bits codes are used, i.e., 2×6 or 2×5 end functions, the 6 or 5 bit code end functions can be transformed into the above 2×4 bit codes. For example, the transformation of 2×6 to 2×4 is shown in FIG. 11E for #F and 11F for #G, as discussed above.

The above 32 bits can be used from 8 to 32 bit index values. These values can be used as addresses to memory for data sections correspondingly pointed to by the key. Either the entire data record pointed to by the key or the abstracted record of 12 bits produced by the abstraction engine 37*a* can be retrieved from memory 538.

When abstraction engine 37*a* is also used to compress the data record content, i.e., the input bit string, the de-abstraction engine 37*b* is used to recover the input bit string.

Cryptographic Hash Functions

Cryptographic hash functions can also be provided by abstraction/de-abstraction. Referring now to FIG. 35, abstraction engine 37*a* receives a message 580 of any finite length L and performs 582 an abstraction to output 584 two abstraction codes. The abstraction codes correspond to a short, fixed length hash of the input message using as the hash function a transformation permutation and the abstraction engine 37. A cryptographic hash can be used in various applications such as in a digital signature. Because the abstraction codes are produced by the abstraction engine that requires knowledge of the abstraction process, knowledge of the limit and AD strings and the permutation used to code end #F and end #G it would provide a good hash function, since an attacker would have difficulty finding the message and the hash function that produced the same hash result.

Message Authentication Codes

The abstraction engine 37*a* can also be used for message authentication codes, which like cryptographic hash functions, except that a secret key can be used to authenticate the hash value upon receipt. The secret key is one of the limit string, the address string or a transformation permutation.

Figure 36A:
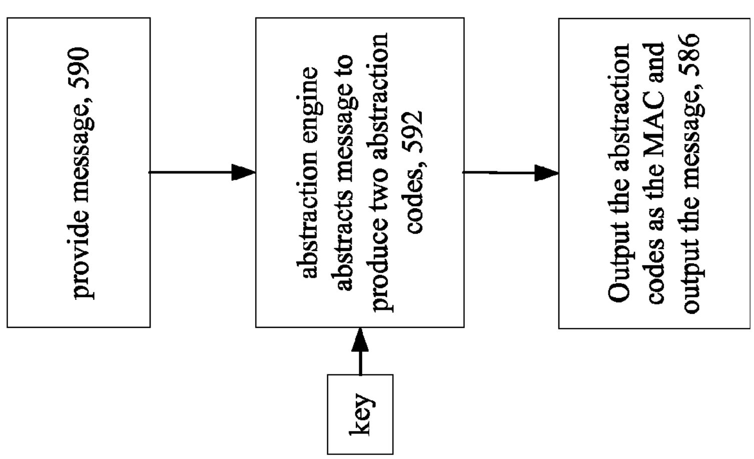
FIGS. 36A and 36B depict flow charts for message authentication code formation using abstraction codes and verification using de-abstraction of the abstraction codes.

Referring now to FIG. 36A, a sender provides a message 590 and the sender runs 592 the message through the abstraction engine 37*a* producing a pair of abstraction codes, using the key to authenticate the sender and the message. The pair of abstraction codes are coded by the key, and the abstraction engine outputs 586 the message and the abstraction codes as the MAC (message authentication code).

Figure 36B:
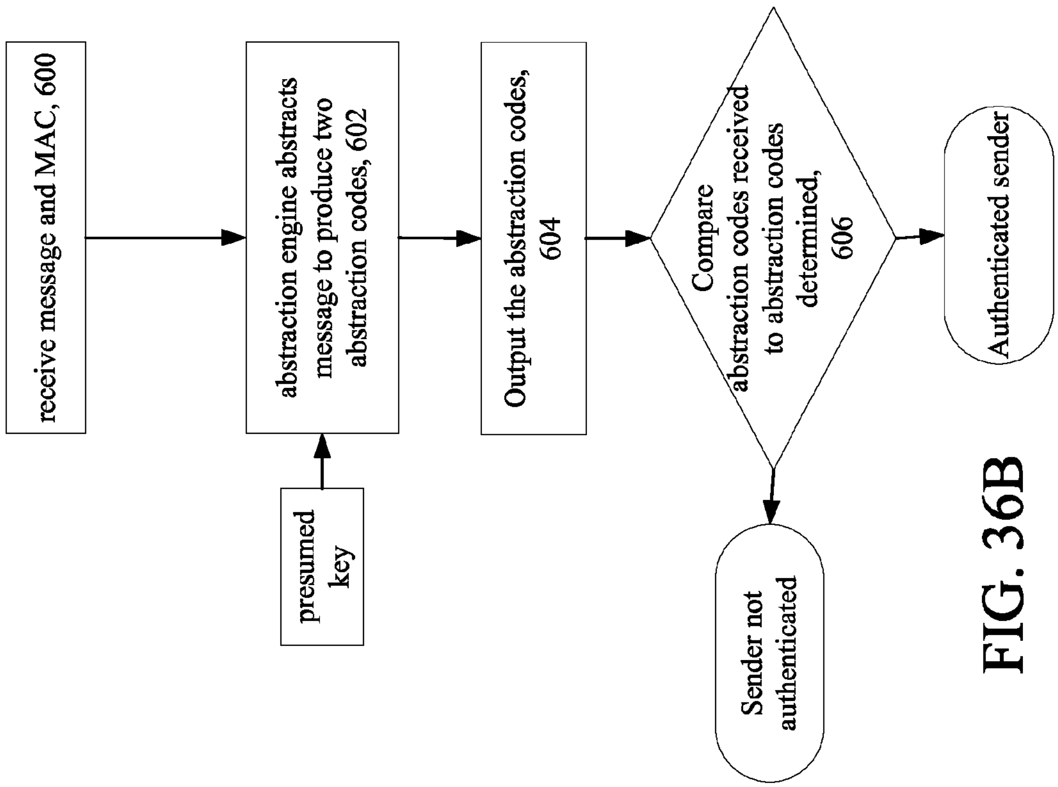
Figure 37:
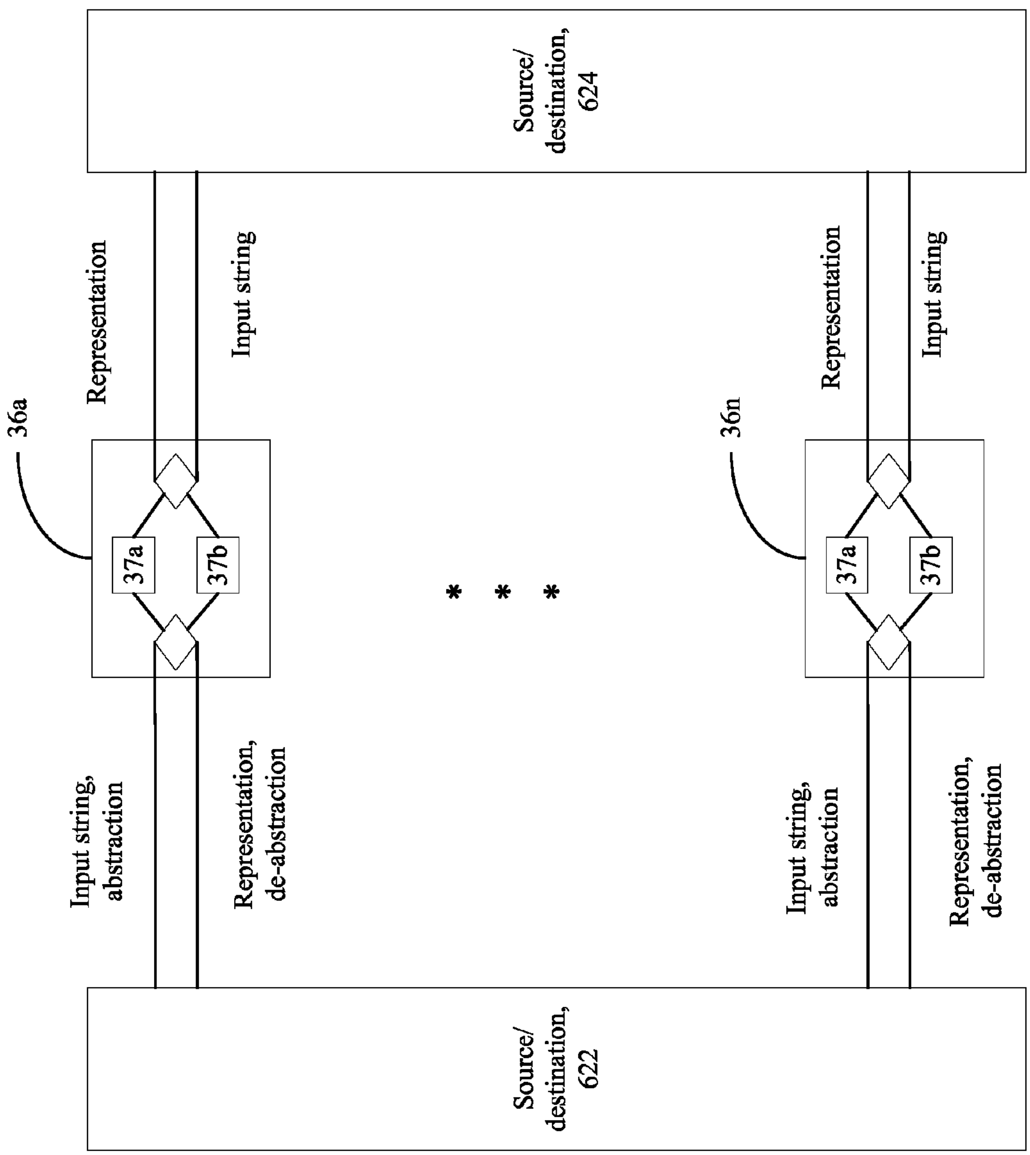
FIG. 37 is a block diagram of a parallel abstraction/de-abstraction implementation.
Figure 38:
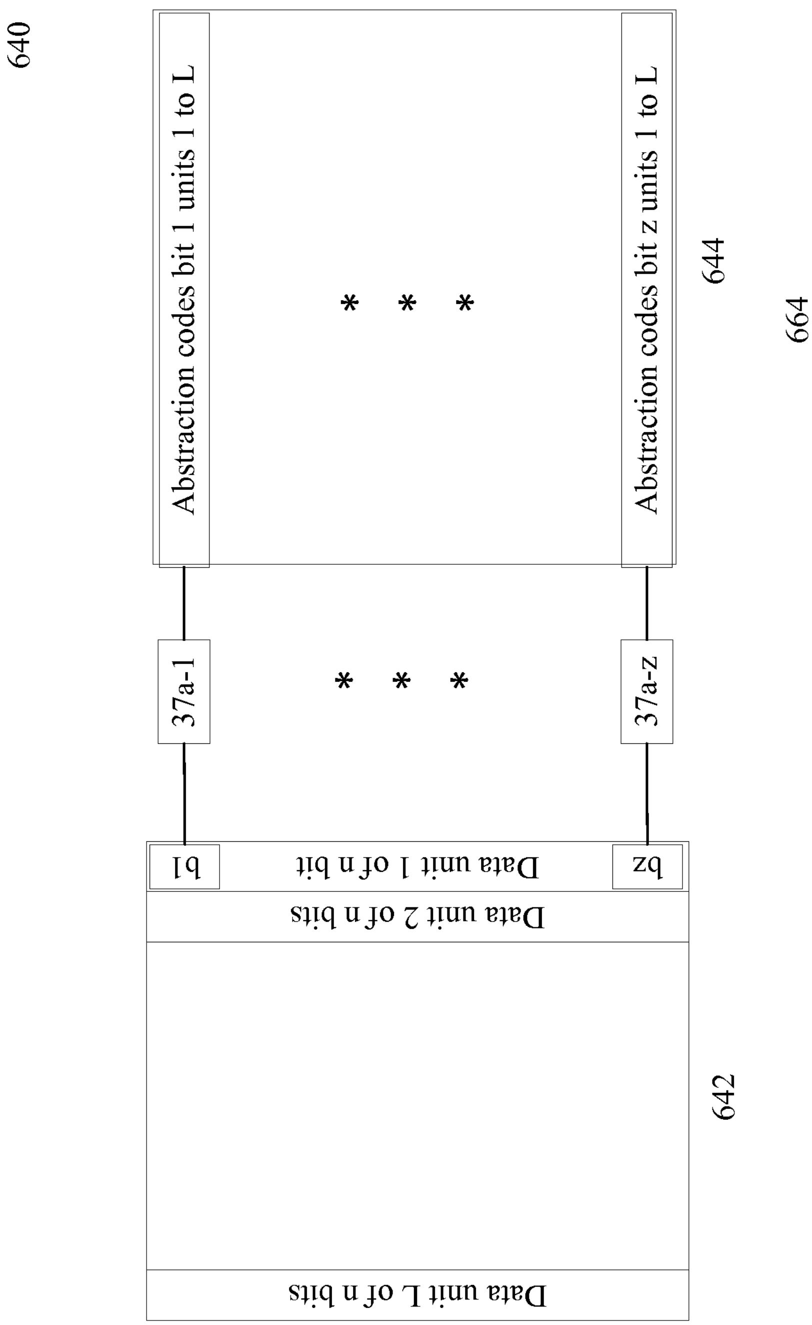
FIG. 38 is a block diagram of a parallel abstraction implementation.
Figure 39:
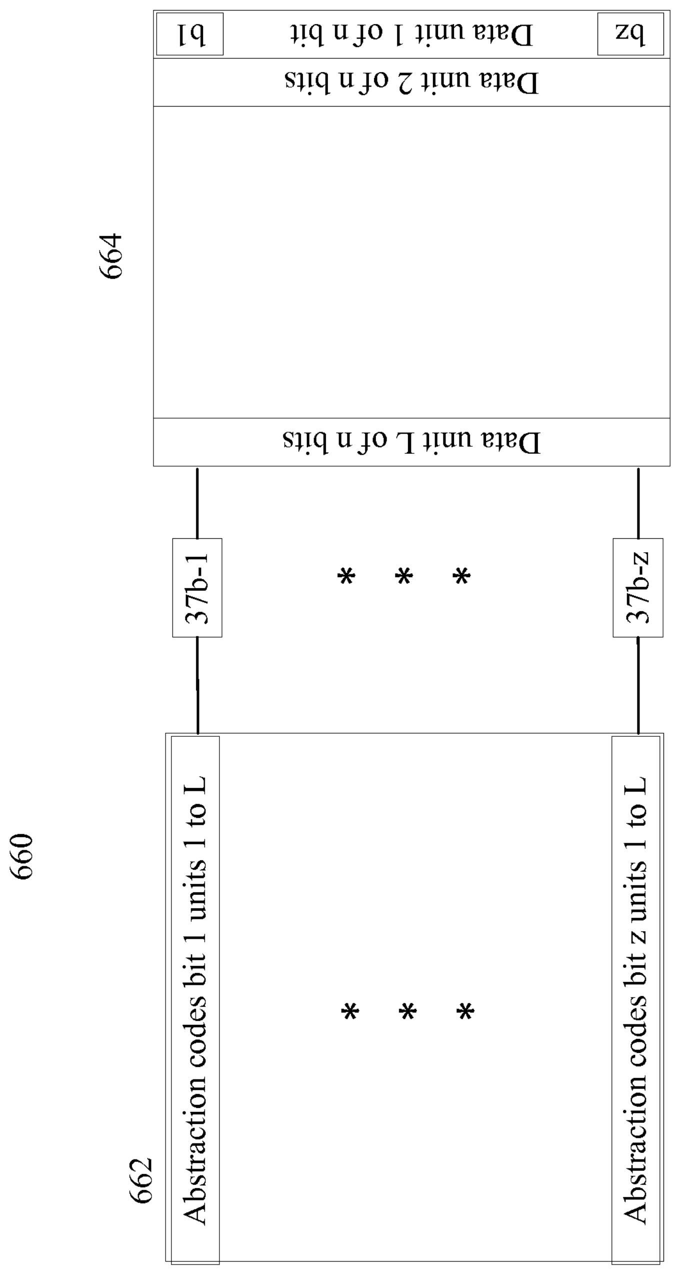
FIG. 39 is a block diagram of a parallel de-abstraction implementation.

Referring now to FIG. 36B, a receiver, receives the message 600 and runs 602 the received message though an abstraction engine 37*a* using a stored key (the same key that was used to authenticate the message from the authentic sender and which was exchanged or agreed upon prior to sending of the message). The receiver presumes that the stored key authenticates the sender of the message as the authentic sender. The abstraction engine outputs 604 the resulting abstraction codes. The receiver compares 606 the two sets of abstraction codes, i.e., the set received with the message and the calculated set.

If the sender and receiver used the same key and the message was not altered or corrupted, then the abstraction codes will be the same and thus, the receiver can be assured that the sender of the message is the authentic sender and the message is authentic. If the abstraction codes are different then the receiver knows that something is wrong, either an old key was used or the sender is not the authentic sender or the message was corrupted or otherwise altered during transmission.

Parallel Configurations

Referring now to FIG. 37, an exemplary parallel configuration of abstraction and de-abstraction is shown. This exemplary configuration can be used with any application, but is especially useful where the source data, e.g., the input, is not in a serial form. The parallel configuration obviates the need for parallel to serial and serial to parallel conversions for abstraction and de-abstraction respectively and can be more efficiently executed.

The configuration includes source/destination 622 and destination/source 624 devices. These devices 622, 624 source/receive data in a parallel format. For example, source/destination 622 could be a bus and destination/source 624 could be a memory that receives data from the bus during WRITE operations and during READ operations the destination/source 624 (memory) sends data to source/destination 622 (bus).

The configuration 620 also includes a plurality of abstraction/de-abstraction engines 36*a*-36*n*, typically of a number corresponding to the data width of the source/destination 622 and destination/source 624 devices. For example for a system having a 32 bit wide bus there could be 32 such engines.

Referring now to FIG. 38, a parallel abstraction configuration 640 is shown. The configuration 640 includes a device 642, such as a register, a buffer, memory etc. The device 642 here a memory has L number of entries where L is the length of an input bit string. Alternatively, the device 642 could have fewer than L number of entries and could have storage for a single data unit provided the rate at which the device is filled is less than the rate at which abstraction occurs. The entries in the memory are data units comprising plural bits (1-*z*) organized as e.g., bytes, words, long words, quad words, etc. Each bit position of data units are assigned to one of abstraction engines 37*a*-1 to 37*a*-*z*, as shown. The abstraction engines 37*a*-1 to 37*a*-*z* produce plural abstraction codes, one set of abstraction codes per bit position for each block of L data units. Thus, each abstraction engine 37*a*-1-37*a*-*z* operates over bit positions rather than data units. The abstraction codes are, e.g., stored in memory or storage 644 (as shown) and/or can be transmitted or otherwise used according to the particular application.

Referring now to FIG. 39, a parallel de-abstraction configuration 660 is shown. The configuration 660 includes a device 662, such as a buffer, memory etc. The device 664, here a memory, has z number of entries where z is the width of the data units that will be recovered. The entries in the memory 662 are abstraction codes. Each bit position of the memory 662 is assigned to one of plural de-abstraction engines 37*b*-1 to 37*b*-*z*, as shown. The de-abstraction engines 37*b*-1 to 37*b*-*z* recover plural data units a bit position at a time. Thus, each de-abstraction engine operates on a bit position, recovering from the abstraction codes in each bit position data bits of the data units. The recovered bits provided by the de-abstraction engines 37*b*-1 to 37*b*-*z* can be stored in a device 664 and/or can be transmitted a recovered data unit at a time.

Abstraction and de-abstraction functionality can be provided by a computer program product that receives an input bit string or receives the two codes and string L with either the abstraction or de-abstraction tables (stored, e.g. in memory or computer storage or other approaches) abstracts the two six bit codes or returns the input bit string according to whether the processing is abstraction or de-abstraction. The abstraction and de-abstraction functionality can be provided in separate routines or circuitry.

The devices can be any sort of computing device. For example, the devices can be a mobile device, a desktop computer, a laptop, a cell phone, a personal digital assistant ("PDA"), a server, an embedded computing system, a special purpose computing device, a signal processor device, and so forth.

Server can be any of a variety of computing devices capable of receiving information, such as a server, a distributed computing system, a desktop computer, a laptop, a cell phone, a rack-mounted server, and so forth. Server may be a single server or a group of servers that are at a same location or at different locations.

Server can receive information from client device user device via interfaces. Interfaces can be any type of interface capable of receiving information over a network, such as an Ethernet interface, a wireless networking interface, a fiber-optic networking interface, a modem, and so forth. Server also includes a processor and memory. A bus system (not shown), including, for example, a data bus and a motherboard, can be used to establish and to control data communication between the components of server.

Processor may include one or more microprocessors. Generally, processor may include any appropriate processor and/or logic that is capable of receiving and storing data, and of communicating over a network (not shown). Memory can include a hard drive and a random access memory storage device, such as a dynamic random access memory, machine-readable media, or other types of non-transitory machine-readable storage devices. Components also include a storage device, which is configured to store information, code, etc.

Embodiments can be implemented in digital electronic circuitry, or in computer hardware, firmware, software, or in combinations thereof. Embodiments can also involve pipelining of various computational stages. Apparatus of the invention can be implemented in a computer program product tangibly embodied or stored in a machine-readable or computer readable hardware storage device and/or machine readable hardware media for execution by a programmable processor; and method actions can be performed by a programmable processor executing a program of instructions to perform functions and operations of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object oriented programming language, or in assembly or machine language if desired; and in any case, the language can be a compiled or interpreted language.

Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD_ROM disks. Any of the foregoing can be supplemented by, or incorporated in, ASICs (application-specific integrated circuits).

A number of embodiments of the invention have been described. Nevertheless, it will be understood that various modifications may be made without departing from the spirit and scope of the invention. For example these techniques can be used for other applications and there can be other configurations. Further still network devices can be of various sorts including routers, switches, interface cards, network processors and so forth. Accordingly, other embodiments are within the scope of the following claims.

What is claimed is:

1. A device implemented method comprises:

receiving by a computing device that includes a processor and memory, an input bit string of bits, with the input bit string having a finite number of bits, the input bit string having a bit length L;

iteratively transforming by the computing device, the bits of the input string into sets of interim function codes, with for each bit of the input bit string each of the sets of the interim function codes transformed in part from functions that are reverse sequence isomoric pairs and previous determined ones of the interim function codes; and providing by the computing device, the set of the interim function codes that is determined for the bit at the bit position L of the input bit string, as a set of abstraction codes that correspond to a lossless representation of the input bit string having fewer bits than the bit length L.

2. The device implemented method of claim 1 wherein iteratively transforming, transforms the bits of the input bit string further from beginning conditions for the bit position corresponding to the corresponding input bits, and permissibility conditions; and the method further comprises:

applying a permutation of a bit representation for the function codes to the abstraction codes.

3. The device implemented method of claim 1 wherein the set of abstraction codes and the length L of the input bit string are the representation of the input bit string, and wherein the input bit string is a digital bit string that represents either digital data or computer instruction code.

4. The device implemented method of claim 1 wherein the set of abstraction codes are two abstraction codes with each abstraction code being six bits in length.

5. The device implemented method of claim 1 wherein the set of abstraction codes are two abstraction codes with each abstraction code being five bits in length.

6. The device implemented method of claim 1 wherein the set of abstraction codes are two abstraction codes with each abstraction code being four bits in length.

7. The device implemented method of claim 1 wherein iteratively transforming, further comprises:

iteratively accessing by the computing device a table structure stored in the memory to determine the set of interim function codes, for each iteration, retrieving from the table structure the set of interim function codes for a bit position, according to beginning conditions for the bit position and values of the determined set of the interim function codes for a present set of inputs and a next set of inputs.

8. The device implemented method of claim 1 further comprising:

iteratively retrieving the interim function codes from a table by evaluating for each bit of the input bit string, a corresponding set of present inputs and initial state for the bit of the input bit string to provide a subsequent set of functions and next set of inputs for a next bit in the input string.

9. The device implemented method of claim 1 wherein interactively transforming the bits of the input string into the sets of interim function codes further comprises:

iteratively determining a DA bit for each bit position of the input bit string, according to beginning conditions and by:

testing for a limit condition at the bit positions:

when a limit condition is not encountered, using the bit from the input bit string at the bit position as the DA bit value of a next set inputs; and when a limit condition is encountered, substituting for the bit from the input bit string at the bit position, a limit bit from a limit bit table according to an index value of the limit string, for the bit at the bit position of the input bit string as the DA bit value of the next set of inputs.

10. The device implemented method of claim 9 wherein testing for the limit condition further comprises determining by the device at the bit positions whether for a value of an AD bit of an AD bit string at the bit positions, the limit condition occurs when for a present input of the AD bit or the DA bit, the interim function codes have the same values for either the AD and/or the DA bits.

11. A device implemented method of producing a representation of an input bit string of a finite number of digital bits of a length L, the representation having fewer bits than the finite number of bits L, the method comprises:

receiving by the device that includes a processor and memory, the input bit string of the length L;

iteratively, determining by the device a set of interim function codes for each bit of the input bit string, up to the length L of the input bit string by iterative accesses to a table that stores function codes according to beginning conditions, final states and permissibility conditions; and when the length L of the input bit string has been reached by the iterative determining, producing a final set of interim function codes.

12. The device implemented method of claim 11 wherein the table is included in a program that executes on the processor to perform the method on the device, and the method further comprises:

detecting a non-permissible condition;

determining by the device a bit value to substitute for a bit value in the input string based on the detected non-permissible condition; and obtaining by the device for each bit in the input string including any substituted bit values, interim values of the set of interim functions from a table stored in the memory, with the table storing beginning condition values including present state values, the interim function codes, and next present state values of the interim function codes.

13. The device implemented method of claim 11 wherein the input string is of blocks of the length L and iteratively determining further comprises:

iteratively, determining by the device the interim function codes over each of the blocks of the length L of the input string;

transforming the final set of interim function codes into a pair of transformed abstraction codes by:

selecting a permutation of a binary representation of function codes as a binary representation to correspond to the final set of the interim function codes.

14. The device implemented method of claim 11 wherein the final set of interim function codes are a pair of abstraction codes that is the representation of the input string, with each of the pair provided as one of binary representations that are each four bits in length or that are each five bits in length or that are each six bits in length.

15. The device implemented method of claim 11 wherein the input bit string distributed over plural blocks of known size to accommodate the finite number of bits of the length L, and iteratively determining further comprises:

iteratively, determining by the device the interim functions for each of the blocks in succession.

16. The device implemented method of claim 11 further comprising:

iteratively determining by the device the interim and the final set of functions by evaluating each bit of the input bit string according to a set of initial state values to provide subsequent interim function values and next state values.

17. The device implemented method of claim 11 further comprising:

retrieving by the device a limit bit from a table of limit bits, when a non-permissive condition is encountered, where the number of bits in the limit bit table is indexed from an initial index to a value of at least about L/3.

18. The device implemented method of claim 11 wherein iteratively calculating interim functions further comprises:

iteratively determining by the device a DA bit for bit positions of the input bit string, by:

testing for a permissive condition for each of the bit positions to determine presence of a limit condition:

when the limit condition is not encountered, using the bit from the input bit string according to the bit position; and when the limit condition is encountered, substituting for the bit from the input bit string according to the bit position, a limit bit from a limit bit table according to an index value of the limit string.

19. The device implemented method of claim 18 wherein a limit condition occurs when for a present set of inputs that comprise bits of an AD bit string and bits of a DA bit string, the computed interim functions have the same values for either the AD and/or the DA input bits.

20. The device implemented method of claim 19 wherein the input bit string has an index k and iteratively determining operates over the index k, and the method further comprises:

determining by the device when iteratively determining reaches the index value of k equal to the length L of the input bit string; and when k equals the length L, the iterative determining provides the final set of interim functions.

21. The device implemented method of claim 11 wherein an abstraction engine performs the iteratively determining, with the abstraction engine being one of a plurality of abstraction engines, and the input string is one of a parallel set of plural input strings that corresponds to a bit width of a source of the parallel set of plural input strings, and with the method further comprising:

receiving by the plurality of abstraction engines the parallel set of plural input bit strings; and assigning the abstraction engines to perform the iteratively processing for corresponding ones of the plurality of the input bit strings in the parallel set of plural input bit strings according to input string bit positions to produce corresponding plural abstraction codes per input bit string position.

22. The device implemented method of claim 11 further comprising:

storing in memory in the device a table, and wherein the table comprises:

plural rows, with each row representing a function and with each row including:

a set of present inputs, including a state value, an AD value and a DA value; and a next set of present inputs including a set of transition values for each transition level of the function.

23. The device implemented method of claim 11 further comprises:

generating a table by the device;

storing the table as a data structure in memory, the table including plural rows, with each row representing a function and with each row including a set of present inputs, including a state value, an AD value and a DA value; and a next set of present inputs including a set of transition values for each transition level of the function.

24. The device implemented method of claim 11 further comprising:

determining the length L of the input bit string.

25. The device implemented method of claim 11 wherein the length L of the input bit string is received.

26. The device implemented method of claim 11 wherein the length L of the input bit string is fixed.

27. The device implemented method of claim 1 wherein the memory stores a table accessible by a computer program product executed by the processor to:

perform the iteratively determining with the table including plural rows, with each row representing a function.

28. The device implemented method of claim 1 wherein the memory stores:

a first table for a first, function type accessible by a computer program product executed by the processor to perform the iteratively determining with the table including plural rows, with each row representing a function and with each row including a set of present inputs, including a state value, an AD value and a DA value; and a next set of present inputs including a set of transition values for each transition level of the function; and a second table for a second different function type, the second table further comprising:

plural rows, with each row representing a function of the second function type and with each row including columns that include a set of present inputs, including a state value, an AD value and a DA value; and a next set of present inputs including a set of transition values for each transition level of the second function type.

29. The device implemented method of claim 27 wherein the function is a first function type and a second, different function type and with the first and second function types represented by the plural rows of the table and the columns including:

a set of present inputs, including a state value, an AD value and a DA value; and a next set of present inputs including a set of transition values for each transition level of corresponding ones of the first and second function types.

30. The device implemented method of claim 27 wherein the table includes rows that have permissible and non-permissible values for the function.

31. The device implemented method of claim 27 wherein the table includes only rows that have permissible values for the function.

32. The device implemented method of claim 27 wherein the table includes rows that have permissible and non-permissible values for at least one of the first and second function types.

33. The device implemented method of claim 28 wherein the table includes only rows that have permissible values for the first and second function types.

34. The device implemented method of claim 29 wherein the table includes rows that have permissible and non-permissible values for at least one of the first and second function types.

35. The device implemented method of claim 29 wherein the table includes only rows that have permissible values for the first and second function types.

36. A device comprises:

a processor:

memory in communication with the processor, and logic to configure the processor to:

receive an input bit string having a finite number of bits of a bit length L;

iteratively determine plural sets of first and second function codes from the input bit string over the length L of the input bit string for each input bit at each corresponding bit position by calculating each of the plural sets of the first and second function codes from corresponding beginning conditions, permissibility conditions, corresponding next state conditions, and values of the input bit; and provide the first and second function codes determined for bit position L of the input string, as a representation of the input bit string, where the number of bits in the representation are less than the number of bits in the input bit string.

37. A computer program product tangibly stored in a non-transitory readable medium hardware storage device that is readable by a computer, the computer program product for producing a representation of an input bit string of bits of a finite length L, the representation having fewer bits than the finite number of bits L, the computer program product comprising instructions for causing a processor to:

receive an input bit string having a finite number of data bits of a bit length L;

iteratively determine plural sets of interim function codes from the input bit string over the length L of the input bit string by calculating each of the sets of interim function codes from corresponding beginning conditions for a corresponding bit position of the input bit stream, permissibility conditions, next state conditions, and data bits of the input string or substituted data bits from a limit string; and provide the set of interim function codes determined for bit position L of the input string as a representation of the input bit string.

38. A electronic device implemented method comprises:

receiving by the electronic device, an input bit string of bits of a finite length of a length L;

producing by the electronic device a set of abstraction codes by an abstraction engine in communication with the electronic storage device, by iteratively transforming the bits of the input string into sets of interim function codes, with for each bit of the input bit string each of the sets of the interim function codes transformed in part from functions that are reverse sequence isomoric pairs, and previous determined ones of the interim function codes with the set of abstraction codes being the set of interim function codes that were transformed a bit position corresponding to the length L of the input string; and storing by the electronic device, the set of abstraction codes into a data storage medium of the electronic storage device, with the set of codes corresponding to an abstracted representation of the input bit string.

39. The device implemented method of claim 38 wherein the set of abstraction codes are two codes with each code being six bits in length.

40. The device implemented method of claim 38 wherein the set of abstraction codes are two codes with each code being five bits in length.

41. The device implemented method of claim 1 wherein the set of abstraction codes are two codes with each code being four bits in length.

42. The device implemented method of claim 38 wherein the data storage medium of the storage device is selected from the group consisting of an optical medium, a magnetic medium, and a semiconductor medium.

43. The device implemented method of claim 38 wherein the abstraction engine is provided in the storage device and is configured to produce the abstraction codes by:

iteratively determining by the abstraction engine according to permissibility conditions, sets of interim function codes, with for each iteration for a given bit of the input bit string, evaluating a corresponding set of present inputs and initial state to provide an first interim set of function codes and a next set of inputs and a next state for a next bit in the input string, when the bit at the length L of the input bit string has been evaluated, producing a final set of function codes; and transforming by the abstraction engine the final set of function codes into the abstraction codes.

44. The device implemented method of claim 38 wherein the length L of the input bit string is a known length.

45. The device implemented method of claim 38 wherein the length L of the input bit string is determined by populating one or more structures each of a known length with the input bit string by the abstraction engine.

46. The device implemented method of claim 43 wherein determining permissibility conditions comprises:

determining when a limit condition occurs.

47. The device implemented method of claim 38 wherein the input bit string has an index k, the method further comprising:

iteratively calculating by the abstraction engine sets of interim function codes for values at bit positions of the input string;

testing for an impermissibility condition by detecting that one or both of values for DA and AD conditions result in the same interim function code;

determining when the index k reaches the length L of the input bit string; and when k has reached the length L, outputting final values of the interim function codes; and transforming the final values of the computed interim function codes into the abstraction codes.

48. A storage device comprises:

an interface configured to receive an input bit string of data bits of a finite length L;

a storage medium; and an abstraction engine configured to:

receive the input bit string; and produce from the input bit string a set of abstraction codes, where the set of abstraction codes comprise a first code having a first length of a number of bits, and a second code having the same first length of the number of bits;

circuitry to send the set of abstraction codes to the storage medium to store the set of codes in a location in the storage medium, with the first and second codes corresponding to an abstracted lossless representation of the input bit string.

49. A device implemented method of transmitting data over a network, the method comprises:

receiving by a device an input bit string of data bits of a finite length defined as a length L;

producing from the input bit string by an abstraction engine in the device a set of abstraction codes that represent the input bit string;

forming a formatted unit of data comprising connection information and a payload with the payload comprising the set of abstraction codes that represent the input bit string.

50. The device implemented method of claim 49 wherein the set of abstraction codes are two abstraction codes with each code being six bits in length.

51. The device implemented method of claim 49 wherein the set of abstraction codes are two abstraction codes with each code being five bits in length.

52. The device implemented method of claim 49 wherein the set of abstraction codes are two abstraction codes with each code being four bits in length.

53. The device implemented method of claim 49, wherein the length L of the input bit string is a known length and the payload is a fixed length.

54. The device implemented method of claim 53 wherein the abstraction engine is configured for:

iteratively determining by the abstraction engine a set of interim function codes, for a given bit of the input bit string, evaluating a corresponding set of present inputs and initial state to provide an interim set of function codes and a next set of inputs and next state, for a next bit in the input string, according to permissibility conditions; and when the length of the input bit string has been reached producing a final set of function codes; and transforming by the abstraction engine the final set of function codes into the abstraction codes that are used to form the payload of the formatted unit of data.

55. The device implemented method of claim 49 further comprising:

determining the length L of the input bit string.

56. The device implemented method of claim 49 further comprising:

receiving the length L of the input bit string.

57. The device implemented method of claim 54 wherein determining permissibility conditions comprises determining when a limit condition occurs by detecting an impermissibility condition when one or both of values for DA and AD conditions result in the same interim function code; upon detecting an impermissibility condition, using as a value of the DA or AD conditions a bit value obtained from a limit string of predetermined values.

58. The device implemented method of claim 57 wherein the input bit string has an index k, the method further comprises:

determining by the abstraction engine when the index k reaches the length L of the input bit string; and when k has reached the length L, outputting by the abstraction engine final values of the computed function codes.

59. A network device comprises:

an interface configured to receive an input bit string of data bits of a finite length L;

an abstraction engine configured to:

produce from the input bit string a set of abstraction codes; and a forming engine that produces a formatted unit of data comprising connection information and a payload, with the payload comprising the set of abstraction codes.

60. The device of claim 59 further comprising:

a storage device that stores the set of abstraction codes, with the set of abstraction codes corresponding to a lossless compressed representation of the input bit string, with the forming engine configured to retrieve the set of abstraction codes from the storage device.

61. The device of claim 59 wherein the formatted unit of data is a fixed length cell.

62. The device of claim 59 wherein the formatted unit of data is a packet.

63. The device of claim 59 wherein the formatted unit of data is a frame.

64. A device implemented method of encrypting an input bit string of data bits of a finite length into a compressed, encrypted representation of the input bit string, the method comprises:

receiving by a device the input bit string of data bits of finite length defined as length L;

abstracting the input bit string by an abstraction engine into a set of abstraction codes that correspond to a lossless representation of the input bit string, with the abstraction codes formed using a secured abstraction encryption key; and sending by the device the set of abstraction codes to a recipient application, the set of abstraction codes.

65. The device implemented method of claim 64 wherein the set of abstraction codes are two codes with each code being six bits in length.

66. The device implemented method of claim 64 wherein the set of abstraction codes are two codes with each code being five bits in length.

67. The device implemented method of claim 64 wherein the set of abstraction codes are two codes with each code being four bits in length.

68. The device implemented method of claim 64 wherein the secured abstraction encryption key comprises one or more of a secured instance of a limit string, a secured instance of an address string, and a secured instance of a permutation of a binary representation for the abstraction codes for code transformation by the abstraction engine.

69. The device implemented method of claim 64, further comprising:

exchanging the secured abstraction encryption key with the recipient application in a secure manner.

70. The device implemented method of claim 64 wherein the determined encryption key is a randomly selected permutation of a binary representation of abstraction codes; and the method further comprises:

transforming by the abstraction engine the abstraction codes into a binary representation using the randomly selected permutation; and securing exchanging information about the randomly selected permutation with a recipient device including a second abstraction engine.

71. The device implemented method of claim 64 wherein determining the encryption key further comprises:

producing at least one of a random limit string, a random address string and a random permutation for code transformation;

securing the produced at least one as the encryption key.

72. The device implemented method of claim 64 wherein forming from the abstraction the encryption key further comprises:

producing a random permutation for code transformation;

securing the produced random permutation as the encryption key.

73. The device implemented method of claim 72 wherein securing the produced random permutation as the encryption key comprises:

encrypting the encryption key with a different encryption algorithm.

74. The device implemented method of claim 64 further comprising:

sending a value representing the length L of the input bit string to the recipient application.

75. The device implemented method of claim 64 wherein the abstraction engine is configured for:

iteratively determining by the abstraction engine according to permissibility conditions sets of interim function codes, for each iteration for a given bit of the input bit string, evaluating a corresponding set of present inputs and initial state to provide an interim set of function codes and next set of inputs and next state for a next bit in the input string; when the bit at the length L of the input bit string has been evaluated, producing a final set of function codes: and transforming by the engine the final set of function codes into the abstraction codes.

76. The device implemented method of claim 70, further comprising:

enabling user selection of at least one of limit string, address string and permutation of a code transformation from which the abstraction engine produces the encryption key.

77. A device implemented method of producing a hash, the method comprises:

receiving a key that corresponds to a stored input bit string of data bits of a finite length L;

producing by an abstraction engine in the device a set of end words by abstracting a set of code words from the input bit string corresponding to the key;

applying by the device the set of end words to point to a location in memory associated with the key.

78. The device implemented method of claim 77 wherein the set of codes are two codes with each code being six bits in length.

79. The device implemented method of claim 77 wherein the set of codes are two codes with each code being five bits in length.

80. The device implemented method of claim 77 wherein the set of codes are two codes with each code being four bits in length.

81. The device implemented method of claim 77, further comprising:

applying the key through the abstraction engine to produce the end words according to:

i end-0 #F3,4 and #G3,4 each containing 4 bits=8 bits=order 0-7, i end-1,#F3,4 and #G3,4 each containing 4 bits=8 bits=order 8-15, i end-2,#F3,4 and #G3,4 each containing 4 bits=8 bits=order 16-23, i end-3,#F3,4 and #G3,4 each containing 4 bits=8 bits=order 24-31; and storing the end words in storage.

82. The device implemented method of claim 77 further comprising:

iteratively producing by the abstraction engine, a set of abstraction codes.

83. The device implemented method of claim 77 wherein the end words are values used as addresses to memory for data sections correspondingly pointed to by the key.

84. The device implemented method of claim 77 wherein the abstraction engine provides the end words as hashes that map the keys to an index.

85. A device implemented method of producing a cryptographic hash, the method comprises:

providing to a device an input bit string of data bits having a finite length;

calculating by the device from the input bit string a set of abstraction codes; and returning by the device the set of abstraction codes as the cryptographic hash.

86. A device configuration for abstraction comprises:

a storage device having storage for one or more entries where the one or more entries are data units comprising plural bits in a like plurality of bit positions; and a like plurality of abstraction units fed by the storage device with each bit position of the storage device coupled to a corresponding one of abstraction engines, with the abstraction engines configured to produce plural abstraction codes according to the corresponding bit position of the storage device coupled to the corresponding abstraction engine.

87. The device implemented method of claim 46 wherein when a limit condition occurs, the device substitutes for the data bit from the input bit string according to the bit position, a limit bit from a limit bit table according to an index value of the limit string.

88. The device implemented method of claim 46 wherein when a limit condition is not present the device uses the data bit from the input bit string according to the bit position.

89. The device implemented method of claim 57 wherein when a limit condition occurs, the device substitutes for the data bit from the input bit string according to the bit position, a limit bit from a limit bit table according to an index value of the limit string.

90. The device implemented method of claim 57 wherein when a limit condition is not present the device uses the data bit from the input bit string according to the bit position.

91. The device implemented method of claim 2 wherein calculating by the device the set of abstraction codes accesses a table that stores functions based on a non-abelian group of order six.

92. The device implemented method of claim 11 wherein iteratively calculating by the device the set of abstraction codes accesses a table that stores functions based on a non-abelian group of order six to obtain a subsequent set of functions.

93. The device of claim 36 wherein the device calculates the abstraction codes by accessing a table that stores interim function codes that are based on a non-abelian group of order six.

94. The computer program product of claim 37 wherein the processor calculates the abstraction codes by accessing a table that stores interim function codes that are based on a non-abelian group of order six.

95. The device implemented method of claim 43 wherein obtaining interim values comprises:

retrieving subsequent sets of functions from the table that stores interim function codes that are and that is based on a non-abelian group of order six.

96. The device of claim 48 wherein the device produces the abstraction codes by applying a table that stores interim function codes that are based on a non-abelian group of order six.

97. The device implemented method of claim 49 wherein the processor produces the abstraction codes by applying a table that stores interim function codes that are based on a non-abelian group of order six.

98. The device implemented method of claim 54 wherein producing comprises:

retrieving the set of functions from a table that stores interim function codes that are based on a non-abelian group of order six.

99. The network device of claim 59 wherein the engine produces the abstraction codes by applying a table that stores interim function codes that are based on a non-abelian group of order six.

100. The device implemented method of claim 75 wherein calculating interim function codes comprises:

retrieving the set of functions from a table that stores interim function codes that are based on a non-abelian group of order six.

* * * * *